US008541160B2

(12) United States Patent
Shibuya

(10) Patent No.: US 8,541,160 B2
(45) Date of Patent: Sep. 24, 2013

(54) ACTINIC-RAY- OR RADIATION-SENSITIVE RESIN COMPOSITION AND METHOD OF FORMING PATTERN USING THE SAME

(75) Inventor: Akinori Shibuya, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 119 days.

(21) Appl. No.: 13/095,328

(22) Filed: Apr. 27, 2011

(65) Prior Publication Data

US 2011/0269072 A1 Nov. 3, 2011

(30) Foreign Application Priority Data

Apr. 28, 2010 (JP) ................................ 2010-104191
Mar. 23, 2011 (JP) ................................ 2011-064695

(51) Int. Cl.

| | |
|---|---|
| ***G03F 7/00*** | (2006.01) |
| ***G03F 7/028*** | (2006.01) |
| ***G03F 7/20*** | (2006.01) |
| ***G03F 7/004*** | (2006.01) |

(52) U.S. Cl.
USPC ......................... 430/270.1; 430/396; 430/913

(58) Field of Classification Search
USPC ....................................... 430/270.1, 913, 396
See application file for complete search history.

(56) References Cited

U.S. PATENT DOCUMENTS

| | | | | |
|---|---|---|---|---|
| 7,232,642 | B2 | 6/2007 | Takemoto et al. | |
| 7,303,852 | B2 * | 12/2007 | Hatakeyama et al. | 430/270.1 |
| 7,368,218 | B2 | 5/2008 | Hatakeyama et al. | |
| 7,638,260 | B2 * | 12/2009 | Seki et al. | 430/270.1 |
| 7,666,571 | B2 * | 2/2010 | Watanabe et al. | 430/270.1 |
| 7,718,342 | B2 * | 5/2010 | Funatsu et al. | 430/270.1 |
| 7,771,913 | B2 * | 8/2010 | Kaneko et al. | 430/270.1 |
| 7,771,914 | B2 * | 8/2010 | Hatakeyama et al. | 430/270.1 |
| 7,871,752 | B2 | 1/2011 | Hasegawa et al. | |
| 7,875,746 | B2 * | 1/2011 | Wada | 564/82 |
| 7,981,589 | B2 * | 7/2011 | Hasegawa et al. | 430/270.1 |
| 8,043,782 | B2 * | 10/2011 | Jeong | 430/111.4 |
| 8,057,981 | B2 * | 11/2011 | Harada et al. | 430/270.1 |
| 8,101,335 | B2 * | 1/2012 | Harada et al. | 430/270.1 |
| 8,173,354 | B2 * | 5/2012 | Ohsawa et al. | 430/270.1 |
| 2006/0264528 | A1 * | 11/2006 | Wada | 522/130 |
| 2010/0233629 | A1 | 9/2010 | Wada | |

FOREIGN PATENT DOCUMENTS

| | | | |
|---|---|---|---|
| JP | 2004-210917 | A | 7/2004 |
| JP | 2005-321765 | A | 11/2005 |
| JP | 2005-352466 | A | 12/2005 |
| JP | 2006-330098 | A | 12/2006 |
| JP | 2007-119678 | A | 5/2007 |
| JP | 2008-031298 | A | 2/2008 |

OTHER PUBLICATIONS

Machine translation of JP 2006-330098 (no date).*

* cited by examiner

*Primary Examiner* — Amanda C. Walke
(74) *Attorney, Agent, or Firm* — Sughrue Mion, PLLC

(57) ABSTRACT

Provided is an actinic-ray- or radiation-sensitive resin composition excelling in the LWR, pattern collapse performance and DOF, and a method of forming a pattern using the same. The composition according to the present invention contains (A) a resin containing a repeating unit with any of partial structures of general formula (I) below, (B) a compound (PA) as defined in the specification, and (C) a compound being configured to generate an acid when exposed to actinic rays or radiation, wherein the resin is contained in an amount of 50 mass % or more based on total solids of the composition.

(I)

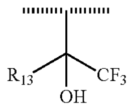

23 Claims, No Drawings

ACTINIC-RAY- OR RADIATION-SENSITIVE RESIN COMPOSITION AND METHOD OF FORMING PATTERN USING THE SAME

CROSS-REFERENCE TO RELATED APPLICATIONS

This application is based upon and claims the benefit of priority from prior Japanese Patent Applications No. 2010-104191, filed Apr. 28, 2010; and No. 2011-064695, filed Mar. 23, 2011, the entire contents of both of which are incorporated herein by reference.

BACKGROUND OF THE INVENTION

1. Field of the Invention

The present invention relates to an actinic-ray- or radiation-sensitive resin composition and a method of forming a pattern using the same. More specifically, the present invention relates to a composition and a method of forming a pattern therewith that is suitable for use in lithography operations employed in a semiconductor production process for an IC or the like, the production of a circuit board for a liquid crystal, a thermal head or the like and other photofabrication. Further more specifically, the present invention relates to a composition and a method of forming a pattern therewith that is suitable for exposure using an a far-ultraviolet light of wavelength 250 nm or shorter or an electron beam as a light source.

In the present invention, the terms “actinic rays” and “radiation” mean, for example, a mercury lamp bright line spectrum, far ultraviolet rays represented by an excimer laser, extreme ultraviolet (EUV) rays, X-rays, electron beams (EB) and the like. In the present invention, the term “light” means actinic rays or radiation.

The expression “exposure” used herein, unless otherwise noted, means not only light irradiation using a mercury lamp, far ultraviolet, X-rays, EUV light, etc. but also lithography using particle beams, such as an electron beam and an ion beam.

2. Description of the Related Art

A chemical amplification resist is a material for forming a pattern capable of, upon exposure to far ultraviolet rays or other radiation, generating an acid at the exposed area. A reaction catalyzed by the generated acid allow the solubility of the exposed area in a developer to be different from that of the non-exposed area. The difference in the solubility between those areas makes it possible to attain pattern formation on a substrate.

In using a KrF excimer laser as an exposure light source, a resin whose fundamental skeleton consists of a poly(hydroxystyrene) exhibiting a low absorption mainly in the region of 248 nm is employed as a major component. Accordingly, favorable pattern with high sensitivity and high resolving power can be formed. Thus, a system superior to the conventional naphthoquinone diazide/novolak resin system has been realized.

On the other hand, in using a light source of a further shorter wavelength, for example, an ArF excimer laser (193 nm) as an exposure light source, the above-mentioned chemical amplification system has not been satisfactory because the compounds having an aromatic group inherently exhibit a sharp absorption in the region around 193 nm.

Therefore, various resists for an ArF excimer laser containing an alicyclic hydrocarbon structure have been developed. However, the current situation is that it is extremely difficult to discover an appropriate combination among an employed resin, a photoacid generator, an additive and a solvent, etc., from the viewpoint of the comprehensive performance of a resist. In particular, in the formation of a nanopattern of 65 nm or less line width, there is a demand for enhancing the line pattern roughness performance and resolving power In recent years, it has been discovered that the resolving power, roughness characteristics and pattern collapse performance can be improved by making the above resin with an alicyclic hydrocarbon structure contain a repeating unit with a specified lactone structure or a specified alcohol structure having its α-position substituted with a fluoroalkyl group.

For example, patent references 1 and 2 describe resist compositions each loaded with a resin containing a repeating unit with a structure in which a spacer is introduced between a polymer principal chain and a lactone skeleton. Further, patent reference 3 describes that not only the resolving power and line edge roughness but also the iso/dense bias and exposure margin can be improved by using resist compositions each loaded with a resin containing a specified lactone repeating unit in which a similar spacer is introduced.

Still further, patent references 4 and 5 describe resist compositions each loaded with a resin containing a repeating unit with a specified alcohol structure having its α-position substituted with a fluoroalkyl group. It is also described that the roughness characteristics and pattern collapse performance can be improved by the use of such resist compositions.

Various ingenuities have also been exerted on other components than the resin. For example, patent reference 6 describes that a specified low-molecular compound whose proton acceptor properties are dissipated upon exposure to light is effective in the improvement of roughness performance.

However, in the most recent 45 nm or less line width generation to which a liquid immersion process is applied, it is required to further enhance the resist performances. In particular, it is required to further enhance not only the line width roughness (LWR) and pattern collapse performance but also the defocus latitude (Depth of Focus: DOF).

[Citation List]

[Patent Literature]

[Patent reference 1] Jpn. Pat. Appln. KOKAI Publication No. (hereinafter referred to as JP-A-) 2005-352466,

[Patent reference 2] JP-A-2004-210917,

[Patent reference 3] JP-A-2008-031298,

[Patent reference 4] JP-A-2007-119678,

[Patent reference 5] JP-A-2005-321765, and

[Patent reference 6] JP-A-2006-330098.

BRIEF SUMMARY OF THE INVENTION

It is an object of the present invention to provide an actinic-ray- or radiation-sensitive resin composition excelling in the LWR, pattern collapse performance and DOF, and provide a method of forming a pattern using the same.

Examples of present invention are as follows.

[1] An actinic-ray- or radiation-sensitive resin composition comprising: (A) a resin containing a repeating unit with any of partial structures of general formula (I) below, the resin being configured to increase its rate of dissolution in an alkali developer when acted on by an acid; (B) a compound (PA) containing a functional group with proton acceptor properties and being configured to decompose when exposed to actinic rays or radiation to thereby produce a compound exhibiting lower or no proton acceptor properties or a compound exhibiting acid properties instead of the proton acceptor properties; and (C) a compound being configured to generate an acid when exposed to actinic rays or radiation; wherein the resin is contained in an amount of 50 mass % or more based on total solids of the composition,

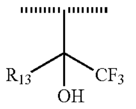

(I)

in which $R_{13}$ represents a hydrogen atom, an alkyl group or a cycloalkyl group.

[2] The composition according to [1], wherein the repeating unit is represented by at least one selected from the group consisting of general formulae (I-1) to (I-3) below,

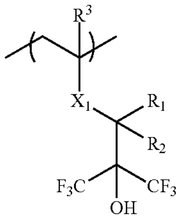

(I-1)

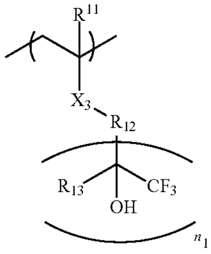

(I-2)

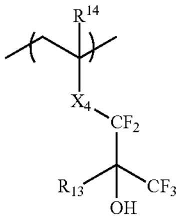

(I-3)

in which each of $R^3$, $R^{11}$ and $R^{14}$ independently represents a hydrogen atom, an alkyl group or a halogen atom;

each of $X_1$, $X_3$ and $X_4$ independently represents any one of —C(═O)—, —C(═O)—O—, —C(═O)—O—$R_6$—, —O—, —C(═O)—$R_6$—C(═O)— and —C(═O)—O—$R_6$—C(═O)—O—, in which $R_6$ represents an alkylene group or a cycloalkylene group;

$R_1$ represents a hydrogen atom, an alkyl group, a cycloalkyl group or a halogen atom, and $R_2$ represents a hydrogen atom, an alkyl group or a cycloalkyl group, provided that $R_1$ and $R_2$ may be bonded to each other to thereby form a ring;

$R_{12}$ represents a cycloalkylene group or a cycloalkanetriyl group, and $R_{13}$ represents a hydrogen atom, an alkyl group or a cycloalkyl group, provided that in general formula (I-2), $R_{12}$ and $R_{13}$ may be bonded to each other to thereby form a ring; and $n_1$ is 1 or 2.

[3] The composition according to [2], wherein the repeating unit is represented by the general formula (I-1) or (I-3).

[4] The composition according to [2], wherein the repeating unit is represented by the general formula (I-2) in which $n_1$ is 2.

[5] The composition according to any of [1] to [4], wherein the compound produced by the decomposition of the compound (PA) upon exposure to actinic rays or radiation is represented by general formula (PA-1) below:

$$Q\text{-}A\text{-}(X)_n\text{—}B\text{—}R \qquad \text{(PA-1)}$$

in which

Q represents —$SO_3H$, —$CO_2H$ or —$W_1NHW_2R_f$, in which $R_f$ represents an alkyl group, a cycloalkyl group or an aryl group, and each of $W_1$ and $W_2$ independently represents —$SO_2$— or —CO—;

A represents a single bond or a bivalent connecting group;

X represents —$SO_2$— or —CO—;

n is 0 or 1;

B represents a single bond, an oxygen atom or —$N(R_x)R_y$—, in which $R_x$ represents a hydrogen atom or a monovalent organic group, and $R_y$ represents a single bond or a bivalent organic group, provided that $R_x$ may be bonded to $R_y$ to thereby form a ring or may be bonded to R to thereby form a ring; and R represents a monovalent organic group containing the functional group with proton acceptor properties.

[6] The composition according to [5], wherein Q represents —$SO_3H$ or —$CO_2H$.

[7] The composition according to any of [1] to [4], wherein the compound (PA) is represented by general formula (7) below, $$\underset{(R\rightarrow_{m} A^{+} \leftarrow R_N)_n}{X^-} \qquad (7)$$

in which

A represents a sulfur atom or an iodine atom;

m is 1 or 2 and n is 1 or 2, provided that m+n=3 when A is a sulfur atom and that m+n=2 when A is an iodine atom;

R represents an aryl group;

$R_N$ represents an aryl group substituted with the functional group with proton acceptor properties; and $X^-$ represents a counter anion.

[8] The composition according to any of [1] to [7], wherein the resin further contains any of repeating units of general formula (II-1) below:

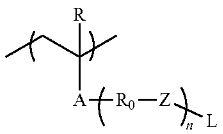

(II-1)

in which

R represents a hydrogen atom, an alkyl group or a halogen atom;

A represents —COO— or —CONH—;

$R_0$, when n≧2 each independently, represents an alkylene group, a cycloalkylene group or a combination thereof;

Z, when n≧2 each independently, represents an ether bond, an ester bond, an amido bond, a urethane bond or a urea bond;

L represents a substituent with a lactone structure; and n is an integer of 1 to 5.

[9] The composition according to any of [1] to [8], further comprising a hydrophobic resin.

[10] The composition according to [9], the hydrophobic resin comprising at least one of a fluorine atom and a silicone atom.

[11] The composition according to [9] or [10], the hydrophobic resin comprising at least one group selected from among the following groups (x), (y) and (z):

(x) an alkali-soluble group;

(y) a group that is decomposed by the action of an alkali developer, resulting in an increase of solubility in the alkali developer; and (z) a group that is decomposed by the action of an acid.

[12] The composition according to any of [9] to [11], wherein a content of the hydrophobic resin in the composition based on the total solids thereof is in the range of 0.01 to 20 mass %.

[13] A resist film formed from the composition according to any of [1] to [12].

[14] A method of forming a pattern, comprising:

forming the composition according to any of [1] to [12] into a film, exposing the film, and developing the exposed film.

[15] The method according to [14], wherein the exposure is performed through an immersion liquid.

The present invention has made it feasible to provide an actinic-ray- or radiation-sensitive resin composition excelling in the LWR, pattern collapse performance and DOF, and provide a method of forming a pattern using the same.

DETAILED DESCRIPTION OF THE INVENTION

Embodiments of the present invention will be described below.

Note that, with respect to the expression of a group (or an atomic group) used in this specification, the expression without explicitly referring to whether the group is substituted or unsubstituted encompasses not only groups with no substituents but also groups having one or more substituents. For example, the expression "alkyl group" encompasses not only alkyl groups having no substituents (viz. unsubstituted alkyl groups) but also alkyl groups having one or more substituents (viz. substituted alkyl groups).

<Actinic-ray- or Radiation-sensitive Resin Composition>

The actinic-ray- or radiation-sensitive resin composition of the present invention comprises (A) a resin which is configured to increase its rate of dissolution in an alkali developer when acted on by an acid (hereinafter also referred to as "an acid-decomposable resin"), (B) a compound (PA) containing a functional group with proton acceptor properties and being configured to decompose when exposed to actinic rays or radiation to thereby produce a compound exhibiting lower or no proton acceptor properties or a compound exhibiting acid properties instead of the proton acceptor properties (hereinafter also referred to as "a compound (PA)"), and (C) a compound which is configured to generate an acid when exposed to actinic rays or radiation (hereinafter also referred to as "an acid generator").

This composition may further comprise at least any of (D) a basic compound, (E) a low-molecular compound containing a group that is cleaved when acted on by an acid, (F) a hydrophobic resin, (G) a surfactant, (H) a solvent and (I) other components. These components will be sequentially described below.

(A) Acid-decomposable Resin

The composition of the present invention contains an acid-decomposable resin. At least one of acid-decomposable resins contains a repeating unit with any of partial structures of general formula (I) below (the repeating unit will hereinafter also be referred to as a repeating unit (R)). Note that the repeating unit (R) may contain two or more partial structures of general formula (I) below.

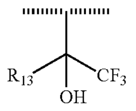

(I)

In the formula, $R_{13}$ represents a hydrogen atom, an alkyl group or a cycloalkyl group.

The alkyl group represented by $R_{13}$ may be in the form of a linear or branched chain. This alkyl group preferably has 1 to 10 carbon atoms, more preferably 1 to 4 carbon atoms. This alkyl group is preferably a methyl group or an ethyl group, more preferably a methyl group.

The cycloalkyl group represented by $R_{13}$ may be monocyclic or polycyclic. This cycloalkyl group preferably has 3 to 20 carbon atoms, more preferably 5 to 8 carbon atoms.

A substituent may be introduced in the alkyl group or cycloalkyl group represented by $R_{13}$. As such a substituent, there can be mentioned, for example, a halogen atom, such as a fluorine atom, a chlorine atom or a bromine atom; a mercapto group; a hydroxyl group; an alkoxy group, such as a methoxy group, an ethoxy group, an isopropoxy group, a t-butoxy or a benzyloxy group; an alkyl group, such as a methyl group, an ethyl group, a propyl group, an isopropyl group, a butyl group, a sec-butyl group, a t-butyl group, a pentyl group or a hexyl group; a cycloalkyl group, such as a cyclopropyl group, a cyclobutyl group, a cyclopentyl group, a cyclohexyl group or a cycloheptyl group; a cyano group; a nitro group; a sulfonyl group; a silyl group; an ester group; an acyl group; a vinyl group; or an aryl group. The substituent is preferably a halogen atom, most preferably a fluorine atom.

It is further preferred for the alkyl group represented by $R_{13}$ to have 1 to 4 carbon atoms and to be substituted with one or more fluorine atoms. This alkyl group is preferably a trifluoromethyl group or a tetrafluoroethyl group, most preferably a trifluoromethyl group.

The repeating unit (R) is preferably represented by at least one selected from the group consisting of general formulae (I-1) to (I-3) below. More preferably, the repeating unit (R) is represented by general formula (I-1) or (I-3). When such structures are employed, for example, the swelling at the time of alkali development can be suppressed, so that the LWR and/or pattern collapse performance can be enhanced.

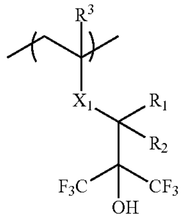

(I-1)

-continued (I-2)

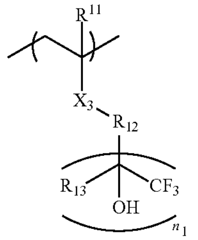

(I-3)

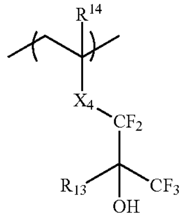

In the formulae, each of $R^3$, $R^{11}$ and $R^{14}$ independently represents a hydrogen atom, an alkyl group or a halogen atom.

Each of $X_1$, $X_3$ and $X_4$ independently represents any one of —C(=O)—, —C(=O)—O—, —C(=O)—O—$R_6$—, —O—, —C(=O)—$R_6$—C(=O)— and —C(=O)—O—$R_6$—C(=O)—O—, in which $R_6$ represents an alkylene group or a cycloalkylene group.

$R_1$ represents a hydrogen atom, an alkyl group, a cycloalkyl group or a halogen atom.

$R_2$ represents a hydrogen atom, an alkyl group or a cycloalkyl group.

$R_1$ and $R_2$ may be bonded to each other to thereby form a ring.

$R_{12}$ represents a cycloalkylene group or a cycloalkanetriyl group.

$R_{13}$ is as defined above in connection with general formula (I).

In general formula (I-2), $R_{12}$ and $R_{13}$ may be bonded to each other to thereby form a ring.

$n_1$ is 1 or 2.

Each of the alkyl groups represented by $R^3$, $R^{11}$ and $R^{14}$ preferably has 1 to 5 carbon atoms. A methyl group is especially preferred. Substituents may further be introduced in the alkyl groups represented by $R^3$, $R^{11}$ and $R^{14}$. As such substituents, there can be mentioned, for example, a halogen atom, a hydroxyl group and an alkoxy group, such as a methoxy group, an ethoxy group, an isopropoxy group, a t-butoxy or a benzyloxy group. It is preferred for each of $R^3$, $R^{11}$ and $R^{14}$ to be a hydrogen atom or an alkyl group. More preferably, each of $R^3$, $R^{11}$ and $R^{14}$ is a hydrogen atom, a methyl group, a hydroxymethyl group or a trifluoromethyl group.

Each of $X_1$, $X_3$ and $X_4$ is preferably —C(=O)—, —C(=O)—O—, —C(=O)—O—$R_6$— or —C(=O)—O—$R_6$—C(=O)—O—, more preferably —C(=O)—O— or —C(=O)—O—$R_6$—.

The alkylene group represented by $R_6$ may be in the form of a linear or branched chain. This alkylene group preferably has 1 to 10 carbon atoms, more preferably 1 to 5 carbon atoms.

The cycloalkylene group represented by $R_6$ may be monocyclic or polycyclic. This cycloalkylene group preferably has 3 to 10 carbon atoms, more preferably 5 or 6 carbon atoms.

A substituent may be introduced in the alkylene group or cycloalkylene group represented by $R_6$. As such a substituent, there can be mentioned, for example, a halogen atom, such as a fluorine atom, a chlorine atom or a bromine atom; a mercapto group; a hydroxyl group; an alkoxy group, such as a methoxy group, an ethoxy group, an isopropoxy group, a t-butoxy or a benzyloxy group; an alkyl group, such as a methyl group, an ethyl group, a propyl group, an isopropyl group, a butyl group, a sec-butyl group, a t-butyl group, a pentyl group or a hexyl group; a cycloalkyl group, such as a cyclopropyl group, a cyclobutyl group, a cyclopentyl group, a cyclohexyl group or a cycloheptyl group; a cyano group; a nitro group; a sulfonyl group; a silyl group; an ester group; an acyl group; a vinyl group; or an aryl group.

Each of the alkyl groups represented by $R_1$ and $R_2$ may be in the form of a linear or branched chain. Each of these alkyl groups preferably has 1 to 20 carbon atoms, more preferably 1 to 5 carbon atoms.

Each of the cycloalkyl groups represented by $R_1$ and $R_2$ may be monocyclic or polycyclic. Each of these cycloalkyl groups preferably has 3 to 20 carbon atoms, more preferably 5 to 8 carbon atoms.

As the halogen atom represented by $R_1$, there can be mentioned, for example, a fluorine atom, a chlorine atom, a bromine atom or an iodine atom. Preferably, the halogen atom represented by $R_1$ is a fluorine atom.

When $R_1$ and $R_2$ are bonded to each other to thereby form a ring, the group of the formula —($R_1$—$R_2$)— is a bivalent organic group, which preferably has 2 to 20 carbon atoms, more preferably 5 to 10 carbon atoms. This ring may be monocyclic or polycyclic.

A substituent may be introduced in the alkyl groups and cycloalkyl groups represented by $R_1$ and $R_2$ and the ring formed by the mutual bonding of $R_1$ and $R_2$. As such substituents, there can be mentioned, for example, those set forth above in connection with $R_6$.

The cycloalkylene group represented by $R_{12}$ may be monocyclic or polycyclic. This cycloalkylene group preferably has 4 to 12 carbon atoms, more preferably 5 or 10 carbon atoms.

The cycloalkanetriyl group represented by $R_{12}$ may be monocyclic or polycyclic. This cycloalkanetriyl group preferably has 4 to 12 carbon atoms, more preferably 5 or 10 carbon atoms.

The ring formed by the mutual bonding of $R_{12}$ and $R_{13}$ preferably has 3 to 12 carbon atoms, more preferably 5 or 10 carbon atoms.

A substituent may be introduced in the cycloalkylene group and cycloalkanetriyl group represented by $R_{12}$ and the ring formed by the mutual bonding of $R_{12}$ and $R_{13}$. As such substituents, there can be mentioned, for example, those set forth above in connection with $R_6$. As the substituent, a halogen atom is preferred, and a fluorine atom is especially preferred.

The repeating unit (R) is also preferable to be represented by general formula (I-2) in which $n_1$ is 2. When such a structure is employed, for example, the swelling at the time of alkali development can be suppressed, so that the LWR and/or pattern collapse performance can be enhanced.

Specific examples of the repeating units (R) of general formula (I-1) are given below. In the formulae, $R^3$ has the same meaning as mentioned above.

-continued
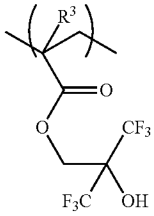
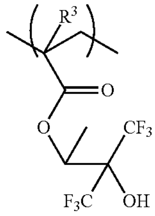
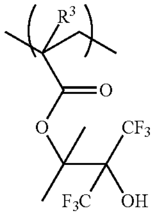
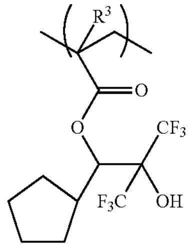
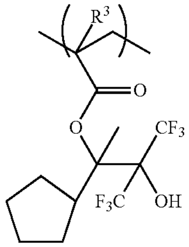
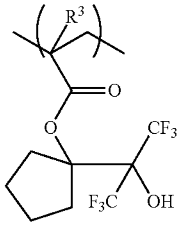
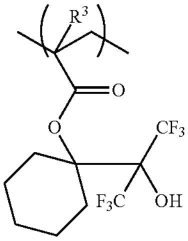
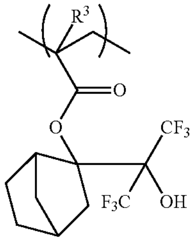
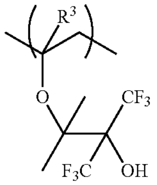
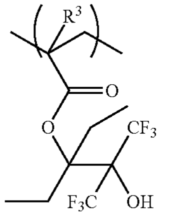
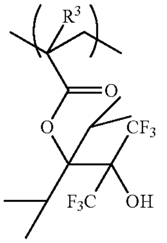
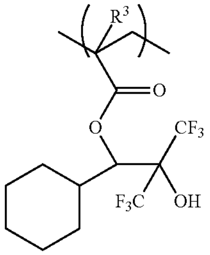
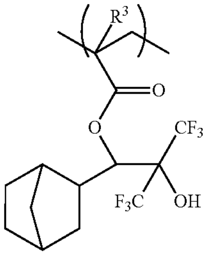
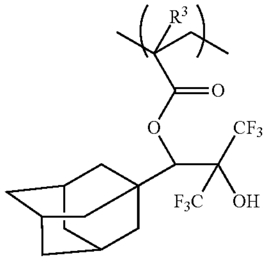
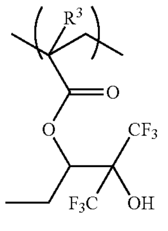
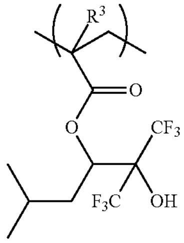
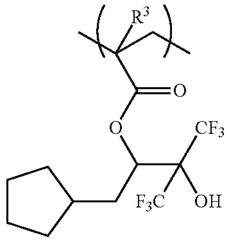
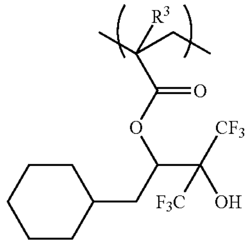
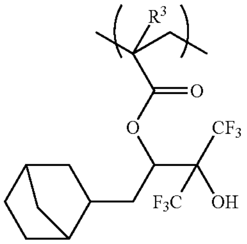
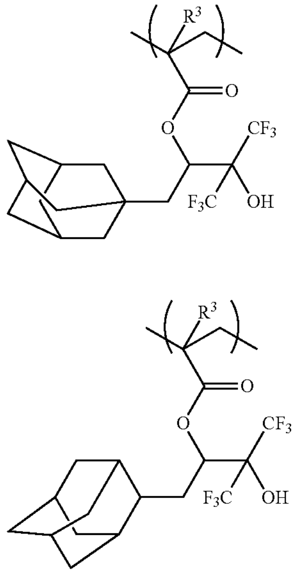
Specific examples of the repeating units (R) of general formula (I-2) are given below. In the formulae, $R^{11}$ has the same meaning as mentioned above.
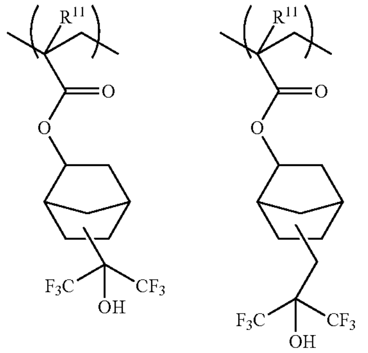

-continued

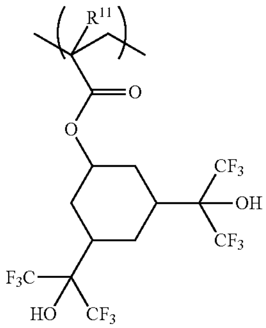

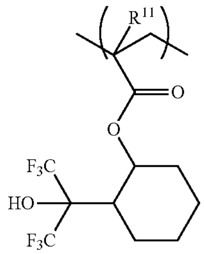

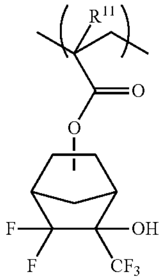

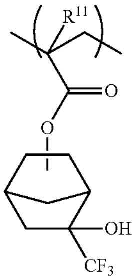

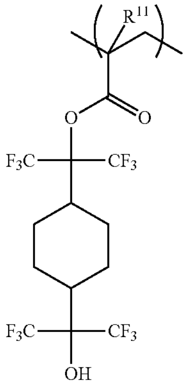

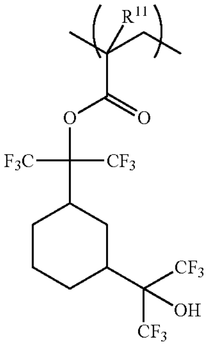

Specific examples of the repeating units (R) of general formula (I-3) are given below. In the formulae, $R^{14}$ has the same meaning as mentioned above.

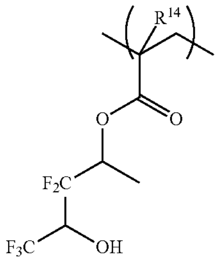

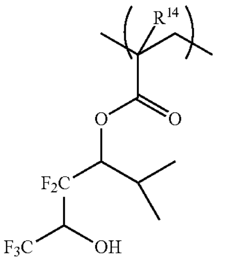

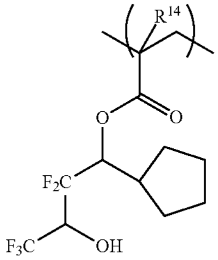

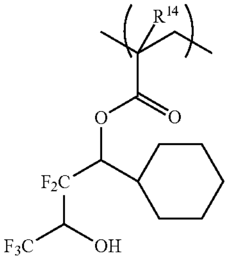

-continued

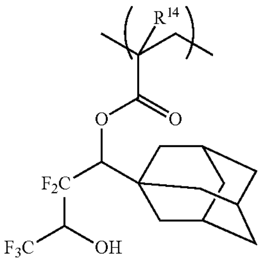

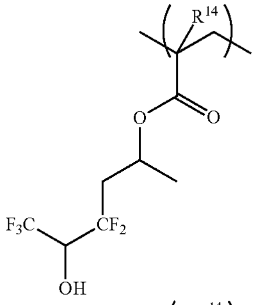

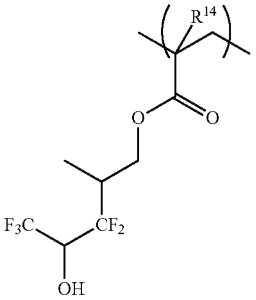

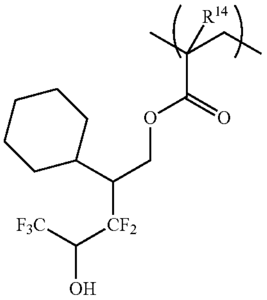

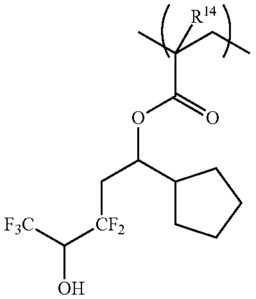

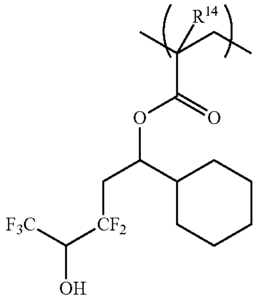

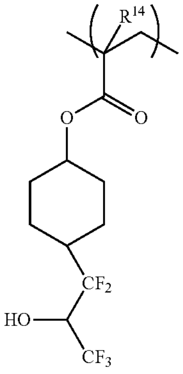

The content of repeating unit (R) based on all the repeating units of the resin is preferably in the range of 0.5 to 25 mol %, more preferably 1 to 20 mol % and further more preferably 1.5 to 15 mol %.

The acid-decomposable resin preferably contains a repeating unit with any partial structures represented by general formula (II) below.

$$-\left(R_0-Z\right)_n L \qquad \text{(II)}$$

In the formula, $R_0$ or each of $R_0$'s when n≧2 independently represents an alkylene group, a cycloalkylene group, or a combination thereof.

Z or each of Z's when n≧2 independently represents an ether bond, an ester bond, an amido bond, a urethane bond, or a urea bond.

L represents a substituent with a lactone structure.

n is an integer of 1 to 5.

Detailed explanations on general formula (II) will be given below.

The group represented by $R_0$ is not particularly limited as far as the group is an alkylene group or a cycloalkylene group. Preferred alkylene group is the one having 1 to 10 carbon atoms, and more preferred is the one having 1 to 5 carbon atoms. As such, a methylene group, an ethylene group, and a propylene group can be exemplified. Preferred cycloalkylene group is the one having 4 to 20 carbon atoms. As such, a cyclohexylene group, a cyclopentylene group, a norbornylene group, and an adamanthylene group can be exemplified. The group represented by $R_0$ is preferably an alkylene group.

Z is preferably an ether bond, an ester bond, an amido bond, or a urethane bond, and more preferably an ether bond or an ester bond.

Preferably, n is 1.

As for the group represented by L, any groups with a lactone structure can be employed. However, groups with a 5 to 7-membered ring lactone structure are preferred, and those resulting from condensation of lactone structures of a 5 to 7-membered ring with other cyclic structures effected in a fashion to form a bicyclo structure or spiro structure are especially preferred. More preferably, the alicyclic hydrocarbon based acid-decomposable resin has a repeating unit having a lactone structure represented by any of general formulae (LC1-1) to (LC1-17) below. The groups with lactone structures may be directly bonded to the principal chain of the resin. Preferred lactone structures are those of the formulae (LC1-1), (LC1-4), (LC1-5), (LC1-6), (LC1-13), (LC1-14), and (LC1-17).

LC1-1

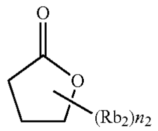

LC1-2

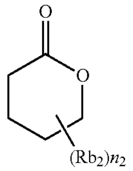

LC1-3

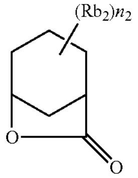

LC1-4

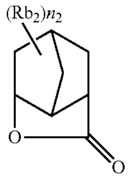

-continued

LC1-5

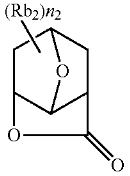

LC1-6

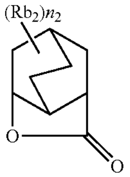

LC1-7

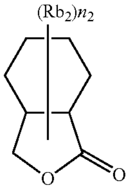

LC1-8

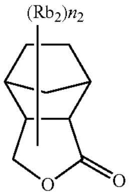

LC1-9

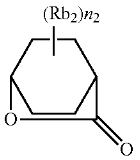

LC1-10

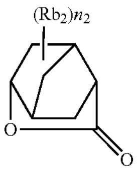

LC1-11

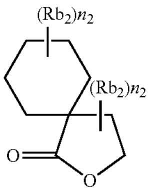

LC1-12

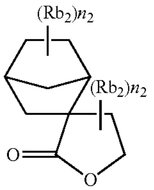

-continued

LC1-13

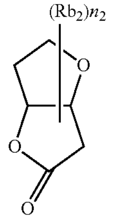

LC1-14

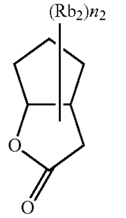

LC1-15

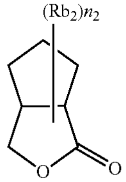

LC1-16

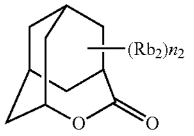

LC1-17

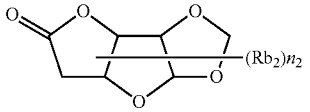

The presence of a substituent ($Rb_2$) on the portion of the lactone structure is optional. As preferred substituents ($Rb_2$), there can be mentioned an alkyl group having 1 to 8 carbon atoms, a cycloalkyl group having 3 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group and the like. In the formulae, $n_2$ is an integer of 0 to 4. When $n_2$ is an integer of 2 or greater, the plurality of present substituents ($Rb_2$) may be identical to or different from each other. Further, the plurality of present substituents ($Rb_2$) may be bonded to each other to thereby form a ring.

As preferred lactone repeating unit containing a structure represented by general formula (II), the one represented by general formula (II-1) below can be exemplified.

(II-1)

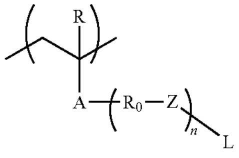

In the formula,

R represents a hydrogen atom, an alkyl group or a halogen atom.

A represents —COO— or —CONH—.

$R_0$ or each of $R_0$'s when n≧2 independently represents an alkylene group, a cycloalkylene group, or a combination thereof.

Z or each of Z's when n≧2 independently represents an ether bond, an ester bond, an amido bond, a urethane bond, or a urea bond.

L represents a substituent with a lactone structure.

n is an integer of 1 to 5.

Detailed explanations on general formula (II-1) will be given below.

As preferred example of the group represented by R, those explained with regards $R^3$, $R^{11}$, and $R^{14}$ in general formulae (I-1) to (I-3).

Preferred examples and ranges of $R_0$, L, Z, and n is the same as above.

As more preferred lactone repeating unit, the one represented by general formula (II-2) below can be exemplified.

(II-2)

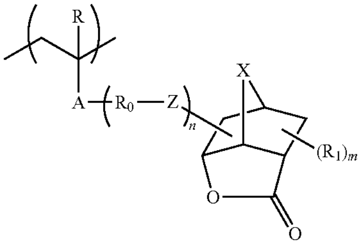

In the general formula (II-2), each of R, A, $R_0$, Z and n has the same meaning as in general formula (II-1).

$R_1$, when m≧2 each of $R_1$'s independently, represents an optionally substituted alkyl group, an optionally substituted cycloalkyl group, an optionally substituted ester group, or a cyano group. When m≧2, two or more $R_1$'s may be bonded to each other to thereby form a ring.

X represents an alkylene group, an oxygen atom, or a sulfur atom.

m is the number of substituents and represents an integer of 0 to 5.

More detailed explanations on general formula (II-2) will be given below.

Preferred examples and ranges of R, $R_0$, Z, and n is the same as in general formula (II-1).

The alkyl group represented by $R_1$ is preferably an alkyl group having 1 to 4 carbon atoms, more preferably a methyl group or an ethyl group, and most preferably a methyl group. As the cycloalkyl group, there can be mentioned, for example, a cyclopropyl group, a cyclobutyl group, a cyclopentyl group or a cyclohexyl group. As the ester group, there can be mentioned, for example, a methoxycarbonyl group, an ethoxycarbonyl group, an n-butoxycarbonyl group or a t-butoxycarbonyl group. One or more substituents may be introduced thereto. As such substituents, there can be mentioned, for example, a hydroxyl group; an alkoxy group such as a methoxy group or an ethoxy group; a cyano group; and a halogen atom such as a fluorine atom.

More preferably, $R_1$ is a methyl group or a cyano group, further more preferably a cyano group.

When m is 1 or greater, preferably, at least one $R_1$ is bonded to the α-position or β-position of the lactone with respect to the carbonyl group. Most preferably, the bonding is effected to the α-position.

As the alkylene group represented by X, there can be mentioned a methylene group, an ethylene group or the like. X is preferably an oxygen atom or a methylene group, more preferably a methylene group.

Specific examples of the repeating units with the partial structures of general formula (II) are given below. In the given specific examples, R represents a hydrogen atom, an optionally substituted alkyl group or a halogen atom, preferably a hydrogen atom, a methyl group, a hydroxymethyl group or an acetoxymethyl group.

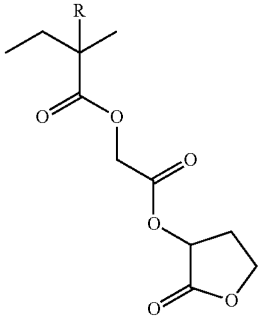

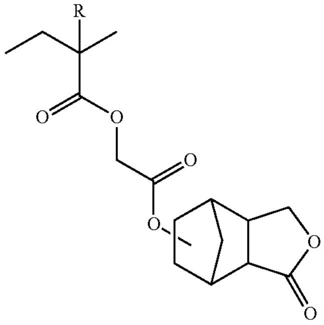

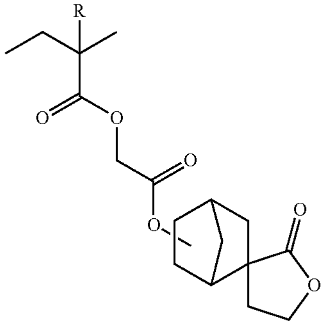

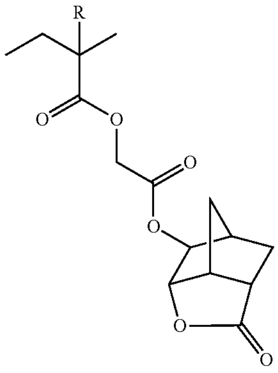

-continued

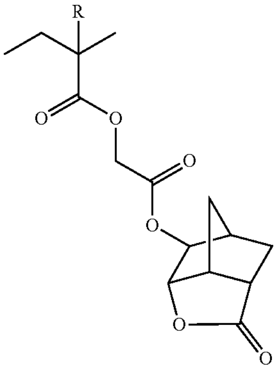

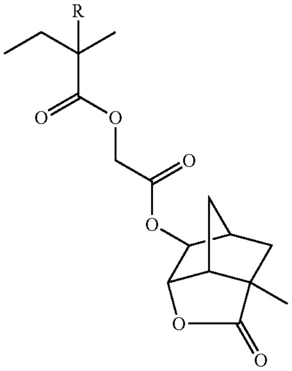

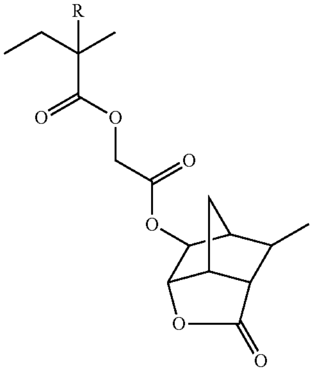

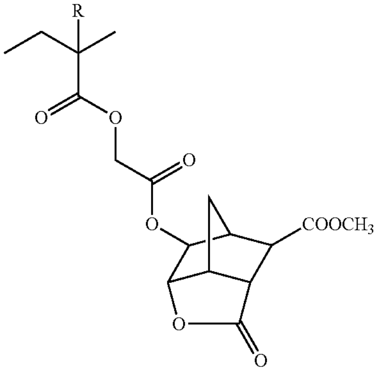

-continued
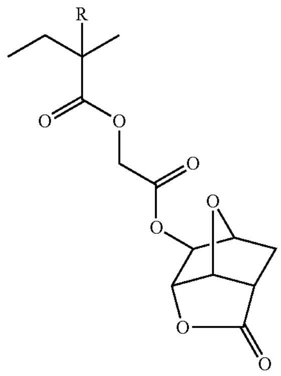
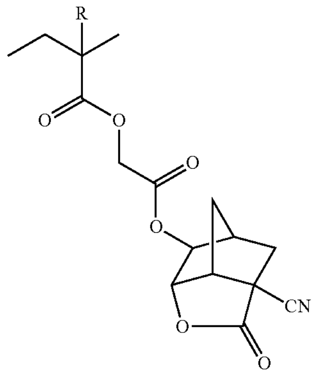
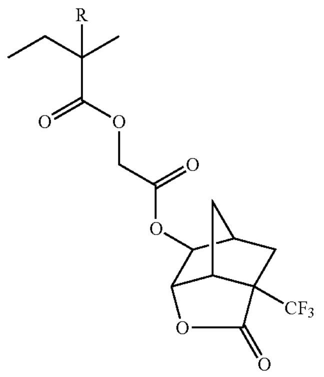
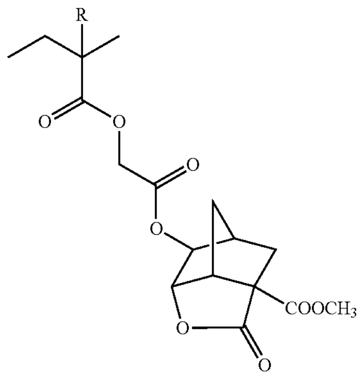
-continued
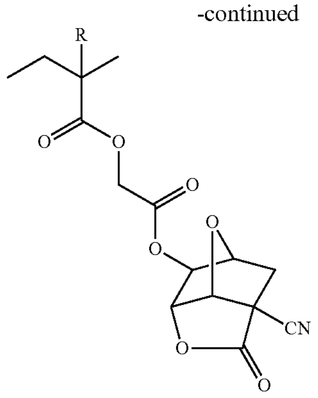
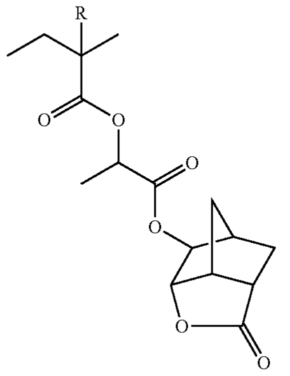
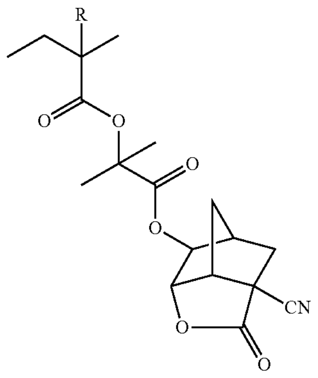
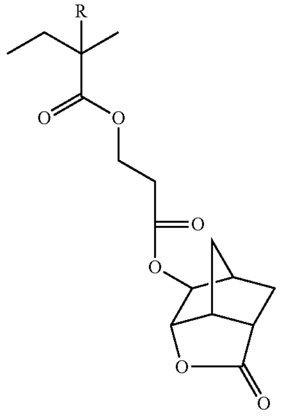

-continued
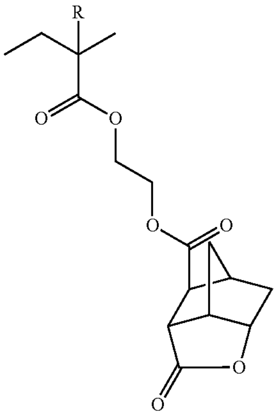
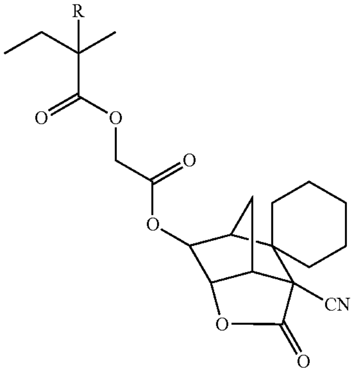
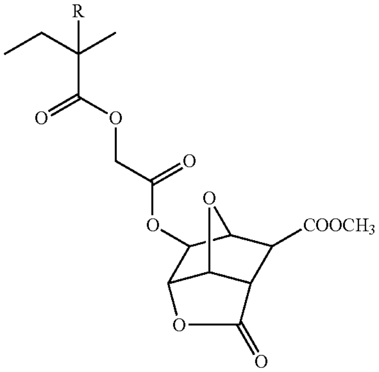
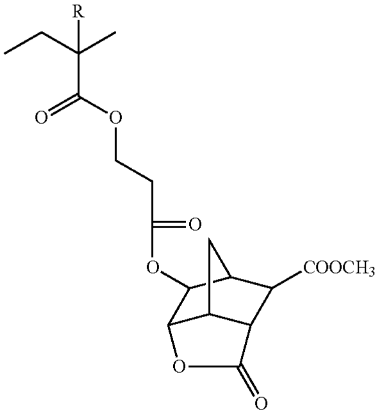
-continued
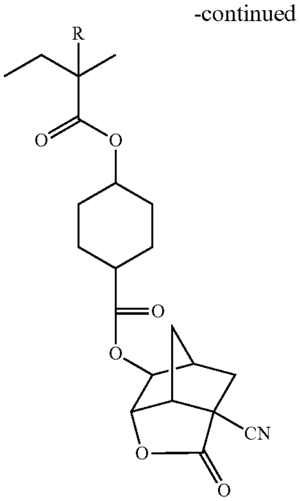
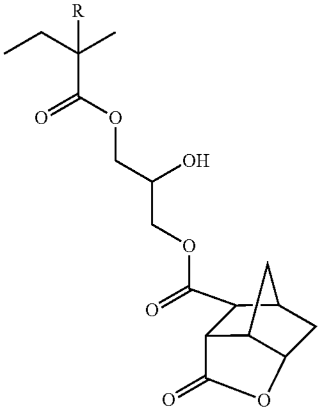
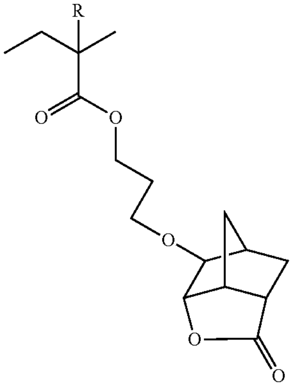
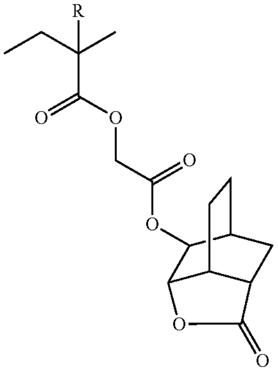
Further, specific examples of the repeating units of general formula (II-1) are given below.

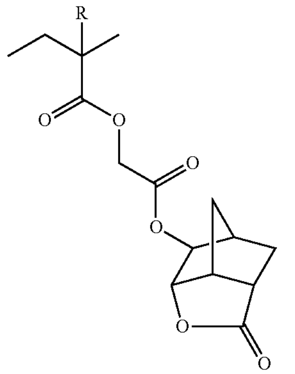

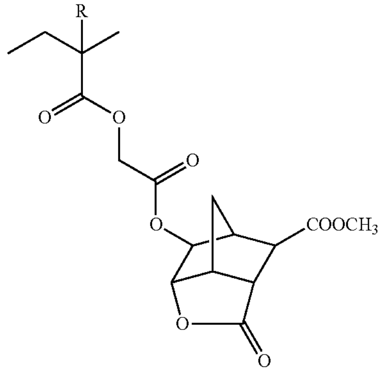

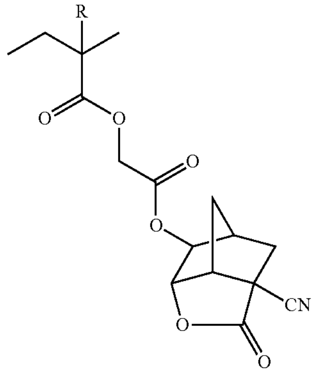

The repeating unit containing a lactone group is generally present in the form of optical isomers. Any of the optical isomers may be used.

The acid-decomposable resin may contain other lactone structures than the lactone structures of general formula (II). For example, structures resulting from substitution of the hydrogen atom of the carboxylic acid group of (meth)acrylic acid with any of the lactone structures of above formulae (LC1-1) to (LC1-17) may be contained.

The content of repeating units with the partial structures of general formula (II), based on all the repeating units of the resin, is preferably in the range of 20 to 60 mol %, more preferably 30 to 50 mol %.

The acid-decomposable resin may further contain any of the following repeating units.

<Repeating Unit Containing an Acid-decomposable Group>

The acid-decomposable group preferably has a structure in which an alkali-soluble group is protected by a group which is removable by degradation upon the action of acid.

The alkali-soluble group is not particularly limited as far as being a group which is configured to decompose in an alkali developer to be an ion. As preferred alkali-soluble group, there can be mentioned a carboxyl group, a fluoroalcohol group (especially a hexafluoroisopropanol group) and a sulfonate group.

The acid-decomposable group is preferably a group as obtained by substituting the hydrogen atom of any of these alkali-soluble groups with an acid eliminable group.

As the acid eliminable group, there can be mentioned, for example, $—C(R_{36})(R_{37})(R_{38})$, $—C(R_{36})(R_{37})(OR_{39})$, $—C(R_{01})(R_{02})(OR_{39})$ or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded to each other to thereby form a ring.

Each of $R_{01}$ to $R_{02}$ independently represents a hydrogen atom, an alkyl group, a cycloalkyl group, an aryl group, an aralkyl group or an alkenyl group.

Preferably, the acid-decomposable group is a cumyl ester group, an enol ester group, an acetal ester group, a tertiary alkyl ester group or the like. A tertiary alkyl ester group is more preferred.

The repeating unit with an acid-decomposable group is preferably any of those of the following general formula (AI).

(AI)

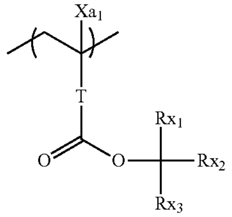

In general formula (AI), $Xa_1$ represents a hydrogen atom, a methyl group, or a group represented by $—CH_2—R_9$. $R_9$ represents a monovalent organic group. $R_9$ preferably represents an alkyl or an acyl group having 5 or less carbon atoms, more preferably an alkyl group having 3 or less carbon atoms, and further more preferably a methyl group. $Xa_1$ preferably represents a hydrogen atom, a methyl group, a trifluoromethyl group or a hydroxymethyl group.

T represents a single bond or a bivalent connecting group.

Each of $Rx_1$ to $Rx_3$ independently represents a linear or branched alkyl group or a mono- or polycycloalkyl group.

At least two of $Rx_1$ to $Rx_3$ may be bonded to each other to thereby form a mono- or polycycloalkyl group.

As the bivalent connecting group represented by T, there can be mentioned, for example, an alkylene group, a group of the formula —(COO-Rt)— or a group of the formula —(O-Rt)—. In the formulae, Rt represents an alkylene group or a cycloalkylene group.

T is preferably a single bond or a group of the formula —(COO-Rt)—. Rt is preferably an alkylene group having 1 to 5 carbon atoms, more preferably a $—CH_2—$ group or $—(CH_2)_3—$ group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a monocycloalkyl group, such as a cyclopentyl group or a cyclohexyl group, or a polycycloalkyl group, such as a norbornyl group, a tetracyclodecanyl group, a tetracyclododecanyl group or an adamantyl group.

In an especially preferred mode, $Rx_1$ is a methyl group or an ethyl group, and $Rx_2$ and $Rx_3$ are bonded to each other to thereby form any of the above-mentioned cycloalkyl groups.

One or more substituents may further be introduced in each of the groups above. As the substituents, there can be mentioned, for example, an alkyl group (preferably having 1 to 4 carbon atoms), a halogen atom, a hydroxy group, an alkoxy group (preferably having 1 to 4 carbon atoms), a carboxyl group, an alkoxycarbonyl group (preferably having 2 to 6 carbon atoms). Preferably, each of the substituents has 8 or less carbon atoms.

Specific examples of the preferred repeating units containing an acid-decomposable group will be shown below, which however in no way limit the scope of the present invention.

In the specific examples, Rx and Xa1 each represents a hydrogen atom, $CH_3$, $CF_3$ or $CH_2OH$. Each of Rxa and Rxb represents an alkyl group having 1 to 4 carbon atoms. Z or each of Zs independently represents a substituent containing one or more polar groups. p represents 0 or a positive integer.

1

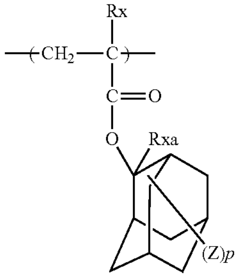

2

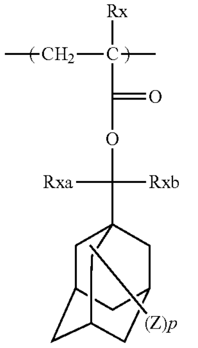

3

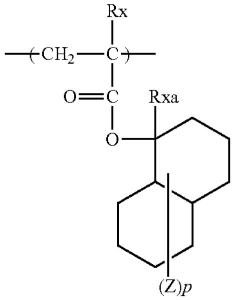

-continued

4

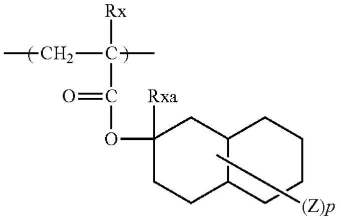

5

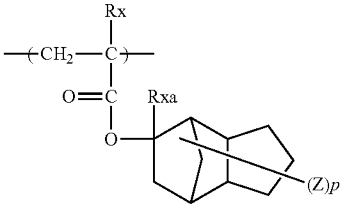

6

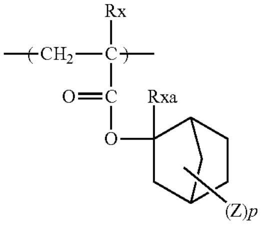

7

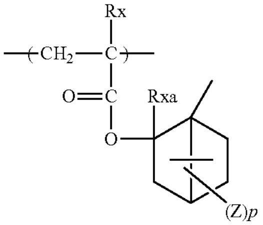

8

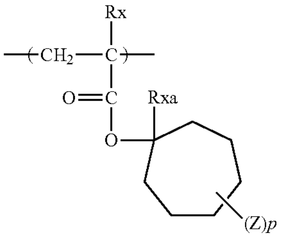

9

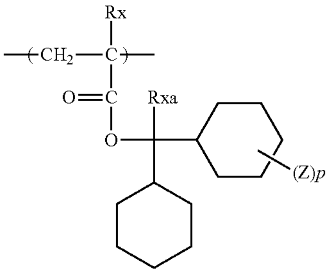

10

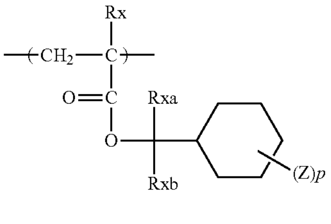

-continued
11
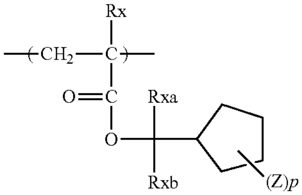
12
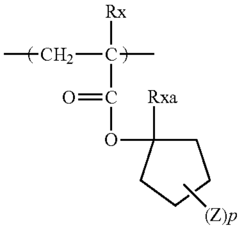
13
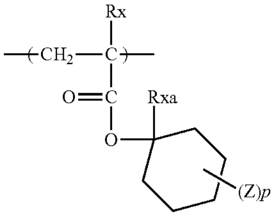
14
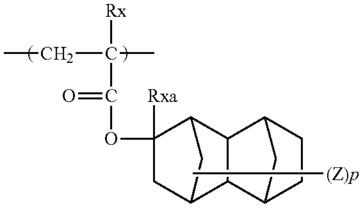
15
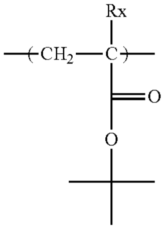
16
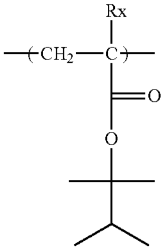
-continued
17
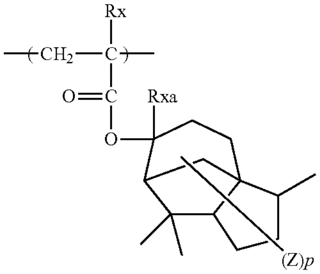
18
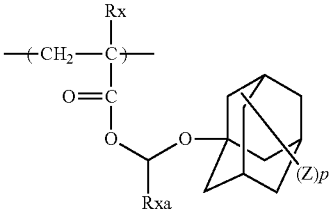
19
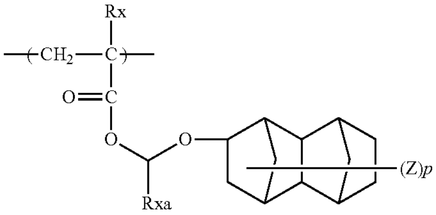
20
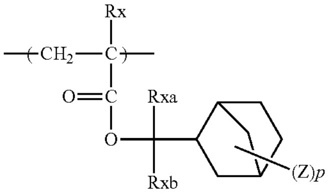
21
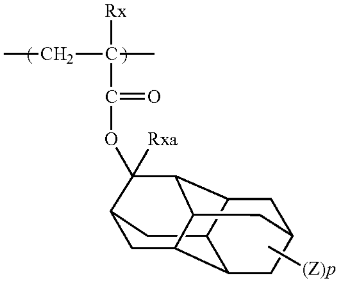
22
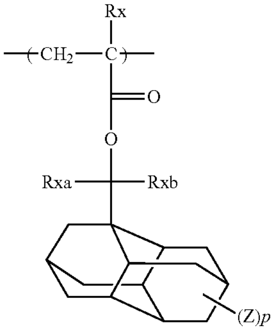

-continued
23
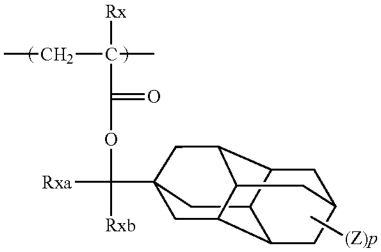
24
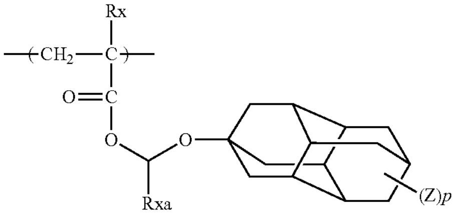
25
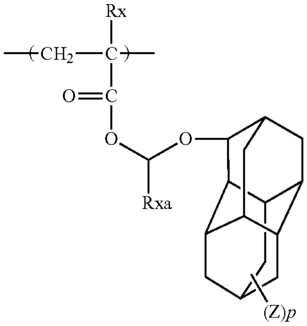
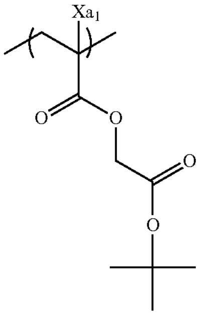
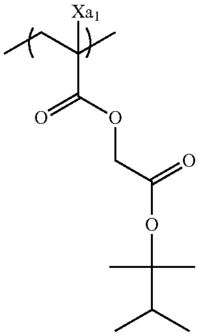
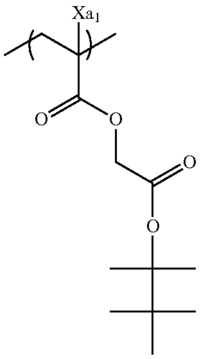
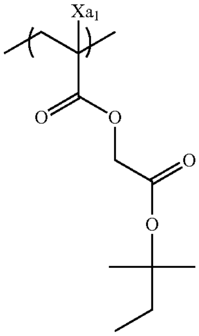
-continued
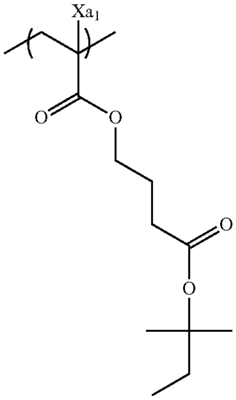
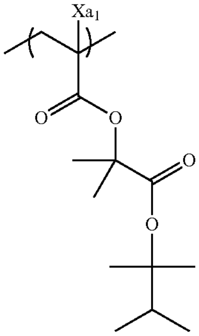
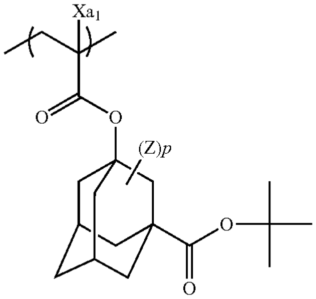
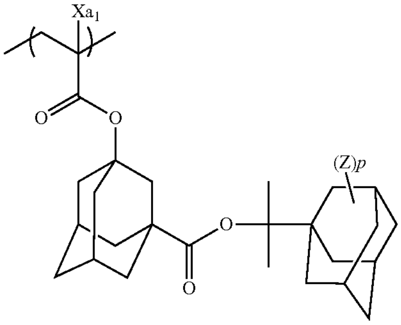
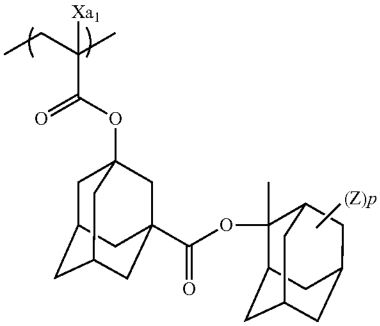
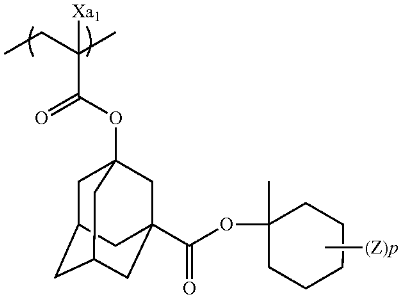

-continued
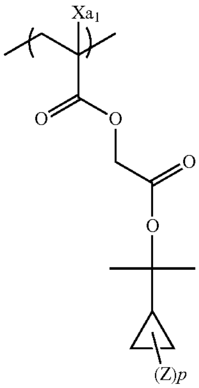
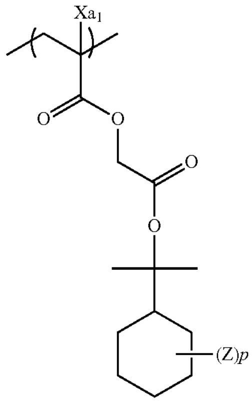
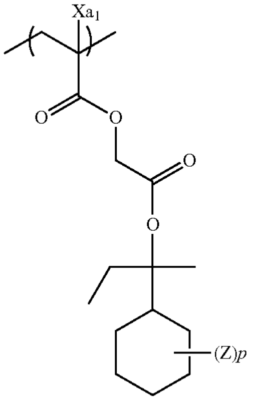
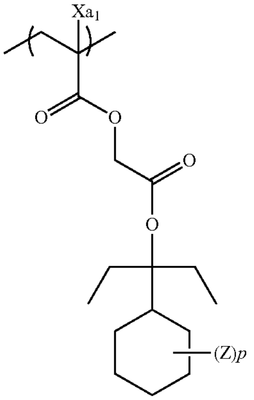
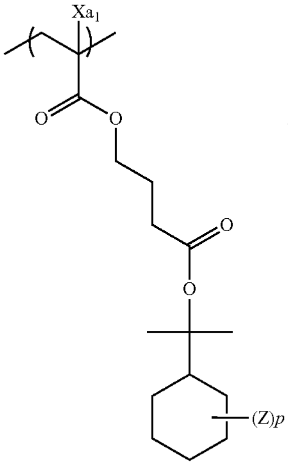
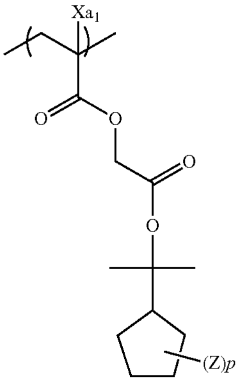
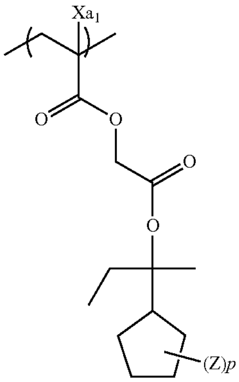
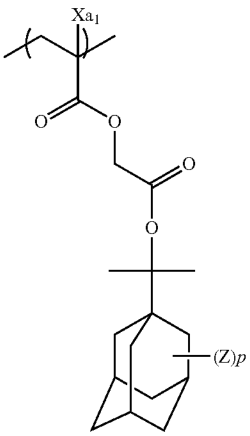
-continued
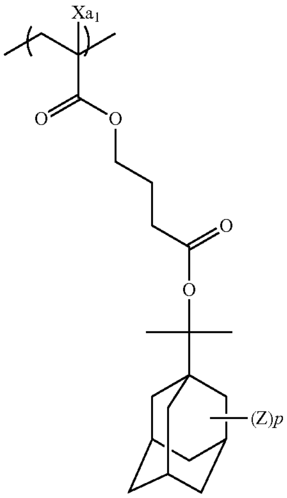
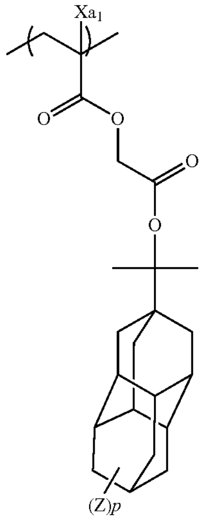
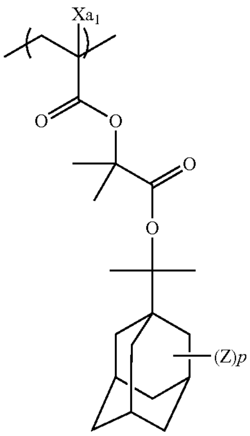
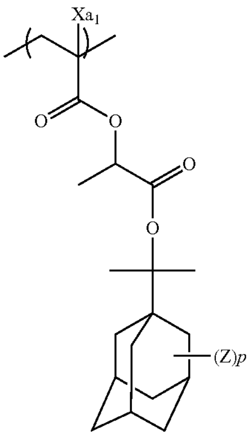
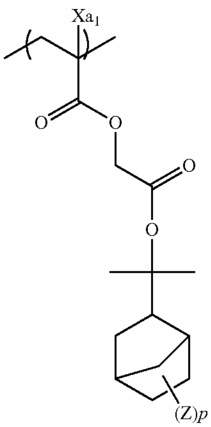
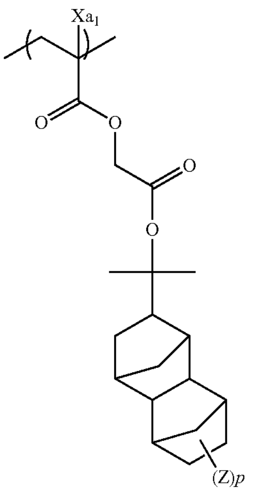

-continued
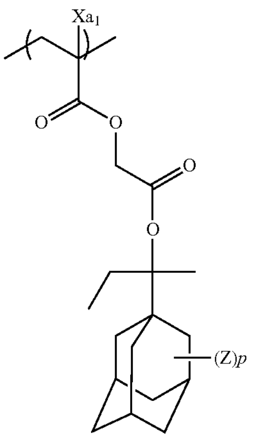
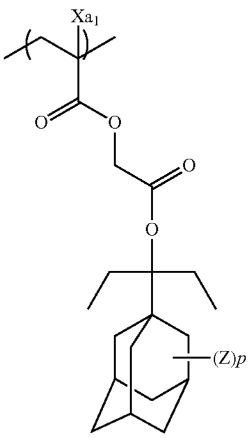
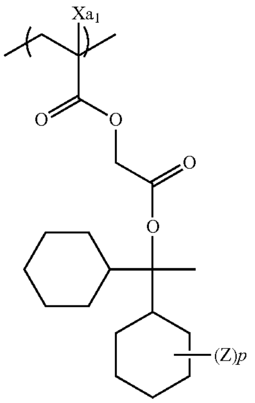
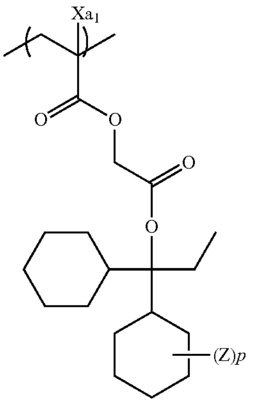
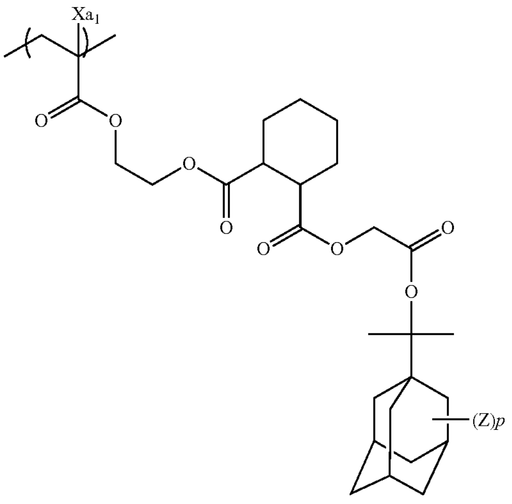
-continued
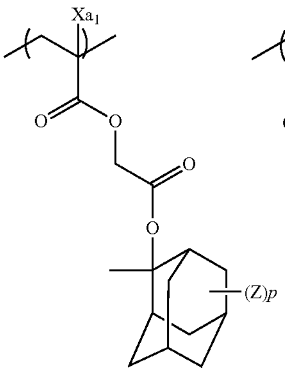
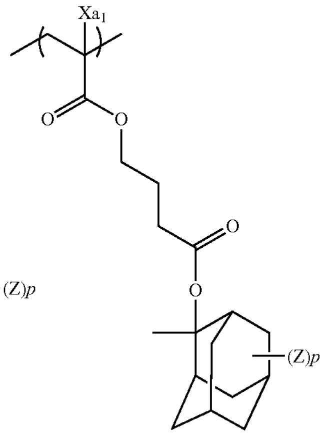
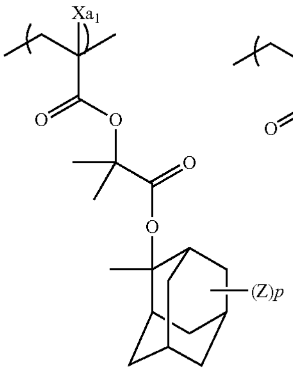
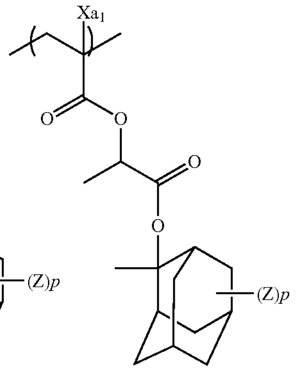
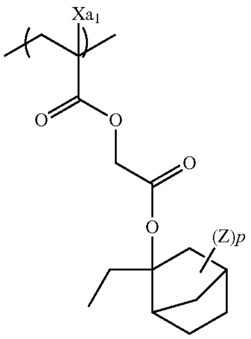
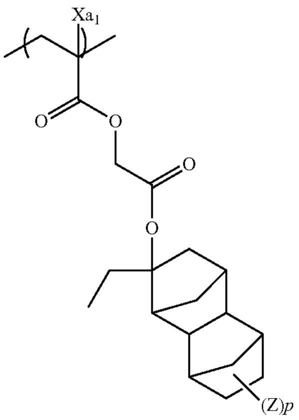

-continued

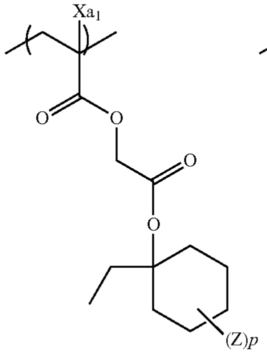

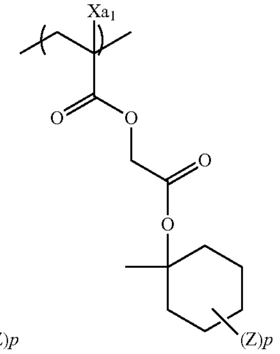

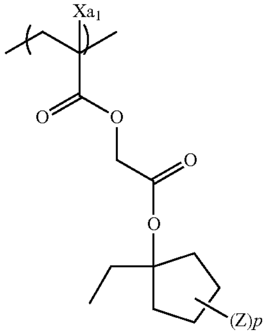

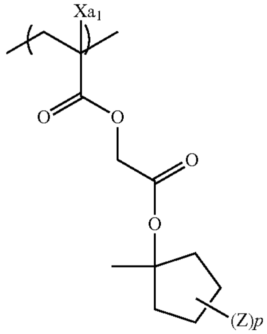

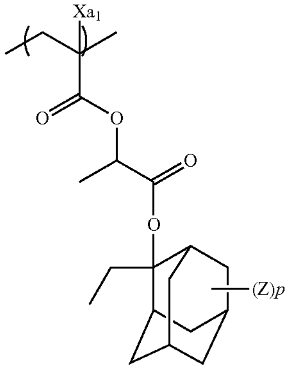

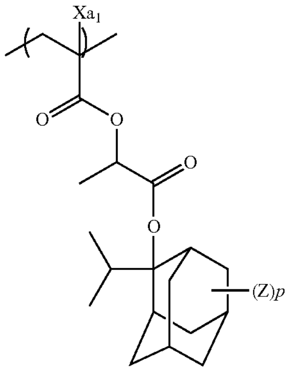

It is more preferred for the acid-decomposable resin to contain, as the repeating units of general formula (AI), any of the repeating units of general formula (I) below and/or any of the repeating units of general formula (II) below.

(1)

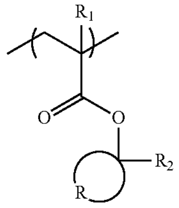

(2)

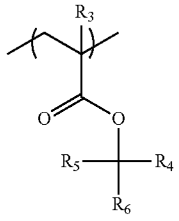

In general formulae (I) and (II), each of $R_1$ and $R_3$ independently represents a hydrogen atom, a methyl group or any of the groups of the formula —$CH_2$—$R_9$. $R_9$ represents a monovalent organic group.

Each of $R_2$, $R_4$, $R_5$ and $R_6$ independently represents an alkyl group or a cycloalkyl group.

R represents an atomic group required for forming an alicyclic structure in cooperation with a carbon atom.

$R_1$ preferably represents a hydrogen atom, a methyl group, a trifluoromethyl group or a hydroxymethyl group.

The alkyl group represented by $R_2$ may be linear or branched, and one or more substituents may be introduced therein.

The cycloalkyl group represented by $R_2$ may be monocyclic or polycyclic, and a substituent may be introduced therein.

$R_2$ preferably represents an alkyl group, more preferably an alkyl group having 1 to 10 carbon atoms, further more preferably 1 to 5 carbon atoms. As examples thereof, there can be mentioned a methyl group and an ethyl group.

R represents an atomic group required for forming an alicyclic structure in cooperation with a carbon atom. The alicyclic structure formed by R is preferably an alicyclic structure of a single ring, and preferably has 3 to 7 carbon atoms, more preferably 5 or 6 carbon atoms.

$R_3$ preferably represents a hydrogen atom or a methyl group, more preferably a methyl group.

Each of the alkyl groups represented by $R_4$, $R_5$ and $R_6$ may be linear or branched, and one or more substituents may be introduced therein. The alkyl groups are preferably those each having 1 to 4 carbon atoms, such as a methyl group, an ethyl group, an n-propyl group, an isopropyl group, an n-butyl group, an isobutyl group and a t-butyl group.

Each of the cycloalkyl groups represented by $R_4$, $R_5$ and $R_6$ may be monocyclic or polycyclic, and a substituent may be introduced therein. The cycloalkyl groups are preferably a monocycloalkyl group, such as a cyclopentyl group or a cyclohexyl group, and a polycycloalkyl group, such as a norbornyl group, a tetracyclodecanyl group, a tetracyclododecanyl group or an adamantyl group.

The repeating units of general formula (2) are preferably those of general formula (2-1) below.

(2-1)

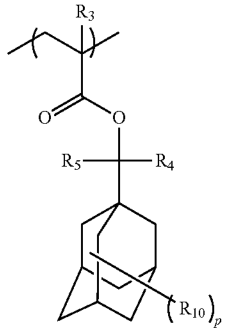

In general formula (2-1), $R_3$ to $R_5$ have the same meaning as in general formula (2).

$R_{10}$ represents a substituent containing a polar group. When a plurality of $R_{10}$s exist, they may be identical to or different from each other. As the substituent containing a polar group, there can be mentioned, for example, a linear or branched alkyl group, or cycloalkyl group, in which a hydroxyl group, a cyano group, an amino group, an alkylamido group or a sulfonamido group is introduced. An alkyl group in which a hydroxyl group is introduced is preferred. A branched alkyl group in which a hydroxyl group is introduced is more preferred.

In the formula, p is an integer of 0 to 15, preferably in the range of 0 to 2, and more preferably 0 or 1.

The content of repeating unit containing an acid-decomposable group based on all the repeating units of the resin is preferably in the range of 20 to 70 mol %, and more preferably 30 to 50 mol %.

<Repeating Unit Containing a Hydroxyl Group or a Cyano Group>

Acid-decomposable resin preferably contains a repeating unit containing a hydroxyl group or a cyano group. Introducing this repeating unit enhances the adherence to substrates and the affinity to developer.

A repeating unit containing a hydroxyl group or a cyano group is preferably a repeating unit having an alicyclic hydrocarbon structure substituted with a hydroxy group or a cyano group. In the alicyclic hydrocarbon structure substituted with a hydroxy group or a cyano group, the alicyclic hydrocarbon structure preferably consists of an adamantyl group, a diamantyl group or a norbornane group. As preferred alicyclic hydrocarbon structures substituted with a hydroxy group or a cyano group, a monohydroxyadamantyl group, a dihydroxyadamantyl group, a monohydroxydiadamantyl group, dihydroxydiadamantyl group, and a norbornyl group substituted with a cyano group.

As the repeating units having any of the atomic moieties, those of the following general formulae (AIIa) to (AIId) can be exemplified.

(AIIa)

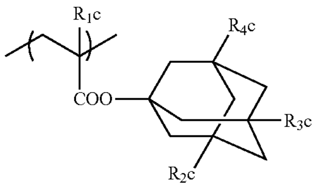

-continued (AIIb)

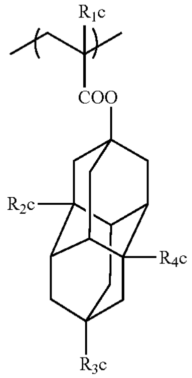

(AIIc)

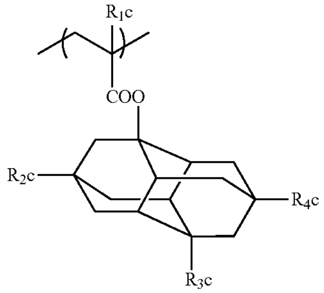

(AIId)

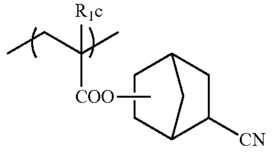

In the general formulae (AIIa) to (AIId), $R_1c$ represents a hydrogen atom, a methyl group, a trifluoromethyl group or a hydroxymethyl group.

Each of $R_2c$ to $R_4c$ independently represents a hydrogen atom, a hydroxy group or a cyano group, with the proviso that at least one of the $R_2c$ to $R_4c$ represents a hydroxy group or a cyano group. Preferably, one or two of the $R_2c$ to $R_4c$ are hydroxy groups and the remainder is a hydrogen atom. More preferably, two of the $R_2c$ to $R_4c$ are hydroxy groups and the remainder is a hydrogen atom.

The content of the repeating unit containing a hydroxyl group or a cyano group based on all the repeating units of the acid-composable resin is preferably in the range of 5 to 40 mol %, more preferably 5 to 30 mol % and further more preferably 10 to 25 mol %.

Specific examples of the repeating units containing a hydroxyl group or a cyano group will be shown below, which however in no way limit the scope of the present invention.

-continued

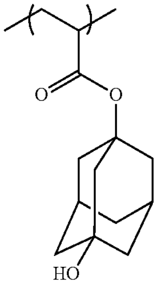

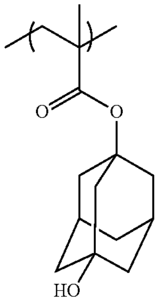

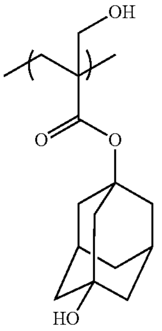

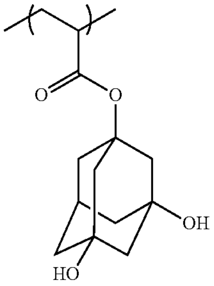

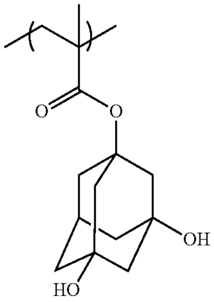

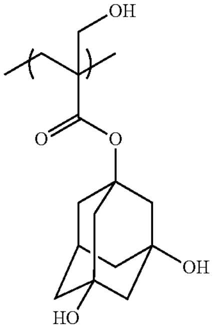

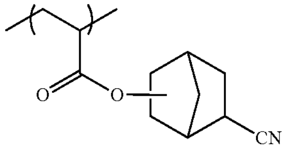

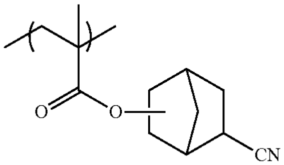

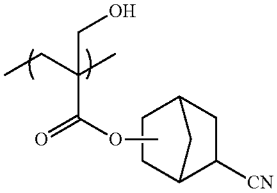

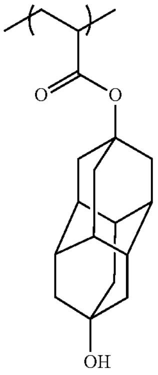

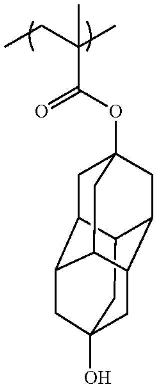

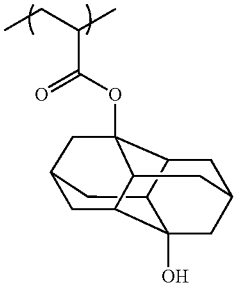

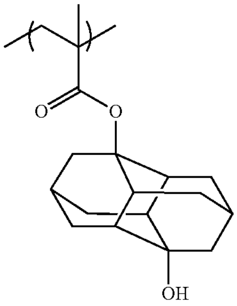

<Alkali-soluble Unit>

The acid-decomposable resin may further contain a repeating unit with an alkali-soluble group other than the repeating unit (R).

As the alkali-soluble group, there can be mentioned a carboxyl group, a sulfonamido group, a sulfonylimido group, a bisulfonylimido group or an aliphatic alcohol substituted at its α-position with an electron-withdrawing group (for example, a hexafluoroisopropanol group). The possession of a repeating unit having a carboxyl group is more preferred. The incorporation of the repeating unit having an alkali-soluble group would increase the resolving power in contact hole usage. The repeating unit having an alkali-soluble group is preferably any of a repeating unit wherein the alkali-soluble group is directly bonded to the principal chain of a resin such as a repeating unit of acrylic acid or methacrylic acid, a repeating unit wherein the alkali-soluble group is bonded via a connecting group to the principal chain of a resin and a repeating unit wherein the alkali-soluble group is introduced in a terminal of a polymer chain by the use of a chain transfer agent or polymerization initiator having the alkali-soluble group in the stage of polymerization. The connecting group may have a cyclohydrocarbon structure of a single ring or multiple rings. The repeating unit of acrylic acid or methacrylic acid is especially preferred.

The content ratio of the repeating unit having an alkali-soluble group based on all the repeating units of the acid-decomposable resin is preferably in the range of 0 to 20 mol %, more preferably 3 to 15 mol % and still more preferably 5 to 10 mol %.

Specific examples of the repeating units having an alkali-soluble group will be shown below, which however in no way limit the scope of the present invention. In the formulae, Rx represents H, $CH_3$, $CH_2OH$ or $CF_3$.

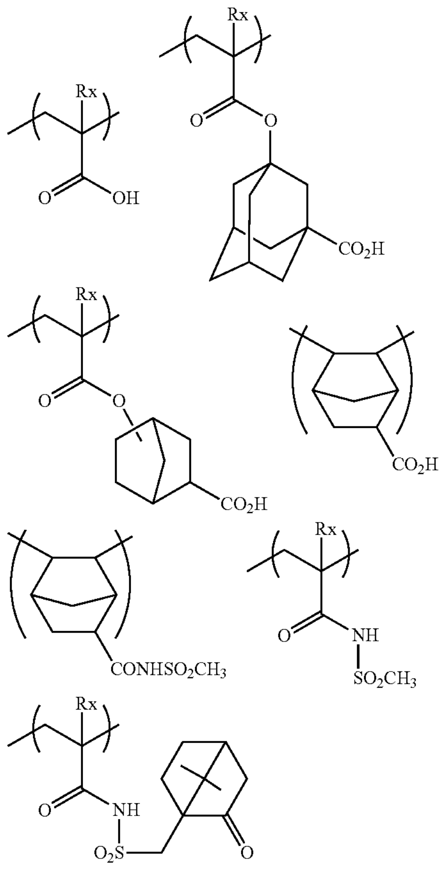

<Repeating Unit that Has a Structure of Alicyclic Hydrocarbon Having No Polar Group, Exhibiting No Acid Decomposability>

The acid-decomposable resin preferably contains a repeating unit that has a structure of alicyclic hydrocarbon having no polar group, exhibiting no acid decomposability. This can, for example, reduce the dissolution of low molecular weight components from the composition film into immersion liquid when exposure through immersion liquid is performed. As such, any of the repeating units represented by general formula (4) below can be exemplified.

(4)

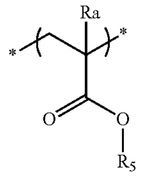

In the general formula (4), $R_5$ represents a hydrocarbon group having at least one cyclic structure in which neither a hydroxyl group nor a cyano group is contained.

Ra represents a hydrogen atom, an alkyl group or a group of the formula —$CH_2$—O—$Ra_2$ in which $Ra_2$ represents a hydrogen atom, an alkyl group or an acyl group. Ra is preferably a hydrogen atom, a methyl group, a hydroxymethyl group or a trifluoromethyl group, further preferably a hydrogen atom or a methyl group.

The cyclic structures contained in $R_5$ include a monocyclic hydrocarbon group and a polycyclic hydrocarbon group. As the monocyclic hydrocarbon group, a cycloalkyl group having 3 to 12 carbon atoms and a cycloalkenyl group having 3 to 12 carbon atoms can be exemplified. Preferably, the monocyclic hydrocarbon group is a monocyclic hydrocarbon group having 3 to 7 carbon atoms.

The polycyclic hydrocarbon groups include ring-assembly hydrocarbon groups and crosslinked-ring hydrocarbon groups.

As the crosslinked-ring hydrocarbon rings, bicyclic hydrocarbon rings, tricyclic hydrocarbon rings, and tetracyclic hydrocarbon rings can be exemplified. Further, the crosslinked-ring hydrocarbon rings include condensed-ring hydrocarbon rings, for example, condensed rings resulting from condensation of multiple 5- to 8-membered cycloalkane rings. As preferred crosslinked-ring hydrocarbon rings, there can be mentioned a norbornyl group and an adamantyl group.

These alicyclic hydrocarbon groups may have one or more substituents. As preferred substituents, a halogen atom, an alkyl group, a hydroxyl group protected by a protective group, and an amino group protected by a protective group can be exemplified. The halogen atom is preferably a bromine, chlorine or fluorine atom. The alkyl group is preferably a methyl, ethyl, butyl or t-butyl group. The alkyl group may further have one or more substituents. As the optional substituent, a halogen atom, an alkyl group, a hydroxyl group protected by a protective group, and an amino group protected by a protective group can be exemplified.

As the protective group, an alkyl group, a cycloalkyl group, an aralkyl group, a substituted methyl group, a substituted ethyl group, an alkoxycarbonyl group and an aralkyloxycarbonyl group can be exemplified. Preferred alkyl groups include alkyl groups having 1 to 4 carbon atoms. Preferred substituted methyl groups include methoxymethyl, methoxythiomethyl, benzyloxymethyl, t-butoxymethyl and 2-methoxyethoxymethyl groups. Preferred substituted ethyl groups include 1-ethoxyethyl and 1 methyl 1 methoxyethyl groups. Preferred acyl groups include aliphatic acyl groups having 1 to 6 carbon atoms, such as formyl, acetyl, propionyl, butyryl, isobutyryl, valeryl and pivaloyl groups. Preferred alkoxycarbonyl groups include alkoxycarbonyl groups having 1 to 4 carbon atoms and the like.

When the acid-decomposable resin contains the repeating unit that has a structure of alicyclic hydrocarbon having no polar group, exhibiting no acid decomposability, the content thereof based on all the repeating units of the acid-decomposable resin is preferably in the range of 1 to 40 mol %, more preferably 1 to 20 mol %.

Specific examples of the repeating unit that has a structure of alicyclic hydrocarbon having no polar group, exhibiting no acid decomposability will be shown below, which however in no way limit the scope of the present invention. In the formulae, Ra represents H, $CH_3$, $CH_2OH$ or $CF_3$.

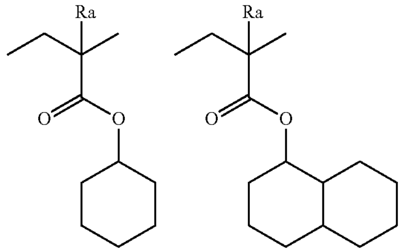

-continued

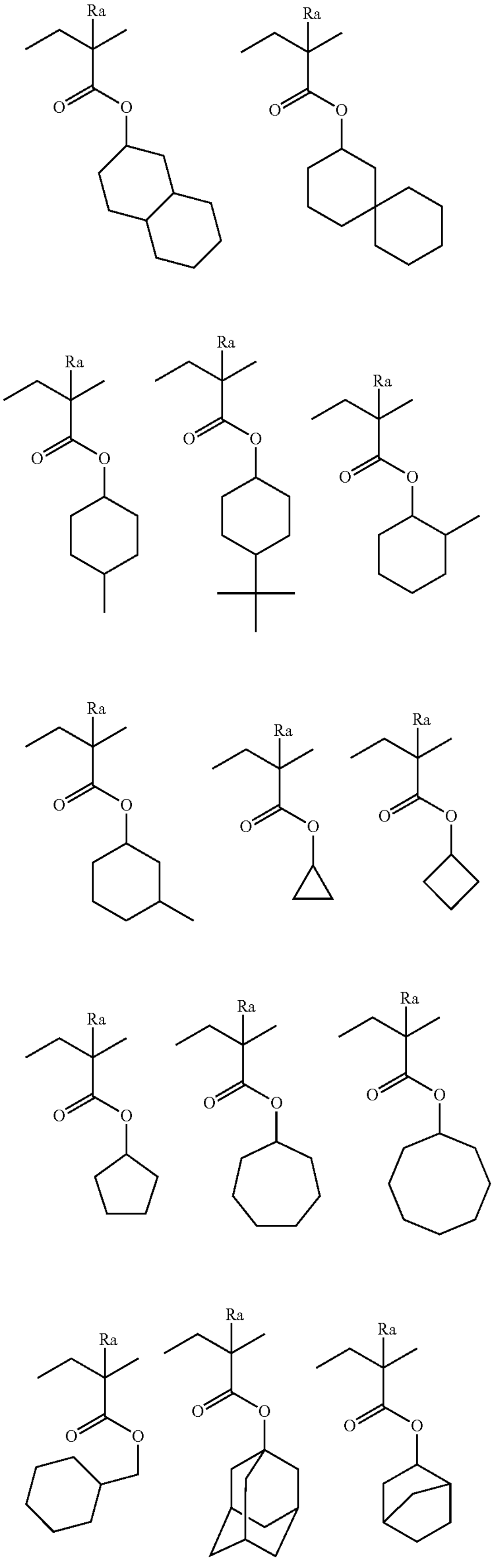

-continued

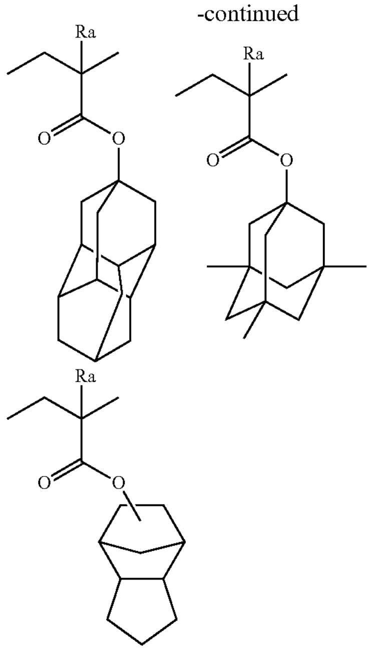

<Other Repeating Units>

Various repeating structural units other than those mentioned hereinbefore can be introduced in the acid-decomposable resin in order to regulate the dry etching resistance, standard developer adaptability, adherence to substrates, resist profile, and generally required properties for resist, such as resolving power, heat resistance, sensitivity, and the like.

As such other repeating structural units, those corresponding to the following monomers can be exemplified, which however are nonlimiting.

Such other repeating structural units would permit fine regulation of the properties required to have by the resin for use in the composition of the present invention, especially, (1) solubility in applied solvents, (2) film forming easiness (glass transition temperature), (3) alkali developability, (4) film thinning (selection of hydrophilicity/hydrophobicity and alkali-soluble group), (5) adhesion of unexposed areas to substrate, and (6) dry etching resistance, etc.

As the above-mentioned monomers, compounds having an unsaturated bond capable of addition polymerization, selected from among acrylic esters, methacrylic esters, acrylamides, methacrylamides, allyl compounds, vinyl ethers, vinyl esters and the like can be exemplified.

The monomers are not limited to the above, and unsaturated compounds capable of addition polymerization that are copolymerizable with the monomers corresponding to the above various repeating structural units can be used in the copolymerization.

The molar ratios of individual repeating structural units contained in the resin for use in the composition of the present invention are appropriately determined from the viewpoint of regulation of not only the resist dry etching resistance but also the standard developer adaptability, substrate adhesion, resist profile and generally required properties of resists such as resolving power, heat resistance and sensitivity.

When the composition of the present invention is used in ArF exposure, it is preferred for the acid-decomposable resin to contain less aromatic groups from the viewpoint of transparency to ArF light. More specifically, the content of repeating unit with an aromatic ring is preferably 3 mol % or less. More preferably, the acid-decomposable resin does not essentially contain a repeating unit with an aromatic ring.

Preferred acid-decomposable resin is that whose repeating units consisting of (meth)acrylate repeating units. In that instance, use can be made of any of a resin wherein all the repeating units consist of methacrylate repeating units, a resin wherein all the repeating units consist of acrylate repeating units and a resin wherein all the repeating units consist of methacrylate repeating units and acrylate repeating units. However, it is preferred for the acrylate repeating units to account for 50 mol % or less of all the repeating units. Copolymer containing 20 to 50 mol % of (meth)acrylate repeating unit with an acid-decomposable group, 20 to 50 mol % of (meth)acrylate repeating unit with a lactone group, 5 to 30 mol % of (meth)acrylate repeating unit with alicyclic hydrocarbon structure substituted with a hydroxyl group or a cyano group, and optionally 0 to 20 mol % of other (meth) acrylate repeating unit is more preferred.

The weight average molecular weight of the acid-decomposable resin in terms of polystyrene molecular weight as measured by GPC is preferably in the range of 1,000 to 200,000, more preferably 2,000 to 20,000, still more preferably 3,000 to 15,000 and further preferably 5,000 to 12,000. The regulation of the weight average molecular weight to 1,000 to 200,000 would prevent deteriorations of heat resistance and dry etching resistance and also prevent deterioration of developability and increase of viscosity leading to poor film forming property.

Use is made of the resin whose dispersity (molecular weight distribution) is usually in the range of 1 to 3, preferably 1 to 2.6, more preferably 1 to 2 and most preferably 1.4 to 2.0. The lower the molecular weight distribution, the more excellent the resolving power and resist profile and the smoother the side wall of the resist pattern to thereby attain an excellence in roughness.

The acid-decomposable resin of the present invention can be synthesized by conventional techniques (for example, radical polymerization). Detailed methods for synthesis and purification are described in, for example, Chapter 2 "Polymer synthesis" of "Courses on Experimental Chemistry 26, Polymer Chemistry, 5th edition" published by Maruzen corporation. As regards purification of the resin, it is preferred to remove impurities such as unreacted monomer, oligomer and metal as much as possible. Such purification can reduce the number of defects and further increase resolution.

The acid-decomposable resin may be used either individually or in combination. In the latter case, the composition according to the present invention may comprise two or more resins containing the repeating unit (R) explained above, or may comprise one or more resins containing the repeating unit (R) and one or more resins not containing the repeating unit (R)

The content of the resin containing the repeating unit (R) based on the total solid content of the whole composition is 50 mass % or more. The content is preferably in the range of 50 to 95 mass % and more preferably in the range of 60 to 90 mass %.

The total content of the acid-decomposable resin based on the total solid content of the whole composition is 50 mass % or more. The content is preferably in the range of 50 to 99.9 mass % and more preferably in the range of 60 to 99.0 mass %.

(B) a compound (PA) containing a functional group with proton acceptor properties and being configured to decompose when exposed to actinic rays or radiation to thereby produce a compound exhibiting lower or no proton acceptor properties or a compound exhibiting acid properties instead of the proton acceptor properties The composition of the present invention contains a compound (PA) containing a functional group with proton acceptor properties and being configured to decompose when exposed to actinic rays or radiation to thereby produce a compound exhibiting lower or no proton acceptor properties or a compound exhibiting acid properties instead of the proton acceptor properties.

The inventors have found that the LWR, pattern collapse performance and DOF can be strikingly enhanced by using the above acid-decomposable resin containing the repeating unit (R) in combination with the compound (PA). The reason therefor is not necessarily apparent. However, the inventors presume the following. The repeating unit (R) acts as an alkali-soluble acid group. Consequently, when the acid-decomposable resin containing the repeating unit (R) is used, the superior portion of a pattern comes to be relatively easily dissolved, so that it is occasionally difficult to form a pattern with rectangular configuration. In contrast, the compound (PA) acts as a basic compound that exhibits low volatility in the stage of coating and/or drying, so that any acid occurring upon exposure is effectively quenched at the superior portion of the pattern. Therefore, when the resin is used in combination with the compound (PA), the pattern with rectangular configuration can be formed. Thus, the LWR, pattern collapse performance and DOF can be enhanced by the combinational use.

The functional group with proton acceptor properties refers to a functional group having a group or an electron capable of electrostatic interaction with a proton, and means, for example, a functional group with a macrocyclic structure such as a cyclopolyether, or a functional group containing a nitrogen atom with an unshared electron pair not contributing to π-conjugation. The nitrogen atom with an unshared electron pair not contributing to π-conjugation is, for example, a nitrogen atom with any of the partial structures of the following general formula.

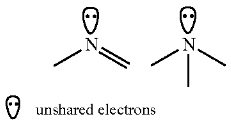

As preferred partial structures of the functional groups with proton acceptor properties, there can be mentioned, for example, crown ether, azacrown ether, primary to tertiary amine, pyridine, imidazole, and pyrazine structures and the like.

The compound (PA) is configured to decompose when exposed to actinic rays or radiation to thereby produce a compound exhibiting lower or no proton acceptor properties or a compound exhibiting acid properties instead of the proton acceptor properties. The expression "exhibiting lower or no proton acceptor properties or a compound exhibiting acid properties instead of the proton acceptor properties." refers to a change of proton acceptor properties caused by the addition of a proton to the functional group with proton acceptor properties. In particular, the expression means that when a proton adduct is formed from the compound (PA) containing a functional group with proton acceptor properties and a proton, the equilibrium constant of the chemical equilibrium thereof is decreased.

The proton acceptor properties can be ascertained by performing pH measurement.

In the present invention, it is preferred for the acid dissociation constant pKa of the compound produced by the decomposition of the compound (PA) when exposed to actinic rays or radiation to satisfy the relationship $pKa<-1$. Satisfying the relationship $-13<pKa<-1$ is more preferred, and satisfying the relationship $-13<pKa<-3$ is further more preferred.

In the present invention, the acid dissociation constant pKa refers to the acid dissociation constant pKa in an aqueous solution, for example, any of those listed in Kagaku Binran (Chemical Handbook) (II) (Revised 4th Edition, 1993, edited by The Chemical Society of Japan, published by Maruzen Co., Ltd.). The lower the value of acid dissociation constant, the greater the acid strength. For example, the acid dissociation constant pKa in an aqueous solution can be actually measured through the determination of the acid dissociation constant at 25° C. using an infinitely diluted aqueous solution. Alternatively, the values based on a data base of publicly known literature values and Hammett's substituent constants can be determined by calculation by means of the following software package 1. All the pKa values appearing in this description are those determined by calculation by means of this software package.

Software package 1: Advanced Chemistry Development (ACD/Labs) Software V8.14 for Solaris (1994-2007 ACD/Labs).

The compound (PA) produces, for example, any of the compounds of general formula (PA-1) below as the above proton adduct produced by the decomposition thereof when exposed to actinic rays or radiation. Each of the compounds of general formula (PA-1) contains not only a functional group with proton acceptor properties but also an acidic group, thereby being a compound exhibiting lower or no proton acceptor properties or a compound exhibiting acid properties instead of the proton acceptor properties.

$$Q\text{-}A\text{-}(X)_n\text{—}B\text{—}R \qquad \text{(PA-1)}$$

In general formula (PA-1),

Q represents $—SO_3H$, $—CO_2H$ or $—W_1NHW_2Rf$, in which Rf represents an alkyl group, a cycloalkyl group or an aryl group, and each of $W_1$ and $W_2$ independently represents $—SO_2—$ or —CO—.

A represents a single bond or a bivalent connecting group.

X represents $—SO_2—$ or —CO—.

n is 0 or 1.

B represents a single bond, an oxygen atom or —N(Rx)Ry-, in which Rx represents a hydrogen atom or a monovalent organic group, and Ry represents a single bond or a bivalent organic group, provided that Rx may be bonded to Ry to thereby form a ring or may be bonded to R to thereby form a ring.

R represents a monovalent organic group containing a functional group with proton acceptor properties.

General formula (PA-1) will be described in greater detail below.

The bivalent connecting group represented by A is preferably a bivalent connecting group having 2 to 12 carbon atoms. As such, there can be mentioned, for example, an alkylene group, a phenylene group or the like. An alkylene group containing at least one fluorine atom is more preferred, which has preferably 2 to 6 carbon atoms, more preferably 2 to 4 carbon atoms. A connecting group, such as an oxygen atom or a sulfur atom, may be introduced in the alkylene chain. In particular, the alkylene group, 30 to 100% of the hydrogen atoms of which are substituted with fluorine atoms, is preferred. It is more preferred for the carbon atom bonded to the Q-moiety to have a fluorine atom. Further, perfluoroalkylene groups are preferred. A perfluoroethylene group, a perfluoropropylene group and a perfluorobutylene group are more preferred.

The monovalent organic group represented by Rx preferably has 1 to 30 carbon atoms. As such, there can be mentioned, for example, an alkyl group, a cycloalkyl group, an aryl group, an aralkyl group, an alkenyl group or the like. Substituents may further be introduced in these groups.

A substituent may be introduced in the alkyl group represented by Rx. The alkyl group is preferably a linear or branched alkyl group having 1 to 20 carbon atoms. An oxygen atom, a sulfur atom or a nitrogen atom may be introduced in the alkyl chain.

The bivalent organic group represented by Ry is preferably an alkylene group.

As the ring structure that may be formed by the mutual bonding of Rx and Ry, there can be mentioned a 5 to 10-membered ring containing a nitrogen atom, and especially preferably 6-membered ring containing a nitrogen atom.

As the substituted alkyl group, in particular, there can be mentioned a linear or branched alkyl group substituted with a cycloalkyl group (for example, an adamantylmethyl group, an adamantylethyl group, a cyclohexylethyl group, a camphor residue, or the like).

A substituent may be introduced in the cycloalkyl group represented by Rx. The cycloalkyl group preferably has 3 to 20 carbon atoms. An oxygen atom may be introduced in the ring.

A substituent may be introduced in the aryl group represented by Rx. The aryl group preferably has 6 to 14 carbon atoms.

A substituent may be introduced in the aralkyl group represented by Rx. The aralkyl group preferably has 7 to 20 carbon atoms.

A substituent may be introduced in the alkenyl group represented by Rx. For example, there can be mentioned groups resulting from the introduction of a double bond at an arbitrary position of any of the alkyl groups mentioned above as being represented by Rx.

The functional group with proton acceptor properties represented by R is as mentioned above. There can be mentioned groups with, for example, an azacrown ether, a primary to tertiary amine, and a nitrogenous heterocyclic aromatic structure such aspyridine or imidazole.

The organic group with such a structure preferably has 4 to 30 carbon atoms. As such, there can be mentioned an alkyl group, a cycloalkyl group, an aryl group, an aralkyl group, an alkenyl group or the like.

The alkyl group, cycloalkyl group, aryl group, aralkyl group and alkenyl group contained in the alkyl group, cycloalkyl group, aryl group, aralkyl group and alkenyl group containing a functional group with proton acceptor properties or an ammonium group represented by R may be the same as the alkyl group, cycloalkyl group, aryl group, aralkyl group and alkenyl group set forth above as being represented by Rx.

As substituents that may be introduced in these groups, there can be mentioned, for example, a halogen atom, a hydroxyl group, a nitro group, a cyano group, carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably 2 to 20 carbon atoms) and the like. With respect to the ring structure of the aryl group, cycloalkyl group, etc. and the aminoacyl group, an alkyl group (preferably 1 to 20 carbon atoms) can further be mentioned as a substituent.

When B is —N(Rx)Ry-, it is preferred for R and Rx to be bonded to each other to thereby form a ring. The formation of a ring structure enhances the stability, and enhances the storage stability of the composition containing the same. The number of carbon atoms constituting the ring is preferably in the range of 4 to 20. The ring may be monocyclic or polycyclic, and an oxygen atom, a sulfur atom or a nitrogen atom may be introduced in the ring.

As the monocyclic structure, there can be mentioned a 4-membered ring, 5-membered ring, 6-membered ring, 7-membered ring or 8-membered ring containing a nitrogen atom, or the like. As the polycyclic structure, there can be mentioned structures each resulting from a combination of two, three or more monocyclic structures. A substituent may be introduced in the monocyclic structure and polycyclic structure. As preferred substituents, there can be mentioned, for example, a halogen atom, a hydroxyl group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 15 carbon atoms), an acyloxy group (preferably 2 to 15 carbon atoms), an alkoxycarbonyl group (preferably 2 to 15 carbon atoms), an aminoacyl group (preferably 2 to 20 carbon atoms) and the like. With respect to the ring structure of the aryl group, cycloalkyl group, etc., an alkyl group (preferably 1 to 15 carbon atoms) can further be mentioned as a substituent. With respect to the aminoacyl group, an alkyl group (preferably 1 to 15 carbon atoms) can further be mentioned as a substituent.

Rf of $—X_1NHX_2Rf$ represented by Q is preferably an alkyl group having 1 to 6 carbon atoms in which a fluorine atom is optionally contained, and more preferably a perfluoroalkyl group having 1 to 6 carbon atoms. Preferably, at least one of $X_1$ and $X_2$ is $—SO_2—$. More preferably, both $X_1$ and $X_2$ are $—SO_2—$.

Q is especially preferred to be $—SO_3H$ or $—CO_2H$ from the viewpoint of hydrophilicity of acid group.

The compound represented by general formula (PA-1) in which Q moiety is sulfonic acid can be synthesized by common sulfonamidation reaction. For example, the compound can be synthesized by selectively reacting one sulfonyl halide moiety of bissulfonyl halide with amine followed by hydrolysis of another sulfonyl halide moiety thereof. Alternatively, the compound can be synthesized by reacting cyclic sulfonic acid anhydride with amine to thereby cause a ring-opening.

It is preferred for the compound (PA) to be an ionic compound. The functional group with proton acceptor properties may be contained in an anion moiety or a cation moiety. Preferably, the functional group is contained in an anion moiety.

The compound (PA) is preferably any of the compounds of general formulae (4) to (6) below.

$$R_f—X_2—N^-—X_1\text{-}A\text{-}(X)_n—B—R[C]^+ \quad (4)$$

$$R—SO_3^-[C]^+ \quad (5)$$

$$R—CO_2^-[C]^+ \quad (6)$$

In general formulae (4) to (6), A, X, n, B, R, Rf, $X_1$ and $X_2$ are as defined above in connection with general formula (PA-1).

$C^+$ represents a counter cation.

The counter cation is preferably an onium cation.

More particularly, as preferred examples thereof, there can be mentioned a sulfonium cation described as being represented by $S^+(R_{201})(R_{202})(R_{203})$ in general formula (ZI) and an iodonium cation described as being represented by $I^+(R_{204})(R_{205})$ in general formula (ZII) given in connection with acid generators to be described hereinafter.

Specific examples of the compounds (PA) are given below, which however in no way limit the scope of the compounds (PA).

(PA-1)

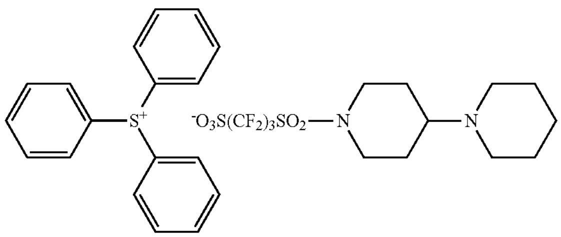

(PA-2)

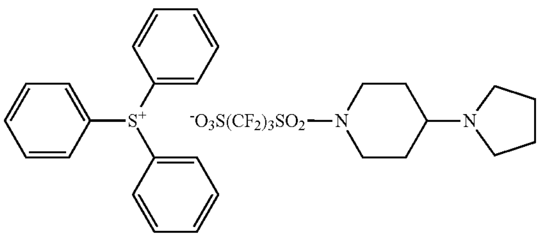

(PA-3)

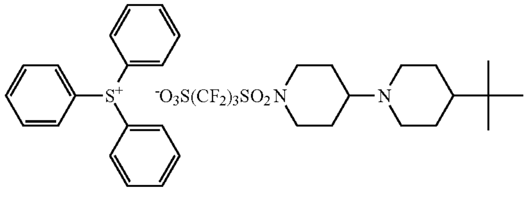

(PA-4)

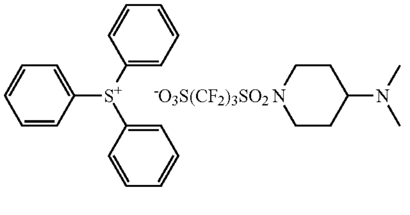

-continued
(PA-5)
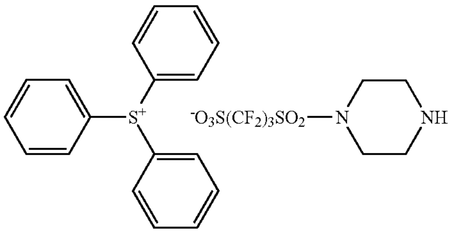
(PA-6)
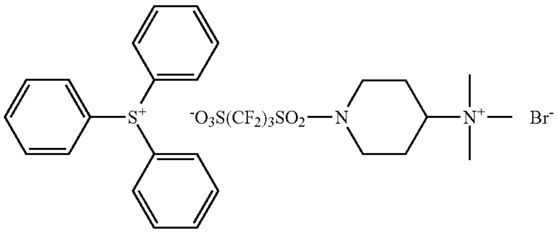
(PA-7)
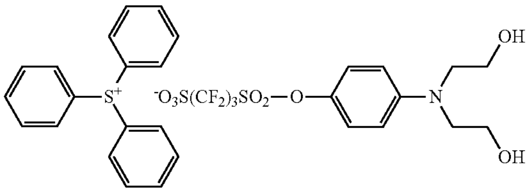
(PA-8)
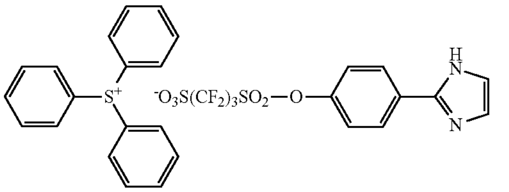
(PA-9)
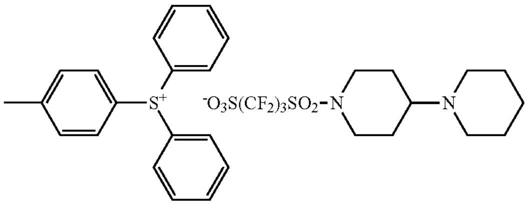
(PA-10)
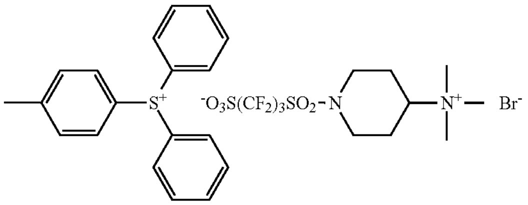
(PA-11)
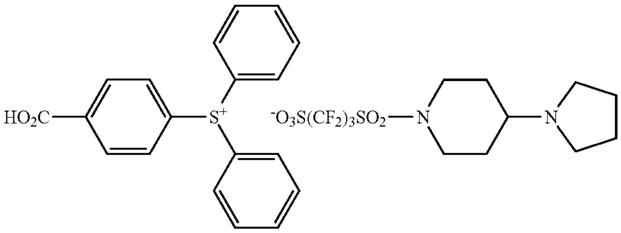
(PA-12)
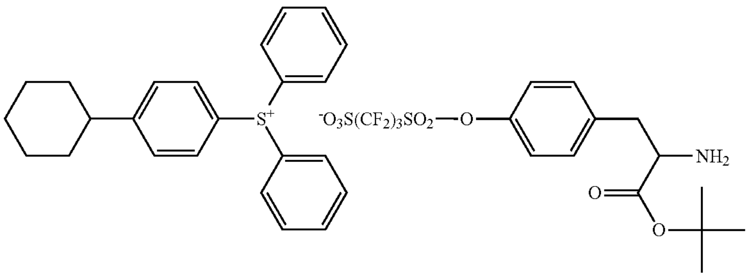
(PA-13)
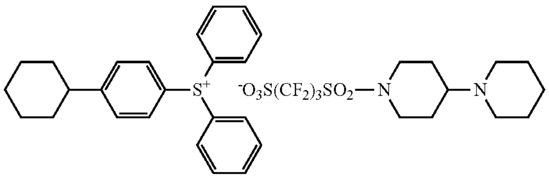
(PA-14)
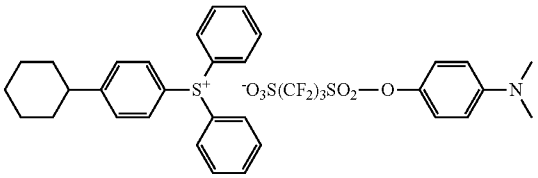

-continued
(PA-15)
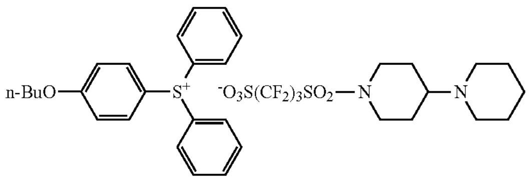
(PA-16)
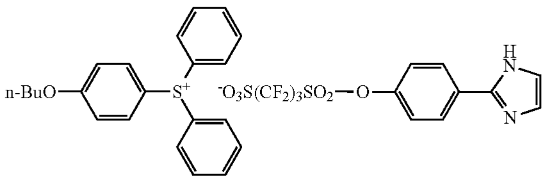
(PA-17)
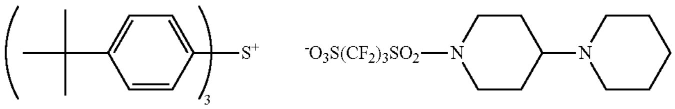
(PA-18)
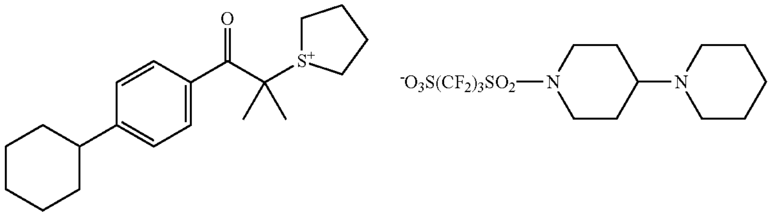
(PA-19)
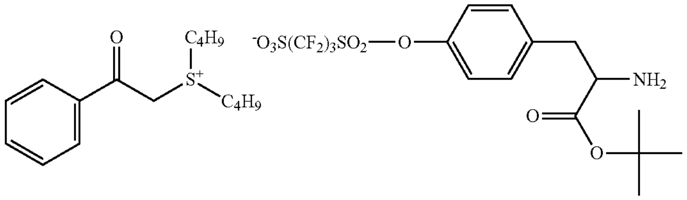
(PA-20)
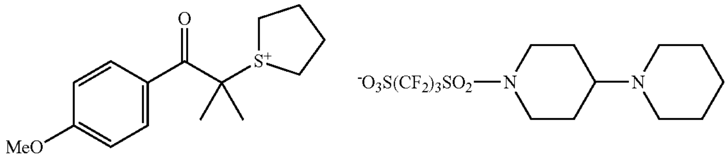
(PA-21)
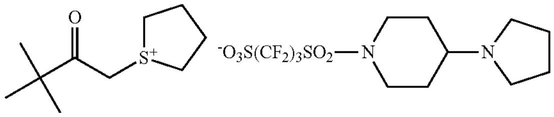
(PA-22)
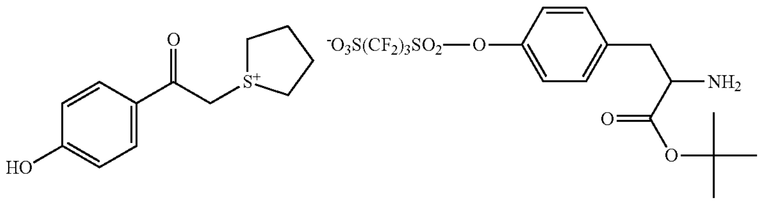
(PA-23)
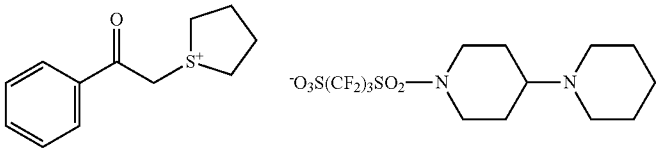
(PA-24)
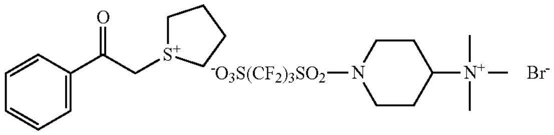
(PA-25)
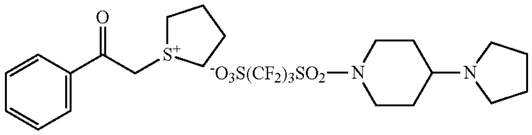

-continued
(PA-26)
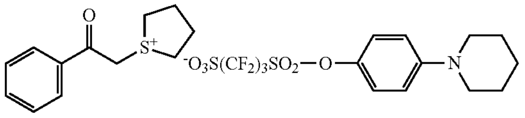
(PA-27)
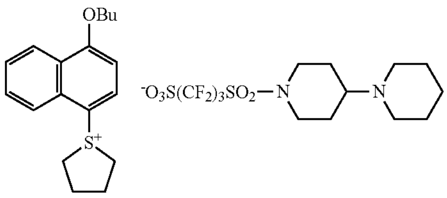
(PA-28)
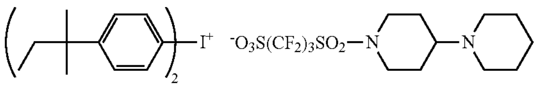
(PA-29)
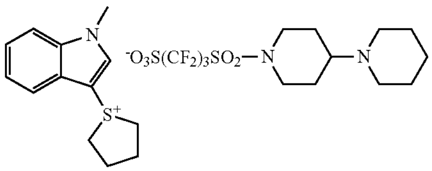
(PA-30)
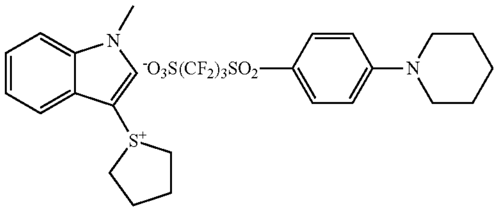
(PA-31)
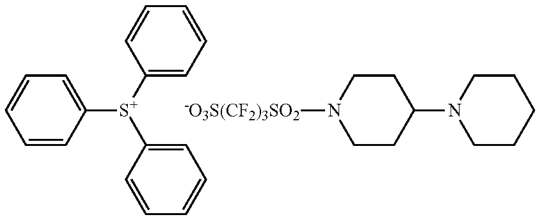
(PA-32)
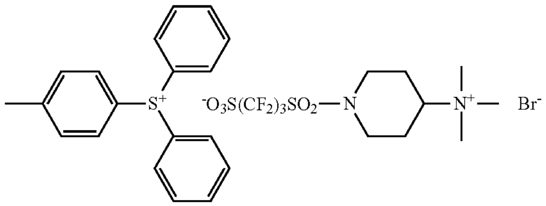
(PA-33)
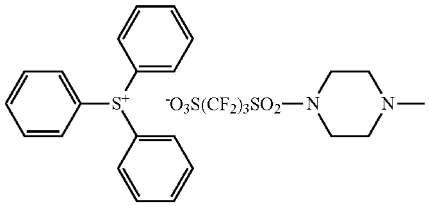
(PA-34)
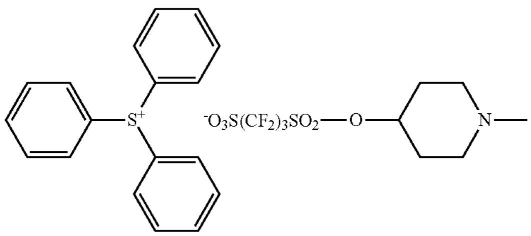
(PA-35)
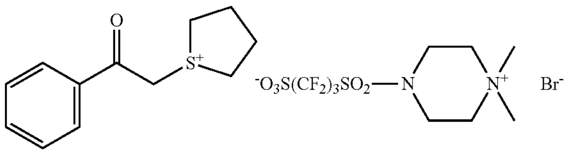
(PA-36)
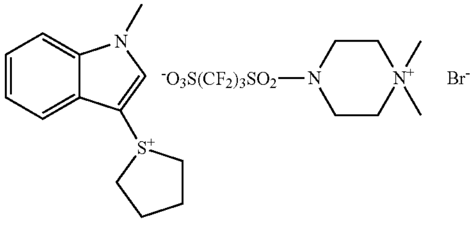
(PA-37)
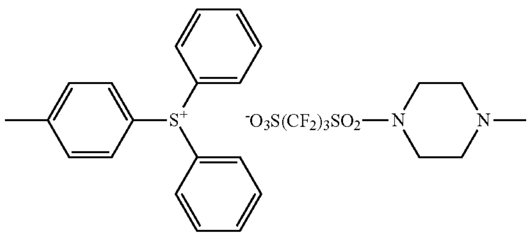

-continued
(PA-38)
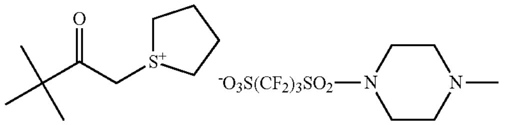
(PA-39)
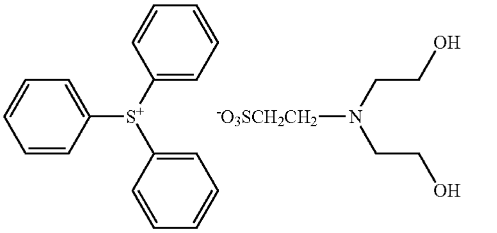
(PA-40)
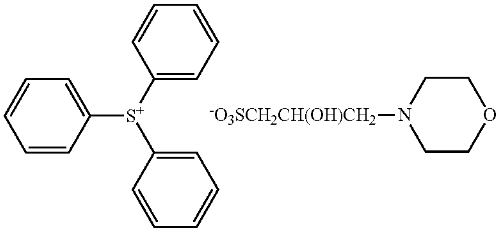
(PA-41)
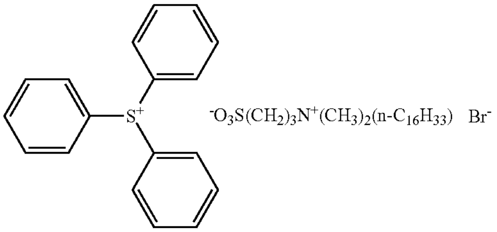
(PA-42)
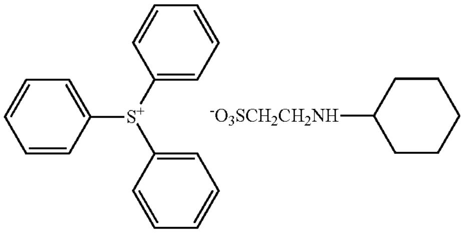
(PA-43)
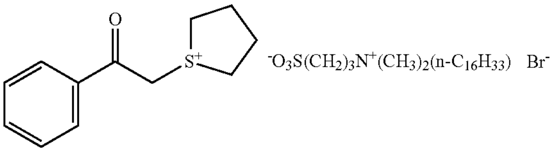
(PA-44)
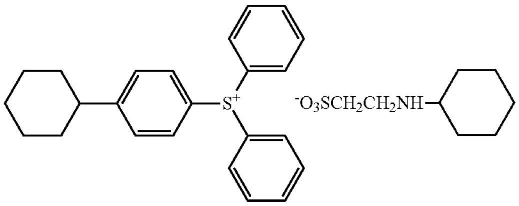
(PA-45)
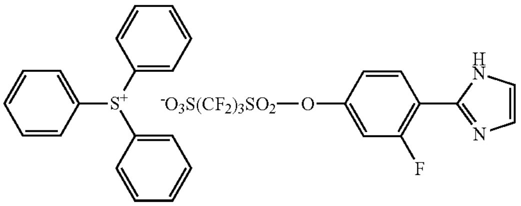
(PA-46)
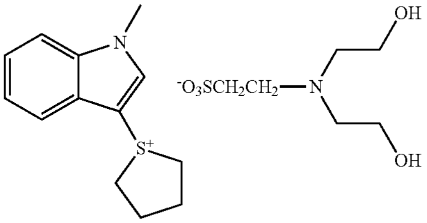
(PA-47)
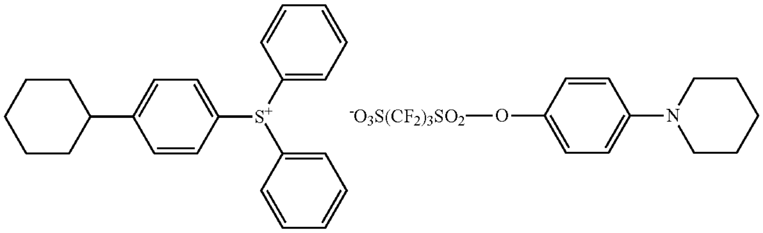
(PA-48)
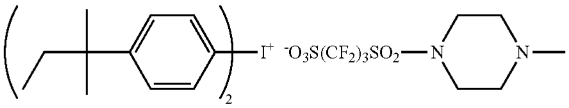

-continued
(PA-49)
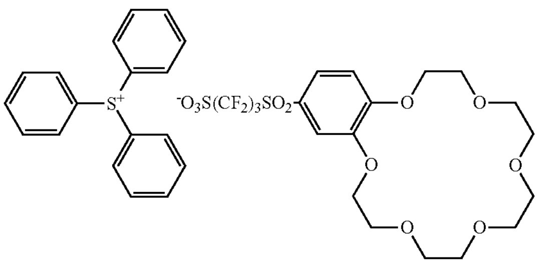
(PA-50)
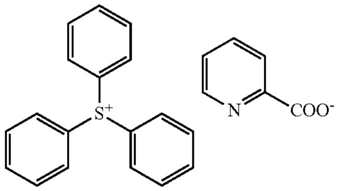
(PA-51)
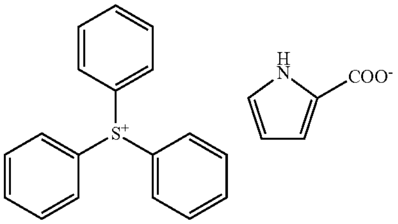
(PA-52)
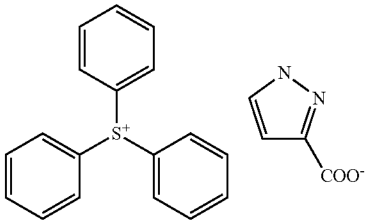
(PA-53)
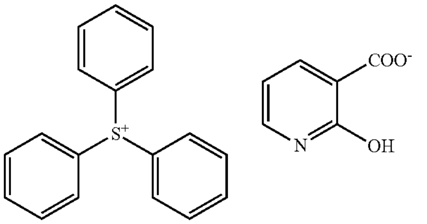
(PA-54)
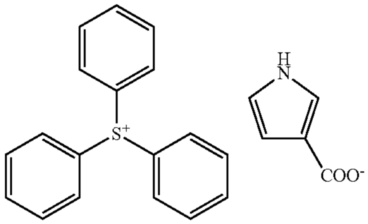
(PA-55)
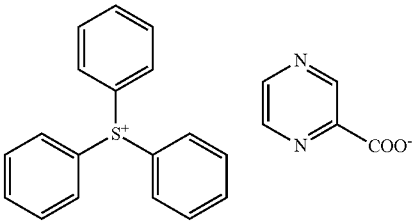
(PA-56)
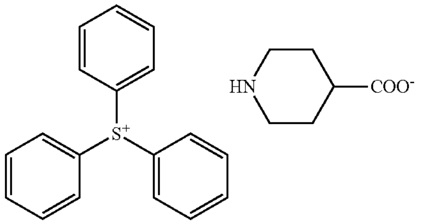
(PA-57)
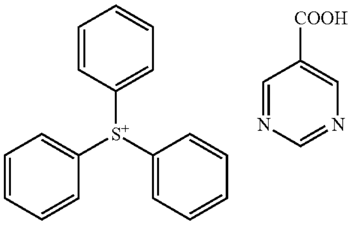
(PA-58)
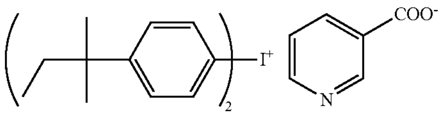
(PA-59)
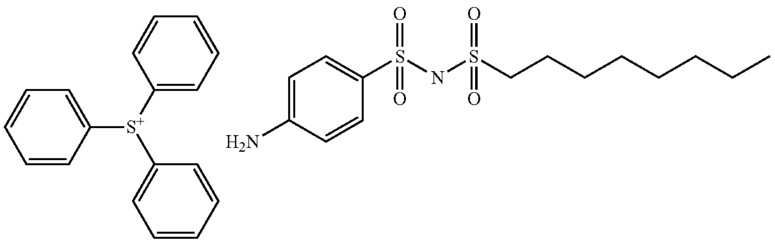

-continued
(PA-60)
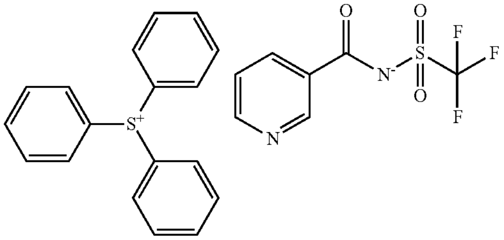
(PA-61)
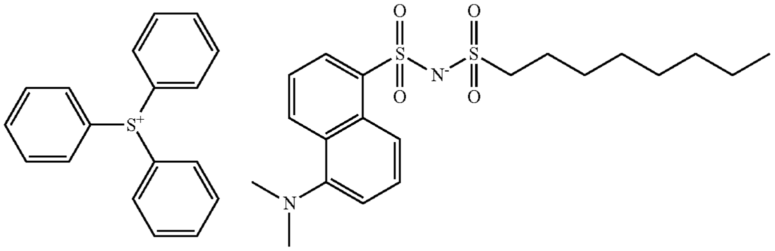
(PA-62)
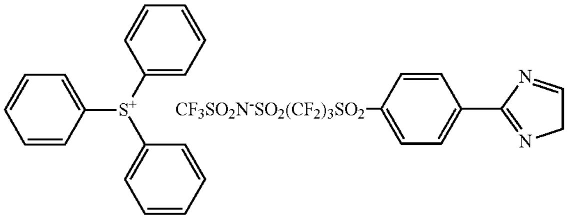
(PA-63)
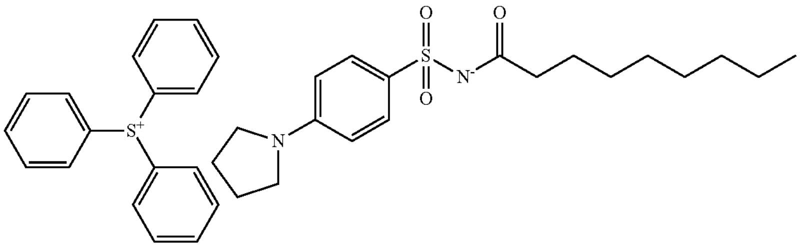
(PA-64)
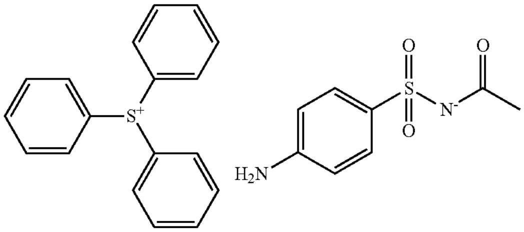
(PA-65)
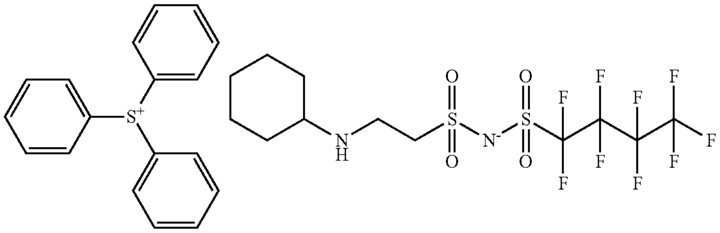

-continued
(PA-66)
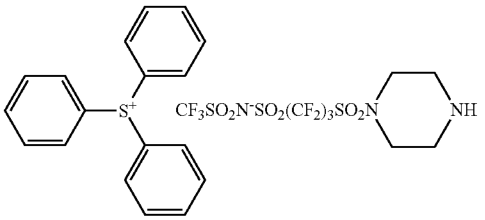
(PA-67)
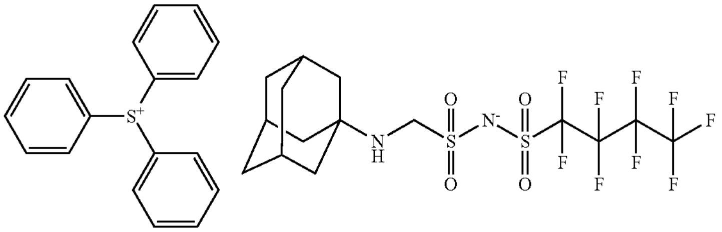
(PA-68)
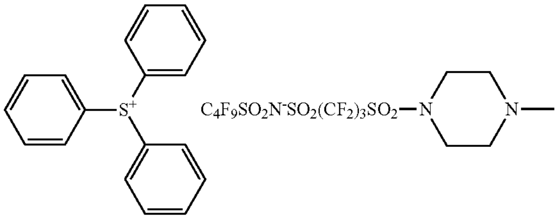
(PA-69)
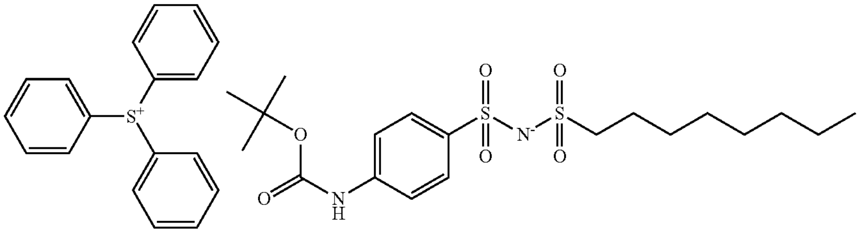
(PA-70)
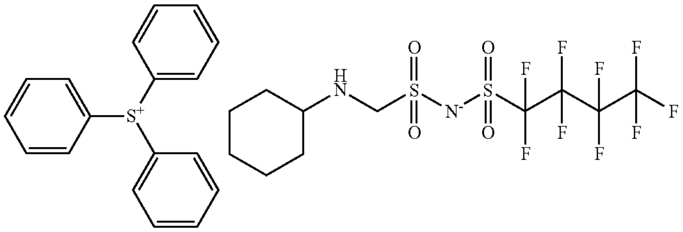
(PA-71)
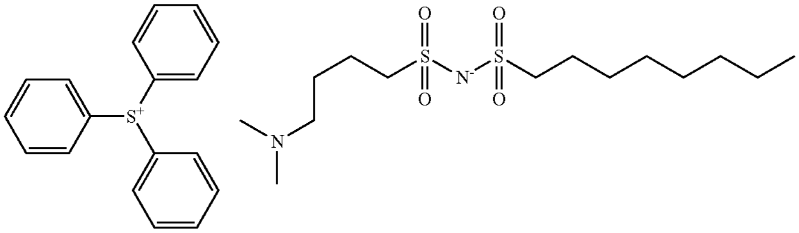
(PA-72)
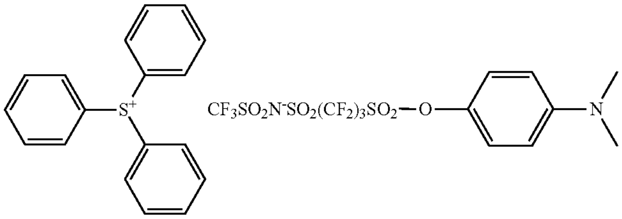

-continued
(PA-73)
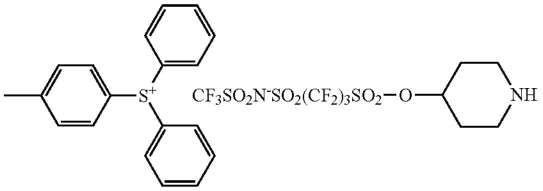
(PA-74)
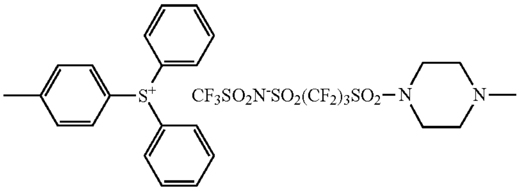
(PA-75)
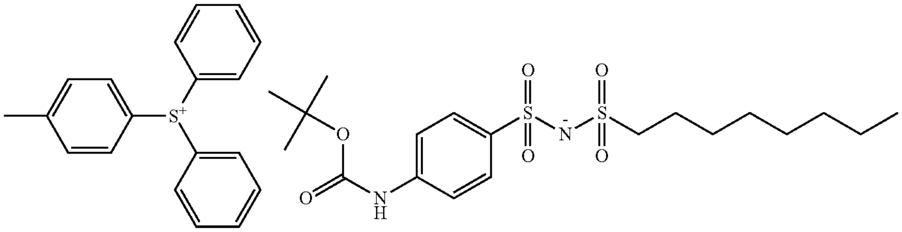
(PA-76)
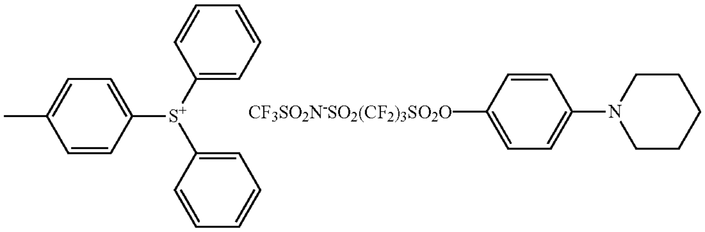
(PA-77)
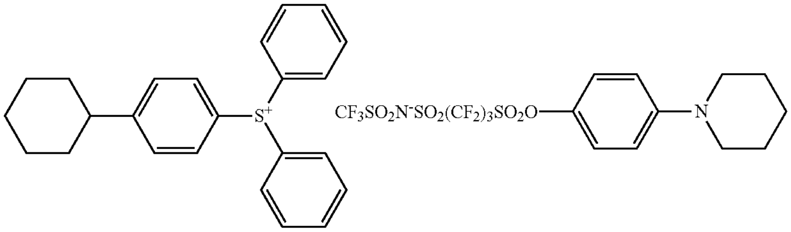
(PA-78)
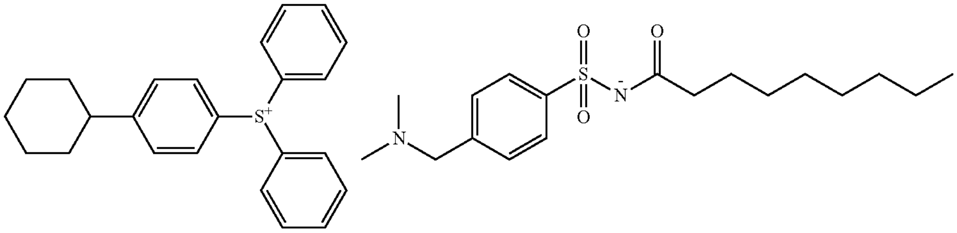
(PA-79)
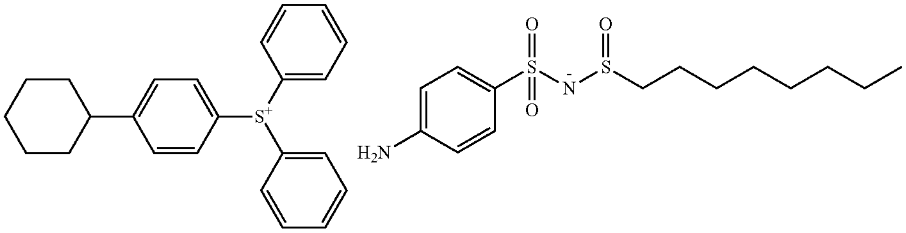

-continued
(PA-80)
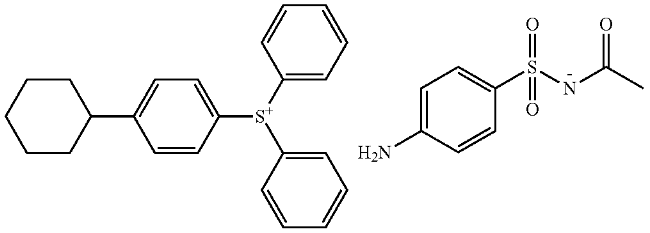
(PA-81)
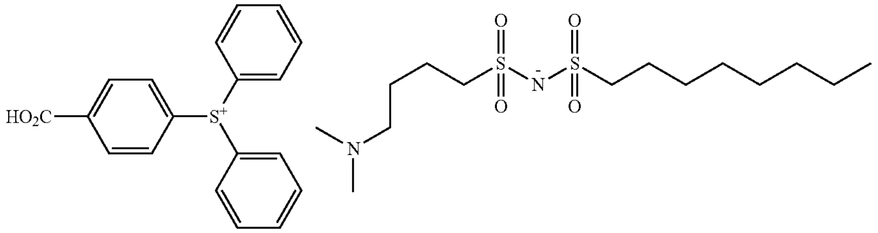
(PA-82)
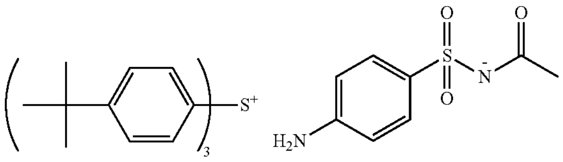
(PA-83)
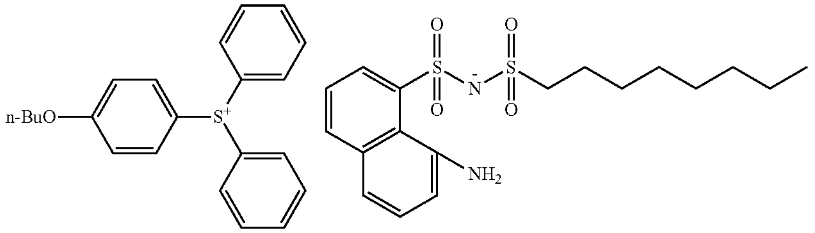
(PA-84)
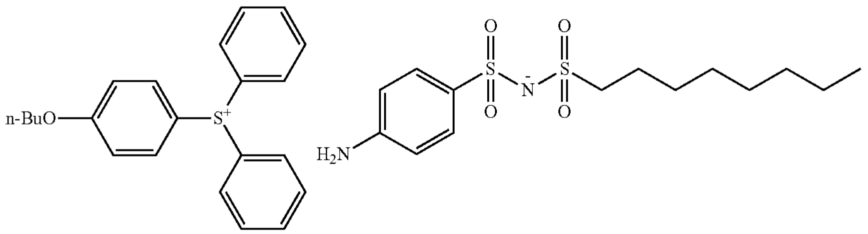
(PA-85)
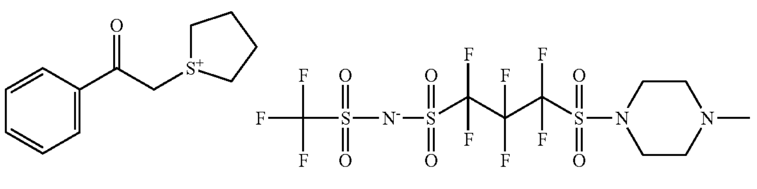
(PA-86)
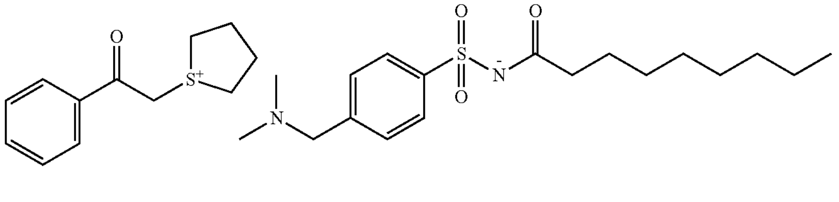

-continued
(P-87)
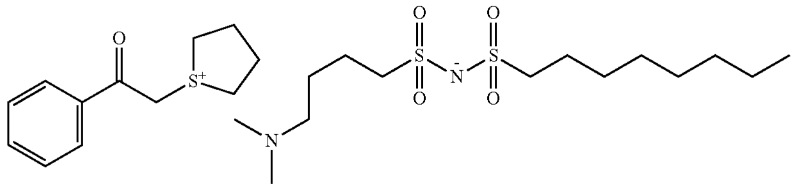
(P-88)
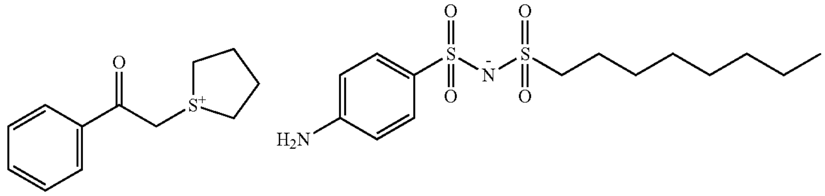
(P-89)
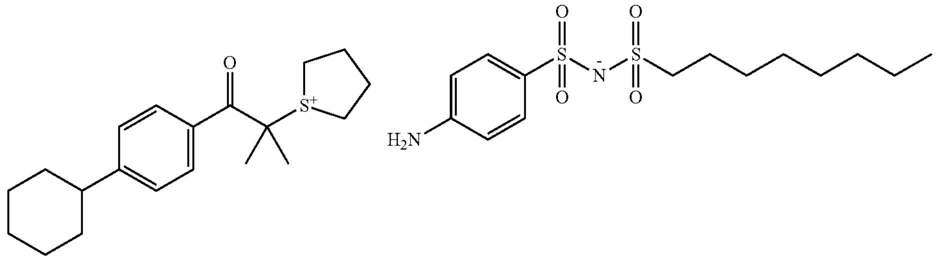
(P-90)
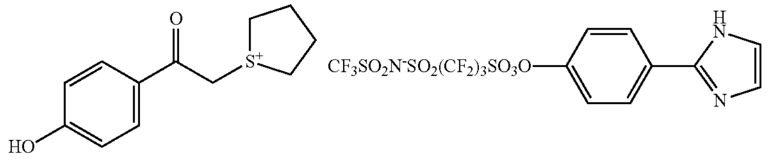
(PA-91)
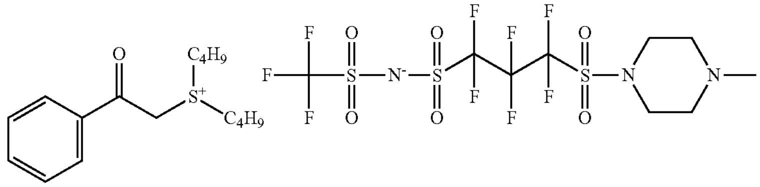
(PA-92)
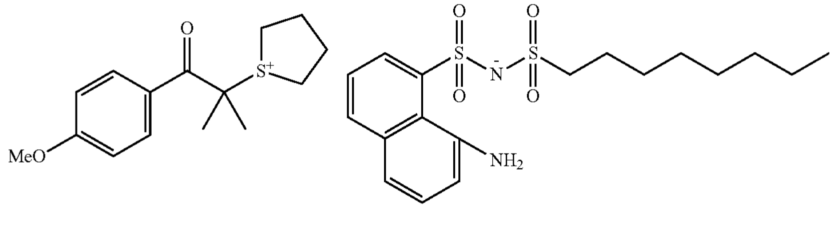
(PA-93)
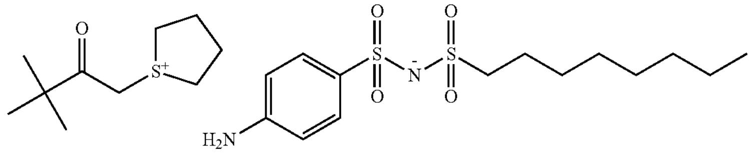
(PA-94)
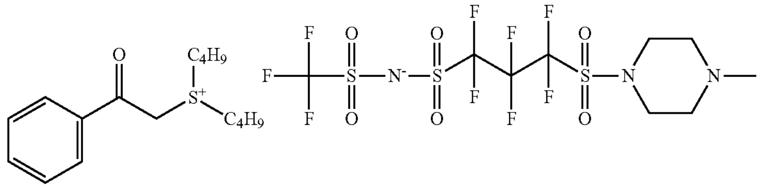

-continued
(PA-95)
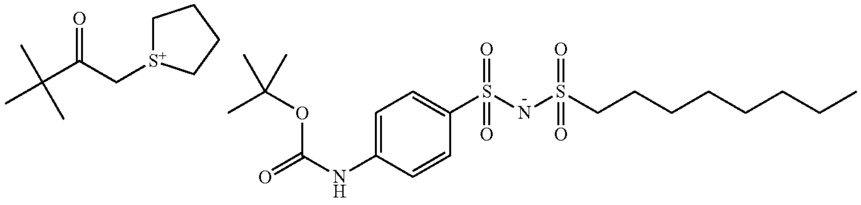
(PA-96)
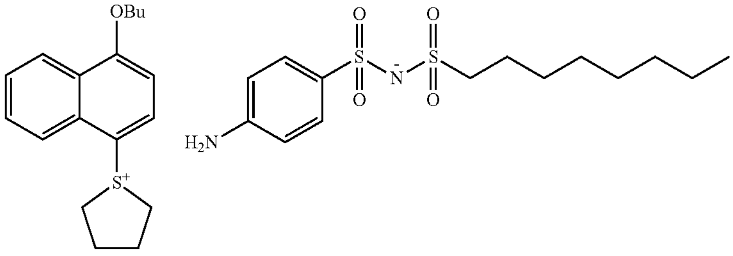
(PA-97)
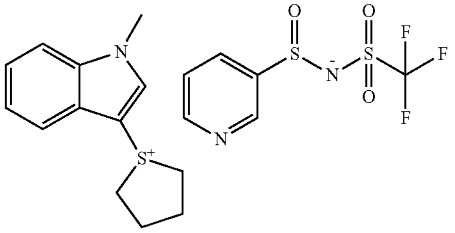
(PA-98)
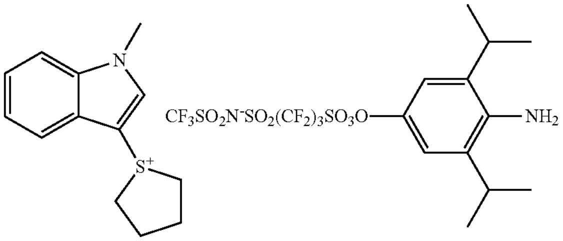
(PA-99)
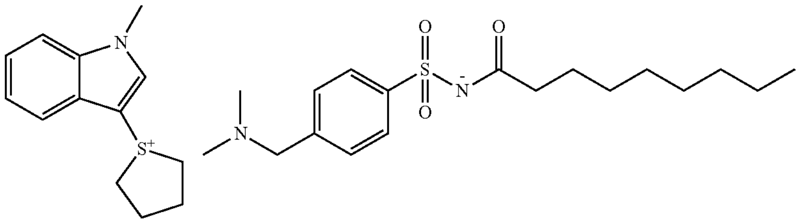
(PA-100)
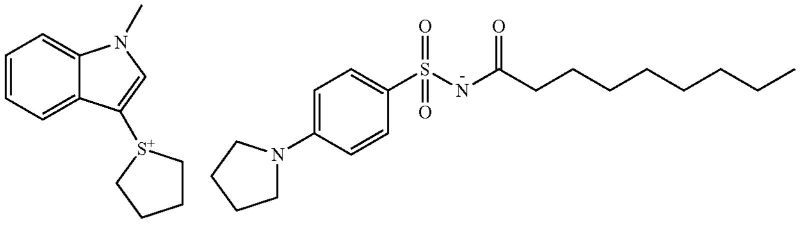
(PA-101)
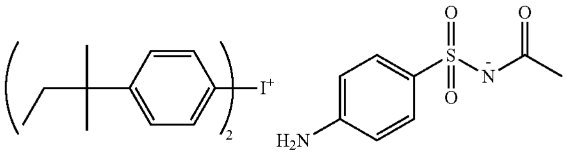
(PA-102)
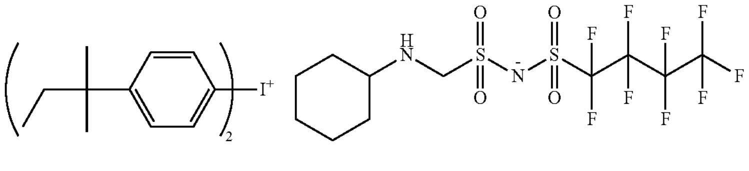

In the present invention, compounds (PA) other than those producing the compounds of general formula (PA-1) can also be appropriately selected. For example, use can be made of ionic compounds each containing a proton acceptor moiety at its cation part. In particular, use can be made of the compounds of general formula (7) below and the like.

$$(R \rightarrow_{m} \overset{+}{A} \leftarrow R_N)_n \quad X^- \qquad (7)$$

in which

A represents a sulfur atom or an iodine atom;

m is 1 or 2 and n is 1 or 2, provided that m+n=3 when A is a sulfur atom and that m+n=2 when A is an iodine atom;

R represents an aryl group;

$R_N$ represents an aryl group substituted with the functional group with proton acceptor properties; and $X^-$ represents a counter anion.

As particular examples of $X^-$, there can be mentioned those as represented by $Z^-$ in general formula (ZI) to be described hereinafter.

A preferred example of the aryl groups represented by R and $R_N$ is a phenyl group.

Specific examples of the functional groups with proton acceptor properties introduced in $R_N$ are the same as mentioned above in connection with formula (PA-1).

Specific examples of ionic compounds each containing a proton acceptor moiety at its cation part will be shown below.

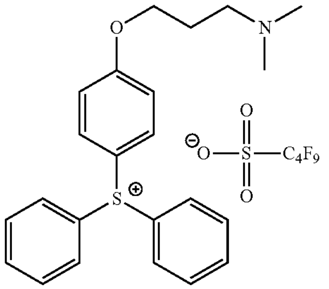

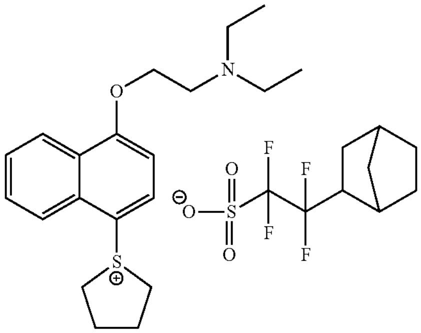

-continued

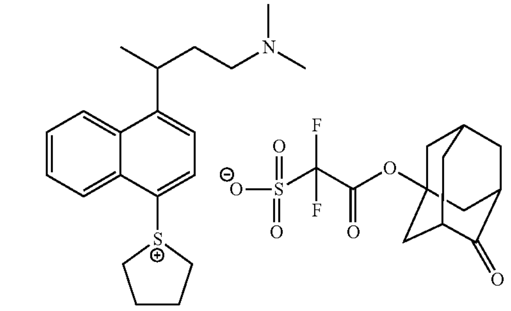

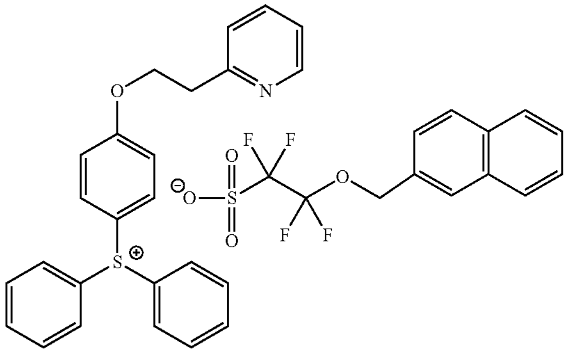

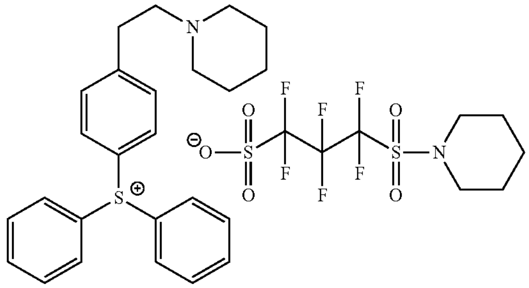

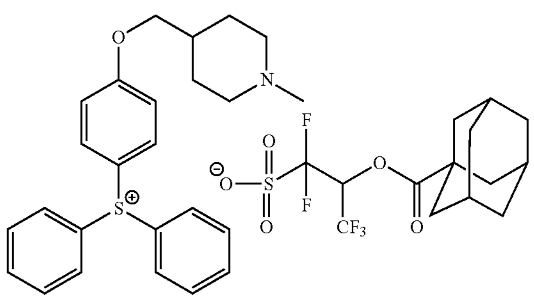

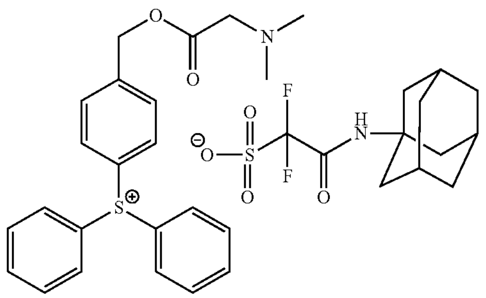

-continued

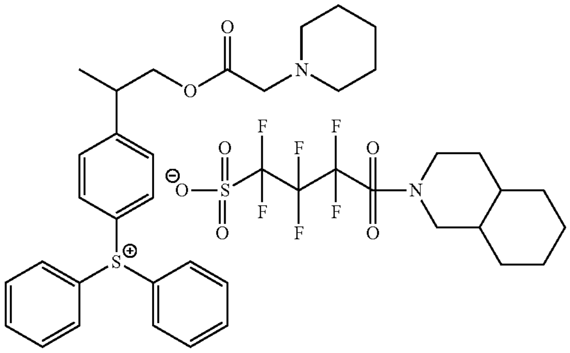

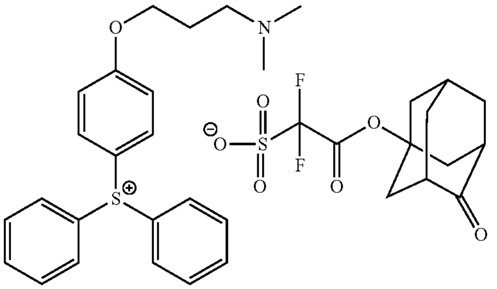

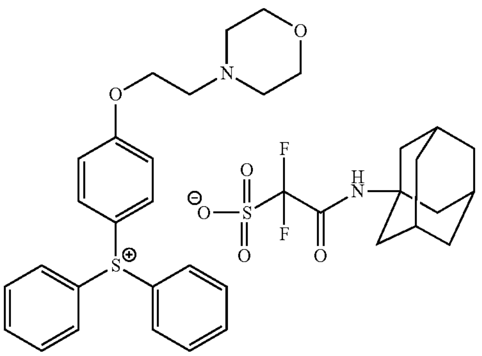

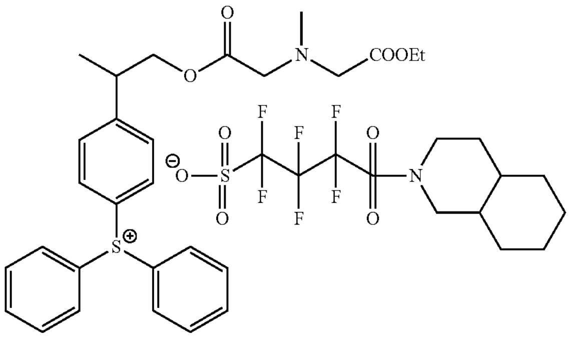

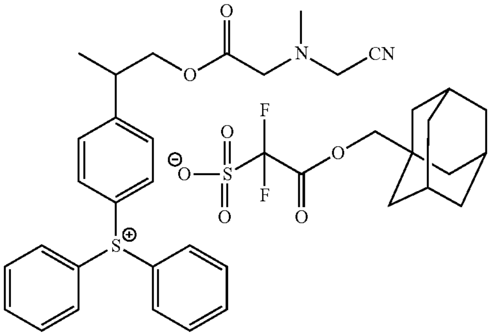

-continued

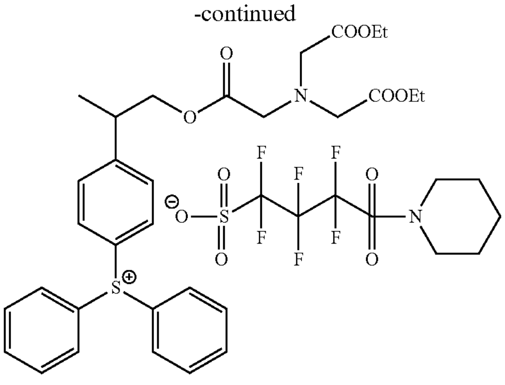

Such compounds may be synthesized, for example, with reference to the methods described in JP-A-2007-230913 and JP-A-2009-122623.

A single type of compound (PA) may be used alone, or two or more types of compounds (PA) may be used in combination.

The content of compound (PA) based on the total solids of the composition is preferably in the range of 0.1 to 10 mass %, more preferably 1 to 8 mass %.

(C) Acid Generator

The composition according to the present invention contains an acid generator.

As the acid generator, use can be made of a member appropriately selected from among a photoinitiator for photocationic polymerization, a photoinitiator for photoradical polymerization, a photo-achromatic agent and photo-discoloring agent for dyes, any of publicly known compounds that generate an acid when exposed to actinic rays or radiation employed in microresists, etc., and mixtures thereof.

As the acid generator, a diazonium salt, a phosphonium salt, a sulfonium salt, an iodonium salt, an imide sulfonate, an oxime sulfonate, diazosulfone, disulfone and o-nitrobenzyl sulfonate can be exemplified.

Further, use can be made of compounds obtained by introducing any of the above groups or compounds that generate an acid when exposed to actinic rays or radiation in a polymer principal chain or side chain, for example, compounds described in U.S. Pat. No. 3,849,137, DE 3914407, JP-A's-63-26653, 55-164824, 62-69263, 63-146038, 63-163452, 62-153853, 63-146029, etc.

Furthermore, use can be made of compounds that generate an acid when exposed to light described in U.S. Pat. No. 3,779,778, EP 126,712, etc.

As preferred compounds among the acid generators, those represented by the following general formulae (ZI), (ZII) and (ZIII) can be exemplified.

(ZI)

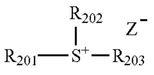

(ZII)

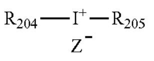

(ZIII)

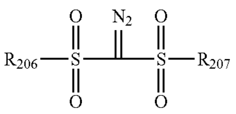

In the above general formula (ZI), each of $R_{201}$, $R_{202}$ and $R_{203}$ independently represents an organic group.

The number of carbon atoms in the organic group represented by $R_{201}$, $R_{202}$ and $R_{203}$ is generally in the range of 1 to 30, preferably 1 to 20.

Two of $R_{201}$ to $R_{203}$ may be bonded to each other to thereby form a ring structure. The ring structure may contain therein an oxygen atom, a sulfur atom, an ester group, an amido group or a carbonyl group. As the group formed by the mutual bonding of two of $R_{201}$ to $R_{203}$, there can be mentioned, for example, an alkylene group, such as a butylene group or a pentylene group.

$Z^-$ represents a nonnucleophilic anion.

As the nonnucleophilic anion represented by $Z^-$, a sulfonate anion, a carboxylate anion, a sulfonylimido anion, a bis(alkylsulfonyl)imido anion, and a tris(alkylsulfonyl)methide anion can be exemplified.

The nonnucleophilic anion means an anion whose capability of inducing a nucleophilic reaction is extremely low. Any decomposition over time attributed to an intramolecular nucleophilic reaction can be suppressed by the use of this anion. Therefore, when this anion is used, the stability over time of the relevant composition and the film formed therefrom can be enhanced.

As the sulfonate anion, an aliphatic sulfonate anion, an aromatic sulfonate anion, and a camphor sulfonate anion can be exemplified.

As the carboxylate anion, an aliphatic carboxylate anion, an aromatic carboxylate anion, and an aralkyl carboxylate anion can be exemplified.

The aliphatic moiety of the aliphatic sulfonate anion may be an alkyl group or a cycloalkyl group, being preferably an alkyl group having 1 to 30 carbon atoms or a cycloalkyl group having 3 to 30 carbon atoms. As such, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group can be exemplified.

As a preferred aromatic group of the aromatic sulfonate anion, an aryl group having 6 to 14 carbon atoms, such as a phenyl group, a tolyl group and a naphthyl group can be exemplified.

The alkyl group, cycloalkyl group and aryl group of the aliphatic sulfonate anion and aromatic sulfonate anion may have one or more substituents. As the substituent of the alkyl group, cycloalkyl group and aryl group of the aliphatic sulfonate anion and aromatic sulfonate anion, a nitro group, a halogen atom (fluorine atom, chlorine atom, bromine atom or iodine atom), a carboxy group, a hydroxy group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms) can be exemplified. The aryl group or ring structure of these groups may further have an alkyl group (preferably having 1 to 15 carbon atoms) or a cycloalkyl group (preferably having 3 to 15 carbon atoms) as its substituent.

As the aliphatic moiety of the aliphatic carboxylate anion, the same alkyl groups and cycloalkyl groups as mentioned with respect to the aliphatic sulfonate anion can be exemplified.

As the aromatic group of the aromatic carboxylate anion, the same aryl groups as mentioned with respect to the aromatic sulfonate anion can be exemplified.

As a preferred aralkyl group of the aralkyl carboxylate anion, an aralkyl group having 6 to 12 carbon atoms, such as a benzyl group, a phenethyl group, a naphthylmethyl group, a naphthylethyl group, and a naphthylbutyl group can be exemplified.

The alkyl group, cycloalkyl group, aryl group and aralkyl group of the aliphatic carboxylate anion, aromatic carboxylate anion and aralkyl carboxylate anion may have a substituent. As the substituent of the alkyl group, cycloalkyl group, aryl group and aralkyl group of the aliphatic carboxylate anion, aromatic carboxylate anion and aralkyl carboxylate anion, the same halogen atom, alkyl group, cycloalkyl group, alkoxy group, and alkylthio group, etc. as mentioned with respect to the aromatic sulfonate anion can be exemplified.

As the sulfonylimido anion, a saccharin anion can be exemplified.

The alkyl group of the bis(alkylsulfonyl)imido anion and tris(alkylsulfonyl)methyl anion is preferably an alkyl group having 1 to 5 carbon atoms. As such, a methyl group, an ethyl group, a propyl group, an isopropyl group, an n-butyl group, an isobutyl group, a sec-butyl group, a pentyl group, and a neopentyl group can be exemplified. As a substituent of these alkyl groups, a halogen atom, an alkyl group substituted with a halogen atom, an alkoxy group, an alkylthio group, an alkyloxysulfonyl group, an aryloxysulfonyl group, and a cycloalkylaryloxysulfonyl group can be exemplified. An alkyl group substituted with a fluorine atom is preferred.

As the other nonnucleophilic anions, phosphorus fluoride, boron fluoride and antimony fluoride can be exemplified.

The nonnucleophilic anion represented by $Z^-$ is preferably selected from among an aliphatic sulfonate anion substituted at its $\alpha$-position of sulfonic acid with a fluorine atom, an aromatic sulfonate anion substituted with a fluorine atom or a group having a fluorine atom, a bis(alkylsulfonyl)imido anion whose alkyl group is substituted with a fluorine atom and a tris(alkylsulfonyl)methide anion whose alkyl group is substituted with a fluorine atom. More preferably, the nonnucleophilic anion is a perfluorinated aliphatic sulfonate anion having 4 to 8 carbon atoms or a benzene sulfonate anion having a fluorine atom. Still more preferably, the nonnucleophilic anion is a nonafluorobutane sulfonate anion, a perfluorooctane sulfonate anion, a pentafluorobenzene sulfonate anion or a 3,5-bis(trifluoromethyl)benzene sulfonate anion.

Further, as the preferred sulfonate anion, an anion configured to generate the acid represented by general formula (I) below can be exemplified.

(I)

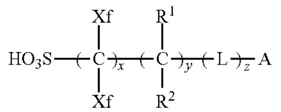

In the formula, each of Xfs independently represents a fluorine atom or an alkyl group having at least one hydrogen atom thereof substituted with one or more fluorine atoms. Each of $R^1$ and $R^2$ independently represents a hydrogen atom, a fluorine atom, an alkyl group or an alkyl group having at least one hydrogen atom thereof substituted with one or more fluorine atoms. When $y \geqq 2$, the multiple $R^1$s, and also the multiple $R^2$s, may be identical to or different from each other. L represents a single bond or a bivalent connecting group. When $z \geqq 2$, the multiple Ls may be identical to or different from each other. A represents an organic group with a cyclic structure. In the formula, x is an integer of 1 to 20, y an integer of 0 to 10 and z an integer of 0 to 10.

The general formula (I) will be described in greater detail below.

The alkyl group in Xf preferably has 1 to 10 carbon atoms, and more preferably 1 to 4 carbon atoms. The alkyl group having at least one hydrogen atom thereof substituted with one or more fluorine atoms is preferably a perfluoroalkyl group.

Xf is preferably a fluorine atom or a perfluoroalkyl group having 1 to 4 carbon atoms. In particular, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$. Of these, a fluorine atom and $CF_3$ are preferred. A fluorine atom is most preferred.

The alkyl group represented by $R^1$ and $R^2$ may contain a substituent (preferably a fluorine atom) and preferably has 1 to 4 carbon atoms. The alkyl group more preferably is a perfluoroalkyl group having 1 to 4 carbon atoms. In particular, there can be mentioned $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$. Of these, $CF_3$ is preferred.

Each of $R^1$ and $R^2$ is more preferably a fluorine atom or $CF_3$.

In the formula, y is preferably 0 to 4, more preferably 0; x is preferably 1 to 8, more preferably 1 to 4; and z is preferably 0 to 8, more preferably 0 to 4. As the bivalent connecting group represented by L, there can be mentioned, for example, —COO—, —COO—, —CO—, —O—, —S—, —SO—, —$SO_2$—, an alkylene group, a cycloalkylene group or an alkenylene group. Of these, —COO—, —COO—, —CO—, —O—, and —$SO_2$— are preferred. —COO—, —COO—, and —$SO_2$— are more preferred.

As the organic group with a cyclic structure represented by A, there can be mentioned, for example, an alicyclic group, an aryl group or a group with a heterocyclic structure (in which aromaticity is optional).

The alicyclic group represented by A may either be monocyclic or polycyclic. As the alicyclic group of a single ring, a monocyclic cycloalkyl group such as a cyclopentyl group, a cyclohexyl group, or a cyclooctyl group is preferred. As the alicyclic group of multiple rings, a polycyclic cycloalkyl group such as a norbornyl group, a tricyclodecanyl group, a tetracyclodecanyl group, a tetracyclododecanyl group or an adamantyl group is preferred. In particular, employing a bulky alicyclic group which has a ring having 7 or more carbon atoms such as a norbornyl group, a tricyclodecanyl group, a tetracyclodecanyl group, a tetracyclododecanyl group, and an adamantyl group as the group A can reduce in-film diffusion in the PEB (post-exposure bake) stage, thereby enhancing MEEF (Mask Error Enhancement Factor).

The aryl group represented by A is, for example, a phenyl group, a naphthyl group, a phenanthryl group or an anthryl group. Of these, a naphthyl group exhibiting a low absorbance to a light of 193 nm wavelength is especially preferably used.

As the group with the heterocyclic structure, those with a furan ring, a thiophene ring, a benzofuran ring, a benzothiophene ring, a dibenzofuran ring, a dibenzothiophene ring, a pyridine ring, and a pyperidine ring can be exemplified. Of these, those with a furan ring, a thiophene ring, a pyridine ring or a pyperidine ring are particularly preferred.

Further, a cyclic structure with a lactone unit can also be employed as the group with the heterocyclic structure. As such, lactone structures represented by general formulae (LC1-1) to (LC1-17) described earlier can be exemplified.

The above group with a cyclic structure may have a substituent. As the substituent, there can be mentioned an alkyl group (may be linear, branched or cyclic, preferably having 1 to 12 carbon atoms), a cycloalkyl group (may be monocyclic, polycyclic, or spirocyclic, preferably having 3 to 12 carbon atoms), an aryl group (preferably having 6 to 14 carbon atoms), a hydroxyl group, an alkoxy group, an ester group, an amido group, a urethane group, a ureido group, a thioether group, a sulfonamido group, a sulfonic ester group or the like. Carbon atom constituting the cyclic structure (that is, carbon atom contributing ring formation) may be carbonyl carbon atom.

As the aliphatic moiety of the aliphatic carboxylate anion, the same alkyl groups and cycloalkyl groups as mentioned with respect to the aliphatic sulfonate anion can be exemplified.

As the aromatic group of the aromatic carboxylate anion, the same aryl groups as mentioned with respect to the aromatic sulfonate anion can be exemplified.

As a preferred aralkyl group of the aralkyl carboxylate anion, an aralkyl group having 7 to 12 carbon atoms, such as a benzyl group, a phenethyl group, a naphthylmethyl group, a naphthylethyl group, and a naphthylbutyl group can be exemplified.

The alkyl group, cycloalkyl group, aryl group and aralkyl group of the aliphatic carboxylate anion, aromatic carboxylate anion and aralkyl carboxylate anion may have one or more substituents. As the substituent of the alkyl group, cycloalkyl group, aryl group and aralkyl group of the aliphatic carboxylate anion, aromatic carboxylate anion and aralkyl carboxylate anion, the same halogen atom, alkyl group, cycloalkyl group, alkoxy group, and alkylthio group, etc. as mentioned with respect to the aromatic sulfonate anion can be exemplified.

As the sulfonylimido anion, a saccharin anion can be exemplified.

The alkyl group of the bis(alkylsulfonyl)imido anion and tris(alkylsulfonyl)methide anion is preferably an alkyl group having 1 to 5 carbon atoms. As such, a methyl group, an ethyl group, a propyl group, an isopropyl group, an n-butyl group, an isobutyl group, a sec-butyl group, a pentyl group, and a neopentyl group can be exemplified. As a substituent of these alkyl groups, a halogen atom, an alkyl group substituted with a halogen atom, an alkoxy group, an alkylthio group, an alkyloxysulfonyl group, an aryloxysulfonyl group, and a cycloalkylaryloxysulfonyl group can be exemplified. An alkyl group substituted with one or more fluorine atoms is preferred.

The two alkyl groups contained in the bis(alkylsulfonyl) imide anion may be identical to or different from each other. Similarly, the multiple alkyl groups contained in the tris (alkylsulfonyl)methide anion may be identical to or different from each other.

In particular, as the bis(alkylsulfonyl)imide anion and tris (alkylsulfonyl)methide anion, there can be mentioned the anions of general formulae (A3) and (A4) below.

(A3)

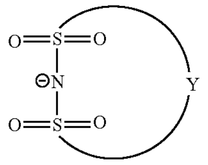

(A4)

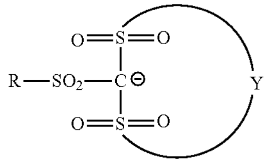

In general formulae (A3) and (A4),

Y represents an alkylene group substituted with at least one fluorine atom, preferably having 2 to 4 carbon atoms. An oxygen atom may be contained in the alkylene chain. Further preferably, Y is a perfluoroalkylene group having 2 to 4 carbon atoms. Most preferably, Y is a tetrafluoroethylene group, a hexafluoropropylene group or an octafluorobutylene group.

In formula (A4), R represents an alkyl group or a cycloalkyl group. An oxygen atom may be contained in the alkylene chain of the alkyl group or cycloalkyl group.

As the compounds containing the anions of general formulae (A3) and (A4), there can be mentioned, for example, particular examples set forth in JP-A-2005-221721.

As the other nonnucleophilic anions, phosphorus fluoride, boron fluoride and antimony fluoride can be exemplified.

The nonnucleophilic anion represented by $Z^-$ is preferably selected from among an aliphatic sulfonate anion substituted at its α-position of sulfonic acid with a fluorine atom, an aromatic sulfonate anion substituted with a fluorine atom or a group having a fluorine atom, a bis(alkylsulfonyl)imido anion whose alkyl group is substituted with a fluorine atom and a tris(alkylsulfonyl)methide anion whose alkyl group is substituted with a fluorine atom. More preferably, the nonnucleophilic anion is a perfluorinated aliphatic sulfonate anion having 4 to 8 carbon atoms or a benzene sulfonate anion having a fluorine atom. Still more preferably, the nonnucleophilic anion is a nonafluorobutane sulfonate anion, a perfluorooctane sulfonate anion, a pentafluorobenzene sulfonate anion or a 3,5-bis(trifluoromethyl)benzene sulfonate anion.

As the organic groups represented by $R_{201}$, $R_{202}$ and $R_{203}$ in general formula (ZI), there can be mentioned, for example, the corresponding groups of compounds (ZI-1), (ZI-2), (ZI-3) or (ZI-4) to be described hereinafter.

Compounds having two or more of the structures of the general formula (ZI) may be used as the acid generator. For example, use may be made of a compound having a structure in which at least one of the $R_{201}$ to $R_{203}$ of one of the compounds of the general formula (ZI) is bonded to at least one of the $R_{201}$ to $R_{203}$ of another of the compounds of the general formula (ZI).

As preferred (ZI) components, the following compounds (ZI-1) to (ZI-4) can be exemplified.

The compounds (ZI-1) are arylsulfonium compounds of the general formula (ZI) wherein at least one of $R_{201}$ to $R_{203}$ is an aryl group, namely, compounds containing an arylsulfonium as a cation.

In the arylsulfonium compounds, all of the $R_{201}$ to $R_{203}$ may be aryl groups. It is also appropriate that the $R_{201}$ to $R_{203}$ are partially an aryl group and the remainder is an alkyl group or a cycloalkyl group.

As the arylsulfonyl compound, there can be mentioned, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, nitrogen atom, sulfur atom or the like. As the aryl group having a heterocyclic structure, a pyrrole residue, a furan residue, a thiophene residue, an indole residue, a benzofuran residue, and a benzothiophene residue can be exemplified. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, a methyl group, an ethyl group, a propyl group, an n-butyl group, a sec-butyl group, a t-butyl group, a cyclopropyl group, a cyclobutyl group, and a cyclohexyl group can be exemplified.

The aryl group, alkyl group or cycloalkyl group represented by $R_{201}$ to $R_{203}$ may have one or more substituents. As the substituent, an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxy group, and a phenylthio group can be exemplified. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 6 carbon atoms and an alkoxy group having 1 to 6 carbon atoms. The substituents may be contained in any one of the three $R_{201}$ to $R_{203}$, or alternatively may be contained in all three of $R_{201}$ to $R_{203}$. When $R_{201}$ to $R_{203}$ represent a phenyl group, the substituent preferably lies at the p-position of the phenyl group.

Now, the compounds (ZI-2) will be described.

The compounds (ZI-2) are compounds represented by the formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a 2-oxoalkyl group, an alkoxycarbonylmethyl group, an allyl group, and a vinyl group. More preferred groups include a linear or branched 2-oxoalkyl group and an alkoxycarbonylmethyl group. Especially preferred is a linear or branched 2-oxoalkyl group.

As preferred alkyl groups and cycloalkyl groups represented by $R_{201}$ to $R_{203}$, a linear or branched alkyl group having 1 to 10 carbon atoms (for example, a methyl group, an ethyl group, a propyl group, a butyl group or a pentyl group) and a cycloalkyl group having 3 to 10 carbon atoms (for example, a cyclopentyl group, a cyclohexyl group or a norbornyl group) can be exemplified. As more preferred alkyl groups, a 2-oxoalkyl group and an alkoxycarbonylmethyl group can be exemplified. As more preferred cycloalkyl group, a 2-oxocycloalkyl group can be exemplified.

The 2-oxoalkyl group may be linear or branched. A group having >C═O at the 2-position of the above-described alkyl group can be preferably exemplified.

The 2-oxocycloalkyl group is preferably a group having >C═O at the 2-position of the above-described cycloalkyl group.

As preferred alkoxy groups of the alkoxycarbonylmethyl group, alkoxy groups having 1 to 5 carbon atoms can be exemplified. As such, there can be mentioned, for example, a methoxy group, an ethoxy group, a propoxy group, a butoxy group and a pentoxy group.

The organic groups containing no aromatic ring represented by $R_{201}$ to $R_{203}$ may further have one or more substituents. As the substituents, a halogen atom, an alkoxy group (having, for example, 1 to 5 carbon atoms), a hydroxy group, a cyano group and a nitro group can be exemplified.

The compounds (ZI-3) are those represented by the following general formula (ZI-3) which have a phenacylsulfonium salt structure.

(ZI-3)

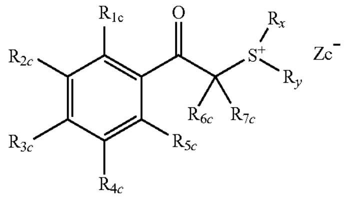

In general formula (ZI-3), each of $R_{1c}$ to $R_{5c}$ independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

Each of $R_{6c}$ and $R_{7c}$ independently represents a hydrogen atom, an alkyl group, a cycloalkyl group, halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$ may be bonded with each other to thereby form a ring structure. This ring structure may contain an oxygen atom, a sulfur atom, an ester bond or an amido bond.

As the ring structure, an aromatic or nonaromatic hydrocarbon ring, an aromatic or nonaromatic heterocycle, or a condensed ring formed by combination of two or more of these rings. As the ring structure, 3 to 10-membered ring can be exemplified. The ring structure is preferably 4 to 8-membered, and more preferably 5 or 6-membered.

As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

As the group formed by combining $R_{5c}$ and $R_{6c}$ or $R_{5C}$ and $R_x$, a single bond or an alkylene bond is preferred. As the alkylene bond, a methylene bond or an ethylene group can be exemplified.

$Zc^-$ represents a nonnucleophilic anion. There can be mentioned the same nonnucleophilic anions as mentioned with respect to the $Z^-$ of the general formula (ZI).

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). As the cycloalkyl group, there can be mentioned, for example, a cycloalkyl group having 3 to 10 carbon atoms (for example, a cyclopentyl group or a cyclohexyl group).

The aryl group represented by $R_{1c}$ to $R_{5c}$ is preferably the one having 5 to 15 carbon atoms. As such, a phenyl group or a naphthyl group can be exemplified.

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 10 carbon atoms (for example, a cyclopentyloxy group or a cyclohexyloxy group).

As specific examples of alkoxy group in the alkoxycarbonyl group represented by $R_{1c}$ to $R_{5c}$ are the same as those of the alkoxy group represented by $R_{1c}$ to $R_{5c}$.

As specific examples of alkyl group in the alkylcarbonyloxy group and an alkylthio group represented by $R_{1c}$ to $R_{5c}$ are the same as those of the alkyl group represented by $R_{1c}$ to $R_{5c}$.

As specific examples of cycloalkyl group in the cycloalkylcarbonyloxy group represented by $R_{1c}$ to $R_{5c}$ are the same as those of the cycloalkyl group represented by $R_{1c}$ to $R_{5c}$.

As specific examples of aryl group in the aryloxy group and arylthio group represented by $R_{1c}$ to $R_{5c}$ are the same as those of the aryl group represented by $R_{1c}$ to $R_{5c}$.

More preferably, at least one of $R_{1c}$ to $R_{5c}$ is a linear or branched alkyl group, a cycloalkyl group, or a linear, branched or cyclic alkoxy group. Furthermore preferably, the sum of the number of carbon atoms in $R_{1c}$ to $R_{5c}$ is in the range of 2 to 15. This can increase solubility in solvent thereby suppressing formation of particles during storage.

As the ring structure that may be formed by the mutual bonding of any two of $R_{1c}$ to $R_{5c}$, there can be mentioned a 5-membered or 6-membered ring, especially preferably a 6-membered ring (for example, a phenyl ring).

As the ring structure that may be formed by the mutual bonding of $R_{5c}$ and $R_{6c}$, there can be mentioned, for example, 4 or more-membered ring (especially 5 or 6-membered ring) formed together with a carbonyl carbon atom and other carbon atoms in general formula (ZI-3) wherein a single bond or an alkylene group (methylene group, ethylene group, or the like) is formed by the mutual bonding of $R_{5c}$ and $R_{6c}$.

Each of the aryl groups represented by $R_{6c}$ and $R_{7c}$ preferably has 5 to 15 carbon atoms. As such, there can be mentioned, for example, a phenyl group or a naphthyl group.

When $R_{6c}$ and $R_{7c}$ are bonded to each other to thereby form a ring, the group formed by the bonding of $R_{6c}$ and $R_{7c}$ is preferably an alkylene group having 2 to 10 carbon atoms. As such, there can be mentioned, for example, an ethylene group, a propylene group, a butylene group, a pentylene group, a hexylene group or the like. Further, the ring formed by the bonding of $R_{6c}$ and $R_{7c}$ may have a heteroatom, such as an oxygen atom, in the ring.

As the alkyl groups and cycloalkyl groups represented by $R_x$ and $R_y$, there can be mentioned the same alkyl groups and cycloalkyl groups as set forth above with respect to $R_{1c}$ to $R_{7c}$.

As the 2-oxoalkyl group and 2-oxocycloalkyl group represented by $R_x$ and $R_y$, there can be mentioned the alkyl group and cycloalkyl group represented by $R_{1c}$ to $R_{7c}$ having >C═O at the 2-position thereof.

With respect to the alkoxy group of the alkoxycarbonylalkyl group represented by $R_x$ and $R_y$, there can be mentioned the same alkoxy groups as mentioned above with respect to $R_{1c}$ to $R_{5c}$. As the alkyl group thereof, there can be mentioned, for example, an alkyl group having 1 to 12 carbon atoms, preferably a linear alkyl group having 1 to 5 carbon atoms (e.g., a methyl group or an ethyl group).

The allyl groups represented by $R_x$ and $R_y$ are not particularly limited. However, preferred use is made of an unsubstituted allyl group or an allyl group substituted with a cycloalkyl group of a single ring or multiple rings (especially the one having 3 to 10 carbon atoms).

The vinyl groups represented by $R_x$ and $R_y$ are not particularly limited. However, preferred use is made of an unsubstituted vinyl group or an vinyl group substituted with a cycloalkyl group of a single ring or multiple rings (especially the one having 3 to 10 carbon atoms).

As the ring structure that may be formed by the mutual bonding of $R_{5c}$ and $R_x$, there can be mentioned, for example, 5 or more-membered ring (especially 5-membered ring) formed together with a sulfur atom and a carbonyl carbon atom in general formula (ZI-3) wherein a single bond or an alkylene group (methylene group, ethylene group, or the like) is formed by the mutual bonding of $R_{5c}$ and $R_{6c}$.

As the ring structure that may be formed by the mutual bonding of $R_x$ and $R_y$, there can be mentioned a 5-membered or 6-membered ring, especially preferably a 5-membered ring (namely, a tetrahydrothiophene ring), formed by bivalent $R_x$ and $R_y$ (for example, a methylene group, an ethylene group, a propylene group or the like) in cooperation with the sulfur atom of general formula (ZI-3).

Each of $R_x$ and $R_y$ is preferably an alkyl group or cycloalkyl group having preferably 4 or more carbon atoms. The alkyl group or cycloalkyl group has more preferably 6 or more carbon atoms and still more preferably 8 or more carbon atoms.

$R_{1c}$ to $R_{7c}$, $R_x$ and $R_y$ may further contain a substituent. As such, there can be mentioned, for example, a halogen atom (e.g. a fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkylgroup, an alkoxycarbonyl group, an aryloxycarbonyl group, an alkoxycarbonyloxy group, an aryloxycarbonyloxy group, or the like.

As the alkyl group, there can be mentioned, for example, a linear or branched alkyl group having 1 to 12 carbon atoms such as a methyl group, an ethyl group, a n-propyl group, an i-propyl group, a n-butyl group, a 2-methylpropyl group, a 1-methylpropyl group, a t-butyl group or the like.

As the cycloalkyl group, there can be mentioned, for example, the one having 3 to 10 carbon atoms such as a cyclopentyl group, a cyclohexyl group, or the like.

As the aryl group, there can be mentioned, for example, the one having 6 to 15 carbon atoms such as a phenyl group, a naphthyl group, or the like.

As the alkoxy group, there can be mentioned, for example, a linear, branched, or cyclic alkoxy group having 1 to 20 carbon atoms such as a methoxy group, an ethoxy group, a n-propoxy group, an i-propoxy group, a n-propoxy group, a n-butoxy group, a 2-methylpropoxy group, a 1-methylpropoxy group, a t-butoxy group, a cyclopentyloxy group, a cyclohexyloxy group, or the like.

As the aryloxy group, there can be mentioned, for example, the one having 6 to 10 carbon atoms such as a phenyloxy group, a naphthyloxy group, or the like.

As the acyl group, there can be mentioned, for example, a linear or branched acyl group having 2 to 12 carbon atoms such as an acetyl group, a propionyl group, a n-butanoyl group, an i-butanoyl group, a n-heptanoyl group, a 2-methylbutanoyl group, a 1-methylbutanoyl group, a t-heptanoyl group, or the like.

As the arylcarbonyl group, there can be mentioned, for example, the one having 6 to 10 carbon atoms such as a phenylcarbonyl group, a naphthylcarbonyl group, or the like.

As the alkoxyalkyl group, there can be mentioned, for example, a linear, branched or cyclic alkoxyalkyl group having 2 to 21 carbon atoms such as a methoxymethyl group, an ethoxymethyl group, a 1-methoxyethyl group, a 2-methoxyethyl group, a 1-ethoxyethyl group, a 2-ethoxyethyl group or the like.

As the aryloxyalkyl group, there can be mentioned, for example, the one having 7 to 12 carbon atoms such as a phenyloxymethyl group, a phenyloxyethyl group, a naphthyloxymethyl group, a naphthyloxyethyl group or the like.

As the alkoxycarbonyl group, there can be mentioned, for example, a linear, branched or cyclic alkoxycarbonyl group having 2 to 21 carbon atoms such as a methoxycarbonyl group, an ethoxycarbonyl group, a n-propoxycarbonyl group, an i-propoxycarbonyl group, a n-butoxycarbonyl group, a 2-methylpropoxycarbonyl group, a 1-methylpropoxycarbonyl group, a t-butoxycarbonyl group, a cyclopentyloxycarbonyl group, a cyclohexyloxycarbonyl group, or the like.

As the aryloxycarbonyl group, there can be mentioned, for example, the one having 7 to 11 carbon atoms such as a phenyloxycarbonyl group, a naphthyloxycarbonyl group, or the like.

As the alkoxycarbonyloxy group, there can be mentioned, for example, a linear, branched or cyclic alkoxycarbonyloxy group having 2 to 21 carbon atoms such as a methoxycarbonyloxy group, an ethoxycarbonyloxy group, a n-propoxycarbonyloxy group, an i-propoxycarbonyloxy group, a n-butoxycarbonyloxy group, a t-butoxycarbonyloxy group, a cyclopentyloxycarbonyloxy group, a cyclohexyloxycarbonyloxy group, or the like.

As the aryloxycarbonyloxy group, there can be mentioned, for example, the one having 7 to 11 carbon atoms such as a phenyloxycarbonyloxy group, a naphthyloxycarbonyloxy group, or the like.

In general formula (ZI-3), it is more preferred that each of $R_{1c}$, $R_{2c}$, $R_{4c}$, and $R_{5c}$ represents a hydrogen atom, and $R_{3c}$ represents a group other than a hydrogen atom, that is an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

Specific examples of the cation part in the compound (ZI-3) will be described below.

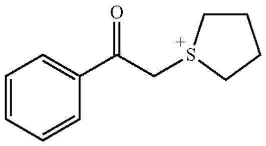
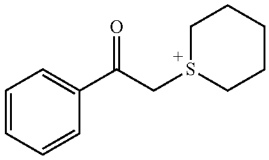
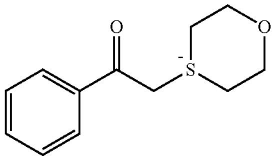
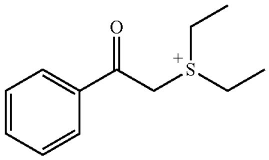
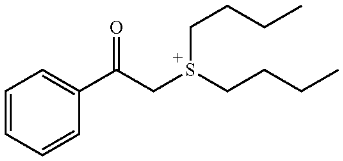
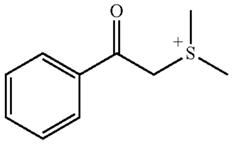
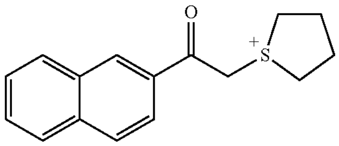
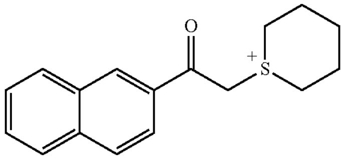
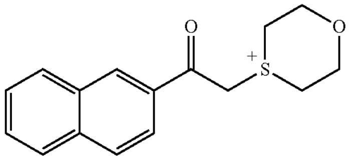
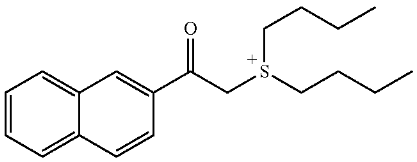
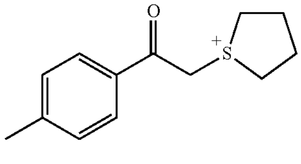
-continued
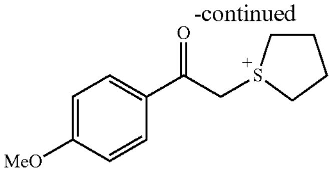
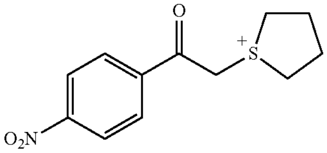
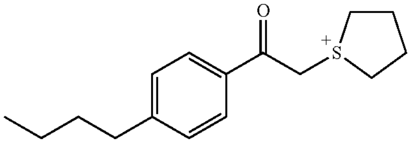
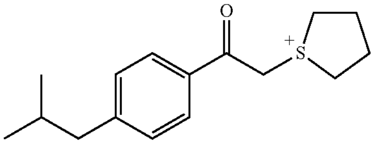
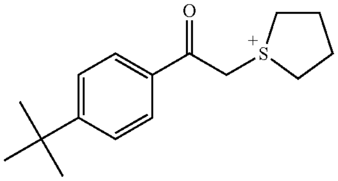
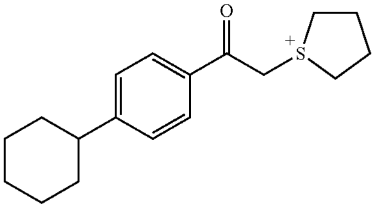
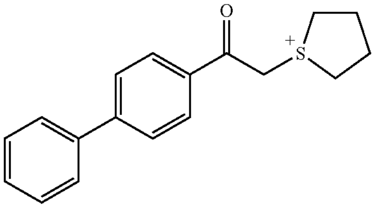
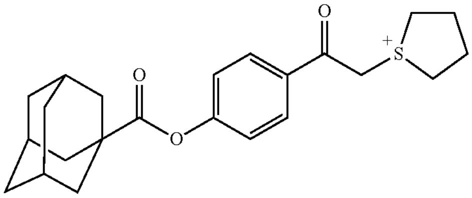
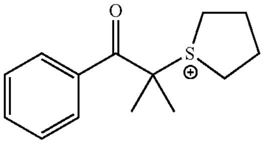
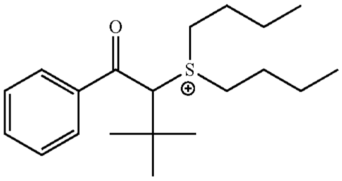

-continued
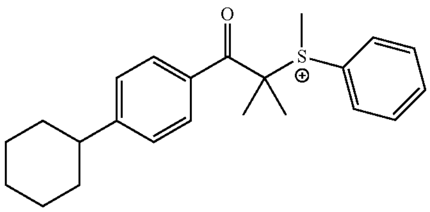
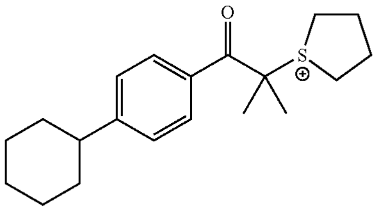
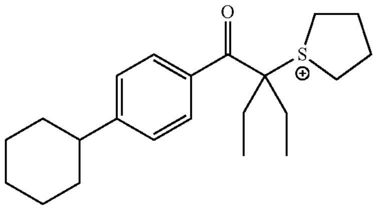
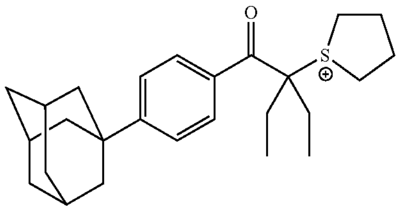
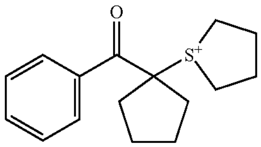
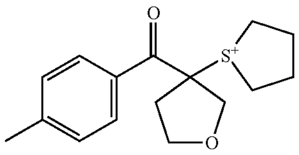
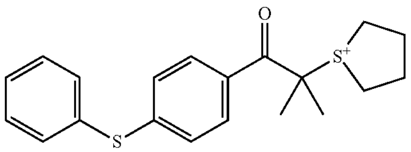
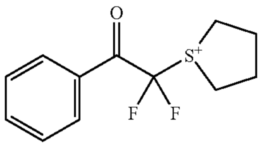
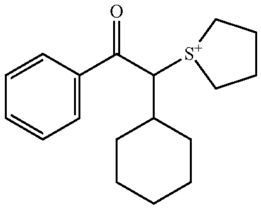
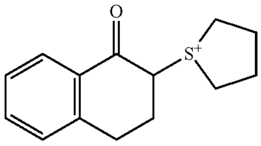
-continued
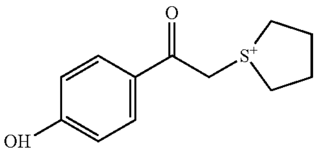
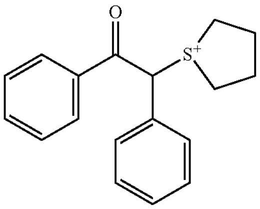
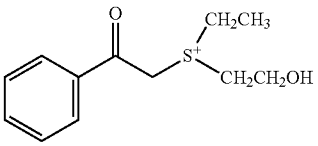
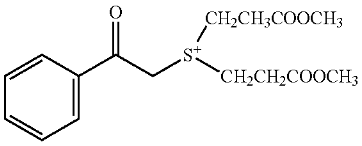
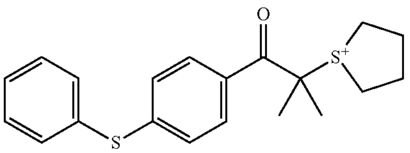
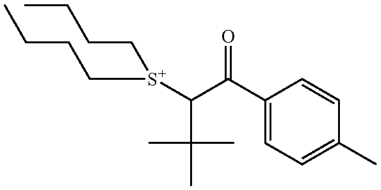
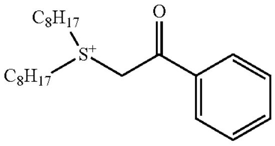
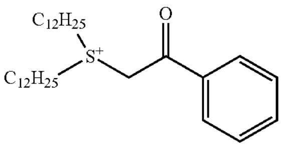
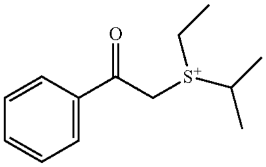
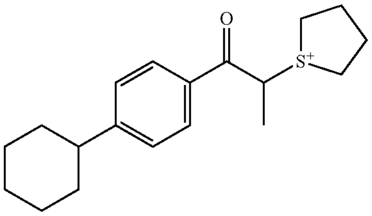

-continued

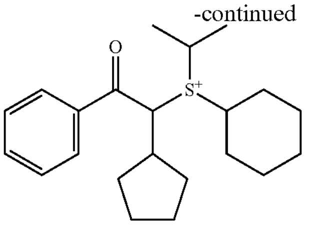

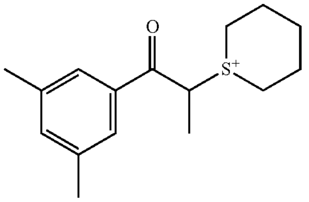

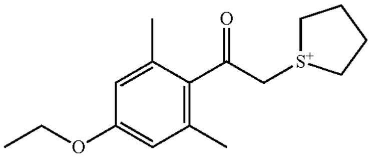

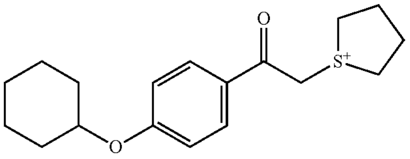

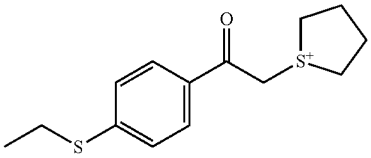

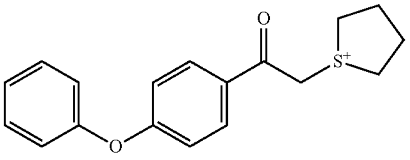

The compounds (ZI-4) are those of general formula (ZI-4) below.

(ZI-4)

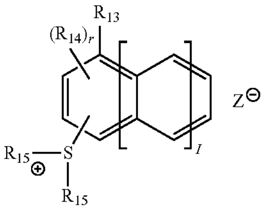

In general formula (ZI-4), $R_{13}$ represents any of a hydrogen atom, a fluorine atom, a hydroxyl group, an alkyl group, a cycloalkyl group, an alkoxy group, an alkoxycarbonyl group and a group with a cycloalkyl skeleton of a single ring or multiple rings. These groups may have one or more substituents.

$R_{14}$, each independently in the instance of $R_{14}$s, represents any of a hydroxyl group, an alkyl group, a cycloalkyl group, an alkoxy group, an alkoxycarbonyl group, an alkylcarbonyl group, an alkylsulfonyl group, a cycloalkylsulfonyl group and a group with a cycloalkyl group. These groups may have one or more substituents.

Each of $R_{15}$s independently represents an alkyl group, a cycloalkyl group or a naphthyl group, provided that the two $R_{15}$s may be bonded to each other to thereby form a ring. These groups may have one or more substituents.

In the formula, 1 is an integer of 0 to 2, and r is an integer of 0 to 8.

$Z^-$ represents a nonnucleophilic anion. As such, there can be mentioned any of the same nonnucleophilic anions as mentioned with respect to the $Z^-$ of the general formula (ZI).

In general formula (ZI-4), the alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are preferred.

As the cycloalkyl groups represented by $R_{13}$, $R_{14}$ and $R_{15}$, there can be mentioned a monocylic or polycyclic cycloalkyl group (preferably having 3 to 20 carbon atoms) such as cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl, adamantyl and the like. Cyclopropyl, cyclopentyl, cyclohexyl and cyclooctyl are especially preferred.

The alkoxy groups represented by $R_{13}$ and $R_{14}$ may be linear or branched and preferably each have 1 to 10 carbon atoms. As such, there can be mentioned, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group represented by $R_{13}$ and $R_{14}$ may be linear or branched and preferably has 2 to 11 carbon atoms. As such, there can be mentioned, for example, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

As the groups with a cycloalkyl group represented by $R_{13}$ and $R_{14}$, there can be mentioned, for example, those with a monocylic or polycyclic cycloalkyl group (preferably having 3 to 20 carbon atoms) can be mentioned. As such, a monocyclic or polucyclic cycloalkyloxy group and an alkoxy group with a cycloalkyl group of a single ring or multiple rings. These groups may further have one or more substituents.

With respect to each of the cycloalkyloxy groups of a single ring or multiple rings represented by $R_{13}$ and $R_{14}$, the sum of carbon atoms thereof is preferably 7 or greater, more preferably in the range of 7 to 15. Further, having a cycloalkyl skeleton of a single ring is preferred. The cycloalkyloxy group of a single ring of which the sum of carbon atoms is 7 or greater is one composed of a cycloalkyloxy group, such as a cyclopropyloxy group, a cyclobutyloxy group, a cyclopentyloxy group, a cyclohexyloxy group, a cycloheptyloxy group, a cyclooctyloxy group or a cyclododecanyloxy group, optionally having a substituent selected from among an alkyl group such as methyl, ethyl, propyl, butyl, pentyl, hexyl, heptyl, octyl, dodecyl, 2-ethylhexyl, isopropyl, sec-butyl, t-butyl or isoamyl, a hydroxyl group, a halogen atom (fluorine, chlorine, bromine or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, provided that the sum of carbon atoms thereof, including those of any optional substituent introduced in the cycloalkyl group, is 7 or greater.

As the cycloalkyloxy group of multiple rings of which the sum of carbon atoms is 7 or greater, there can be mentioned a norbornyloxy group, a tricyclodecanyloxy group, a tetracyclodecanyloxy group, an adamantyloxy group or the like.

With respect to each of the alkyloxy groups having a cycloalkyl group represented by $R_{13}$ and $R_{14}$, the sum of carbon atoms thereof is preferably 7 or greater, more preferably in the range of 7 to 15. Further, the alkoxy group having a cycloalkyl skeleton of a single ring is preferred. The alkoxy group having a cycloalkyl skeleton of a single ring of which the sum of carbon atoms is 7 or greater is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy or isoamyloxy, substituted with the above optionally substituted cycloalkyl group of a single ring, provided that the sum of carbon atoms thereof, including those of the substituents, is 7 or greater. For example, there can be mentioned a cyclohexylmethoxy group, a cyclopentylethoxy group, a cyclohexylethoxy group or the like. A cyclohexylmethoxy group is preferred.

As the alkoxy group having a cycloalkyl skeleton of multiple rings of which the sum of carbon atoms is 7 or greater, there can be mentioned a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group and the like. Of these, a norbornylmethoxy group, a norbornylethoxy group and the like are preferred.

With respect to the alkyl group of the alkylcarbonyl group represented by $R_{14}$, there can be mentioned the same specific examples as mentioned above with respect to the alkyl groups represented by $R_{13}$ to $R_{15}$.

The alkylsulfonyl and cycloalkylsulfonyl groups represented by $R_{14}$ may be linear, branched or cyclic and preferably each have 1 to 10 carbon atoms. As such, there can be mentioned, for example, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are preferred.

Each of the groups may have one or more substituents. As such substituents, there can be mentioned, for example, a halogen atom (e.g., a fluorine atom), a hydroxyl group, a carboxyl group, a cyano group, a nitro group, an alkoxy group, an alkoxyalkyl group, an alkoxycarbonyl group, an alkoxycarbonyloxy group or the like.

As the alkoxy group, there can be mentioned, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

As the alkoxyalkyl group, there can be mentioned, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group, there can be mentioned, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group, there can be mentioned, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-4). The cyclic structure may condense with an aryl group or a cycloalkyl group. The bivalent $R_{15}$s may have substituents. As such substituents, there can be mentioned, for example, a hydroxyl group, a carboxyl group, a cyano group, a nitro group, an alkoxy group, an alkoxyalkyl group, an alkoxycarbonyl group, an alkoxycarbonyloxy group and the like as mentioned above.

It is preferred for the $R_{15}$ of general formula (ZI-4) to be a methyl group, an ethyl group, the above-mentioned bivalent group allowing two $R_{15}$s to be bonded to each other so as to form a tetrahydrothiophene ring structure in cooperation with the sulfur atom of the general formula (ZI-4), or the like.

Each of $R_{13}$ and $R_{14}$ may have one or more substituents. As such substituents, there can be mentioned, for example, a hydroxyl group, an alkoxy group, an alkoxycarbonyl group, a halogen atom (especially, a fluorine atom) or the like.

In the formula, 1 is preferably 0 or 1, more preferably 1, and r is preferably 0 to 2.

Specific examples of the cation part in the compound (ZI-4) will be shown below.

-continued
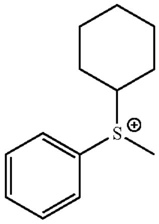
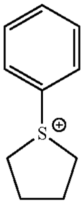
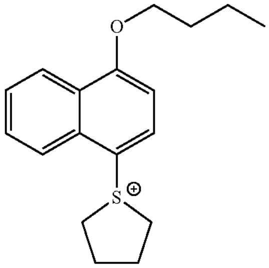
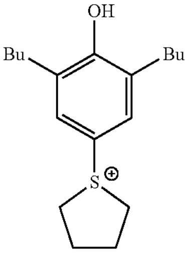
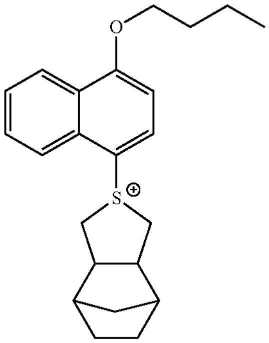
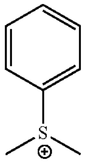
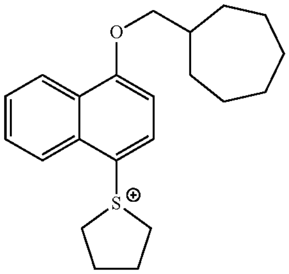
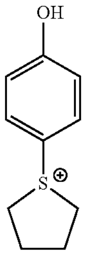
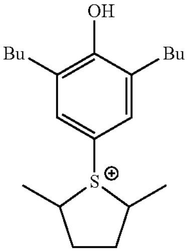
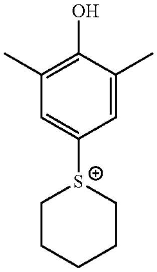
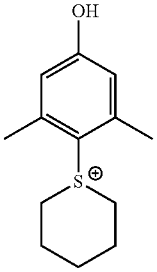
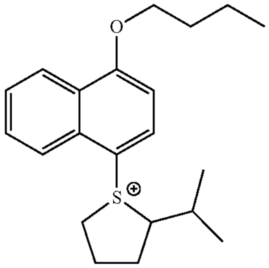
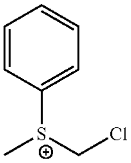
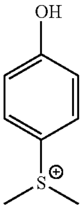
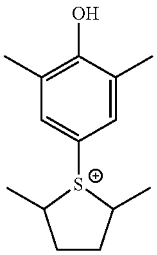
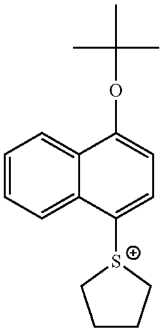
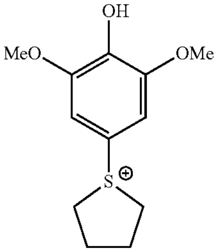
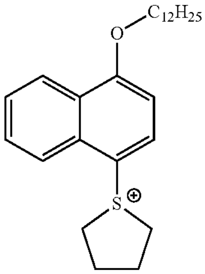
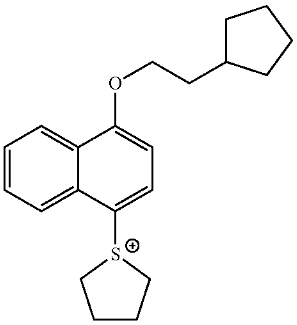
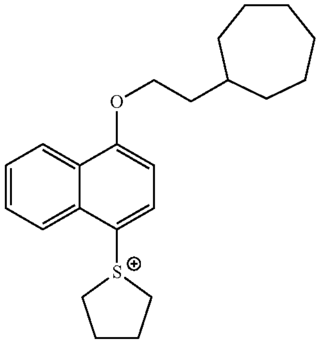
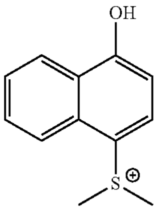
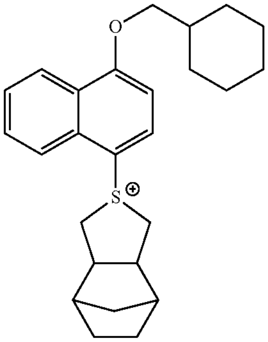
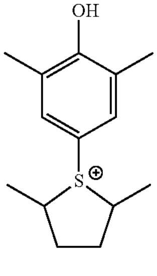
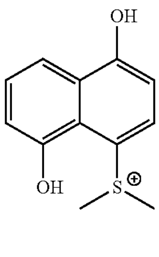
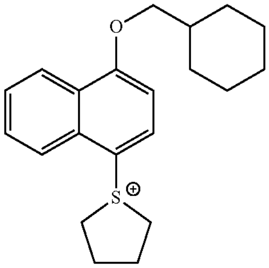

-continued
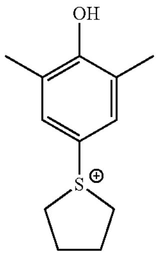
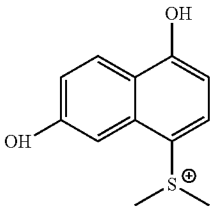
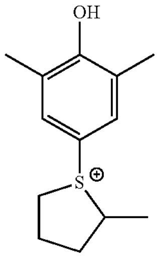
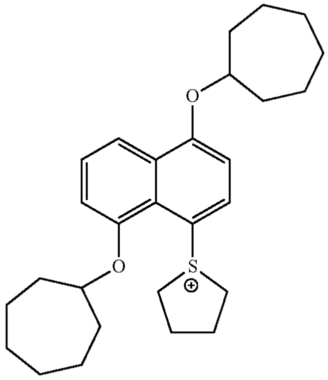
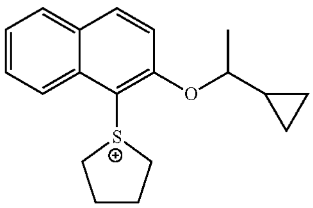
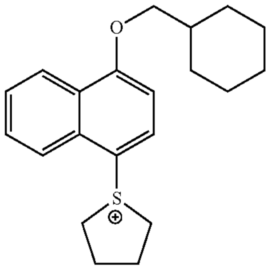
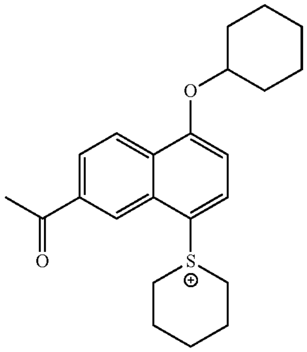
-continued
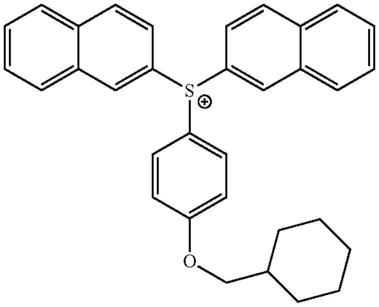
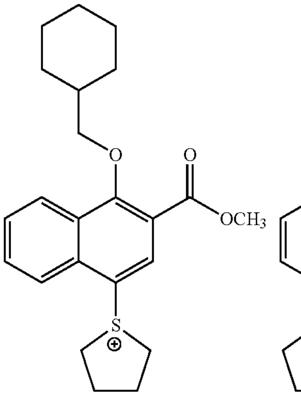
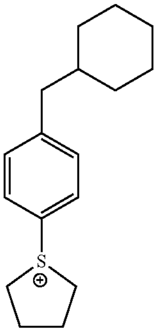
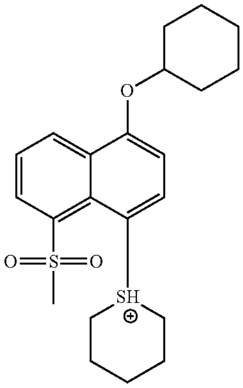
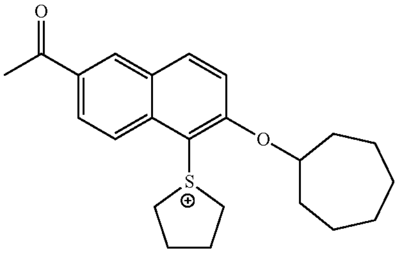
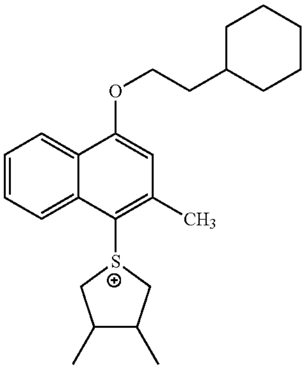

-continued

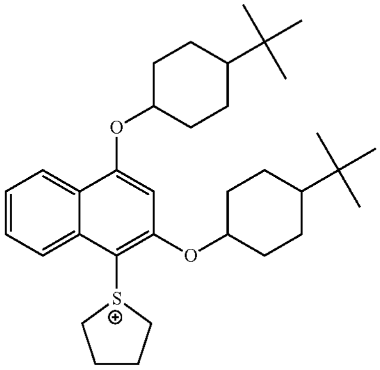

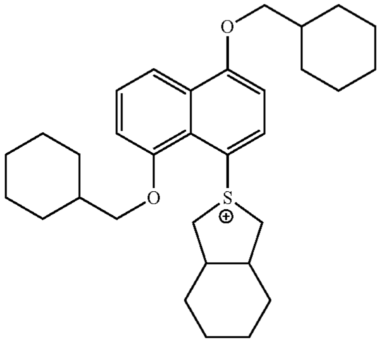

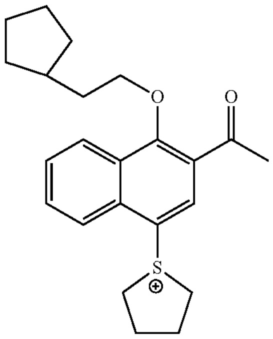

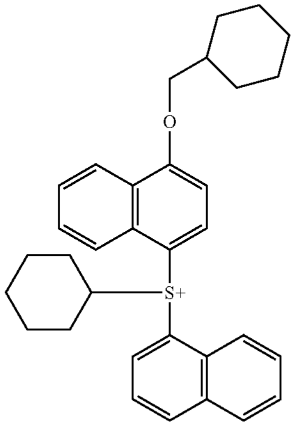

-continued

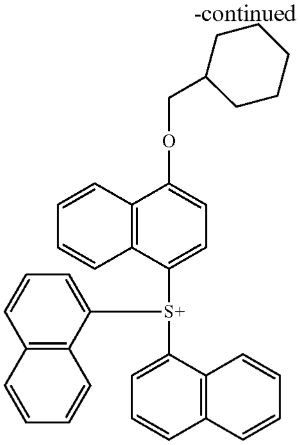

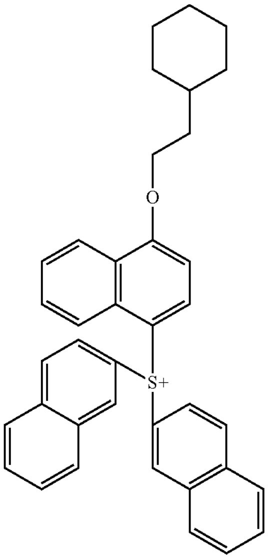

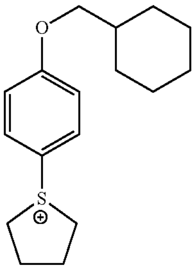

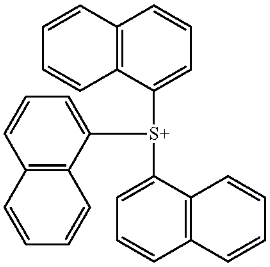

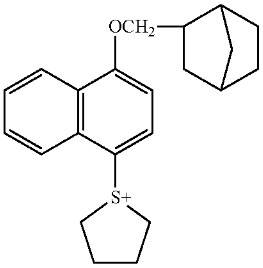

In general formulae (ZII) and (ZIII), each of $R_{204}$ to $R_{207}$ independently represents an aryl group, an alkyl group or a cycloalkyl group.

The aryl group represented by each of $R_{204}$ to $R_{207}$ is preferably a phenyl group or a naphthyl group, more preferably a phenyl group. The aryl group may be one having a heterocyclic structure containing an oxygen atom, nitrogen atom, sulfur atom, etc. As the aryl group having a heterocyclic structure, a pyrrole residue (group formed by loss of one hydrogen atom from pyrrole), a furan residue (group formed by loss of one hydrogen atom from furan), a thiophene residue (group formed by loss of one hydrogen atom from thiophene), an indole residue (group formed by loss of one hydrogen atom from indole), a benzofuran residue (group formed by loss of one hydrogen atom from benzofuran), and a benzothiophene residue (group formed by loss of one hydrogen atom from benzothiophene) can be exemplified.

As preferred alkyl groups and cycloalkyl groups represented by $R_{204}$ to $R_{207}$, a linear or branched alkyl group having 1 to 10 carbon atoms and a cycloalkyl group having 3 to 10 carbon atoms can be exemplified. As the alkyl group, for example, a methyl group, an ethyl group, a propyl group, a butyl group and a pentyl group can be exemplified. As the cycloalkyl group, for example, a cyclopentyl group, a cyclohexyl group and a norbornyl group can be exemplified.

The aryl group, alkyl group and cycloalkyl group represented by $R_{204}$ to $R_{207}$ may have one or more substituents. As a possible substituent on the aryl group, alkyl group and cycloalkyl group represented by $R_{204}$ to $R_{207}$, an alkyl group (having, for example, 1 to 15 carbon atoms), a cycloalkyl group (having, for example, 3 to 15 carbon atoms), an aryl group (having, for example, 6 to 15 carbon atoms), an alkoxy group (having, for example, 1 to 15 carbon atoms), a halogen atom, a hydroxy group, and a phenylthio group can be exemplified.

$Z^-$ represents a nonnucleophilic anion. As such, the same nonnucleophilic anions as mentioned with respect to the $Z^-$ in the general formula (ZI) can be exemplified.

As the acid generators, the compounds represented by the following general formulae (ZIV), (ZV) and (ZVI) can further be exemplified.

ZIV $$Ar_3—SO_2—SO_2—Ar_4$$

ZV

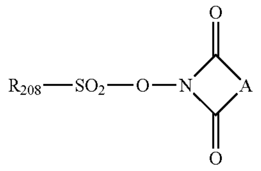

ZVI

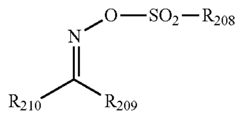

In the general formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

As specific examples of the aryl group represented by $Ar_3$, $Ar_4$, $R_{208}$, $R_{209}$ and $R_{210}$, for example, the same aryl group as explained with respect to $R_{201}$, $R_{202}$ and $R_{203}$ can be exemplified.

As specific examples of the alkyl group and the cycloalkyl group, for example, the same alkyl group and the cycloalkyl group as explained with respect to $R_{201}$, $R_{202}$ and $R_{203}$ can be exemplified.

As the alkylene group represented by A, for example, the one having 1 to 12 carbon atoms such as a methylene group, an ethylene group, a propylene group, an isopropylene group, a butylene group, an isobutylene group, or the like can be exemplified.

As the alkenylene group represented by A, for example, the one having 2 to 12 carbon atoms such as an ethenylene group, a propenylene group, a butenylene group, or the like can be exemplified.

As the arylene group represented by A, for example, the one having 6 to 10 carbon atoms such as a phenylene group, a tolylene group, a naphthylene group, or the like can be exemplified.

Among the acid generators, the compounds represented by the general formulae (ZI) to (ZIII) are more preferred.

The acid generator is preferably a compound capable of generating an acid containing one sulfonic acid group or imido group. More preferably, the acid generator is a compound capable of generating a monovalent perfluoroalkanesulfonic acid, or a compound capable of generating a monovalent aromatic sulfonic acid substituted with a fluorine atom or a group containing a fluorine atom, or a compound capable of generating a monovalent imidic acid substituted with a fluorine atom or a group containing a fluorine atom. Further more preferably, the acid generator is a sulfonium salt of fluorinated alkanesulfonic acid, fluorinated benzenesulfonic acid, fluorinated imidic acid or fluorinated methide acid. With respect to useful acid generators, it is especially preferred for the generated acid to be a fluorinated alkanesulfonic acid, fluorinated benzenesulfonic acid or fluorinated imidic acid of −1 or below pKa. When these acid generators are used, the sensitivity can be enhanced.

Especially preferred examples of the acid generators will be shown below.

(z1)

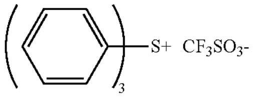

(z2)

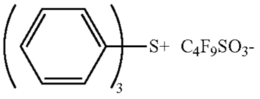

-continued
(z3)
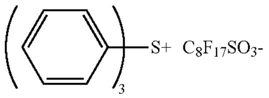
(z4)
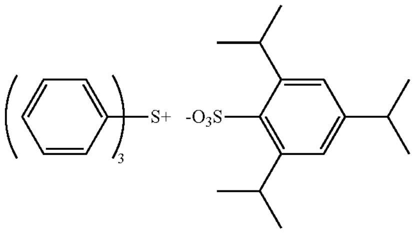
(z5)
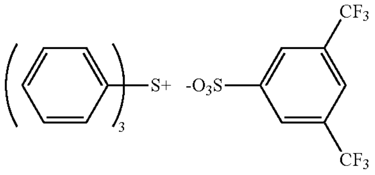
(z6)
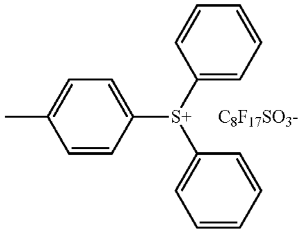
(z7)
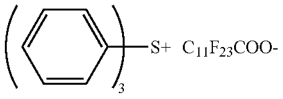
(z8)
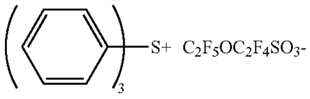
(z9)
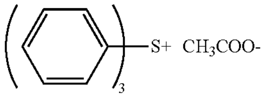
(z10)
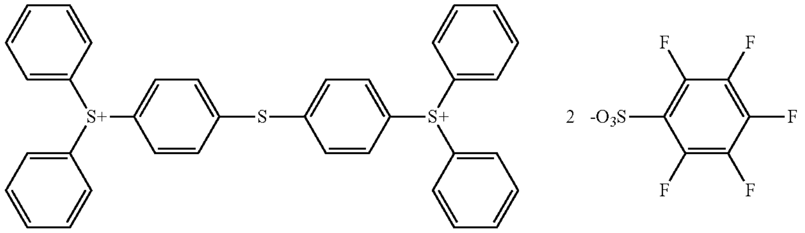
(z11)
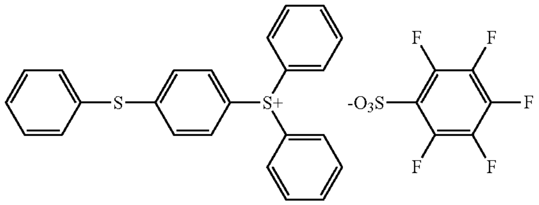
(z12)
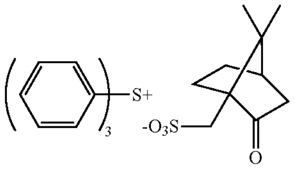
(z13)
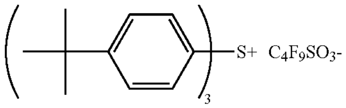
(z14)
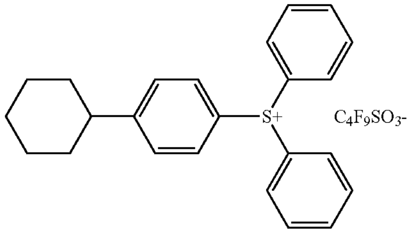

-continued
(z15)
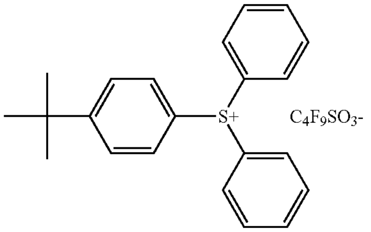
(z16)
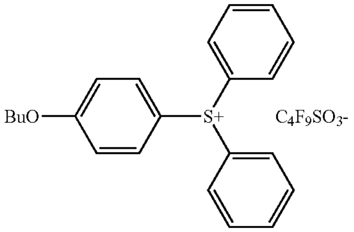
(z17)
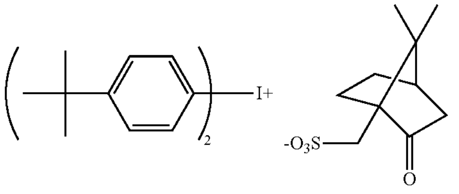
(z18)
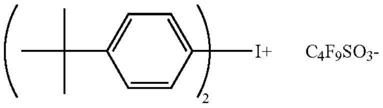
(z19)
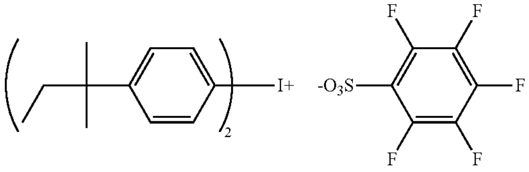
(z20)
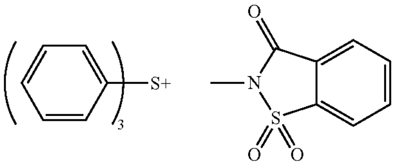
(z21)
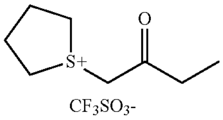
(z22)
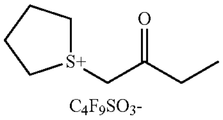
(z23)
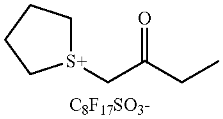
(z24)
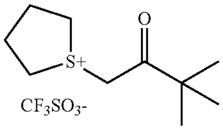
(z25)
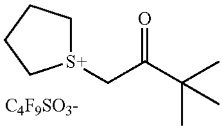
(z26)
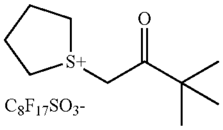
(z27)
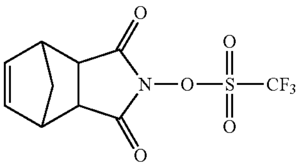
(z28)
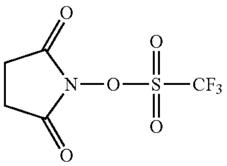
(z29)
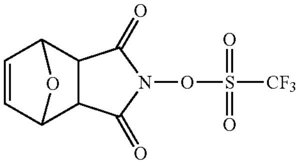
(z30)
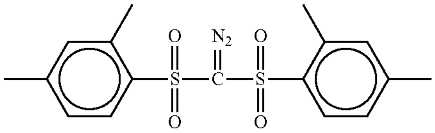
(z31)
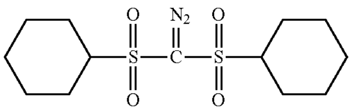
(z32)
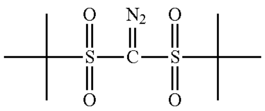

-continued
(z33)
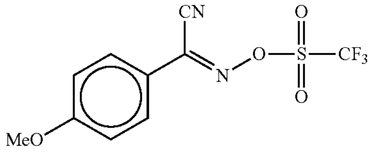
(z34)
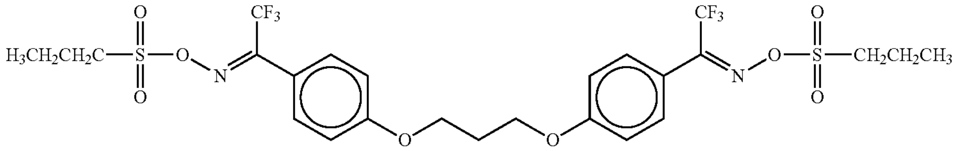
(z35)
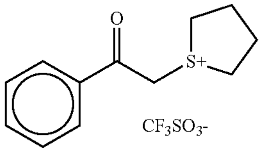
(z36)
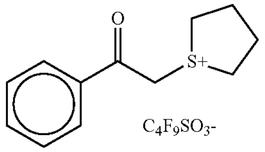
(z37)
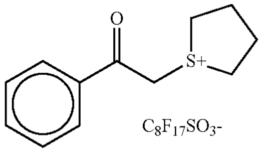
(z38)
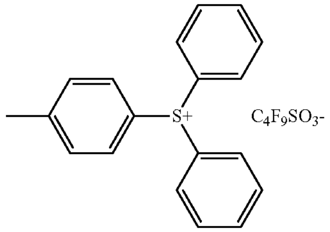
(z39)
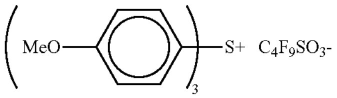
(z40)
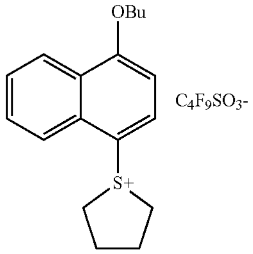
(z41)
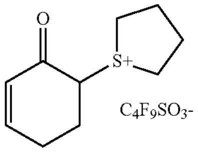
(z42)
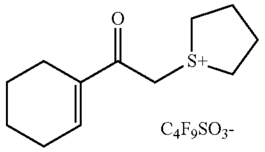
(z43)
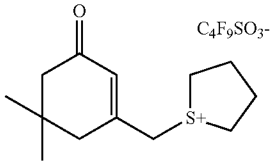
(z44)
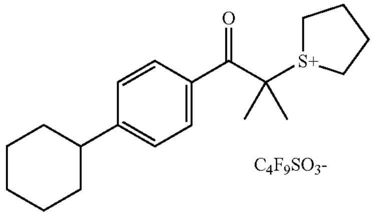
(z45)
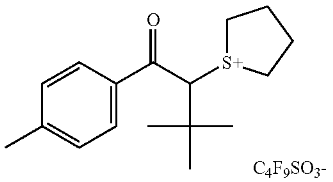
(z46)
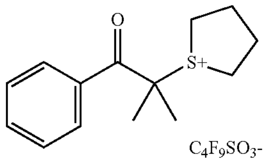

-continued
(z47)
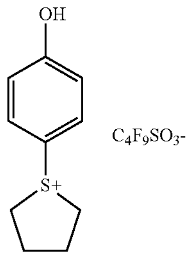
(z48)
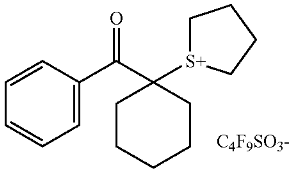
(z49)
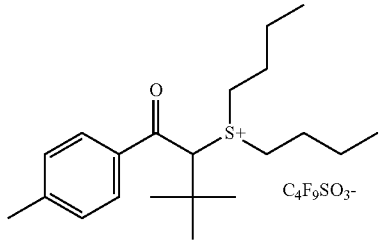
(z50)
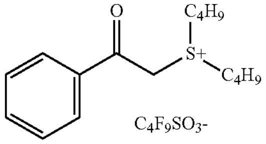
(z51)
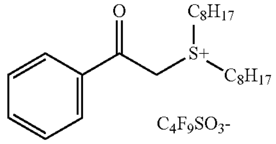
(z52)
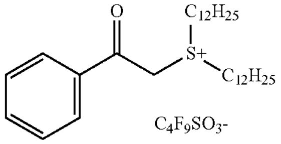
(z53)
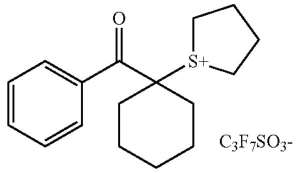
(z54)
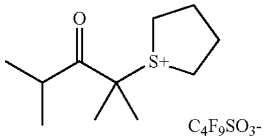
(z55)
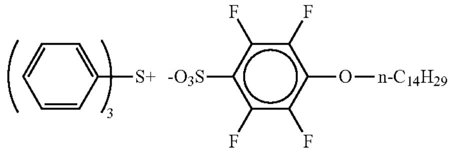
(z56)
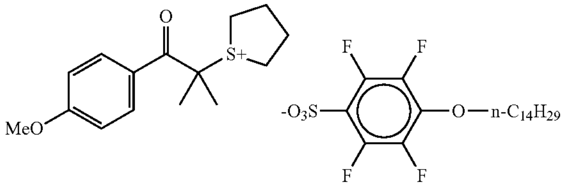
(z57)
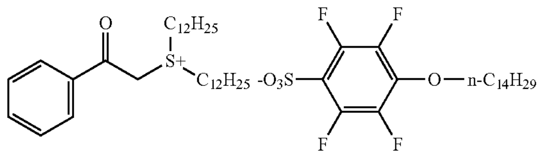
(z58)
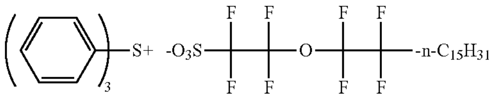
(z59)
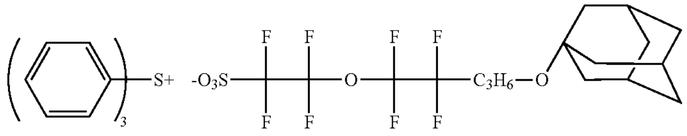
(z60)
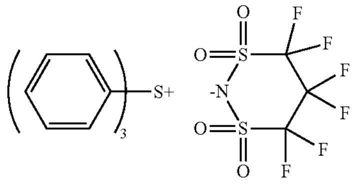
(z61)
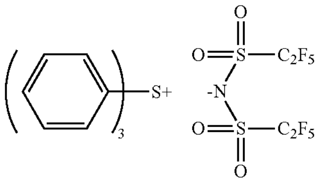

-continued
(z62)
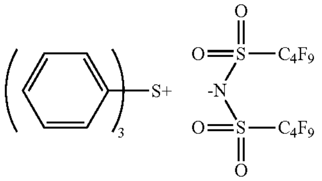
(z63)
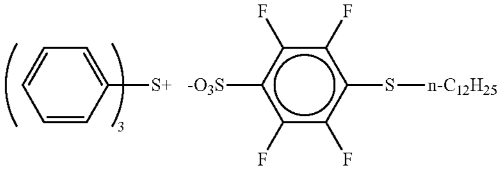
(z64)
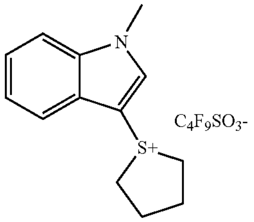
(z65)
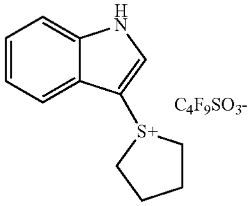
(z66)
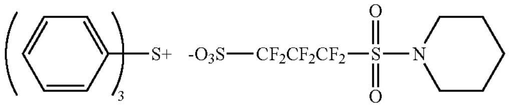
(z67)
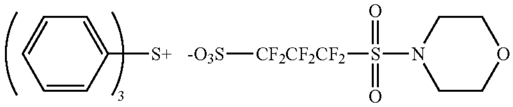
(z68)
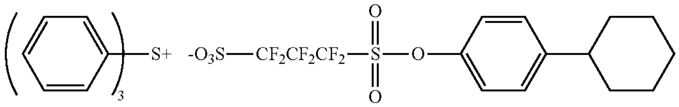
(z69)
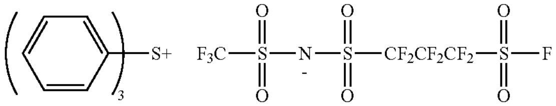
(z70)
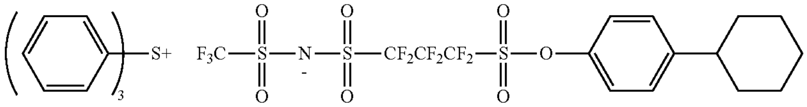
(Z71)
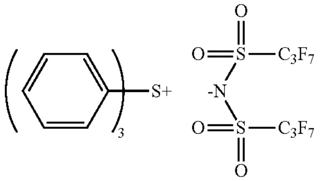
(z72)
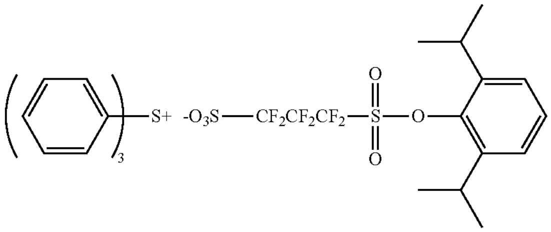
(z73)
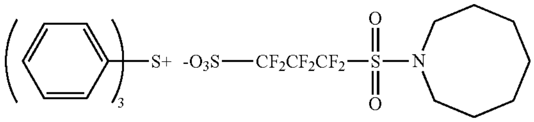
(z74)
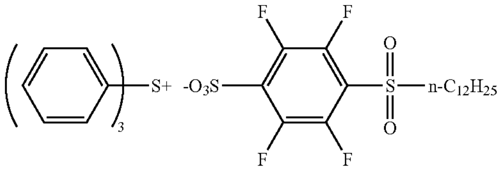
(z75)
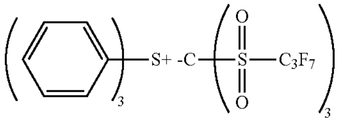
(z76)
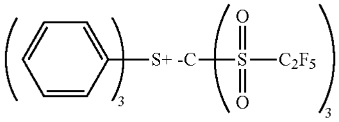
(z77)
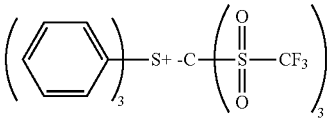

-continued
(z78)
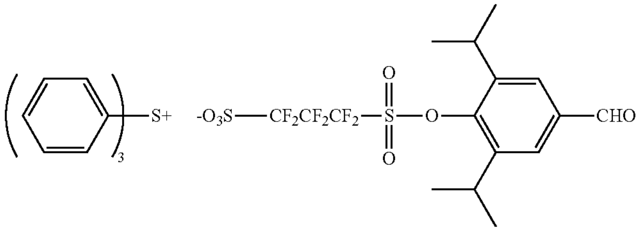
(z79)
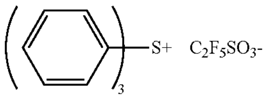
(z80)
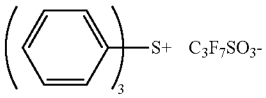
(z81)
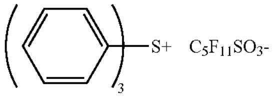
(z82)
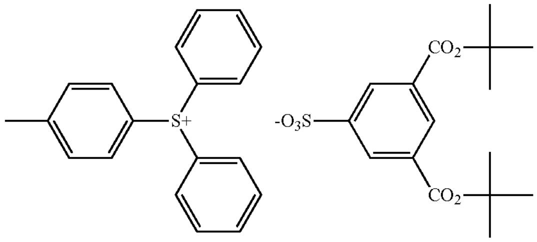
(z83)
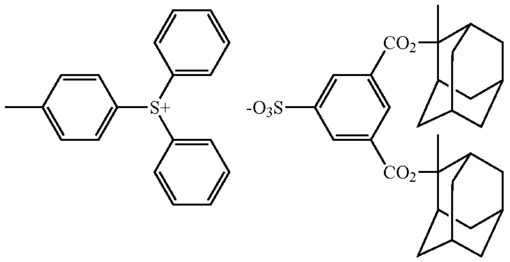
(z84)
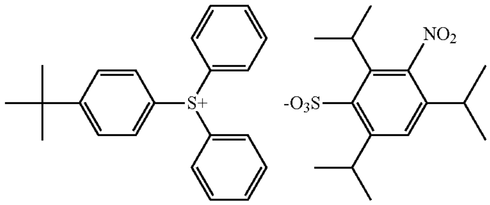
(z85)
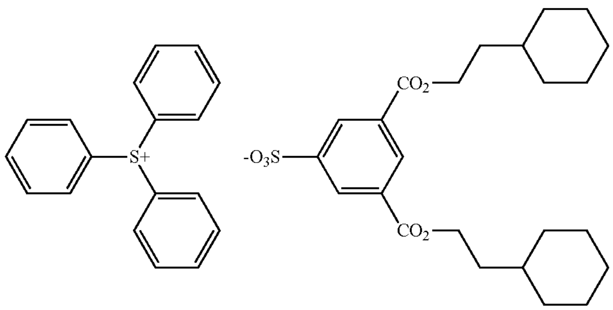
(z86)
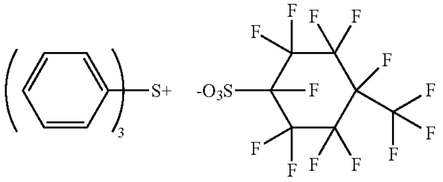
(z87)
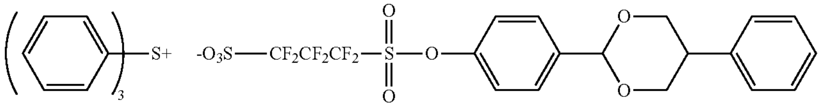

-continued (z88)

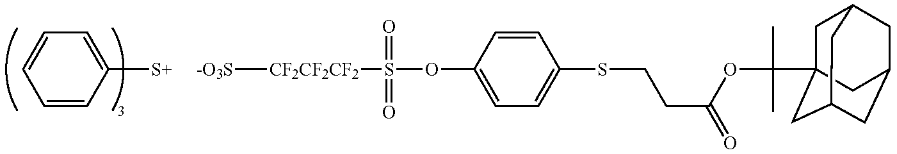

(z89)

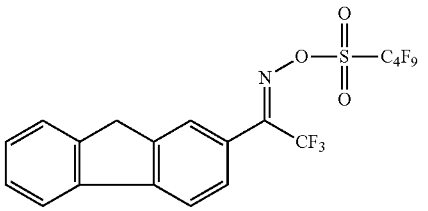

(z90)

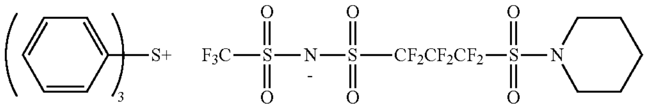

(z91)

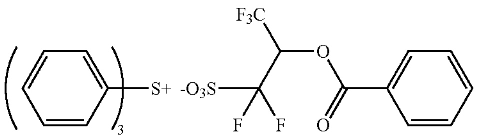

The acid generators can be used either individually or in combination of two or more kinds.

The content of the acid generator based on the total solids of the composition is preferably in the range of 0.1 to 30 mass %, more preferably 5 to 30 mass % and further more preferably 10 to 25 mass %.

(D) Basic Compound

The composition according to the present invention preferably contains a basic compound so as to decrease performance alteration over time from exposure to heating.

As preferred basic compounds, the compounds having the structures represented by the following formulae (A) to (E) can be exemplified.

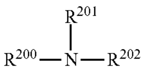

(A)

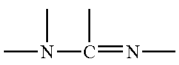

(B)

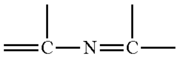

(C)

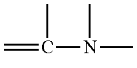

(D)

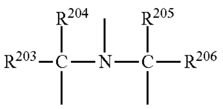

(E)

In the general formulae (A) and (E), $R^{200}$, $R^{201}$ and $R^{202}$ each independently represents a hydrogen atom, an alkyl group (preferably having 1 to 20 carbon atoms), a cycloalkyl group (preferably having 3 to 20 carbon atoms) or an aryl group (preferably having 6 to 20 carbon atoms). $R^{201}$ and $R^{202}$ may be bonded to each other to form a ring.

$R^{203}$, $R^{204}$, $R^{205}$ and $R^{206}$ each independently represents an alkyl group having 1 to 20 carbon atoms.

With respect to the above alkyl group, as a preferred substituted alkyl group, an aminoalkyl group having 1 to 20 carbon atoms, a hydroxyalkyl group having 1 to 20 carbon atoms, and a cyanoalkyl group having 1 to 20 carbon atoms can be exemplified.

More preferably, the alkyl groups in the general formulae (A) and (E) are unsubstituted.

As preferred basic compounds, guanidine, aminopyrrolidine, pyrazole, pyrazoline, piperazine, aminomorpholine, aminoalkylmorpholine and piperidine can be exemplified. As more preferred compounds, those with an imidazole structure, a diazabicyclo structure, an onium hydroxide structure, an onium carboxylate structure, a trialkylamine structure, an aniline structure or a pyridine structure, alkylamine derivatives having a hydroxy group and/or an ether bond, and aniline derivatives having a hydroxy group and/or an ether bond can be exemplified.

As the compounds with an imidazole structure, imidazole, 2,4,5-triphenylimidazole, benzimidazole, and 2-phenylbenzoimidazole can be exemplified.

As the compounds with a diazabicyclo structure, 1,4-diazabicyclo[2,2,2]octane, 1,5-diazabicyclo[4,3,0]non-5-ene, and 1,8-diazabicyclo[5,4,0]undec-7-ene can be exemplified.

As the compounds with an onium hydroxide structure, tetrabutylammonium hydroxide, triarylsulfonium hydroxide, phenacylsulfonium hydroxide, and sulfonium hydroxides having a 2-oxoalkyl group, such as triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide can be exemplified.

As the compounds with an onium carboxylate structure, those having a carboxylate at the anion moiety of the compounds with an onium hydroxide structure, such as acetate, adamantane-1-carboxylate, and perfluoroalkyl carboxylate can be exemplified.

As the compounds with a trialkylamine structure, tri(n-butyl)amine and tri(n-octyl)amine can be exemplified.

As the aniline compounds, 2,6-diisopropylaniline, N,N-dimethylaniline, N,N-dibutylaniline, and N,N-dihexylaniline can be exemplified.

As the alkylamine derivatives having a hydroxy group and/or an ether bond, ethanolamine, diethanolamine, triethanolamine, N-phenyldiethanolamine, and tris(methoxyethoxyethyl)amine can be exemplified.

As the aniline derivatives having a hydroxy group and/or an ether bond, N,N-bis(hydroxyethyl)aniline can be exemplified.

As preferred basic compounds, an amine compound having a phenoxy group, an ammonium salt compound having a phenoxy group, an amine compound having a sulfonic ester group, and an ammonium salt compound having a sulfonic ester group can further be exemplified.

As the amine compounds, primary, secondary, and tertiary amine can be used. In these compounds, it is preferred for at least one alkyl group to be bonded to a nitrogen atom. More preferably, an oxygen atom is contained in the chain of the alkyl group, thereby forming an oxyalkylene group. With respect to the number of oxyalkylene groups in each molecule, one or more is preferred, three to nine more preferred, and four to six further more preferred. Of these oxyalkylene groups, the groups of the formulae $—CH_2CH_2O_7$, $—CH(CH_3)CH_2O—$ and $—CH_2CH_2CH_2O—$ are especially preferred.

As the ammonium salt compound, use can be made of primary, secondary, tertiary and quaternary ammonium salt compounds. An ammonium salt compound having its at least one alkyl group bonded to the nitrogen atom thereof is preferred. Of the ammonium salt compounds, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) besides the alkyl group may be bonded to the nitrogen atom. Of the ammonium salt compounds, it is preferred for the alkyl chain to contain an oxygen atom to form an oxyalkylene group. The number of oxyalkylene groups in each molecule is one or more, preferably 3 to 9, and more preferably 4 to 6. The oxyalkylene group is preferably an oxyethylene group ($—CH_2CH_2O—$) or an oxypropylene group ($—CH(CH_3)CH_2O—$ or $—CH_2CH_2CH_2O—$), more preferably an oxyethylene group ($—CH_2CH_2O—$).

As the anion of the ammonium salt compounds, a halide, a sulfonate, a borate and a phosphate can be exemplified. Of these, a halide and a sulfonate are preferred. Among halides, a chloride, a bromide and an iodide are especially preferred. Among sulfonates, an organic sulfonate having 1 to 20 carbon atoms is especially preferred. As the organic sulfonate, an aryl sulfonate and an alkyl sulfonate having 1 to 20 carbon atoms can be exemplified. The alkyl group of the alkyl sulfonate may have a substituent. As the substituent, a fluorine atom, a chlorine atom, a bromine atom, an alkoxy group, an acyl group, and an aryl group can be exemplified. As specific examples of the alkyl sulfonates, methane sulfonate, ethane sulfonate, butane sulfonate, hexane sulfonate, octane sulfonate, benzyl sulfonate, trifluoromethane sulfonate, pentafluoroethane sulfonate, and nonafluorobutane sulfonate can be exemplified. As the aryl group of the aryl sulfonate, a benzene ring, a naphthalene ring, and an anthracene ring can be exemplified. The benzene ring, naphthalene ring or anthracene ring may have a substituent. As preferred substituents, a linear or branched alkyl group having 1 to 6 carbon atoms and a cycloalkyl group having 3 to 6 carbon atoms can be exemplified. As specific examples of the linear or branched alkyl groups and cycloalkyl groups, methyl, ethyl, n-propyl, isopropyl, n-butyl, i-butyl, t-butyl, n-hexyl, and cyclohexyl group can be exemplified. As other substituents, an alkoxy group having 1 to 6 carbon atoms, a halogen atom, a cyano group, a nitro group, an acyl group, and an acyloxy group can be exemplified.

The amine compound having a phenoxy group and ammonium salt compound having a phenoxy group are those having a phenoxy group at the opposite end of the alkyl group to the nitrogen atom of the amine compound or ammonium salt compound. The phenoxy group may have a substituent. As the substituent of the phenoxy group, an alkyl group, an alkoxy group, a halogen atom, a cyano group, a nitro group, a carboxy group, a carboxylic ester group, a sulfonic ester group, an aryl group, an aralkyl group, an acyloxy group, and an aryloxy group can be exemplified. The substitution position of the substituent may be any of 2- to 6-positions. The number of substituents is optional within the range of 1 to 5.

It is preferred that at least one oxyalkylene group exist between the phenoxy group and the nitrogen atom. The number of oxyalkylene groups in each molecule is one or more, preferably 3 to 9, and more preferably 4 to 6. The oxyalkylene group is preferably an oxyethylene group ($—CH_2CH_2O—$) or an oxypropylene group ($—CH(CH_3)CH_2O—$ or $—CH_2CH_2CH_2O—$), more preferably an oxyethylene group ($—CH_2CH_2O—$).

The sulfonic ester group of the amine compound having a sulfonic ester group or ammonium salt compound having a sulfonic ester group may be any of an alkylsulfonic ester group, a cycloalkylsulfonic ester group, and an arylsulfonic ester group. In the alkylsulfonic ester group, the alkyl group preferably has 1 to 20 carbon atoms. In the cycloalkylsulfonic ester group, the cycloalkyl group preferably has 3 to 20 carbon atoms. In the arylsulfonic ester group, the aryl group preferably has 6 to 12 carbon atoms. The alkylsulfonic ester group, cycloalkylsulfonic ester group, and arylsulfonic ester group may have substituents. As preferred substituents, a halogen atom, a cyano group, a nitro group, a carboxy group, a carboxylic ester group and a sulfonic ester group can be exemplified.

It is preferred that at least one oxyalkylene group exist between the sulfonic ester group and the nitrogen atom. The number of oxyalkylene groups in each molecule is one or more, preferably 3 to 9, and more preferably 4 to 6. The oxyalkylene group is preferably an oxyethylene group ($—CH_2CH_2O—$) or an oxypropylene group ($—CH(CH_3)CH_2O—$ or $—CH_2CH_2CH_2O—$), more preferably an oxyethylene group ($—CH_2CH_2O—$).

Further, the following compounds are also preferred as the basic compound.

(MO-1)

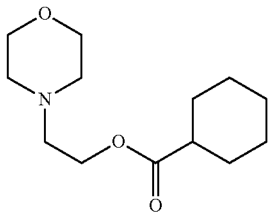

-continued (MO-2)

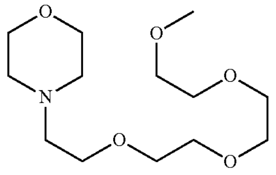

(MO-3)

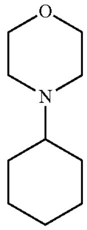

(MO-4)

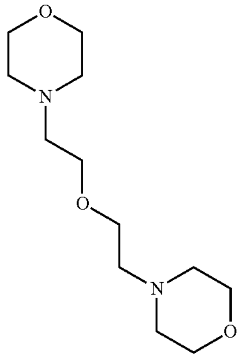

(MO-5)

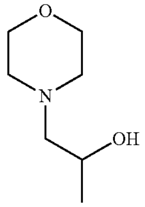

(MO-6)

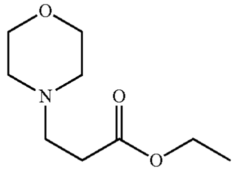

These basic compounds are used either individually or in combination.

The use of the basic compound is optional. When the basic compound is contained in the composition, the amount thereof based on the solid contents of the composition is generally in the range of 0.001 to 10 mass %, preferably 0.01 to 5 mass %.

The molar ratio of the acid generator to basic compound used in the composition is preferably in the range of 2.5 to 300. The molar ratio is preferred to be 2.5 or higher from the viewpoint of sensitivity and resolving power. The molar ratio is preferred to be 300 or below from the viewpoint of the inhibition of any resolving power deterioration due to thickening of resist pattern over time from exposure to heating treatment. The ratio of acid generator/basic compound is more preferably in the range of 5.0 to 200, and still more preferably 7.0 to 150.

These basic compounds are to be used in a given ratio to the following low-molecular compound containing a group that is cleaved when acted on by an acid (E). The ratio of the low-molecular compound containing a group that is cleaved when acted on by an acid to the basic compound (molar ratio) is preferably in the range of 100/0 to 10/90, more preferably 100/0 to 30/70 and most preferably 100/0 to 50/50.

Herein, the basic compounds do not include (E) low-molecular compound containing a group that is cleaved when acted on by an acid, even when the low-molecular compound is a basic compound.

[E] Low-molecular compound containing a group that is cleaved when acted on by an acid The composition of the present invention may contain a low-molecular compound containing a group that is cleaved when acted on by an acid (hereinafter also referred to as a "compound (E).")

The group that is cleaved when acted on by an acid is not particularly limited. However, an acetal group, a carbonate group, a carbamate group, a tertiary ester group, a tertiary hydroxyl group and a hemiaminal ether group are preferably used. A carbamate group and a hemiaminal ether group are especially preferred.

The molecular weight of the low-molecular compound containing a group that is cleaved when acted on by an acid is preferably in the range of 100 to 1000, more preferably 100 to 700 and most preferably 100 to 500.

A single type of compound (E) may be used alone, or two or more types of compounds (E) may be used in combination.

It is optional for the composition of the present invention to contain the compound (E). When the compound (E) is contained, the content of compound (E) based on the total solids of the composition is generally in the range of 1 to 10 mass %, preferably 2 to 5 mass %.

(F) Hydrophobic Resin

The composition of the present invention may further contain a hydrophobic resin described in detail below especially when a liquid immersion exposure is applied thereto. This localizes the hydrophobicity in the surface layer of a composition film. Accordingly, when the immersion medium is water, the static/dynamic contact angle of the surface of the composition film with respect to water can be increased, thereby enhancing the immersion water tracking property.

Although the hydrophobic resin is unevenly localized on any interface, as different from the surfactant, the hydrophobic resin does not necessarily have to have a hydrophilic group in its molecule and does not need to contribute toward uniform mixing of polar/nonpolar substances.

The hydrophobic resin is preferably a resin containing at least one of fluorine atom and silicon atom. The fluorine atom or the silicon atom in the hydrophobic resin may present either in the principal chain or in the side chain.

When the hydrophobic resin contains fluorine atom, the resin preferably has, as a partial structure containing one or more fluorine atoms, an alkyl group containing one or more fluorine atoms, a cycloalkyl group containing one or more fluorine atoms, or an aryl group containing one or more fluorine atoms.

The alkyl group containing one or more fluorine atoms is a linear or branched alkyl group having at least one hydrogen atom thereof substituted with one or more fluorine atoms. The group preferably has 1 to 10 carbon atoms, more preferably 1 to 4 carbon atoms. Further, other substituents than fluorine atom may also be contained.

The cycloalkyl group containing one or more fluorine atoms is a monocyclic or polycyclic alkyl group having at least one hydrogen atom thereof substituted with one or more fluorine atoms. Further, other substituents than fluorine atom may also be contained.

The aryl group containing one or more fluorine atoms is an aryl group having at least one hydrogen atom of an aryl group substituted with one or more fluorine atoms. As the aryl group, a phenyl or a naphthyl group can be exemplified. Further, other substituents than fluorine atom may also be contained.

As preferred alkyl groups containing one or more fluorine atoms, cycloalkyl groups containing one or more fluorine atoms and aryl groups containing one or more fluorine atoms, groups of the following general formulae (F2) to (F4) can be exemplified.

(F2)

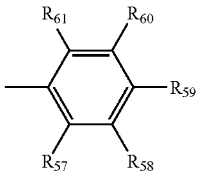

(F3)

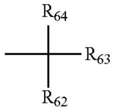

(F4)

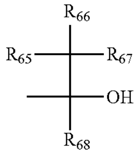

In the general formulae (F2) to (F4), each of $R_{57}$ to $R_{68}$ independently represents a hydrogen atom, a fluorine atom or an alkyl group in condition that: at least one of $R_{57}$-$R_{61}$ represents a fluorine atom or an alkyl group having at least one hydrogen atom thereof substituted with one or more fluorine atoms; at least one of $R_{62}$-$R_{64}$ represents a fluorine atom or an alkyl group having at least one hydrogen atom thereof substituted with one or more fluorine atoms; and at least one of $R_{65}$-$R_{68}$ represents a fluorine atom or an alkyl group having at least one hydrogen atom thereof substituted with one or more fluorine atoms. These alkyl groups preferably are those having 1 to 4 carbon atoms.

It is preferred that all of $R_{57}$-$R_{61}$ and $R_{65}$-$R_{67}$ represent fluorine atoms. Each of $R_{62}$, $R_{63}$ and $R_{68}$ preferably represents an alkyl group having at least one hydrogen atom thereof substituted with one or more fluorine atoms, more preferably a perfluoroalkyl group having 1 to 4 carbon atoms. $R_{62}$ and $R_{63}$ may be bonded to each other to form a ring.

Specific examples of the groups represented by the general formula (F2) include a p-fluorophenyl group, a pentafluorophenyl group, and a 3,5-di(trifluoromethyl)phenyl group.

Specific examples of the groups represented by the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups represented by the general formula (F4) include —$C(CF_3)_2OH$, —$C(C_2F_5)_2OH$, —$C(CF_3)(CH_3)OH$, —$CH(CF_3)OH$ and the like. Of these, —$C(CF_3)_2OH$ is particularly preferred.

The partial structure containing a fluorine atom may directly be bonded to the principal chain. Alternatively, the partial structure may be bonded to the principal chain via an alkylene group, a phenylene group, an ether bond, a thioether bond, a carbonyl group, an ester bond, an amido bond, a urethane bond, a ureylene bond, or a combination of at least two of these.

Preferred repeating units containing one or more fluorine atoms are as follows (C-Ia)

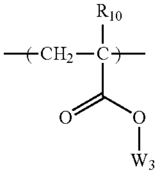

(C-Ib)

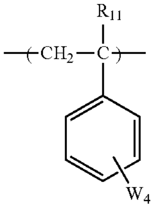

(C-Ic)

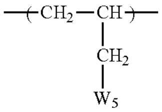

(C-Id)

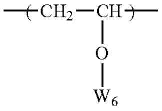

In the formulae, $R_{10}$ and $R_{11}$ each independently represents a hydrogen atom, a fluorine atom, and an alkyl group. As the alkyl group, a linear or branched alkyl group having 1 to 4 carbon atoms is preferred. As an alkyl group with one or more substituents, a fluorinated alkyl group can especially be exemplified.

Each of $W_3$ to $W_6$ independently represents an organic group containing one or more fluorine atoms. Specifically, groups represented by the general formulae (F2) to (F4) can be exemplified.

The following units may also be employed as the repeating unit containing one or more fluorine atoms.

(C-II)

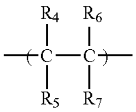

-continued

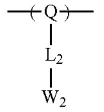

(C-III)

In the formulae, each of $R_4$ to $R_7$ independently represents a hydrogen atom, a fluorine atom, and an alkyl group with the proviso that at least one of $R_4$ to $R_7$ represents a fluorine atom and $R_4$ and $R_5$ or $R_6$ and $R_7$ may form a ring. As the alkyl group, a linear or branched alkyl group having 1 to 4 carbon atoms is preferred. As an alkyl group with one or more substituents, a fluorinated alkyl group can especially be exemplified.

$W_2$ represents an organic group containing one or more fluorine atoms. Specifically, groups represented by the general formulae (F2) to (F4) can be exemplified.

$L_2$ represents a single bond or divalent connecting group. As the divalent connecting group, a substituted or nonsubstituted arylene group, a substituted or nonsubstituted alkylene group, —O—, —$SO_2$—, —CO—, —N(R)— (R represents a hydrogen atom or an alkyl group), —$NHSO_2$—, or a combination of two or more of these groups.

Q represents an alicyclic structure. The alicyclic structure may contain one or more substituents, and may either be monocyclic or polycyclic. When the alicyclic structure contains a polycyclic structure, it may be a bridged type. As the monocyclic one, a cycloalkyl group having 3 to 8 carbon atoms such as a cyclopenryl group, a cyclohexyl group, a cyclobutyl group, or a cyclobutyl group is preferred. As the polycyclic one, a group containing bicyclo-, tricyclo-, or tetracyclo-structure having 5 or more carbon atoms can be exemplified. The polycyclic one preferably is a cycloalkyl group having 6 to 20 carbon atoms such as an adamantyl group, a norbornyl group, a dicyclopentyl group, a tricyclodecanyl group, or a tetracyclododecyl group. At least a part of carbon atoms in the cycloalkyl group may be substituted with one or more heteroatoms such as oxygen atoms. Especially preferred Q include a norbornyl group, a tricyclodecanyl group, a tetracyclodecanyl group, or the like.

Specific examples of the repeating units containing a fluorine atom will be shown below. In the specific examples, $X_1$ represents a hydrogen atom, —$CH_3$, —F or —$CF_3$, and $X_2$ represents —F or —$CF_3$.

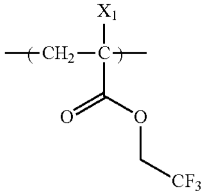

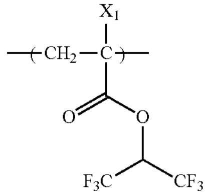

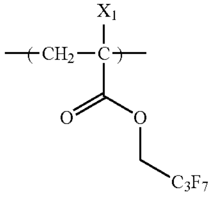

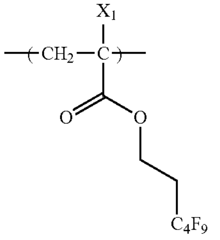

-continued

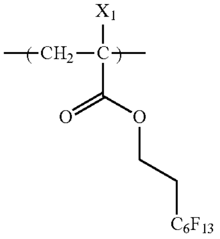

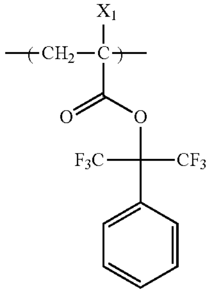

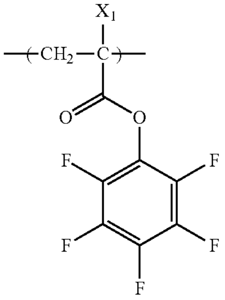

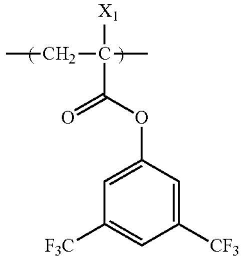

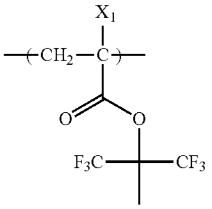

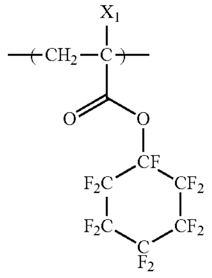

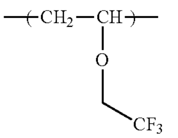

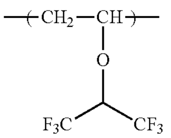

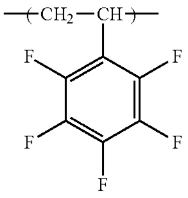

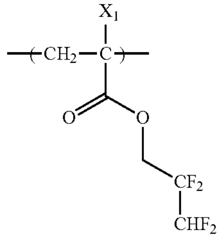

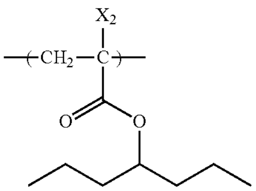

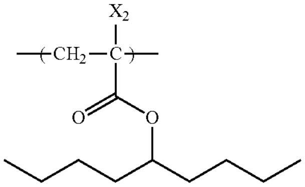

-continued

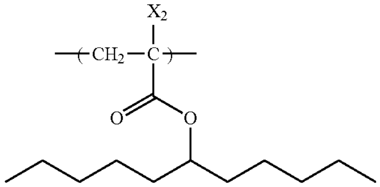

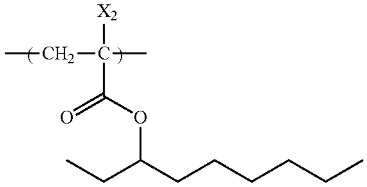

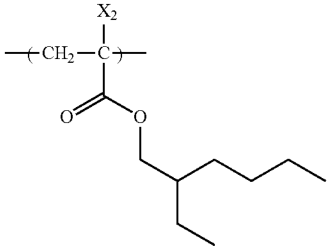

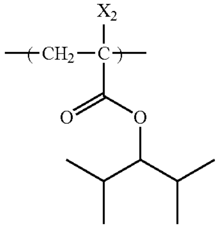

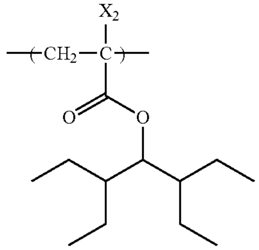

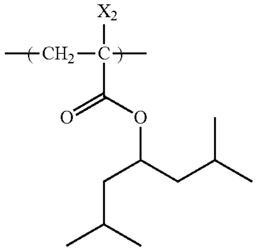

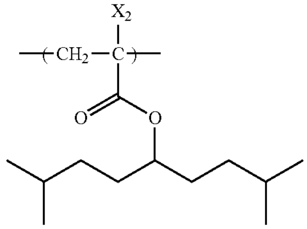

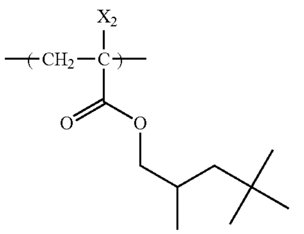

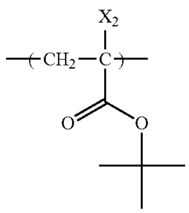

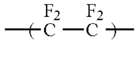

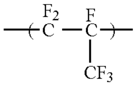

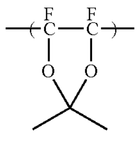

-continued

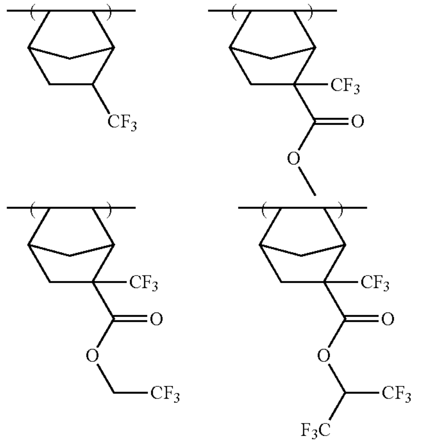

The hydrophobic resin may contain one or more silicon atoms. As partial structure containing one or more silicon atoms, an alkylsilyl structure or a cyclosiloxane structure can be exemplified. Preferred alkylsilyl structure is the one containing one or more trialkylsilyl groups.

As the alkylsilyl structure and cyclosiloxane structure, any of the groups represented by the following general formulae (CS-1) to (CS-3) can be exemplified.

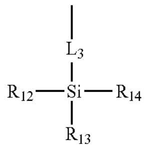

(CS-1)

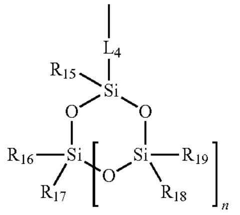

(CS-2)

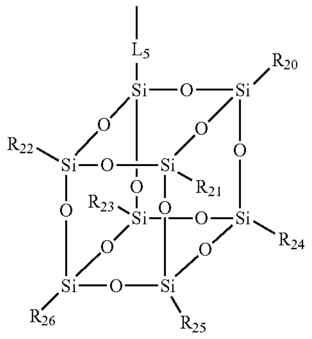

(CS-3)

In the general formulae (CS-1) to (CS-3), each of $R_{12}$ to $R_{26}$ independently represents a linear or branched alkyl group or a cycloalkyl group. The alkyl group preferably has 1 to 20 carbon atoms. The cycloalkyl group preferably has 3 to 20 carbon atoms.

Each of $L_3$ to $L_5$ represents a single bond or a bivalent connecting group. As the bivalent connecting group, any one or a combination of two or more groups selected from the group consisting of an alkylene group, a phenylene group, an ether group, a thioether group, a carbonyl group, an ester group, an amido group, a urethane group and a urea group can be exemplified. The bivalent connecting group preferably has 12 or less carbon atoms.

In the formulae, n is an integer of 1 to 5, and preferably an integer of 2 to 4.

Specific examples of the repeating units represented by any of general formulae (CS-1) to (CS-3) will be shown below. In the specific examples, $X_1$ represents a hydrogen atom, —$CH_3$, —F or —$CF_3$, and $X_2$ represents —F or —$CF_3$.

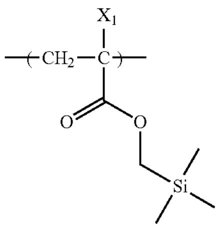

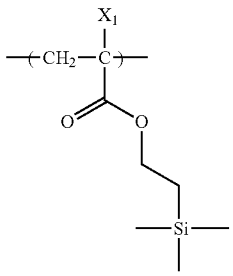

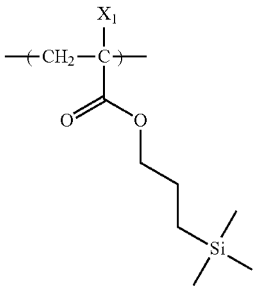

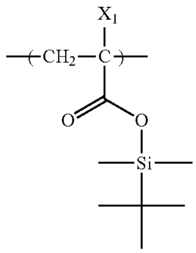

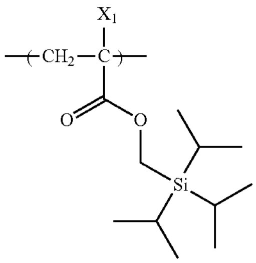

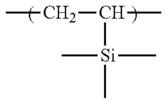

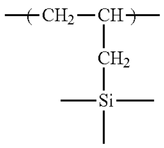

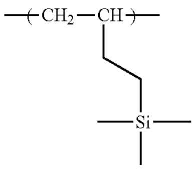

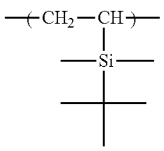

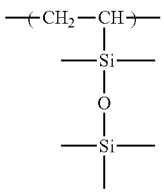

-continued

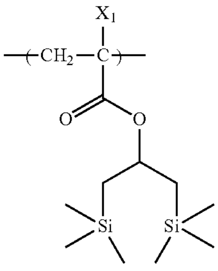

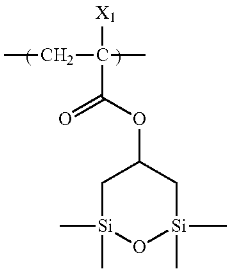

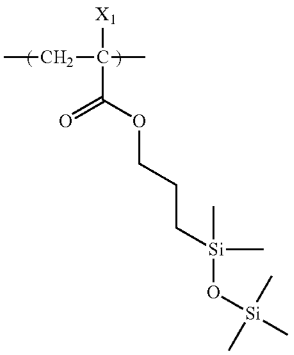

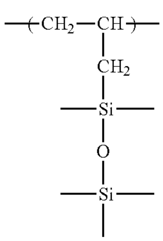

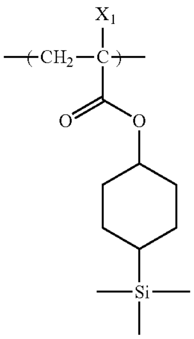

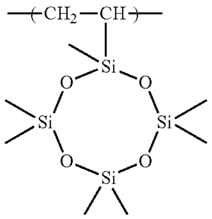

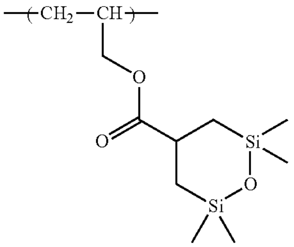

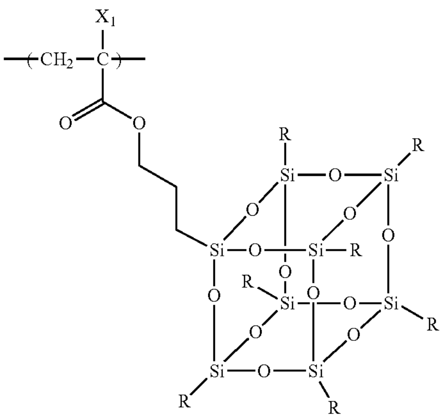

R = $CH_3$, $C_2H_5$, $C_3H_7$, $C_4H_9$

-continued

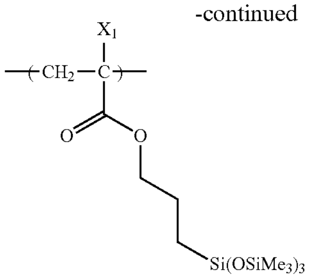

Further, the hydrophobic resin may contain at least one group selected from among the following groups (x) to (z):

(x) an alkali-soluble group;

(y) a group that is decomposed by the action of an alkali developer, resulting in an increase of solubility in the alkali developer (hereinafter also referred to as "polarity conversion group"); and (z) a group that is decomposed by the action of an acid.

As the alkali-soluble group (x), a phenolic hydroxy group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group can be exemplified.

As preferred alkali soluble groups, a fluoroalcohol group (preferably hexafluoroisopropanol group), a sulfonimido group, and a bis(carbonyl)methylene group can be exemplified.

As the repeating unit having an alkali soluble group (x), preferred use is made of any of a repeating unit resulting from direct bonding of an alkali soluble group to the principal chain of a resin like a repeating unit of acrylic acid or methacrylic acid; a repeating unit resulting from bonding, via a connecting group, of an alkali soluble group to the principal chain of a resin; and a repeating unit resulting from polymerization with the use of a chain transfer agent or polymerization initiator having an alkali soluble group to introduce the same in a polymer chain terminal.

The content of repeating units having an alkali soluble group (x) based on all the repeating units of the polymer is preferably in the range of 1 to 50 mol %, more preferably 3 to 35 mol %, and still more preferably 5 to 20 mol %.

Specific examples of the repeating units having an alkali soluble group (x) will be shown below, which however in no way limit the scope of the present invention. In the formulae, Rx represents H, $CH_3$, $CF_3$ or $CH_2OH$.

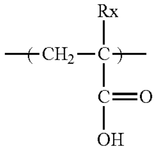

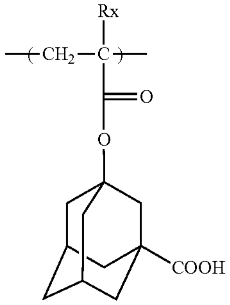

-continued

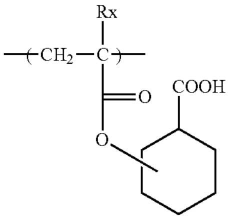

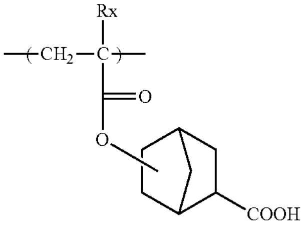

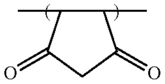

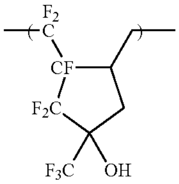

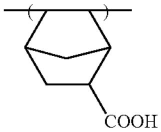

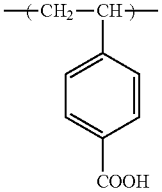

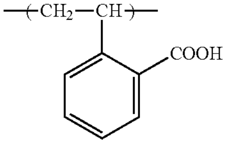

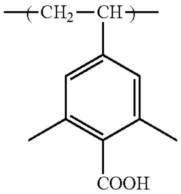

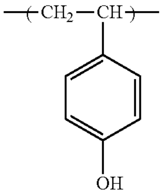

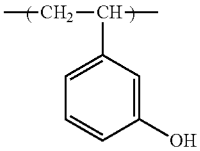

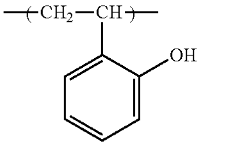

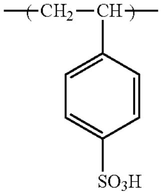

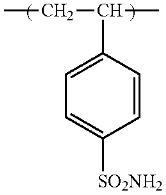

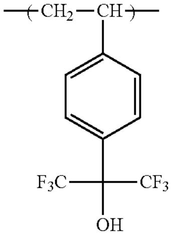

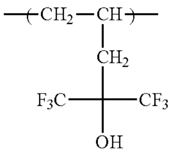

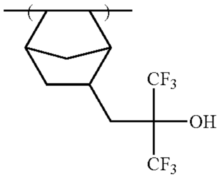

-continued

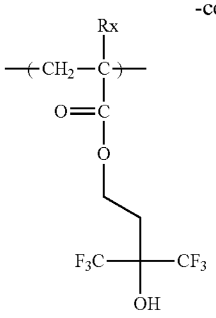
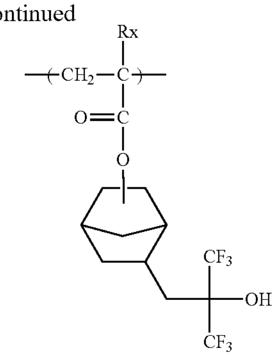
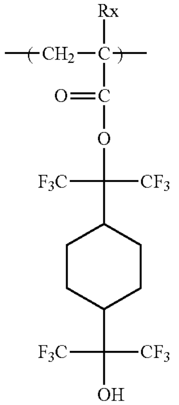
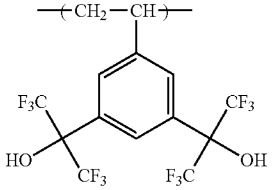
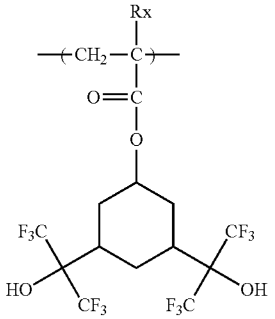
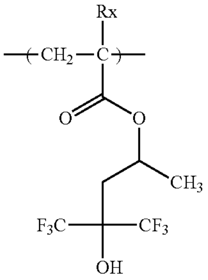
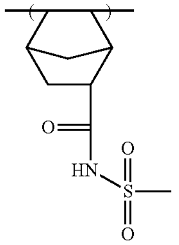
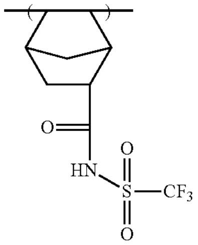
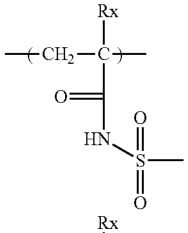
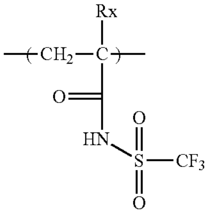
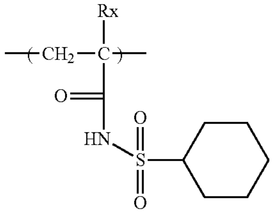

-continued

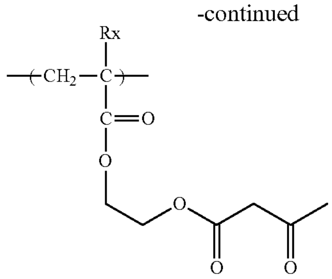
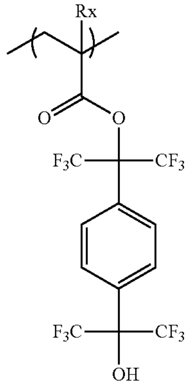
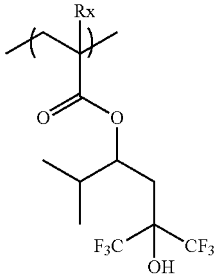
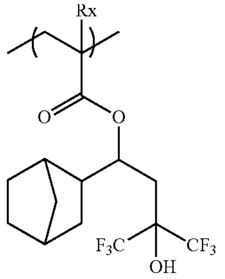

As the group (y) that is decomposed by the action of an alkali developer to thereby increase its solubility in the alkali developer (polarity conversion group (y)), there can be mentioned, for example, a lactone group, a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—$OSO_2O$—), a sulfonic ester group (—$SO_2O$—) or the like. A lactone group is preferred.

It is preferred for the actinic-ray- or radiation-sensitive resin composition of the present invention to contain a resin (Cy) comprising not only a repeating unit (cy) containing at least one polarity conversion group (y) but also at least either a fluorine atom or a silicon atom. The resin (Cy) is hydrophobic, and the addition of the resin (Cy) is preferred especially from the viewpoint of the inhibition of development defects.

The ester group directly bonded to the principal chain of a repeating unit, such as one contained in an acrylate or the like, is not included in the polarity conversion groups according to the present invention, because the ester group is poor in the capability of being decomposed by the action of an alkali developer to thereby increase its solubility in the alkali developer.

The polarity conversion group (y) is contained in, for example, two modes which are both preferred. In one mode, the polarity conversion group is contained in a repeating unit of an acrylic ester or methacrylic ester and introduced in a side chain of a resin. In the other mode, the polarity conversion group is introduced in a terminal of a polymer chain by using a polymerization initiator or chain transfer agent containing the polarity conversion group (y) in the stage of polymerization.

As particular examples of the repeating units (cy) containing the polarity conversion group (y), there can be mentioned the particular examples of the repeating units with the partial structures of general formula (II) and the repeating units with lactone structures other than the above, mentioned hereinbefore with respect to the acid-decomposable resins.

As the repeating unit (cy), there can be mentioned, for example, any of the repeating units of formula (K0) below.

(K0)

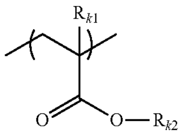

In the formula, $R_{k1}$ represents a hydrogen atom, a halogen atom, a hydroxyl group, an alkyl group, a cycloalkyl group, an aryl group or a group containing a polarity conversion group; and $R_{k2}$ represents an alkyl group, a cycloalkyl group, an aryl group or a group containing a polarity conversion group; provided that one of $R_{k1}$ and $R_{k2}$ is a group containing a polarity conversion group.

The polarity conversion group, as mentioned above, refers to a group that is decomposed by the action of an alkali developer to thereby increase its solubility in the alkali developer. It is preferred for the polarity conversion group to be a group represented by X in the partial structures of general formulae (KA-1) and (KB-1) below.

(KA-1)

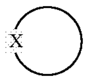

(KB-1)

$$Y^1—X—Y^2$$

In general formulae (KA-1) and (KB-1), X represents a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—$OSO_2O$—) or a sulfonic ester group (—$SO_2O$—).

$Y^1$ and $Y^2$ may be identical to or different from each other, and each thereof represents an electron withdrawing group.

The repeating unit (cy) contains a preferred group whose solubility in an alkali developer is increased by containing a group with the partial structure of general formula (KA-1) or (KB-1). When the partial structure has no bonding hand as in the case of the partial structure of general formula (KA-1) or the partial structure of general formula (KB-1) in which $Y^1$ and $Y^2$ are monovalent, the above group with the partial structure refers to a group containing a monovalent or higher-valent group resulting from the deletion of at least one arbitrary hydrogen atom from the partial structure.

The partial structure of general formula (KA-1) or (KB-1) is linked at its arbitrary position to the principal chain of the resin (Cy) via a substituent.

The partial structure of general formula (KA-1) is a structure in which a ring structure is formed in cooperation with a group represented by X.

In general formula (KA-1), X is preferably a carboxylic ester group (namely, in the case of the formation of a lactone ring structure as KA-1), an acid anhydride group or a carbonic ester group. More preferably, X is a carboxylic ester group.

A substituent may be introduced in the ring structure of general formula (KA-1). For example, when $Z_{ka1}$ is a substituent, nka substituents may be introduced.

$Z_{ka1}$, or each of a plurality of $Z_{ka1}$s independently, represents a halogen atom, an alkyl group, a cycloalkyl group, an ether group, a hydroxyl group, an amido group, an aryl group, a lactone ring group or an electron withdrawing group.

$Z_{ka1}$s may be linked to each other to thereby form a ring. As the ring formed by the mutual linkage of $Z_{ka1}$s, there can be mentioned, for example, a cycloalkyl ring or a heterocycle (for example, a cycloether ring or a lactone ring).

The above nka is an integer of 0 to 10, preferably 0 to 8, more preferably 0 to 5, further more preferably 1 to 4 and most preferably 1 to 3.

The electron withdrawing groups represented by $Z_{ka1}$ are the same as those represented by $Y^1$ and $Y^2$ to be described hereinafter. These electron withdrawing groups may be substituted with other electron withdrawing groups.

$Z_{ka1}$ is preferably an alkyl group, a cycloalkyl group, an ether group, a hydroxyl group or an electron withdrawing group. $Z_{ka1}$ is more preferably an alkyl group, a cycloalkyl group or an electron withdrawing group. It is preferred for the ether group to be one substituted with, for example, an alkyl group or a cycloalkyl group, namely, to be an alkyl ether group or the like. The electron withdrawing group is as mentioned above.

As the halogen atom represented by $Z_{ka1}$, there can be mentioned a fluorine atom, a chlorine atom, a bromine atom, an iodine atom or the like. Among these, a fluorine atom is preferred.

The alkyl group represented by $Z_{ka1}$ may contain a substituent, and may be linear or branched. The linear alkyl group preferably has 1 to 30 carbon atoms, more preferably 1 to 20 carbon atoms. As the linear alkyl group, there can be mentioned, for example, a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, an n-decanyl group or the like. The branched alkyl group preferably has 3 to 30 carbon atoms, more preferably 3 to 20 carbon atoms. As the branched alkyl group, there can be mentioned, for example, an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, a t-decanyl (t-decanoyl) group or the like. It is preferred for the alkyl group represented by $Z_{ka1}$ to be one having 1 to 4 carbon atoms, such as a methyl group, an ethyl group, an n-propyl group, an i-propyl group, an n-butyl group, an i-butyl group or a t-butyl group.

The cycloalkyl group represented by $Z_{ka1}$ may contain a substituent and may be monocyclic or polycyclic. When polycyclic, the cycloalkyl group may be a bridged one. Namely, in that case, the cycloalkyl group may have a bridged structure. The monocycloalkyl group is preferably a cycloalkyl group having 3 to 8 carbon atoms. As such a cycloalkyl group, there can be mentioned, for example, a cyclopropyl group, a cyclopentyl group, a cyclohexyl group, a cyclobutyl group, a cyclooctyl group or the like. As the polycycloalkyl group, there can be mentioned a group with, for example, a bicyclo, tricyclo or tetracyclo structure having 5 or more carbon atoms. This polycycloalkyl group is preferably a cycloalkyl group having 6 to 20 carbon atoms. As such, there can be mentioned, for example, an adamantyl group, a norbornyl group, an isobornyl group, a camphonyl group, a bicyclopentyl group, an α-pinel group, a tricyclodecanyl group, a tetracyclododecyl group, an androstanyl group, any of the following structures or the like. The carbon atoms of each of the cycloalkyl groups may be partially replaced with a heteroatom, such as an oxygen atom.
(1)
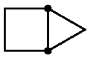
(2)
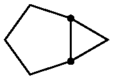
(3)
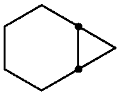
(4)
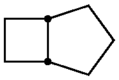
(5)
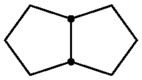
(6)
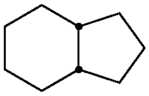
(7)
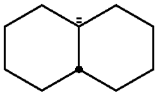
(8)
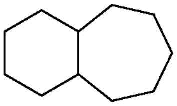
(9)
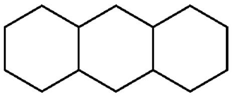
(10)
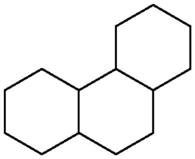
(11)
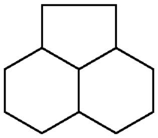
(12)
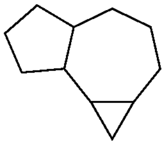
-continued
(13)
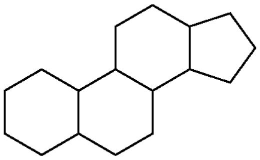
(14)
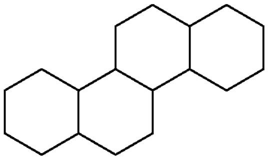
(15)
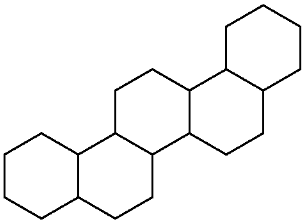
(16)
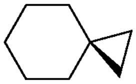
(17)
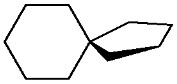
(18)
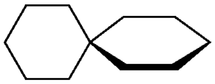
(19)
(20)
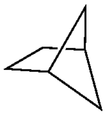
(21)
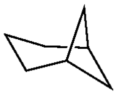
(22)
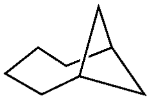
(23)
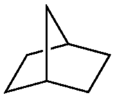
(24)
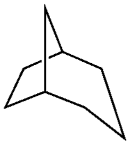

-continued
(25)
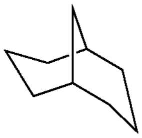
(26)
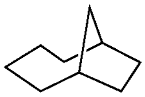
(27)
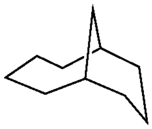
(28)
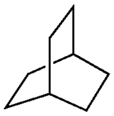
(29)
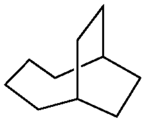
(30)
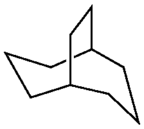
(31)
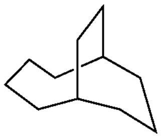
(32)
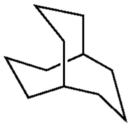
(33)
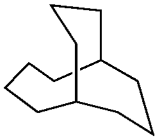
(34)
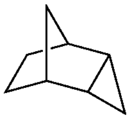
(35)
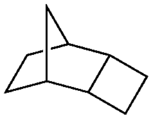
-continued
(36)
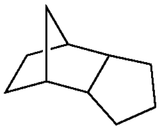
(37)
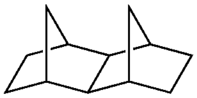
(38)
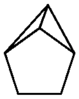
(39)
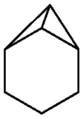
(40)
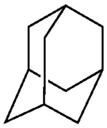
(41)
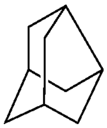
(42)
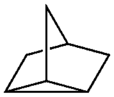
(43)
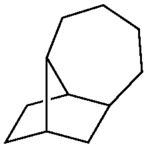
(44)
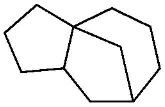
(45)
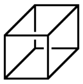
(46)
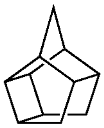
(47)
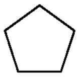
(48)

-continued (49)

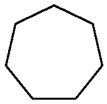

(50)

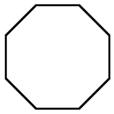

As preferred alicyclic moieties among the above, there can be mentioned an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. As more preferred alicyclic moieties, there can be mentioned an adamantyl group, a decalin group, a norbornyl group, a cedrol group, a cyclohexyl group, a cycloheptyl group, a cyclooctyl group, a cyclodecanyl group, a cyclododecanyl group and a tricyclodecanyl group.

As a substituent that can be introduced in these alicyclic structures, there can be mentioned an alkyl group, a halogen atom, a hydroxyl group, an alkoxy group, a carboxyl group or an alkoxycarbonyl group. The alkyl group is preferably a lower alkyl group, such as a methyl group, an ethyl group, a propyl group, an isopropyl group or a butyl group. More preferably, the alkyl group is a methyl group, an ethyl group, a propyl group or an isopropyl group. As preferred alkoxy groups, there can be mentioned those each having 1 to 4 carbon atoms, such as a methoxy group, an ethoxy group, a propoxy group and a butoxy group. As a substituent that may be introduced in these alkyl and alkoxy groups, there can be mentioned a hydroxyl group, a halogen atom, an alkoxy group (preferably having 1 to 4 carbon atoms) or the like.

Further substituents may be introduced in these groups. As further substituents, there can be mentioned a hydroxyl group; a halogen atom (fluorine, chlorine, bromine or iodine); a nitro group; a cyano group; the above alkyl groups; an alkoxy group, such as a methoxy group, an ethoxy group, a hydroxyethoxy group, a propoxy group, a hydroxypropoxy group, an n-butoxy group, an isobutoxy group, a sec-butoxy group or a t-butoxy group; an alkoxycarbonyl group, such as a methoxycarbonyl group or an ethoxycarbonyl group; an aralkyl group, such as a benzyl group, a phenethyl group or a cumyl group; an aralkyloxy group; an acyl group, such as a formyl group, an acetyl group, a butyryl group, a benzoyl group, a cyanamyl group or a valeryl group; an acyloxy group, such as a butyryloxy group; the above alkenyl groups; an alkenyloxy group, such as a vinyloxy group, a propenyloxy group, an allyloxy group or a butenyloxy group; the above aryl groups; an aryloxy group, such as a phenoxy group; an aryloxycarbonyl group, such as a benzoyloxy group; and the like.

Preferably, X of general formula (KA-1) represents a carboxylic ester group and the partial structure of general formula (KA-1) is a lactone ring. A 5- to 7-membered lactone ring is preferred.

Further, as shown in formulae (KA-1-1) to (KA-1-17) below, the 5- to 7-membered lactone ring as the partial structure of general formula (KA-1) is preferably condensed with another ring structure in such a fashion that a bicyclo structure or a Spiro structure is formed.

The peripheral ring structures to which the ring structure of general formula (KA-1) may be bonded can be, for example, those shown in formulae (KA-1-1) to (KA-1-17) below, or those similar to the same.

It is preferred for the structure containing the lactone ring structure of general formula (KA-1) to be the structure of any of formulae (KA-1-1) to (KA-1-17) below. The lactone structure may be directly bonded to the principal chain. As preferred structures, there can be mentioned those of formulae (KA-1-1), (KA-1-4), (KA-1-5), (KA-1-6), (KA-1-13), (KA-1-14) and (KA-1-17).

KA-1-1

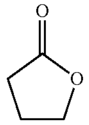

KA-1-2

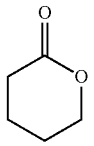

KA-1-3

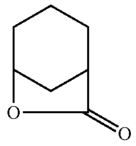

KA-1-4

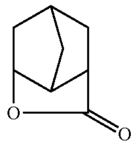

KA-1-5

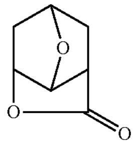

KA-1-6

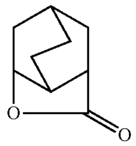

KA-1-7

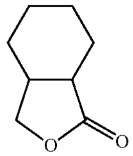

KA-1-8

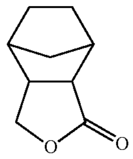

-continued

KA-1-9

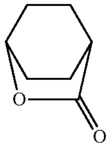

KA-1-10

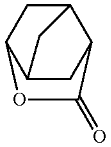

KA-1-11

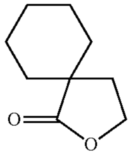

KA-1-12

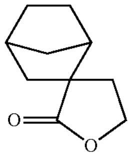

KA-1-13

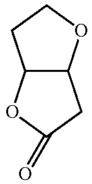

KA-1-14

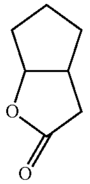

KA-1-15

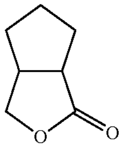

KA-1-16

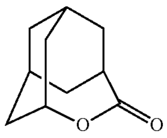

KA-1-17

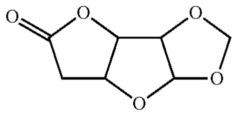

A substituent may optionally be introduced in the above structures containing the lactone ring structure. As preferred substituents, there can be mentioned the same as the substituents $Z_{ka1}$ that may be introduced in the ring structure of general formula (KA-1) above.

In general formula (KB-1), X is preferably a carboxylic ester group (—COO—).

In general formula (KB-1), each of $Y^1$ and $Y^2$ independently represents an electron withdrawing group.

The electron withdrawing group has the partial structure of formula (EW) below. In formula (EW), * represents either a bonding hand directly bonded to the structure of general formula (KA-1) or a bonding hand directly bonded to X of general formula (KB-1).

(EW)

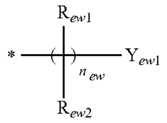

In formula (EW), $n_{ew}$ is the number of repetitions of each of the connecting groups of the formula —C($R_{ew1}$)($R_{ew2}$)—, being an integer of 0 or 1. When $n_{ew}$ is 0, a single bond is represented, indicating the direct bonding of $Y_{ew1}$.

$Y_{ew1}$ can be any of a halogen atom, a cyano group, a nitrile group, a nitro group, any of the halo(cyclo)alkyl groups or haloaryl groups of the formula —C($R_{f1}$)($R_{f2}$)—$R_{f3}$ to be described hereinafter, an oxy group, a carbonyl group, a sulfonyl group, a sulfinyl group and a combination thereof. The electron withdrawing groups may have, for example, the following structures. Herein, the "halo(cyclo)alkyl group" refers to an at least partially halogenated alkyl group or cycloalkyl group. The "haloaryl group" refers to an at least partially halogenated aryl group. In the following structural formulae, each of $R_{ew3}$ and $R_{ew4}$ independently represents an arbitrary structure. Regardless of the types of the structures of $R_{ew3}$ and $R_{ew4}$, the partial structures of formula (EW) exhibit electron withdrawing properties, and may be linked to, for example, the principal chain of the resin. Preferably, each of $R_{ew3}$ and $R_{ew4}$ is an alkyl group, a cycloalkyl group or a fluoroalkyl group.

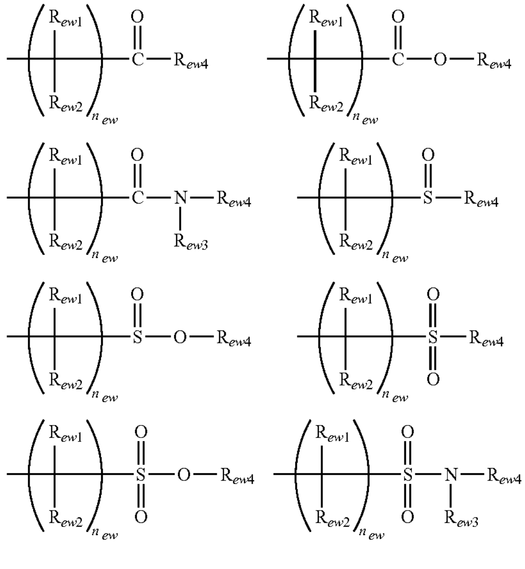

-continued

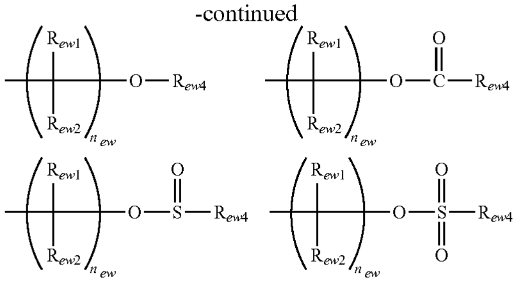

When $Y_{ew1}$ is a bivalent or higher-valent group, the remaining bonding hand or hands form a bond with an arbitrary atom or substituent. At least any of the groups represented by $Y_{ew1}$, $R_{ew1}$ and $R_{ew2}$ may be linked via a further substituent to the principal chain of the resin (Cy).

$Y_{ew1}$ is preferably a halogen atom or any of the halo(cyclo) alkyl groups or haloaryl groups of the formula —C($R_{f1}$)($R_{f2}$)—$R_{f3}$.

Each of $R_{ew1}$ and $R_{ew2}$ independently represents an arbitrary substituent, for example, a hydrogen atom, an alkyl group, a cycloalkyl group or an aryl group.

At least two of $R_{ew1}$, $R_{ew2}$ and $Y_{ew1}$ may be linked to each other to thereby form a ring.

In the above formula, $R_{f1}$ represents a halogen atom, a perhaloalkyl group, a perhalocycloalkyl group or a perhaloaryl group. $R_{f1}$ is preferably a fluorine atom, a perfluoroalkyl group or a perfluorocycloalkyl group, more preferably a fluorine atom or a trifluoromethyl group.

Each of $R_{f2}$ and $R_{f3}$ independently represents a hydrogen atom, a halogen atom or an organic group. $R_{f2}$ and $R_{f3}$ may be linked to each other to thereby form a ring. As the organic group, there can be mentioned, for example, an alkyl group, a cycloalkyl group, an alkoxy group or the like. It is preferred for $R_{f2}$ to represent the same groups as $R_{f1}$ or to be linked to $R_{f3}$ to thereby form a ring.

$R_{f1}$ to $R_{f3}$ may be linked to each other to thereby form a ring. As the formed ring, there can be mentioned a (halo) cycloalkyl ring, a (halo)aryl ring or the like.

As the (halo)alkyl groups represented by $R_{f1}$ to $R_{f3}$, there can be mentioned, for example, the alkyl groups mentioned above as being represented by $Z_{ka1}$ and structures resulting from halogenation thereof.

As the (per)halocycloalkyl groups and (per)haloaryl groups represented by $R_{f1}$ to $R_{f3}$ or contained in the ring formed by the mutual linkage of $R_{f2}$ and $R_{f3}$, there can be mentioned, for example, structures resulting from halogenation of the cycloalkyl groups mentioned above as being represented by $Z_{ka1}$, preferably fluorocycloalkyl groups of the formula $—C_{(n)}F_{(2n-2)}H$ and perfluoroaryl groups of the formula $—C_{(n)}F_{(n-1)}$. The number of carbon atoms, n, is not particularly limited. Preferably, however, it is in the range of 5 to 13, more preferably 6.

As preferred rings that may be formed by the mutual linkage of at least two of $R_{ew1}$, $R_{ew2}$ and $Y_{ew1}$, there can be mentioned cycloalkyl groups and heterocyclic groups. Preferred heterocyclic groups are lactone ring groups. As the lactone rings, there can be mentioned, for example, the structures of formulae (KA-1-1) to (KA-1-17) above.

The repeating unit (cy) may contain two or more of the partial structures of general formula (KA-1), or two or more of the partial structures of general formula (KB-1), or both any one of the partial structures of general formula (KA-1) and any one of the partial structures of general formula (KB-1).

A part or the whole of any of the partial structures of general formula (KA-1) may double as the electron withdrawing group represented by $Y^1$ or $Y^2$ of general formula (KB-1). For example, when X of general formula (KA-1) is a carboxylic ester group, the carboxylic ester group can function as the electron withdrawing group represented by $Y^1$ or $Y^2$ of general formula (KB-1).

The repeating unit (cy) may be a repeating unit (cy') containing at least either a fluorine atom or a silicon atom and a polarity conversion group simultaneously introduced in a side chain thereof, or a repeating unit (cy*) containing a polarity conversion group but containing neither a fluorine atom nor a silicon atom, or a repeating unit (cy") in which a polarity conversion group is introduced in its one side chain while at least either a fluorine atom or a silicon atom is introduced in a side chain other than the above side chain within the same repeating unit. However, it is preferred for the resin (Cy) to contain the repeating unit (cy') as the repeating unit (cy).

When the resin (Cy) contains the repeating unit (cy*), it is preferred for the resin (C) to be a copolymer with a repeating unit (repeating unit (c1) to be described hereinafter) containing at least either a fluorine atom or a silicon atom. In the repeating unit (cy"), it is preferred for the side chain containing a polarity conversion group and the side chain containing at least either a fluorine atom or a silicon atom to be bonded to the same carbon atom of the principal chain, namely to be in a positional relationship shown in formula (K1) below.

In the formula, B1 represents a partial structure containing a group whose solubility is increased in an alkali developer, and B2 represents a partial structure containing at least either a fluorine atom or a silicon atom.

(K1)

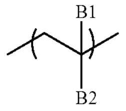

In the repeating unit (cy*) and repeating unit (cy"), it is highly preferred for the polarity conversion group to be a partial structure represented by —COO— in the structure of general formula (KA-1).

The repeating unit (cy) can be a repeating unit with the following partial structure.

(cc)

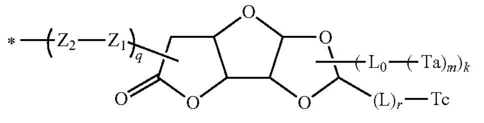

In general formula (cc), $Z_1$ represents a single bond, an ether bond, an ester bond, an amido bond, a urethane bond or a urea bond. When there are a plurality of $Z_1$s, they may be identical to or different from each other. $Z_1$ is preferably an ester bond.

$Z_2$ represents a chain- or cycloalkylene group. When there are a plurality of $Z_2$s, they may be identical to or different from each other. $Z_2$ is preferably an alkylene group having 1 or 2 carbon atoms and a cycloalkylene group having 5 to 10 carbon atoms.

Ta, or each of Ta's independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1) above). An alkyl group, a cycloalkyl group and an electron withdrawing group are preferred. An electron withdrawing group is more preferred. Two or more Ta's may be bonded to each other to thereby form a ring.

$L_0$ represents a single bond or a hydrocarbon group with a valence of m+1 (preferably having 20 or less carbon atoms). A single bond is preferred. $L_0$ is a single bond when m is 1. The hydrocarbon group with a valence of m+1 represented by $L_0$ is, for example, one resulting from the removal of any m−1 hydrogen atoms from an alkylene group, a cycloalkylene group, a phenylene group or a combination thereof.

L, or each of L's independently, represents a carbonyl group, a carbonyloxy group or an ether group.

Tc represents a hydrogen atom, an alkyl group, a cycloalkyl group, a nitrile group, a hydroxyl group, an amido group, an aryl group or an electron withdrawing group (having the same meaning as that of the electron withdrawing group represented by $Y^1$ or $Y^2$ of general formula (KB-1)).

In the formula, * represents a bonding hand to the principal chain or a side chain of the resin. Specifically, any of the partial structures of formula (cc) may be directly bonded to the principal chain, or may be bonded to a side chain of the resin. The bonding hand to the principal chain is one to an atom contained in the bonds as constituents of the principal chain. The bonding hand to a side chain is one to an atom being present outside the bonds as constituents of the principal chain.

In the general formula, m is an integer of 0 to 28, preferably an integer of 1 to 3, more preferably 1;

k is an integer of 0 to 2, preferably 1;

q represents the number of repetitions of the group ($Z_2$—$Z_1$), being an integer of 0 to 5, preferably 0 to 2; and r is an integer of 0 to 5.

The moiety -(L)r-Tc may be replaced with -$L_0$-(Ta)m.

Among the lactone structures of general formula (cc), those in which a fluorine atom or a group containing a fluorine atom is introduced as a substituent in the location remotest from the above * (location at which the number of intervening atoms is the greatest) and those in which a fluorine atom is introduced in the side chain within the same repeating unit different from the side chain on the lactone side shown in general formula (cc) (corresponding to the above repeating unit (cy")) are also preferred.

The alkylene group represented by $Z_2$ when it is linear preferably has 1 to 30 carbon atoms, more preferably 1 to 20 carbon atoms. The alkylene group represented by $Z_2$ when it is branched preferably has 3 to 30 carbon atoms, more preferably 3 to 20 carbon atoms. As particular examples of the alkylene groups represented by $Z_2$, there can be mentioned the groups resulting from the removal of one arbitrary hydrogen atom from each of the particular examples of alkyl groups mentioned above as being represented $Z_{ka1}$.

The cycloalkylene group represented by $Z_2$ preferably has 3 to 8 carbon atoms. As particular examples thereof, there can be mentioned the groups resulting from the removal of one arbitrary hydrogen atom from each of the cycloalkyl groups mentioned above as being represented $Z_{ka1}$.

With respect to the alkyl groups and cycloalkyl groups represented by Ta and Tc, the preferred number of carbon atoms and particular examples are as mentioned above in connection with the alkyl groups and cycloalkyl groups represented by $Z_{ka1}$.

The alkoxy group represented by Ta preferably has 1 to 8 carbon atoms. As such, there can be mentioned a methoxy group, an ethoxy group, a propoxy group, a butoxy group or the like.

Each of the aryl groups represented by Ta and Tc preferably has 6 to 12 carbon atoms. As such, there can be mentioned, for example, a phenyl group and a naphthyl group.

With respect to the alkylene group and cycloalkylene group represented by $L_0$, the preferred number of carbon atoms and particular examples are as mentioned above in connection with the alkylene group and cycloalkylene group represented by $Z_2$.

As further particular structures of the repeating units (cc), the repeating units with the following partial structures are preferred.

(ca-2)

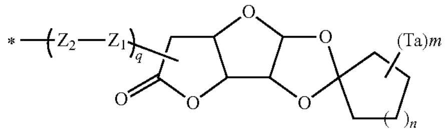

(cb-2)

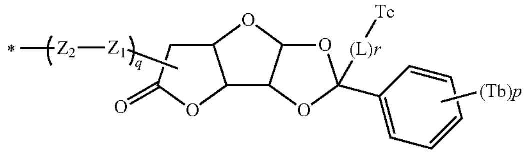

In general formulae (ca-2) and (cb-2), n is an integer of 0 to 11, preferably an integer of 0 to 5, more preferably 1 or 2; and p is an integer of 0 to 5, preferably an integer of 0 to 3, more preferably 1 or 2.

Tb, or each of Tbs independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1)). An alkyl group, a cycloalkyl group and an electron withdrawing group are preferred. When there are a plurality of Tbs, they may be bonded to each other to thereby form a ring.

In the formulae, * represents a bonding hand to the principal chain or a side chain of the resin. Specifically, any of the partial structures of general formulae (ca-2) and (cb-2) may be directly bonded to the principal chain, or may be bonded to a side chain of the resin.

$Z_1$, $Z_2$, Ta, Tc, L, *, m, q and r are as defined above in connection with general formula (cc). Preferred examples thereof are also the same as above.

The repeating unit (cy) can be a repeating unit with the partial structure of general formula (KY-0) below.

(KY-0)

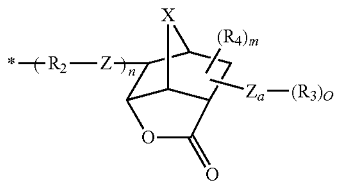

In general formula (KY-0), $R_2$ represents an alkylene group or a cycloalkylene group, provided that when there are a plurality of $R_2$s, they may be identical to or different from each other.

$R_3$ represents a linear, branched or cyclic hydrocarbon group whose hydrogen atoms on constituent carbons are partially or entirely substituted with fluorine atoms.

$R_4$ represents a halogen atom, a cyano group, a hydroxyl group, an amido group, an alkyl group, a cycloalkyl group, an alkoxy group, a phenyl group, an acyl group, an alkoxycarbonyl group or any of the groups of the formula R—C(═O)— or R—C(═O)O— in which R is an alkyl group or a cycloalkyl group. When there are a plurality of $R_4$s, they may be identical to or different from each other. Two or more $R_4$s may be bonded to each other to thereby form a ring.

X represents an alkylene group, a cycloalkylene group, an oxygen atom or a sulfur atom.

Each of Z and Za represents a single bond, an ether bond, an ester bond, an amido bond, a urethane bond or a urea bond. When there are a plurality thereof, they may be identical to or different from each other.

In the formula, * represents a bonding hand to the principal chain or a side chain of the resin; o is the number of substituents, being an integer of 1 to 7; m is the number of substituents, being an integer of 0 to 7; and n is the number of repetitions, being an integer of 0 to 5.

The structure —$R_2$—Z— is preferably the structure of formula —$(CH_2)$l-COO— in which l is an integer of 1 to 5.

With respect to the alkylene group and cycloalkylene group represented by $R_2$, the preferred number of carbon atoms and particular examples are as mentioned above in connection with the alkylene group and cycloalkylene group represented by $Z_2$ of general formula (cc).

The number of carbon atoms of the linear, branched or cyclic hydrocarbon group represented by $R_3$ is preferably in the range of 1 to 30, more preferably 1 to 20 when the hydrocarbon group is linear; is preferably in the range of 3 to 30, more preferably 3 to 20 when the hydrocarbon group is branched; and is in the range of 6 to 20 when the hydrocarbon group is cyclic. As particular examples of the $R_3$ groups, there can be mentioned the above particular examples of the alkyl and cycloalkyl groups represented by $Z_{ka1}$.

With respect to the alkyl groups and cycloalkyl groups represented by $R_4$, the preferred number of carbon atoms and particular examples are as mentioned above in connection with the alkyl groups and cycloalkyl groups represented by $Z_{ka1}$.

The acyl group represented by $R_4$ preferably has 2 to 6 carbon atoms. As such, there can be mentioned, for example, a formyl group, an acetyl group, a propionyl group, a butyryl group, an isobutyryl group, a valeryl group, a pivaloyl group or the like.

As the alkyl moiety of the alkoxy group and alkoxycarbonyl group represented by $R_4$, there can be mentioned a linear, branched or cyclic alkyl moiety. With respect to the alkyl moiety, the preferred number of carbon atoms and particular examples are as mentioned above in connection with the alkyl groups and cycloalkyl groups represented by $Z_{ka1}$.

With respect to the alkylene group and cycloalkylene group represented by X, the preferred number of carbon atoms and particular examples are as mentioned above in connection with the alkylene group and cycloalkylene group represented by $R_2$.

Moreover, as particular structures of the repeating units (cy), there can be mentioned the repeating units with the following partial structures.

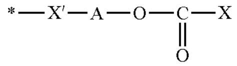
(rf-1)

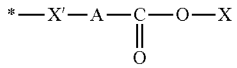
(rf-2)

In general formulae (rf-1) and (rf-2),

X' represents an electron withdrawing substituent, preferably a carbonyloxy group, an oxycarbonyl group, an alkylene group substituted with a fluorine atom or a cycloalkylene group substituted with a fluorine atom.

A represents a single bond or a bivalent connecting group of the formula —C(Rx)(Ry)-. In the formula, each of Rx and Ry independently represents a hydrogen atom, a fluorine atom, an alkyl group (preferably having 1 to 6 carbon atoms, optionally substituted with a fluorine atom) or a cycloalkyl group (preferably having 5 to 12 carbon atoms, optionally substituted with a fluorine atom). Each of Rx and Ry is preferably a hydrogen atom, an alkyl group or an alkyl group substituted with a fluorine atom.

X represents an electron withdrawing group. As particular examples thereof, there can be mentioned the electron withdrawing groups set forth above as being represented by $Y^1$ and $Y^2$. X is preferably a fluoroalkyl group, a fluorocycloalkyl group, an aryl group substituted with fluorine or a fluoroalkyl group, or an aralkyl group substituted with fluorine or a fluoroalkyl group.

* represents a bonding hand to the principal chain or a side chain of the resin, namely, a bonding hand bonded to the principal chain of the resin through a single bond or a connecting group.

When X' is a carbonyloxy group or an oxycarbonyl group, A is not a single bond.

The receding contact angle with water of the resin composition film after alkali development can be decreased by the polarity conversion effected by the decomposition of the polarity conversion group by the action of an alkali developer. The decrease of the receding contact angle between water and the film after alkali development is preferred from the viewpoint of the inhibition of development defects.

The receding contact angle with water of the resin composition film after alkali development is preferably 50° or less, more preferably 40° or less, further more preferably 35° or less and most preferably 30° or less at 23±3° C. in a humidity of 45±5%.

The receding contact angle refers to a contact angle determined when the contact line at a droplet-substrate interface draws back. It is generally known that the receding contact angle is useful in the simulation of droplet mobility in a dynamic condition. In brief, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

The above receding contact angle of the film after alkali development refers to the contact angle obtained by measuring the following film by the dilation/contraction method. Namely, an organic antireflection film ARC29SR (produced by Nissan Chemical Industries, Ltd.) was applied onto a silicon wafer (8-inch caliber) and baked at 205° C. for 60 seconds, thereby forming a 98 nm-thick antireflection film. Each of the compositions of the present invention was applied thereonto and baked at 120° C. for 60 seconds, thereby forming a 120 nm-thick film. The film was developed with an aqueous solution of tetramethylammonium hydroxide (2.38 mass %) for 30 seconds, rinsed with pure water and spin dried. The contact angle of the thus obtained film was measured in accordance with the dilation/contraction method.

The rate of hydrolysis of the resin (Cy) in an alkali developer is preferably 0.001 nm/sec or greater, more preferably 0.01 nm/sec or greater, further more preferably 0.1 nm/sec or greater and most preferably 1 nm/sec or greater.

Herein, the rate of hydrolysis of the resin (Cy) in an alkali developer refers to the rate of decrease of the thickness of a resin film formed from only the resin (Cy) in 23° C. TMAH (aqueous solution of tetramethylammonium hydroxide) (2.38 mass %)

It is preferred for the repeating unit (cy) to be a repeating unit containing at least two polarity conversion groups.

When the repeating unit (cy) contains at least two polarity conversion groups, it is preferred for the repeating unit to contain a group with any of the partial structures having two polarity conversion groups of general formula (KY-1) below. When the structure of general formula (KY-1) has no bonding hand, a group with a mono- or higher-valent group resulting from the removal of at least any arbitrary one of the hydrogen atoms contained in the structure is referred to.

(KY-1)

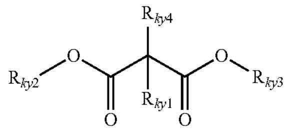

In general formula (KY-1), each of $R_{ky1}$ and $R_{ky4}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group. Alternatively, both $R_{ky1}$ and $R_{ky4}$ may be bonded to the same atom to thereby form a double bond. For example, both $R_{ky1}$ and $R_{ky4}$ may be bonded to the same oxygen atom to thereby form a part (=O) of a carbonyl group.

Each of $R_{ky2}$ and $R_{ky3}$ independently represents an electron withdrawing group. Alternatively, $R_{ky1}$ and $R_{ky2}$ are linked to each other to thereby form a lactone structure, while $R_{ky3}$ is an electron withdrawing group. The formed lactone structure is preferably any of the above-mentioned structures (KA-1-1) to (KA-1-17). As the electron withdrawing group, there can be mentioned any of the same groups as mentioned above with respect to $Y^1$ and $Y^2$ of general formula (KB-1). This electron withdrawing group is preferably a halogen atom, or any of the halo(cyclo)alkyl groups or haloaryl groups of the formula —$C(R_{f1})(R_{f2})$—$R_{f3}$ above. Preferably, $R_{ky3}$ is a halogen atom, or any of the halo(cyclo)alkyl groups or haloaryl groups of the formula —$C(R_{f1})(R_{f2})$—$R_{f3}$ above, while $R_{ky2}$ is either linked to $R_{ky1}$ to thereby form a lactone ring, or an electron withdrawing group containing no halogen atom.

$R_{ky1}$, $R_{ky2}$ and $R_{ky4}$ may be linked to each other to thereby form a monocyclic or polycyclic structure.

As $R_{ky1}$ and $R_{ky4}$, there can be mentioned, for example, the same groups as set forth above with respect to $Z_{ka1}$ of general formula (KA-1).

The lactone rings formed by the mutual linkage of $R_{ky1}$ and $R_{ky2}$ preferably have the structures of formulae (KA-1-1) to (KA-1-17) above. As the electron withdrawing groups, there can be mentioned those mentioned above as being represented by $Y^1$ and $Y^2$ of general formula (KB-1) above.

It is more preferred for the structure of general formula (KY-1) to be the structure of general formula (KY-2) below. The structure of general formula (KY-2) refers to a group with a mono- or higher-valent group resulting from the removal of at least any arbitrary one of the hydrogen atoms contained in the structure.

(KY-2)

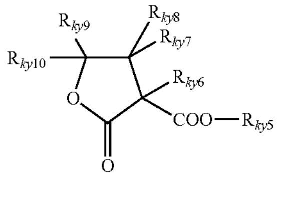

In formula (KY-2), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group.

At least two of $R_{ky6}$ to $R_{ky10}$ may be linked to each other to thereby form a monocyclic or polycyclic structure.

$R_{ky5}$ represents an electron withdrawing group. As the electron withdrawing group, there can be mentioned any of the same groups as set forth above with respect to $Y^1$ and $Y^2$. This electron withdrawing group is preferably a halogen atom, or any of the halo(cyclo)alkyl groups or haloaryl groups of the formula —$C(R_{f1})(R_{f2})$—$R_{f3}$ above.

As $R_{ky5}$ to $R_{ky10}$, there can be mentioned, for example, the same groups as set forth above with respect to $Z_{ka1}$ of formula (KA-1).

It is more preferred for the structure of formula (KY-2) to be the partial structure of general formula (KY-3) below.

(KY-3)

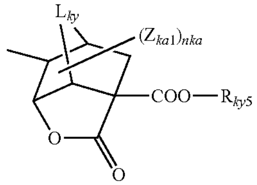

In formula (KY-3), $Z_{ka1}$ and nka are as defined above in connection with general formula (KA-1). $R_{ky5}$ is as defined above in connection with formula (KY-2).

$L_{ky}$ represents an alkylene group, an oxygen atom or a sulfur atom. As the alkylene group represented by $L_{ky}$, there can be mentioned a methylene group, an ethylene group or the like. $L_{ky}$ is preferably an oxygen atom or a methylene group, more preferably a methylene group.

The repeating units (cy) are not limited as long as they are derived by polymerization, such as addition polymerization, condensation polymerization or addition condensation. Preferred repeating units are those obtained by the addition polymerization of a carbon to carbon double bond. As such repeating units, there can be mentioned, for example, acrylate repeating units (including the family having a substituent at the α- and/or β-position), styrene repeating units (including the family having a substituent at the α- and/or β-position), vinyl ether repeating units, norbornene repeating units, repeating units of maleic acid derivatives (maleic anhydride, its derivatives, maleimide, etc.) and the like. Of these, acrylate repeating units, styrene repeating units, vinyl ether repeating units and norbornene repeating units are preferred. Acrylate repeating units, vinyl ether repeating units and norbornene repeating units are more preferred. Acrylate repeating units are most preferred.

When the repeating unit (cy) is a repeating unit containing at least either a fluorine atom or a silicon atom (namely, corresponding to the above repeating unit (cy') or (cy")), as the partial structure containing a fluorine atom within the repeating unit (cy), there can be mentioned any of those set forth in connection with the repeating unit (c1) to be described hereinafter, preferably the groups of general formulae (F2) to (F4) above. As the partial structure containing a silicon atom within the repeating unit (cy), there can be mentioned any of those set forth in connection with the repeating unit (c1) to be described hereinafter, preferably the groups of general formulae (CS-1) to (CS-3) above.

The content of repeating unit (cy) in the resin (Cy), based on all the repeating units of the resin (Cy), is preferably in the range of 10 to 100 mol %, more preferably 20 to 99 mol %, further more preferably 30 to 97 mol % and most preferably 40 to 95 mol %.

The content of repeating unit (cy') based on all the repeating units of the resin (Cy) is preferably in the range of 10 to 100 mol %, more preferably 20 to 100 mol %, further more preferably 30 to 100 mol % and most preferably 40 to 100 mol %.

The content of repeating unit (cy*) based on all the repeating units of the resin (Cy) is preferably in the range of 5 to 70 mol %, more preferably 5 to 60 mol %, further more preferably 10 to 50 mol % and most preferably 10 to 40 mol %. The content of repeating unit containing at least either a fluorine atom or a silicon atom used in combination with the repeating unit (cy*), based on all the repeating units of the resin (Cy), is preferably in the range of 10 to 95 mol %, more preferably 15 to 85 mol %, further more preferably 20 to 80 mol % and most preferably 25 to 75 mol %.

The content of repeating unit (cy") based on all the repeating units of the resin (Cy) is preferably in the range of 10 to 100 mol %, more preferably 20 to 100 mol %, further more preferably 30 to 100 mol % and most preferably 40 to 100 mol %.

Particular examples of the repeating units (cy) containing a group whose solubility in an alkali developer is increased are shown below, which however in no way limit the scope of the repeating units.

Ra represents a hydrogen atom, a fluorine atom, a methyl group or a trifluoromethyl group.

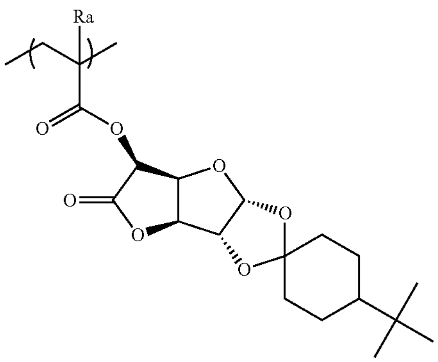

-continued

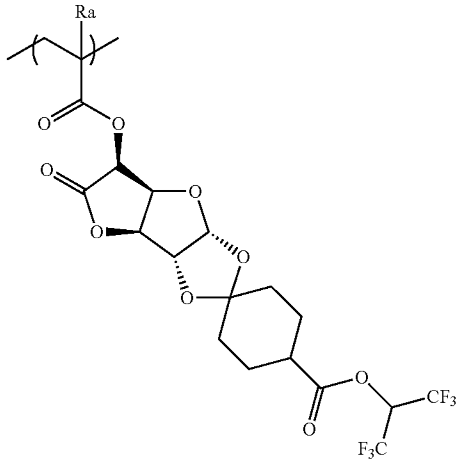

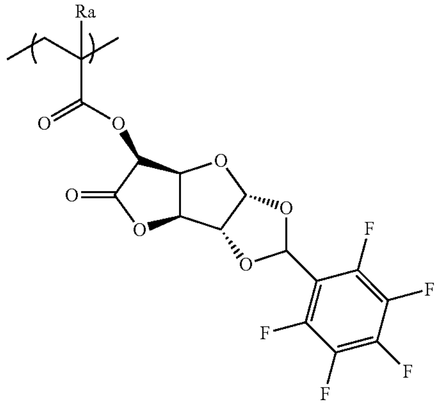

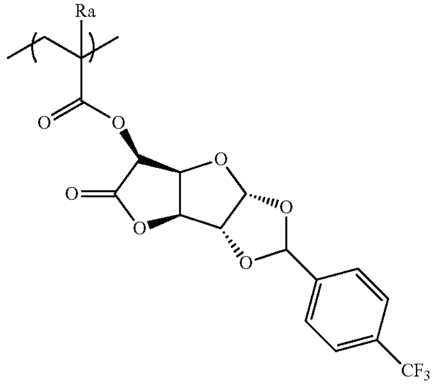

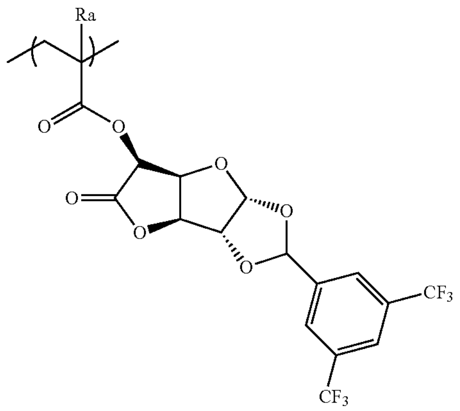

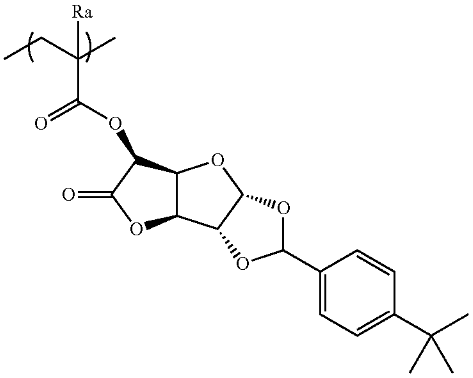
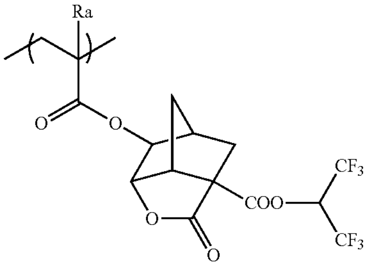
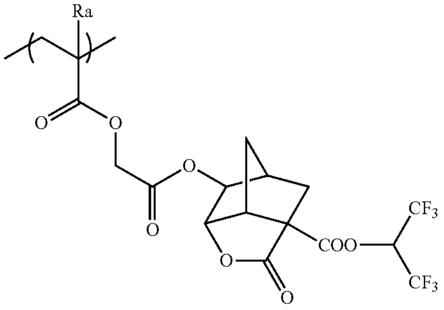
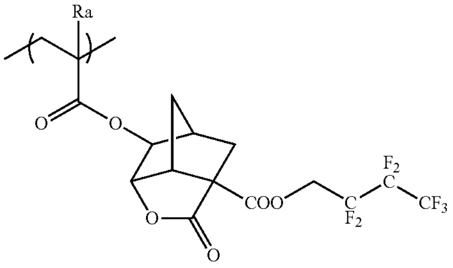
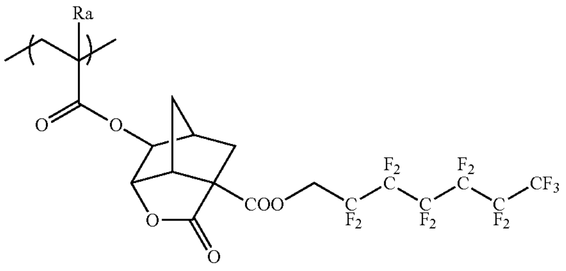
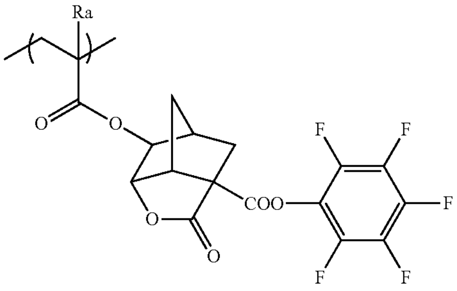
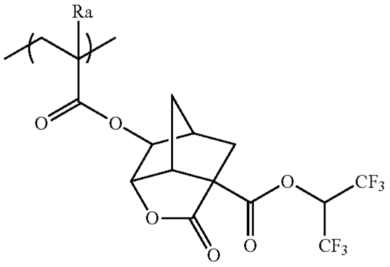
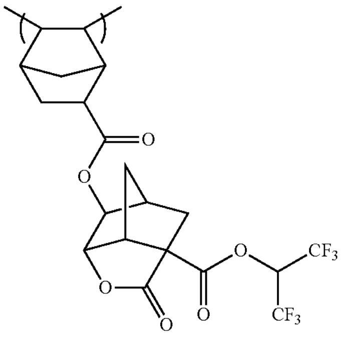
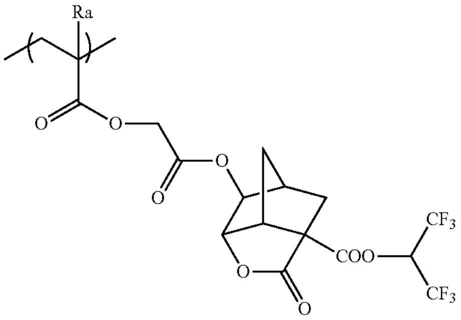
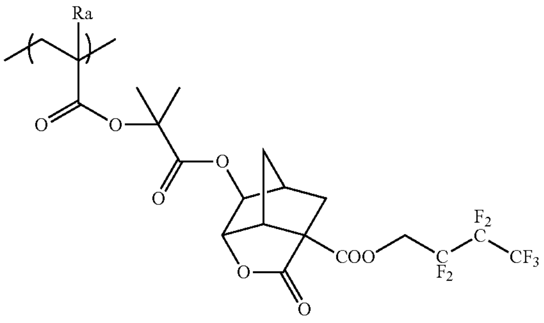

-continued
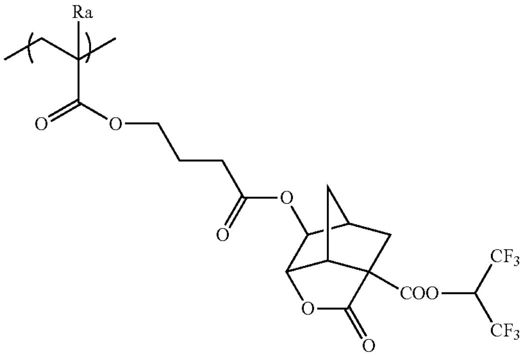
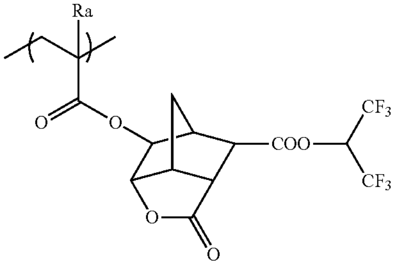
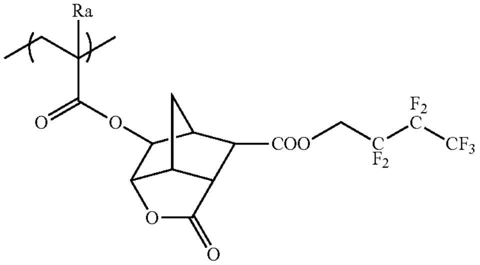
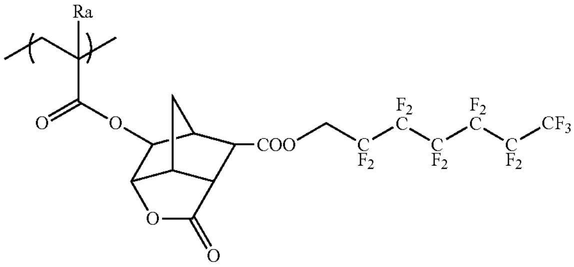
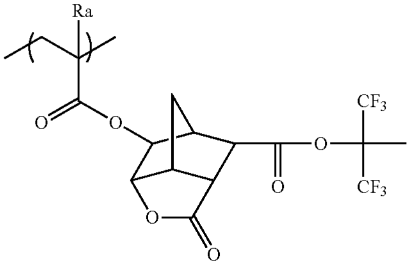
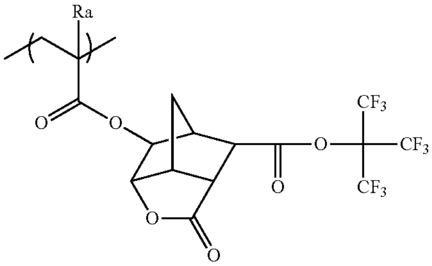
-continued
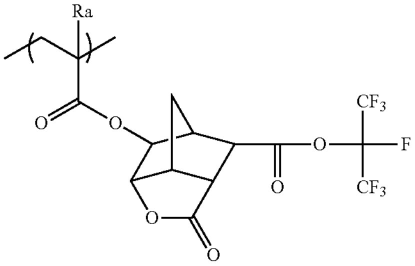
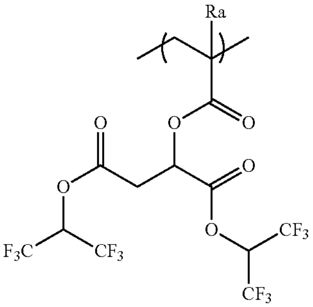
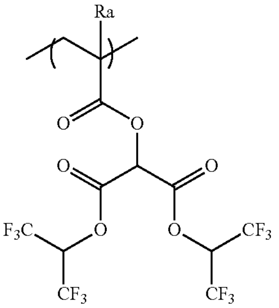
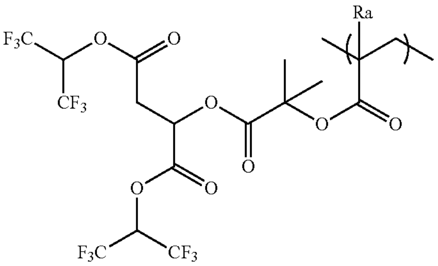
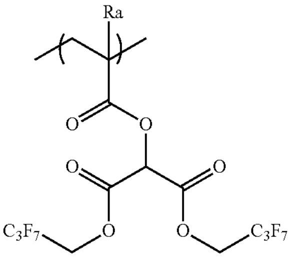
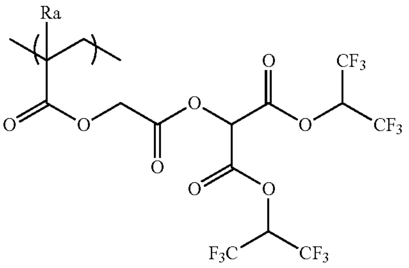

-continued

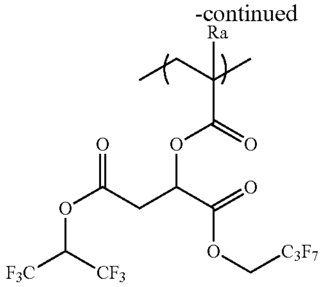

The resin (Cy) may further contain a repeating unit (c1) containing at least either a fluorine atom or a silicon atom, other than the repeating units (cy') and (cy").

As the partial structure having a fluorine atom within the repeating unit (c1), there can be mentioned those set forth above, preferably any of the groups of general formulae (F2) to (F4) above.

As the partial structure having a silicon atom within the repeating unit (c1), there can be mentioned those set forth above, preferably any of the groups of general formulae (CS-1) to (CS-3) above.

It is preferred for the repeating unit (c1) containing at least either a fluorine atom or a silicon atom to be a (meth)acrylate repeating unit.

As particular examples of the repeating units (c1), there can be mentioned the same particular examples as those of repeating units containing a fluorine atom set forth above and the same particular examples as those of repeating units containing groups of general formulae (CS-1) to (CS-3) set forth above. These however in no way limit the scope of the present invention.

As the repeating unit containing a group (z) decomposed by the action of an acid contained in the hydrophobic resin, there can be mentioned any of those containing an acid-decomposable group set forth above in connection with the acid-decomposable resin. The repeating unit containing a group (z) decomposed by the action of an acid may contain at least either a fluorine atom or a silicon atom. The content of repeating unit containing a group (z) decomposed by the action of an acid in the hydrophobic resin, based on all the repeating units of the resin, is preferably in the range of 1 to 80 mol %, more preferably 10 to 80 mol % and further more preferably 20 to 60 mol %.

The hydrophobic resin may further contain any of the repeating units represented by the following general formula (III).

(III)

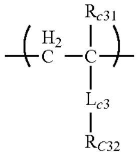

In the formula (III), $R_{c31}$ represents a hydrogen atom, an alkyl group, an alkyl group optionally substituted with one or more fluorine atoms, a cyano group or a group of the formula —$CH_2$—O—$R_{ac2}$ in which $R_{ac2}$ represents a hydrogen atom, an alkyl group or an acyl group. $R_{c31}$ is preferably a hydrogen atom, a methyl group, a hydroxymethyl group, or a trifluoromethyl group, more preferably a hydrogen atom or a methyl group.

$R_{c32}$ represents a group containing an alkyl group, a cycloalkyl group, an alkenyl group, a cycloalkenyl group, or an aryl group. These groups may be substituted with fluorine atom and/or silicon atom.

$L_{c3}$ represents a single bond or a bivalent connecting group.

The alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms such as a phenyl group or a naphthyl group.

These groups may have one or more substituents.

Preferably, $R_{c32}$ represents an unsubstituted alkyl group or an alkyl group substituted with one or more fluorine atoms.

$L_{c3}$ represents a single bond or a bivalent connecting group. As the bivalent connecting group represented by $L_{c3}$, an alkylene group (preferably having 1 to 5 carbon atoms), an oxy group, a phenylene group, or an ester bond (a group represented by —COO—) can be exemplified.

The hydrophobic resin may further contain any of the repeating units represented by general formula (CII-AB) below.

(CII-AB)

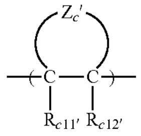

In the formula (CII-AB), each of $R_{c11}$' and $R_{c12}$' independently represents a hydrogen atom, a cyano group, a halogen atom or an alkyl group.

Zc' represents an atomic group required for forming an alicyclic structure in cooperation with two carbon atoms (C—C) to which $R_{c11'}$ and $R_{c12'}$ are respectively bonded.

When any of the groups contained in the repeating unit represented by general formulae (III) or (CII-AB) is substituted with a fluorine atom or a silicone atom, the repeating unit is also corresponding to the aforementioned repeating unit (c1).

Specific examples of the repeating unit represented by general formulae (III) or (CII-AB) will be shown below, which however in no way limit the scope of the present invention. In the formulae, Ra represents H, $CH_3$, $CH_2OH$, $CF_3$ or CN. Note that the repeating unit in which Ra represents $CF_3$ also corresponds to the repeating unit (c1).

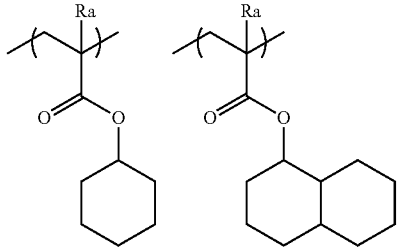

-continued
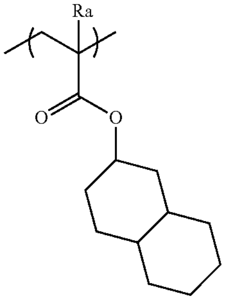
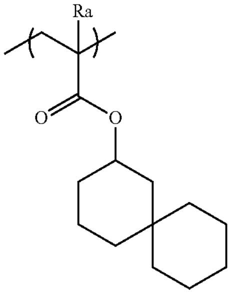
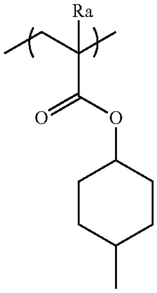
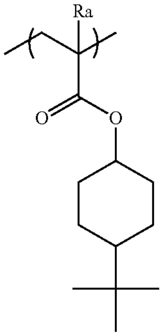
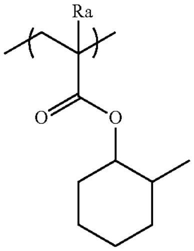
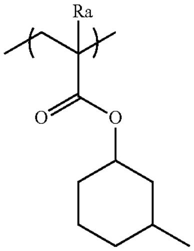
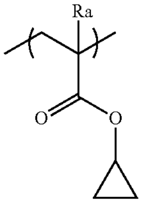
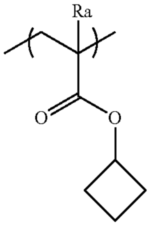
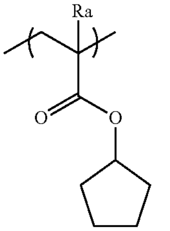
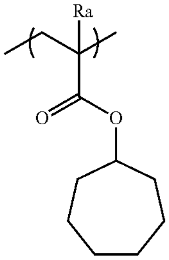
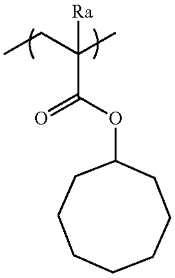
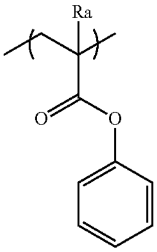
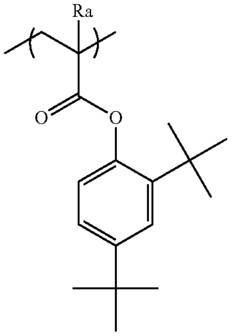
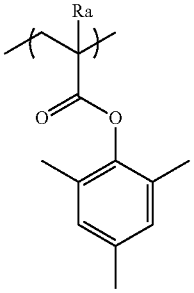
-continued
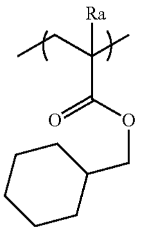
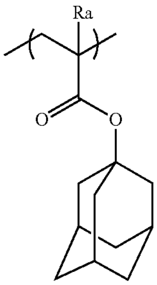
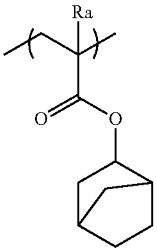
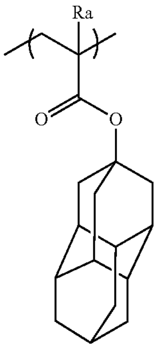
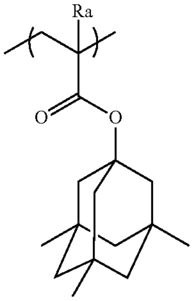
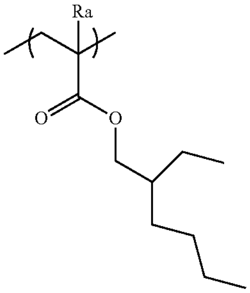
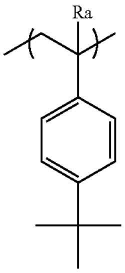
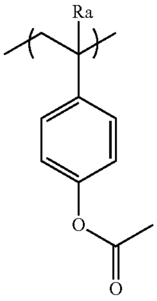
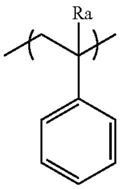
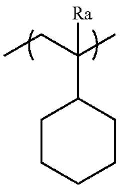
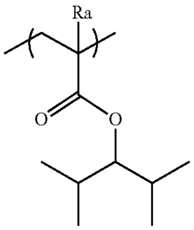
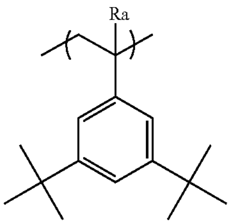
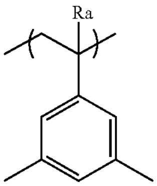
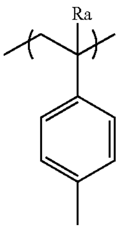
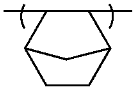

-continued

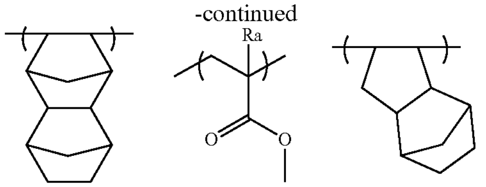

When the hydrophobic resin contains fluorine atoms, the content of the fluorine atoms based on the molecular weight of the hydrophobic resin is preferably in the range of 5 to 80 mass %, and more preferably 10 to 80 mass %. The repeating unit containing fluorine atoms preferably exists in the hydrophobic resin in an amount of 10 to 100 mass %, more preferably 30 to 100 mass %.

When the hydrophobic resin contains silicon atoms, the content of the silicon atoms based on the molecular weight of the hydrophobic resin is preferably in the range of 2 to 50 mass %, more preferably 2 to 30 mass %. The repeating unit containing silicon atoms preferably exists in the hydrophobic resin in an amount of 10 to 100 mass %, more preferably 20 to 100 mass %.

The weight average molecular weight of the hydrophobic resin in terms of standard polystyrene molecular weight is preferably in the range of 1,000 to 100,000, more preferably 1,000 to 50,000, and still more preferably 2,000 to 15,000.

The hydrophobic resin may either be used individually or in combination.

The content of the hydrophobic resin in the resist composition based on the total solids thereof is preferably in the range of 0.01 to 20 mass %, more preferably 0.01 to 10 mass %, furthermore preferably 0.05 to 8 mass % and most preferably 0.1 to 5 mass %.

Impurities such as metals in the hydrophobic resin should naturally be of low quantity as in the acid-decomposable resin. The content of residual monomers and oligomer components is preferably in the range of 0.01 to 5 mass %, more preferably 0.01 to 3 mass %, and still more preferably 0.01 to 1 mass %. Accordingly, there can be obtained a composition being free from in-liquid foreign matters and a change in sensitivity, etc. over time. From the viewpoint of resolving power, resist profile, side wall of resist pattern, roughness, etc., the molecular weight distribution (Mw/Mn, also referred to as the degree of dispersal) thereof is preferably in the range of 1 to 5, more preferably 1 to 3, and still more preferably 1 to 2.

A variety of commercially available products can be used as the hydrophobic resin, and also the resin can be synthesized in accordance with conventional methods (for example, by radical polymerization). As general synthesizing methods, a batch polymerization method in which a monomer species and an initiator are dissolved in a solvent and heated to carry out polymerization and a dropping polymerization method in which a solution of monomer species and initiator is dropped into a hot solvent over a period of 1 to 10 hours can be exemplified. Of these, the dropping polymerization method is preferred. In the synthesis of the hydrophobic resins, the reaction concentration is preferably in the range of 30 to 50 mass %.

Specific examples of the hydrophobic resins will be shown below. The following Table 1 and 2 shows the molar ratio of individual repeating units (corresponding to individual repeating units in order from the left), weight average molecular weight, and degree of dispersal with respect to each of the resins.

(HR-1)

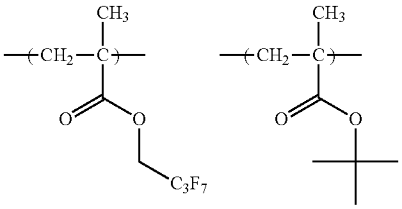

(HR-2)

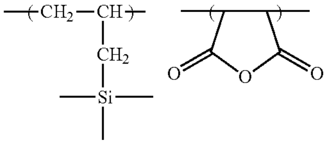

(HR-3)

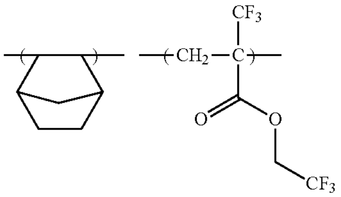

(HR-4)

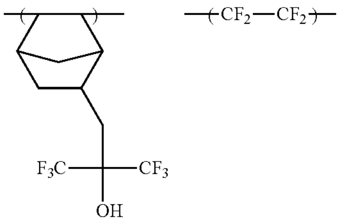

(HR-5)

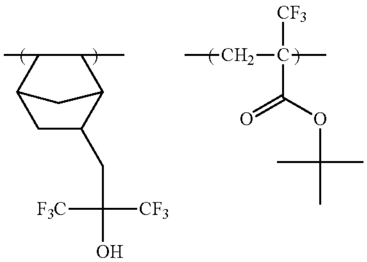

(HR-6)

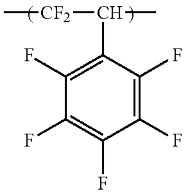

(HR-7)

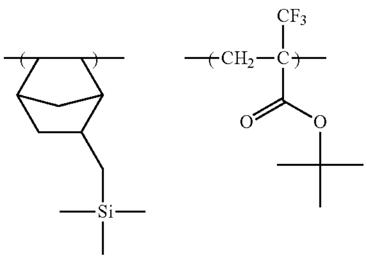

-continued
(HR-8)
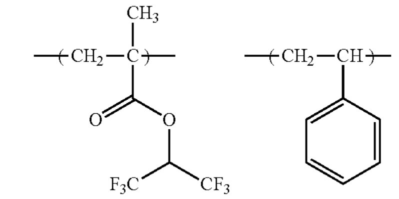
(HR-9)
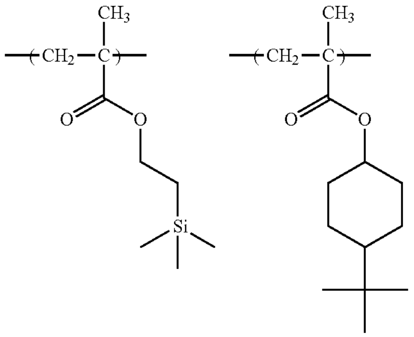
(HR-10)
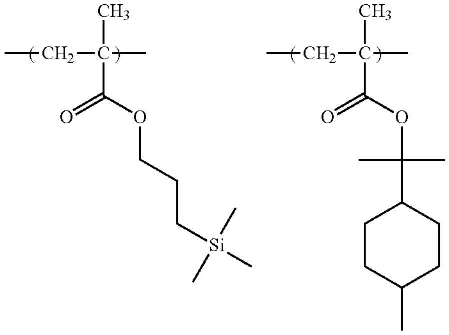
(HR-11)
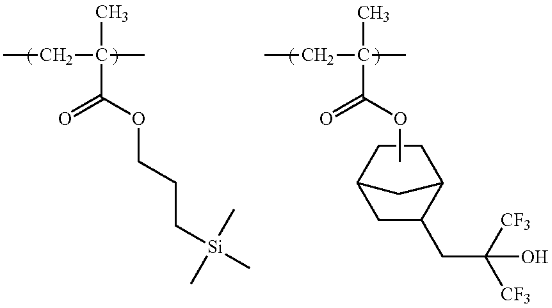
(HR-12)
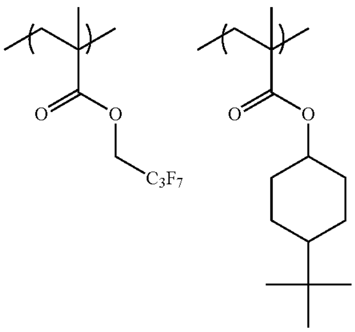
-continued
(HR-13)
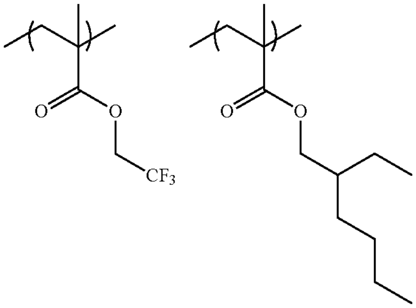
(HR-14)
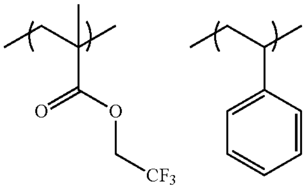
(HR-15)
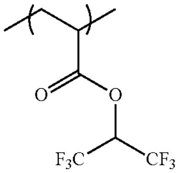
(HR-16)
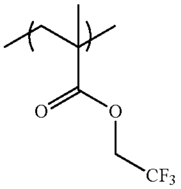
(HR-17)
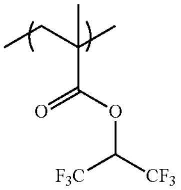
(HR-18)
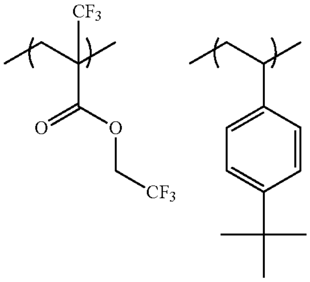

-continued
(HR-19)
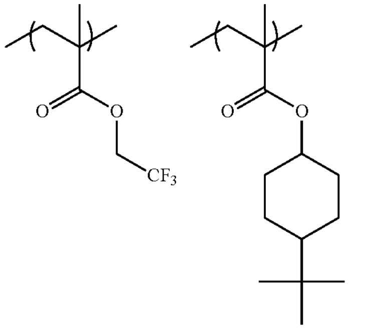
(HR-20)
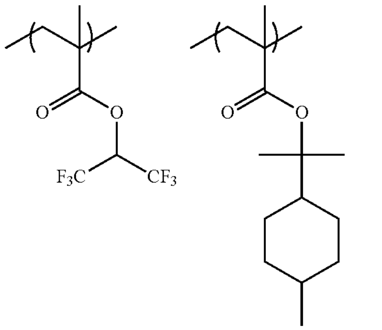
(HR-21)
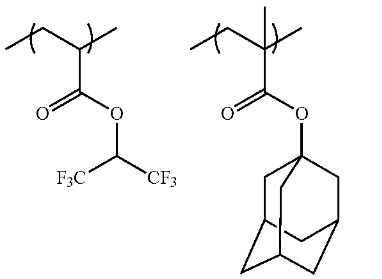
(HR-22)
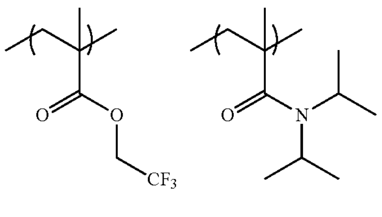
(HR-23)
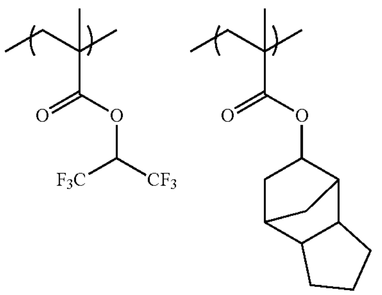
-continued
(HR-24)
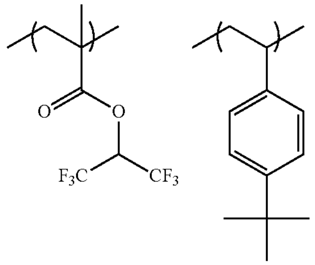
(HR-25)
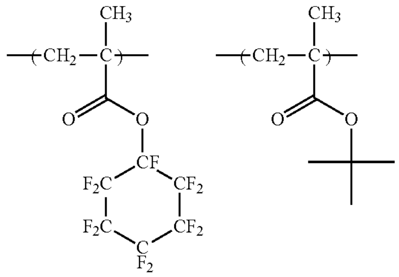
(HR-26)
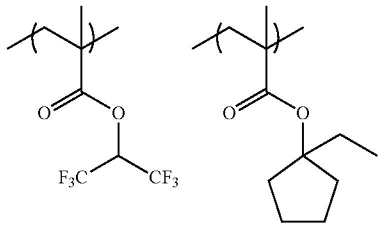
(HR-27)
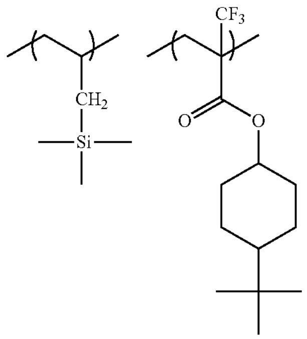
(HR-28)
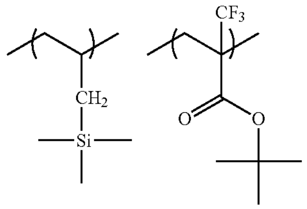
(HR-29)
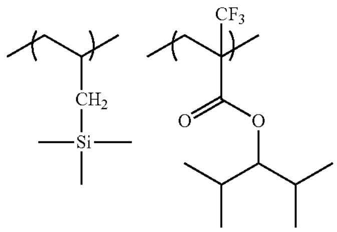

-continued
(HR-30)
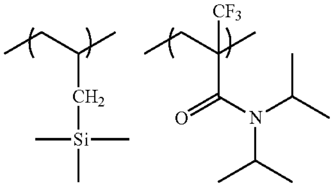
(HR-31)
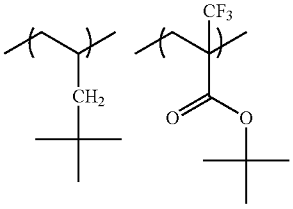
(HR-32)
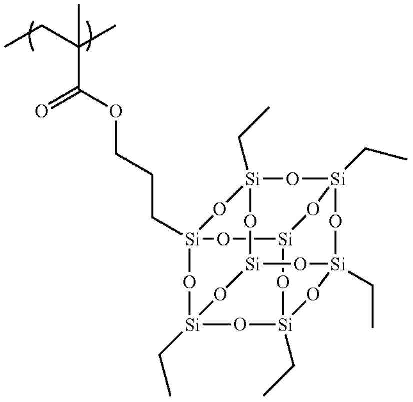
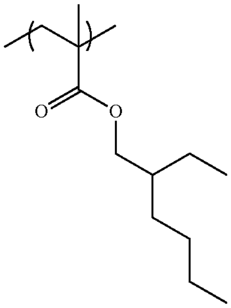
(HR-33)
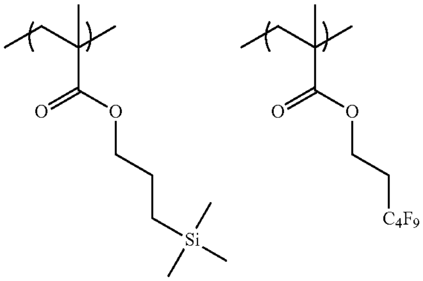
-continued
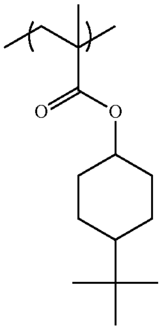
(HR-34)
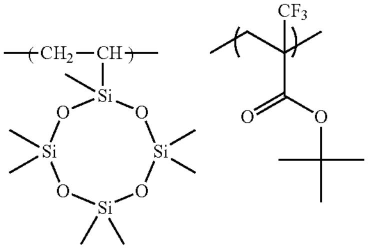
(HR-35)
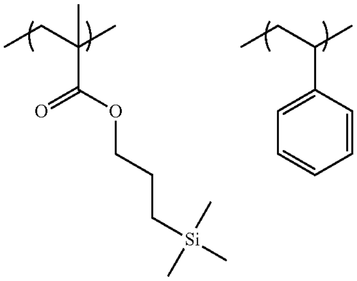
(HR-36)
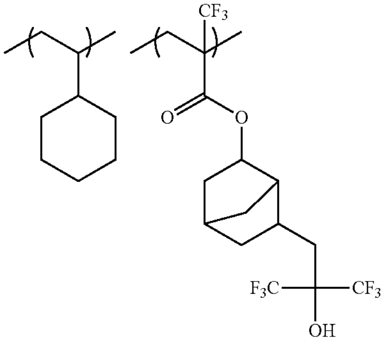
(HR-37)
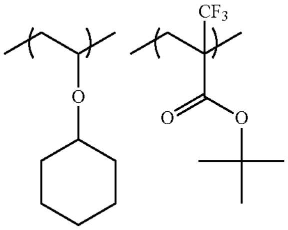

-continued
(HR-38)
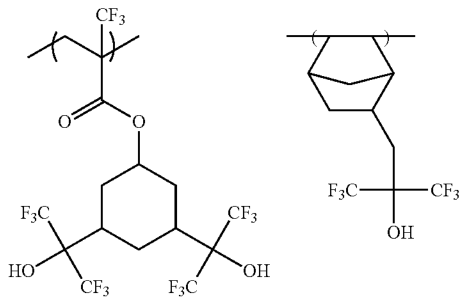
(HR-39)
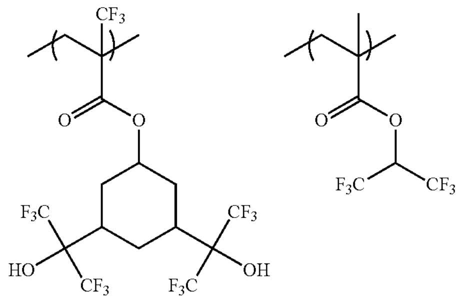
(HR-40)
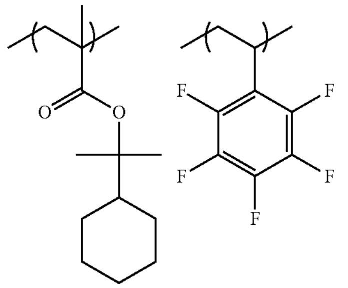
(HR-41)
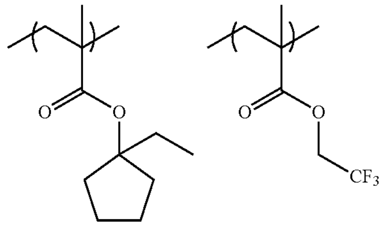
(HR-42)
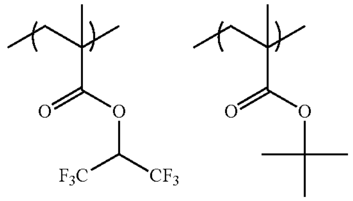
-continued
(HR-43)
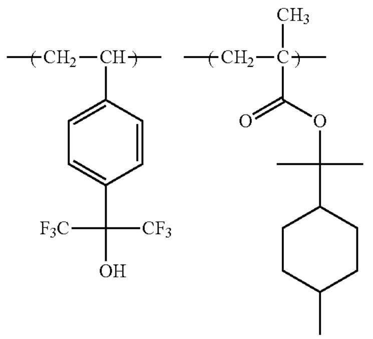
(HR-44)
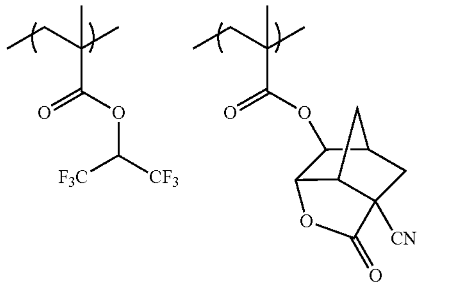
(HR-45)
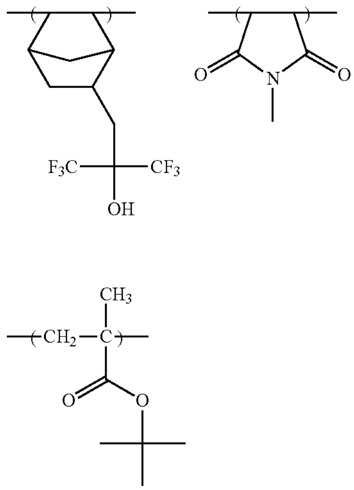
(HR-46)
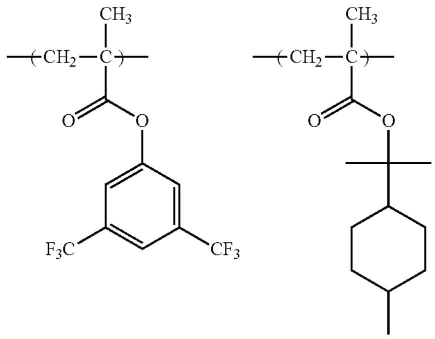

-continued
(HR-47)
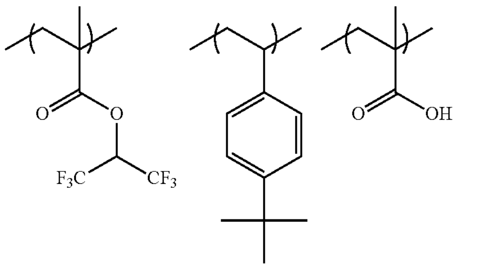
(HR-48)
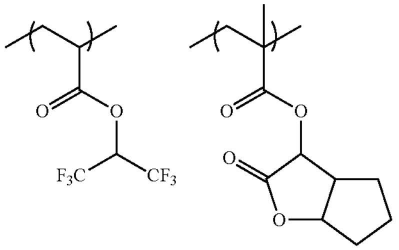
(HR-49)
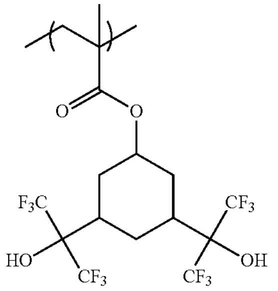
(HR-50)
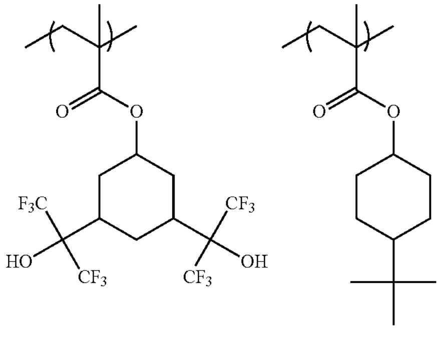
(HR-51)
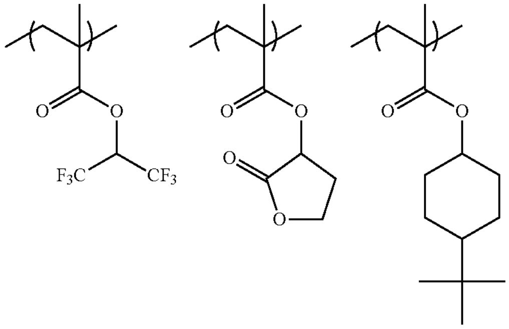
-continued
(HR-52)
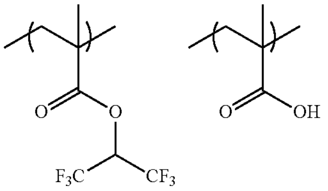
(HR-53)
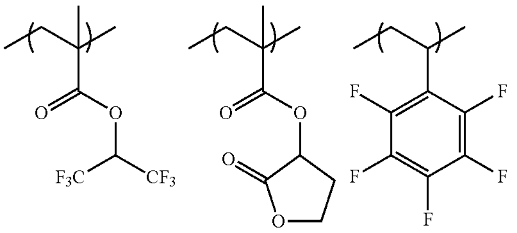
(HR-54)
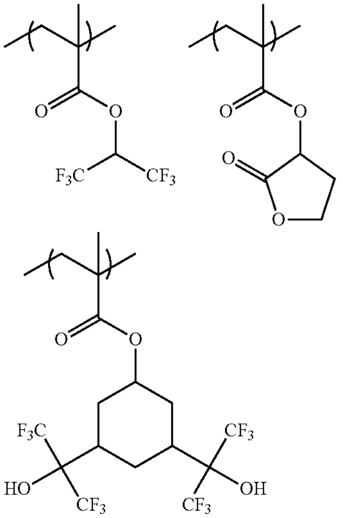
(HR-55)
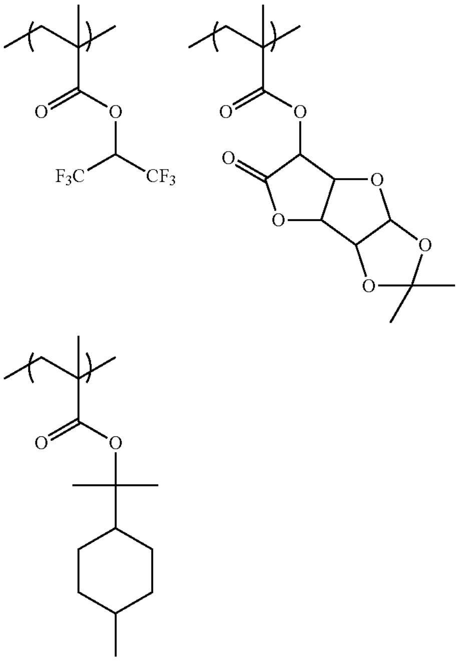

-continued
(HR-56)
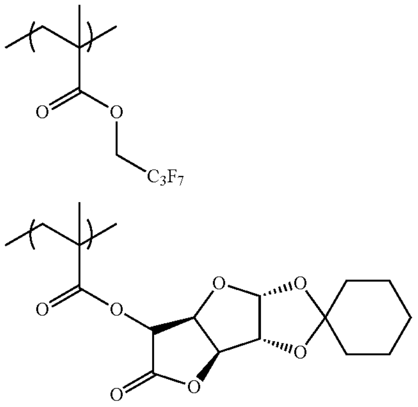
(HR-57)
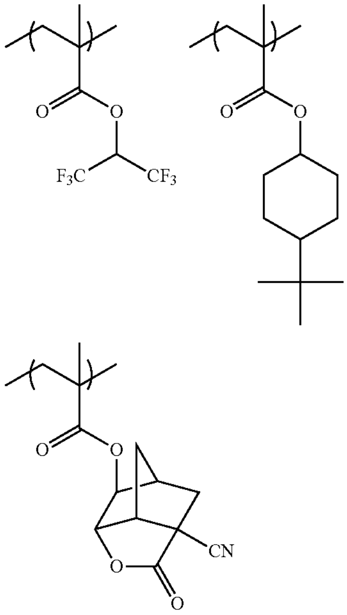
(HR-58)
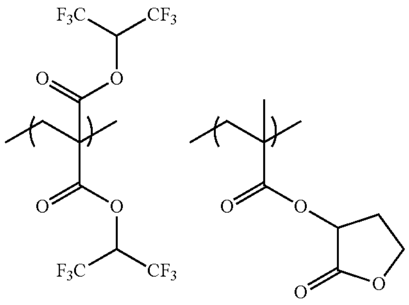
(HR-59)
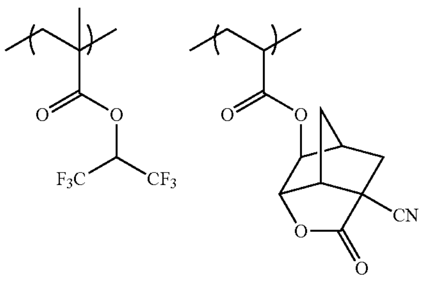
-continued
(HR-60)
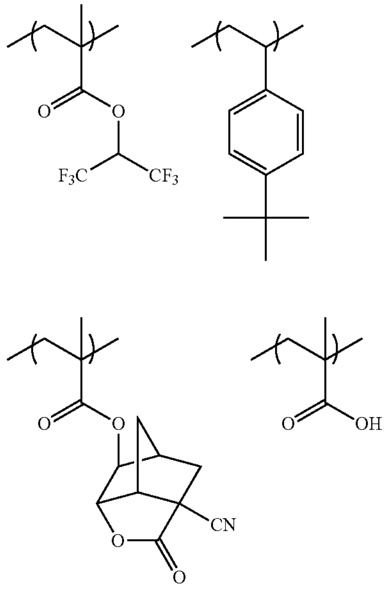
(HR-61)
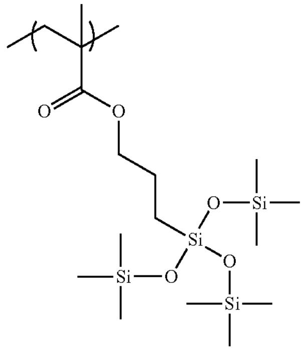
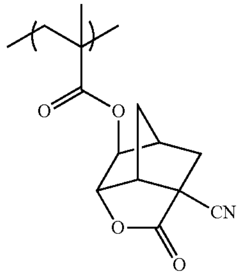
(HR-62)
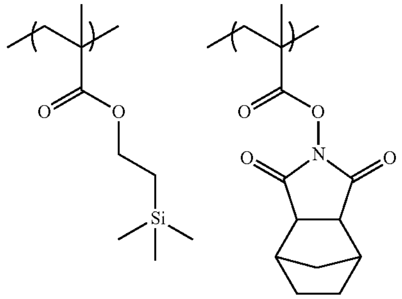

-continued
(HR-63)
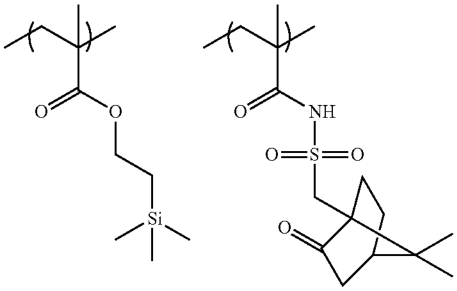
(HR-64)
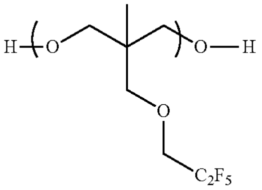
(HR-65)
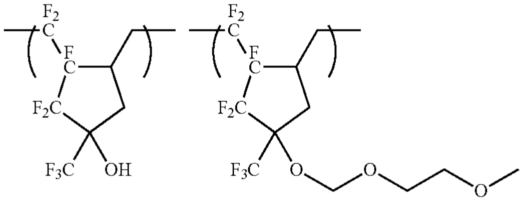
(HR-66)
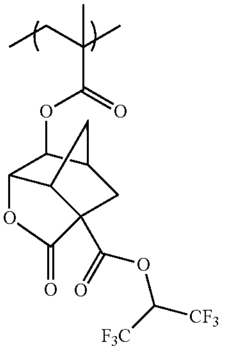
(HR-67)
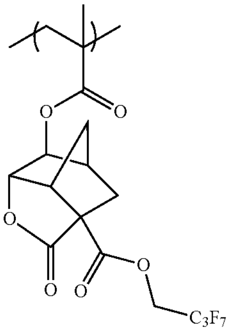
-continued
(HR-68)
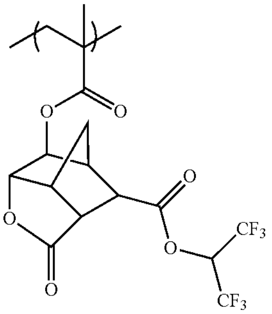
(HR-69)
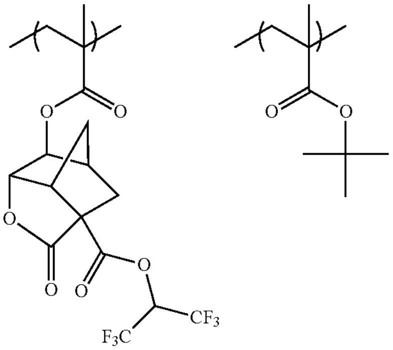
(HR-70)
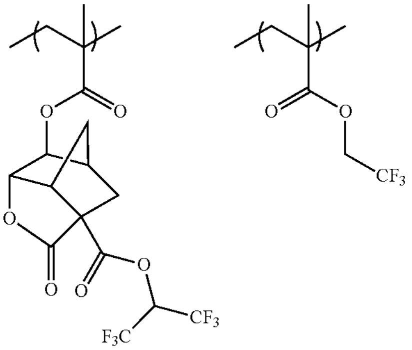
(HR-71)
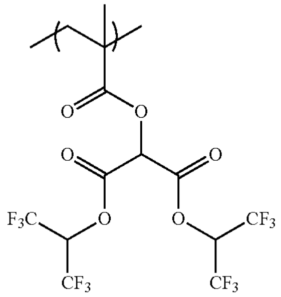
(HR-72)
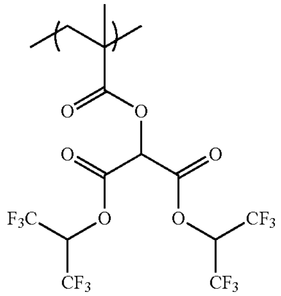

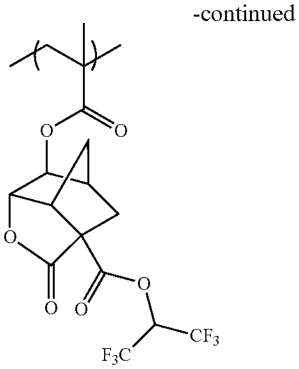
(HR-73)
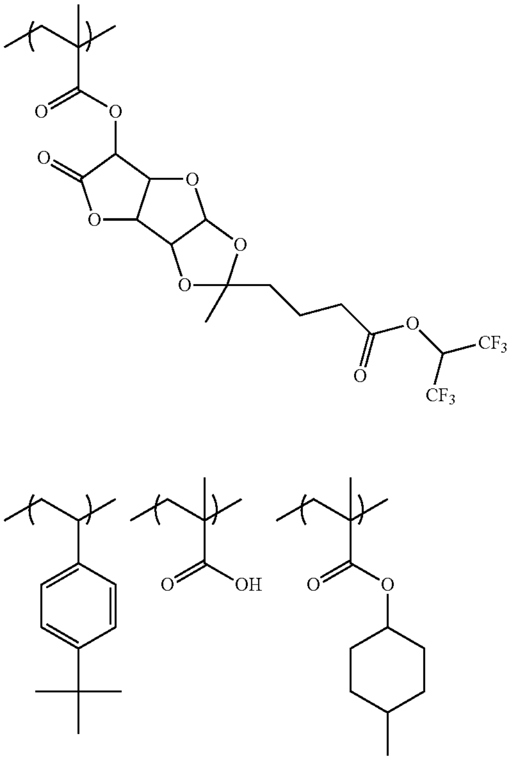
(HR-74)
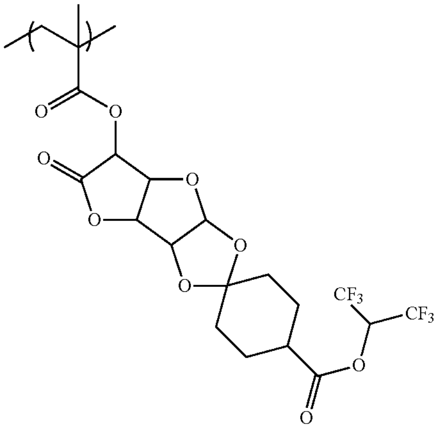
(HR-75)
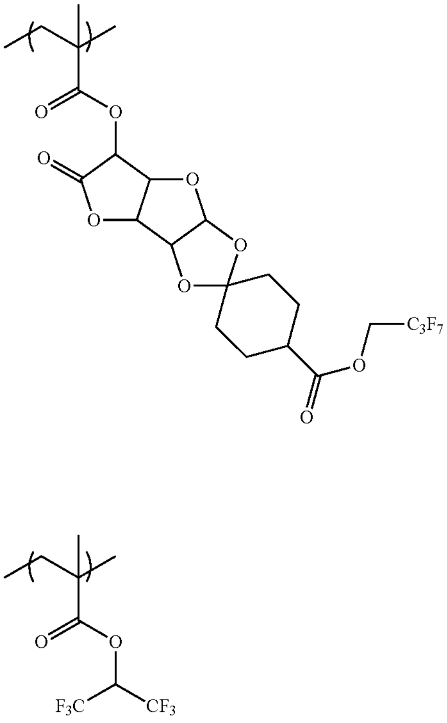
(HR-76)
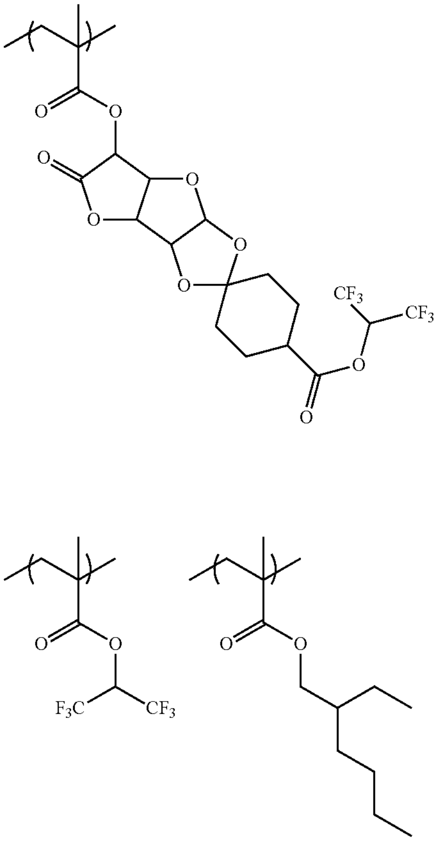

-continued
(HR-77)
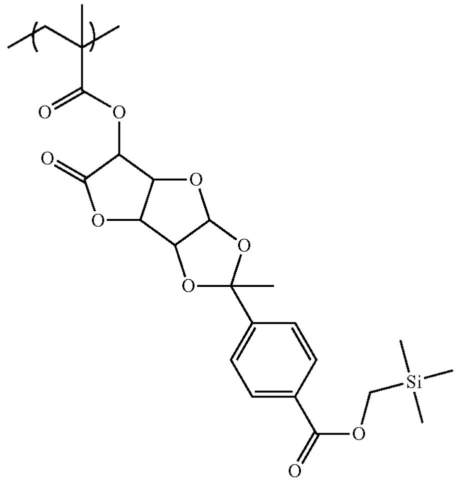
(HR-78)
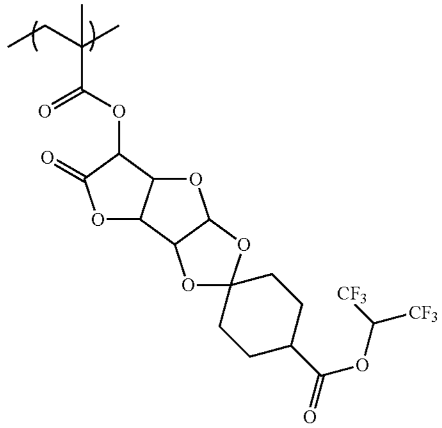
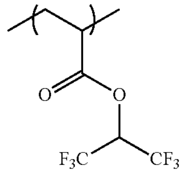
(HR-79)
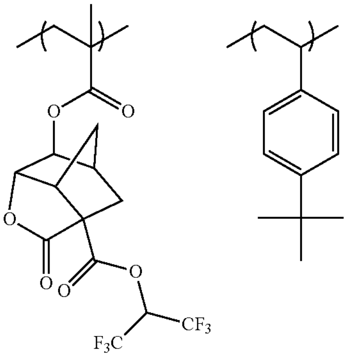
-continued
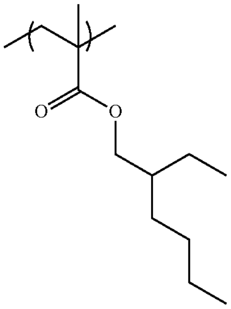
(HR-80)
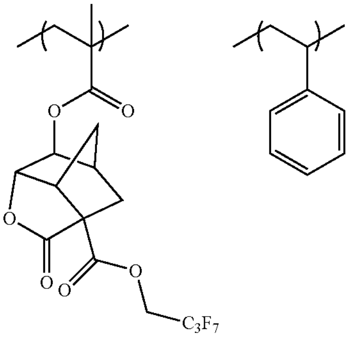
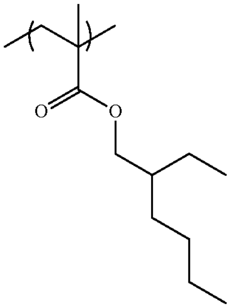
(HR-81)
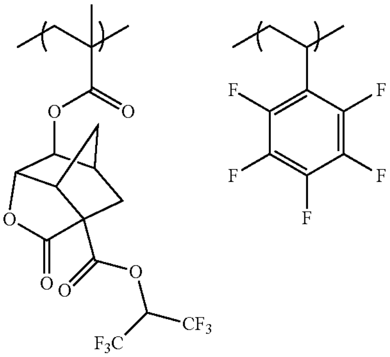
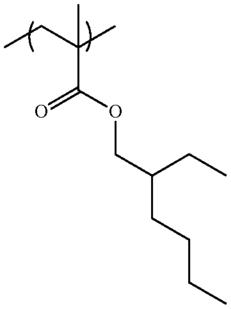

-continued
(HR-82)
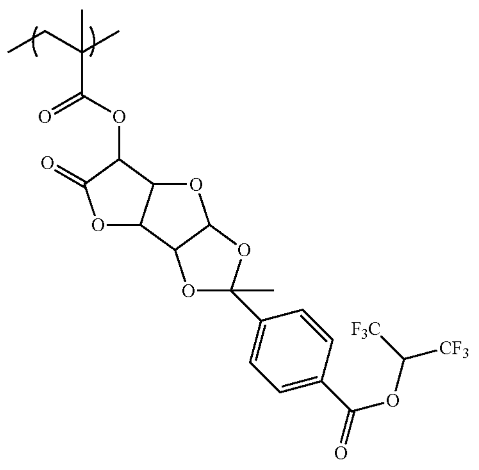
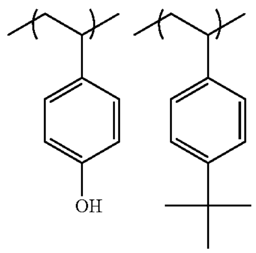
(HR-83)
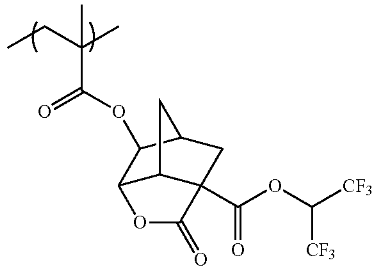
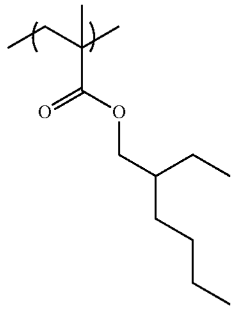
-continued
(HR-84)
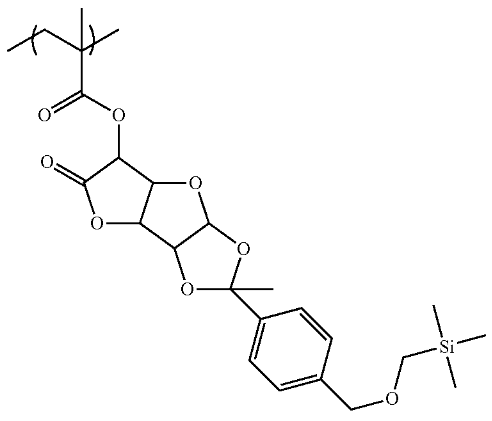
(HR-85)
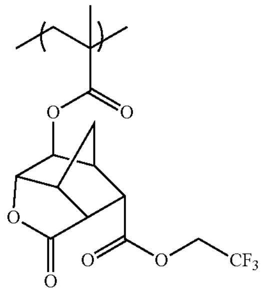
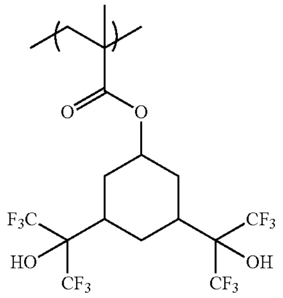
(HR-86)
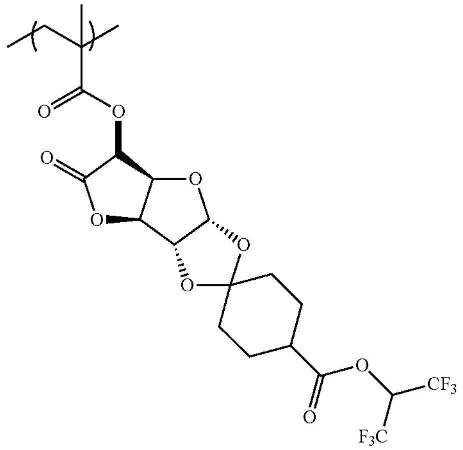

-continued
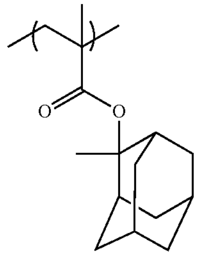
(HR-87)
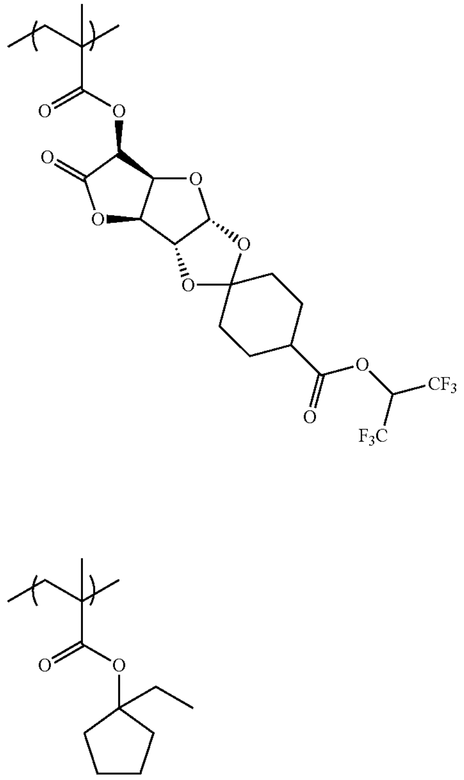
(HR-88)
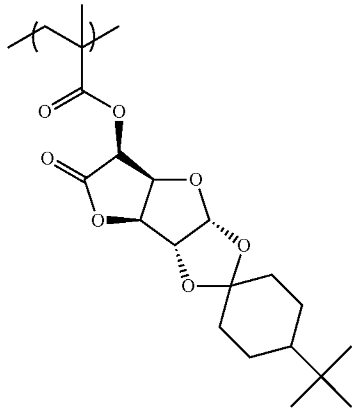
-continued
(HR-89)
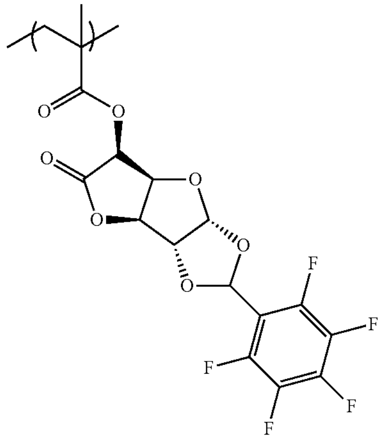
(HR-90)
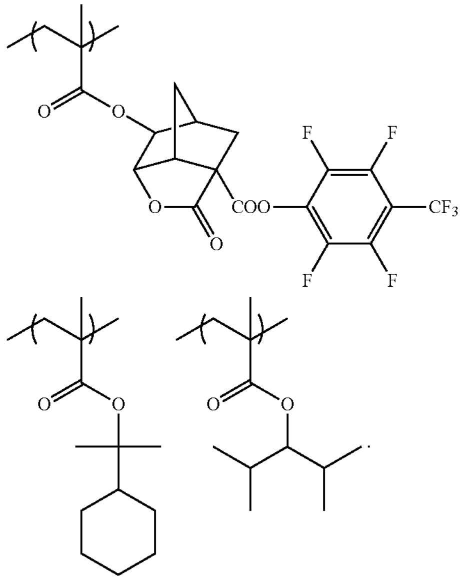
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |

TABLE 1-continued

| Resin | Composition | Mw | Mw/Mn |
|---|---|---|---|
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

(G) Surfactant

The composition according to the present invention may further contain one or more surfactants. It is especially preferred to use a fluorinated and/or siliconized surfactant as the surfactant.

As such surfactants, for example, Megafac F176 and (produced by Dainippon Ink & Chemicals, Inc.); PF656 and PF6320 (produced by OMNOVA); Troy Sol S-366 (produced by Troy Chemical Co., Ltd.); Florad FC 430 (produced by Sumitomo 3M Ltd.); and polysiloxane polymer KP-341 (produced by Shin-Etsu Chemical Co., Ltd.) can be exemplified.

Further, use may be made of surfactants other than the fluorinated and/or siliconized surfactants. More specifically, for example, a polyoxyethylenealkylether and a polyoxyethylenealkylarylether can be exemplified.

Further, other known surfactants can also be used. As employable surfactants, those described in section [0273] et seq. of US Patent Application Publication No. 2008/0248425 can be exemplified.

These surfactants may be used either individually or in combination.

When the composition according to the present invention contains the surfactant, the total amount thereof used based on the total solids of the composition is preferably in the range of 0.0001 to 2 mass %, more preferably 0.0001 to 1.5 mass %, and most preferably 0.0005 to 1 mass %.

(H) Solvent

The composition of the present invention may further contain a solvent.

The solvent is not particularly limited as long as it can dissolve the components of the composition. For example, use can be made of an alkylene glycol monoalkyl ether carboxylate (propylene glycol monomethyl ether acetate or the like), an alkylene glycol monoalkyl ether (propylene glycol monomethyl ether or the like), an alkyl lactate (ethyl lactate, methyl lactate or the like), a cyclolactone (γ-butyrolactone or the like, preferably having 4 to 10 carbon atoms), a chain or cyclic ketone (2-heptanone, cyclohexanone or the like, preferably having 4 to 10 carbon atoms), an alkylene carbonate (ethylene carbonate, propylene carbonate or the like), an alkyl carboxylate (preferably an alkyl acetate such as butyl acetate), an alkyl alkoxycarboxylate (ethyl ethoxypropionate or the like) or the like. As other useful solvents, there can be mentioned, for example, those described in section [0244] et seq. of US 2008/0248425 A1 and the like.

Among the above solvents, an alkylene glycol monoalkyl ether carboxylate and an alkylene glycol monoalkyl ether are preferred.

Any of these solvents may be used alone, and also two or more of these solvents may be used in combination. When two or more of these solvents are mixed together, it is preferred to mix a hydroxylated solvent with a non-hydroxylated solvent. The mass ratio of hydroxylated solvent to non-hydroxylated solvent is in the range of 1/99 to 99/1, preferably 10/90 to 90/10 and more preferably 20/80 to 60/40.

The hydroxylated solvent is preferably an alkylene glycol monoalkyl ether. The non-hydroxylated solvent is preferably an alkylene glycol monoalkyl ether carboxylate.

(I) Other Component

The composition of the present invention can be appropriately loaded with, in addition to the above components, an onium salt of carboxylic acid, any of the dissolution inhibiting compounds of 3000 or less molecular weight described in, for example, Proceeding of SPIE, 2724,355 (1996), a dye, a plasticizer, a photosensitizer, a light absorber, etc.

<Method of Forming Pattern>

The composition of the present invention is typically used in such a manner that the above components (excluding a solvent) are dissolved in a solvent, filtered and applied onto a support. The filter medium preferably comprises a polytetrafluoroethylene, polyethylene or nylon having a pore size of 0.1 μm or less, more preferably 0.05 μm or less and further more preferably 0.03 μm or less.

The composition is applied onto a substrate, such as one for use in the production of integrated circuit elements (e.g., silicon/silicon dioxide coating), by appropriate application means, such as a spinner. Thereafter, the applied composition is dried to thereby obtain a photosensitive film.

This film is exposed through a given mask to actinic rays or radiation, preferably baked (heated), developed and rinsed. Thus, a favorable pattern can be obtained. When the film is exposed to electron beams, lithography through no mask (direct lithography) is generally carried out.

The actinic rays or radiation is not particularly limited, and, for example, a KrF excimer laser, an ArF excimer laser, EUV light, electron beams and the like are used. An ArF excimer laser, EUV light and electron beams are preferred.

Generally, a quaternary ammonium salt, typically tetramethylammonium hydroxide, is used in the alkali developer employed in the development step. The alkali developer is not limited to this, and use can be made of an aqueous solution of an alkali selected from among an inorganic alkali, a primary to tertiary amine, an alcoholamine, a cycloamine and the like.

Further, appropriate amounts of an alcohol and a surfactant may be added to the alkali developer.

The alkali concentration of the alkali developer is generally in the range of 0.1 to 20 mass %.

The pH value of the alkali developer is generally in the range of 10.0 to 15.0.

Pure water is typically used as a rinse liquid, and before the use, an appropriate amount of surfactant can be added thereto.

Prior to the formation of the photosensitive film, the substrate may be coated with an antireflection film.

As the antireflection film, use can be made of not only an inorganic film of titanium, titanium dioxide, titanium nitride, chromium oxide, carbon, amorphous silicon or the like but also an organic film composed of a light absorber and a polymer material. Also, as the organic antireflection film, use can be made of any of commercially available organic antireflection films, such as the DUV30 Series and DUV40 Series produced by Brewer Science Inc., and the AR-2, AR-3 and AR-5 produced by Shipley Co., Ltd.

Exposure may be carried out after filling the interstice between the film and a lens with a liquid (immersion medium) of refractive index higher than that of air at the time of exposure to actinic rays or radiation. That is, liquid immersion exposure may also be carried out. The resolution can be enhanced by the exposure through the immersion medium. The useful immersion medium is preferably water. Water is preferred from the viewpoint of a low temperature coefficient of refractive index, easy procurement and easy handling.

Further, from the viewpoint of refractive index increase, use can be made of a medium of 1.5 or higher refractive index. Such a medium may be an aqueous solution or an organic solvent.

When water is used as an immersion liquid, an additive intended for an increase of refractive index, etc. may be added to water in a slight proportion. Examples of such additives are particularized in Chapter 12 of "Process and Material of Liquid Immersion Lithography" published by CMC Publishing Co., Ltd. On the other hand, the presence of a substance being opaque in 193-nm light or the presence of an impurity whose refractive index is greatly different from that of water invites a distortion of optical image projected on the film. Accordingly, it is preferred to use distilled water as the immersion water. Further, use may be made of water having been purified through an ion exchange filter or the like. Desirably, the electrical resistance of purified water is 18.3 MQcm or higher, and the TOC (organic matter concentration) thereof is 20 ppb or below. Prior deaeration of the water is optional but preferred.

EXAMPLE

The present invention will be described in greater detail below by way of its examples. However, the present invention is in no way limited to these examples.

<Synthesis of Acid-decomposable Resin>

Synthetic Example 1

Synthesis of Resin (1)

In a nitrogen gas stream, 20.4 g of propylene glycol monomethyl ether acetate and 5.1 g of propylene glycol monomethyl ether as solvents were placed in a three-necked flask and heated at 80° C. A solution obtained by dissolving the following monomers amounting in order from the left side to 6.04, 2.15, 3.55 and 1.78 g and further 0.798 g of polymerization initiator V601 (7.0 mol % based on the monomers, produced by Wako Pure Chemical Industries, Ltd.) in 36.8 g of propylene glycol monomethyl ether acetate and 9.2 g of propylene glycol monomethyl ether was dropped into the heated solvents over a period of 6 hours. After the completion of the dropping, reaction was continued at 80° C. for 2 hours. The thus obtained reaction liquid was allowed to stand still to cool and was dropped into a mixed liquid consisting of 420 g of hexane and 180 g of ethyl acetate over a period of 20 minutes. The thus precipitated powder was collected by filtration and dried, thereby obtaining 10.2 g of resin (1). The standard-polystyrene-equivalent weight average molecular weight of the obtained resin (1) was 10100, and the dispersity (Mw/Mn) (Mw/Mn) thereof was 1.53.

Monomers

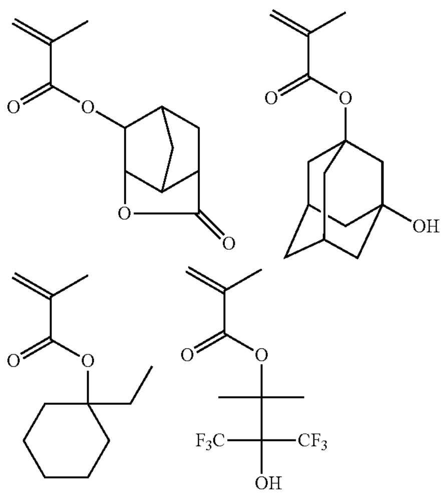

Resin (1)

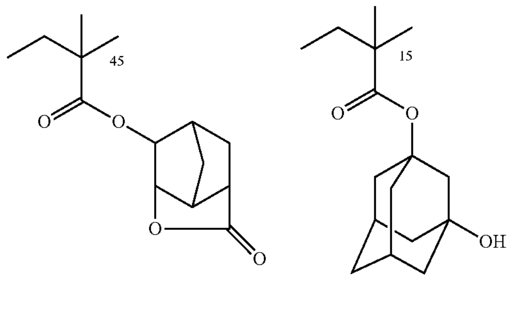

-continued

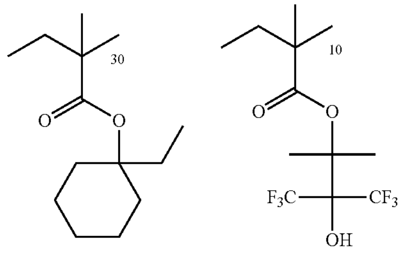

Mw = 10100
Mw/Mn = 1.53

Other resins (2) to (9) were synthesized in the same manner as in the synthesis of the resin (1).

<Synthesis of Compound (PA)>

Synthetic Example 2

Synthesis of Compound (PA-a)

In a nitrogen gas stream, a mixture of 5.0 g (15.8 mmol) of 1,1,2,2,3,3-hexafluoropropane-1,3-disulfonyl difluoride and 50 ml of THF was cooled with ice. A mixed solution consisting of 1.66 g (16.6 mmol) of 1-methylpiperazine, 10 ml of triethylamine and 50 ml of THF was dropped into the cooled mixture over a period of 60 minutes. The mixture was agitated while cooling with ice for an hour and warmed to room temperature at which the mixture was agitated for an hour. The resultant organic phase was sequentially washed with water, a saturated aqueous solution of ammonium chloride and water, and dried over sodium sulfate. The solvent was evaporated off, and 2.36 g (15.8 mmol) of trifluoromethanesulfonamide and 10 ml of triethylamine were added to the residue. The mixture was transferred into a pressure-resistant glass tube and while being sealed, stirred at 100° C. for 20 hours. Chloroform amounting to 100 ml was added to the mixture, and the thus obtained organic phase was washed with water and dried over sodium sulfate, thereby obtaining a brown oil. To the oil, 25 ml of methanol and 60 ml of 1.5 N HCl were added to thereby neutralize the mixture. The thus precipitated white solid was collected by filtration. Thus, 5.65 g of compound (PA-a) shown below was obtained.

Other compounds (PA-b) to (PA-j) were synthesized in the same manner as described above.

<Preparation of Resist Composition>

Referring to Table 3 below, resist compositions were prepared by dissolving non-solvent individual components in solvents to thereby obtain solutions of 4 mass % solid content and passing each of the solutions through a polyethylene filter of 0.05 μm pore size.

The meanings of the abbreviations appearing in Table 3 are as follows. As the hydrophobic resins, use was made of those appropriately selected from among the hydrophobic resins (HR-1) to (HR-90) set forth hereinbefore.

[Acid-decomposable Resin]

Resin 1

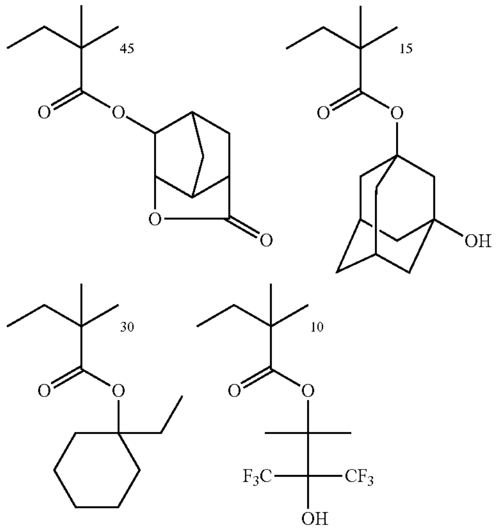

Mw = 10100
Mw/Mn = 1.53

Resin 2

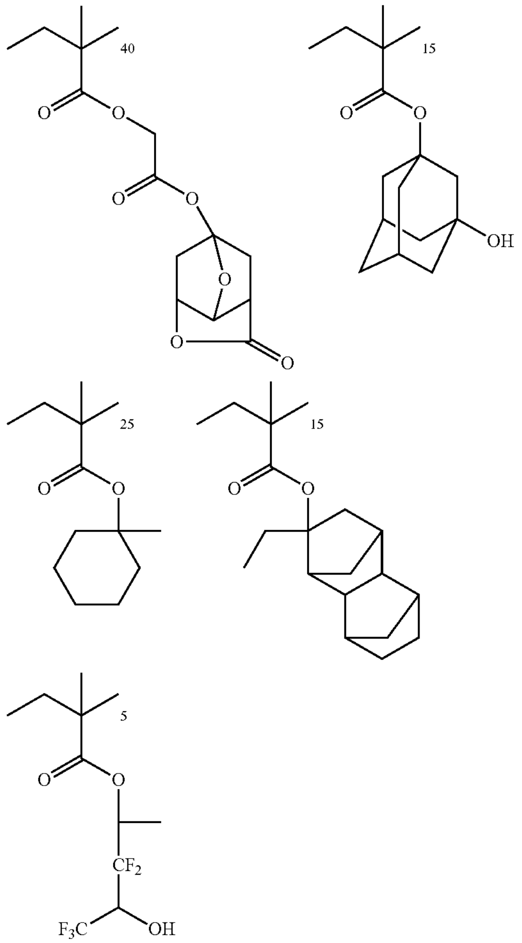

Mw = 9300
Mw/Mn = 1.55

-continued
Resin 3
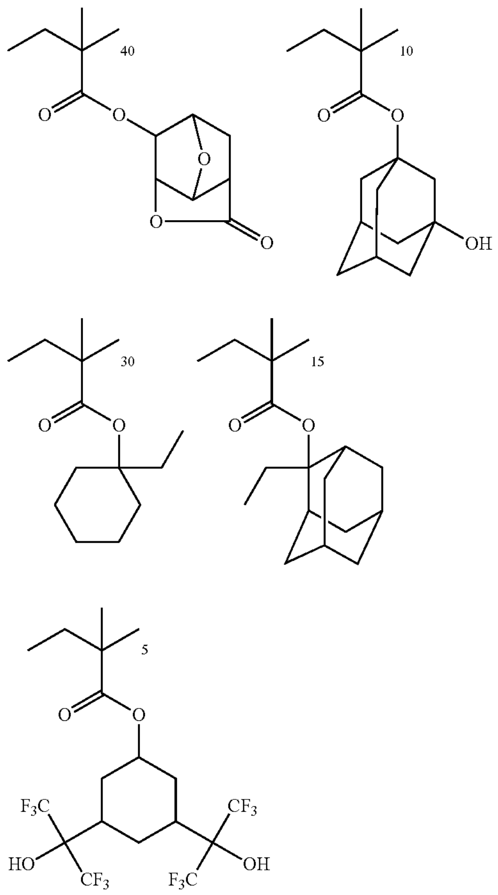
Mw = 7800
Mw/Mn = 1.55
Resin 4
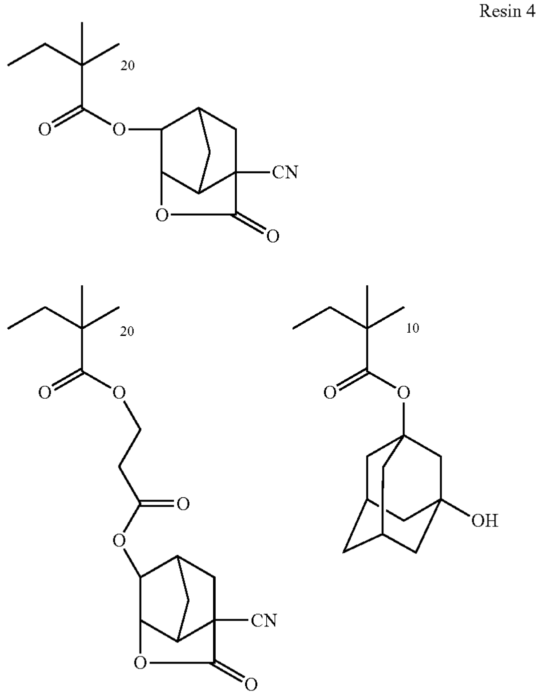
-continued
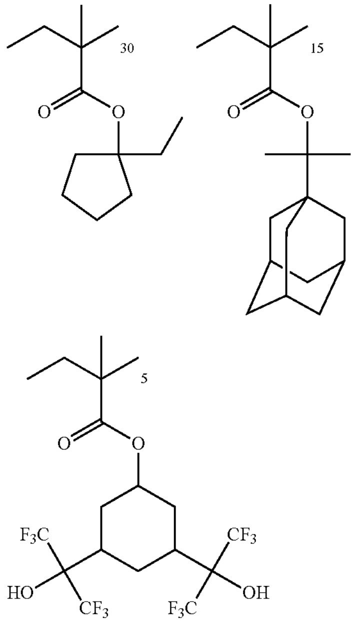
Mw = 9400
Mw/Mn = 1.54
Resin 5
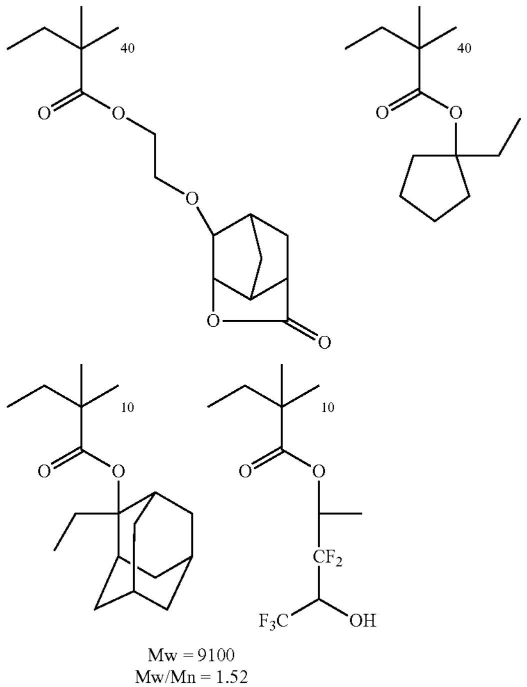
Mw = 9100
Mw/Mn = 1.52
Resin 6
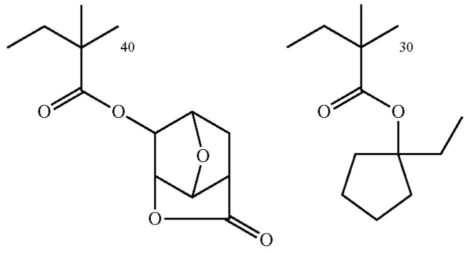

-continued
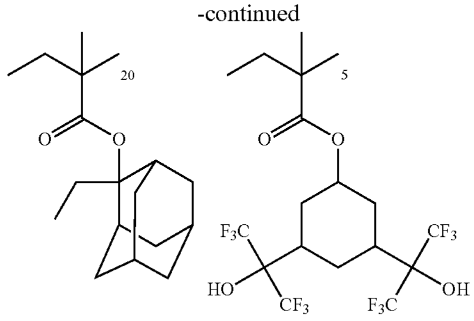
Mw = 9500
Mw/Mn = 1.54
Resin 7
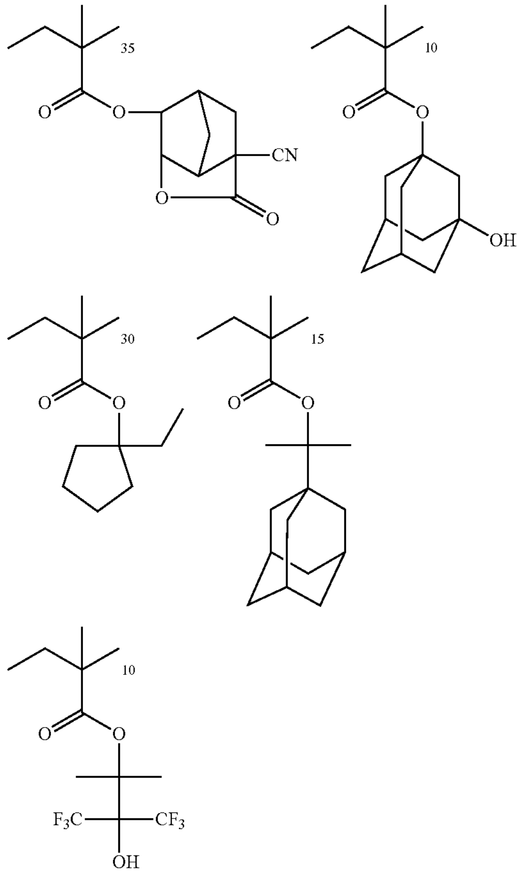
Mw = 9500
Mw/Mn = 1.54
Resin 8
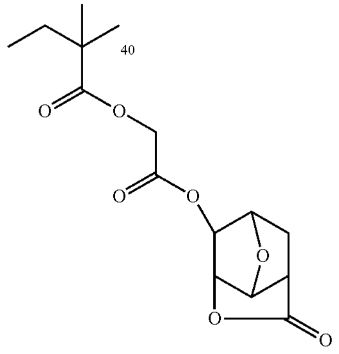
-continued
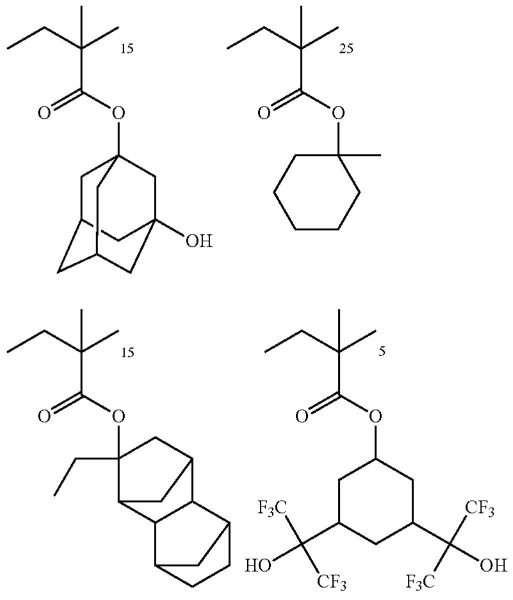
Mw = 9900
Mw/Mn = 1.54
Resin 9
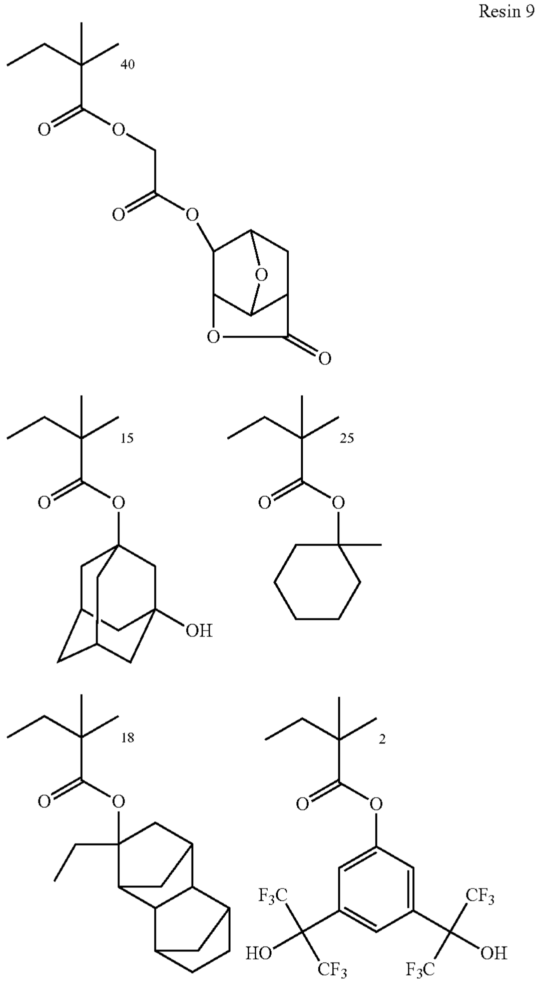
Mw = 9080
Mw/Mn = 1.54

-continued
Resin 10
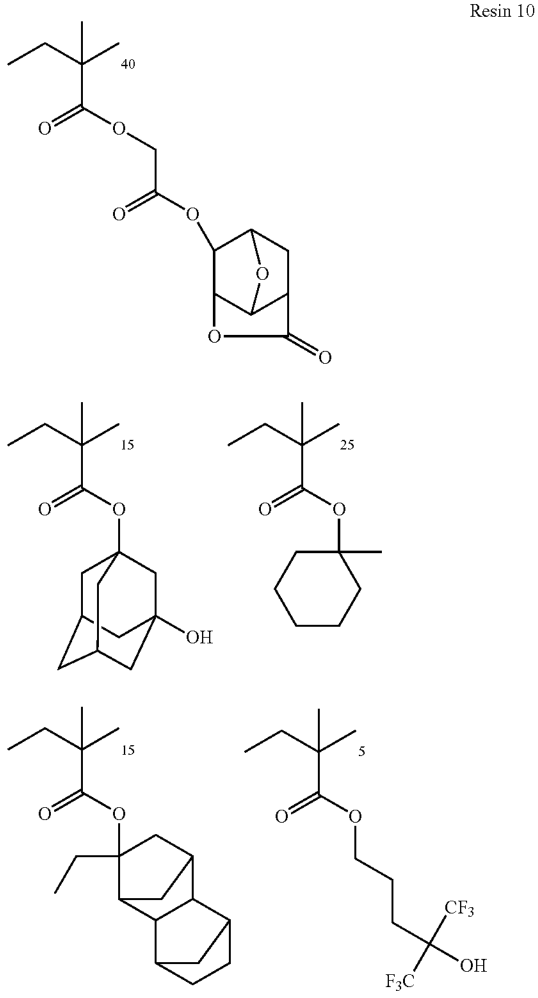
Mw = 7580
Mw/Mn = 1.53
Resin 11
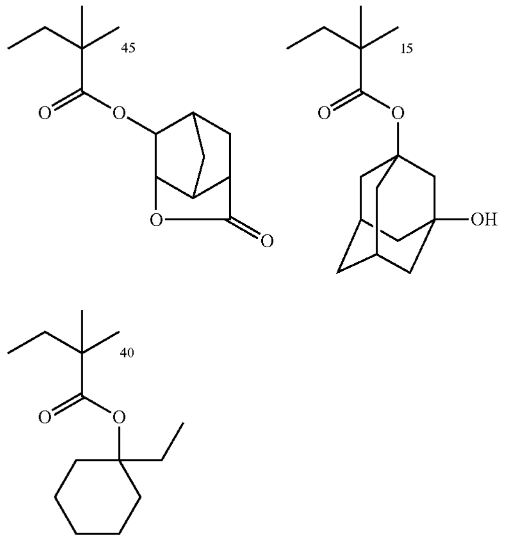
Mw = 10200
Mw/Mn = 1.54
-continued
Resin 12
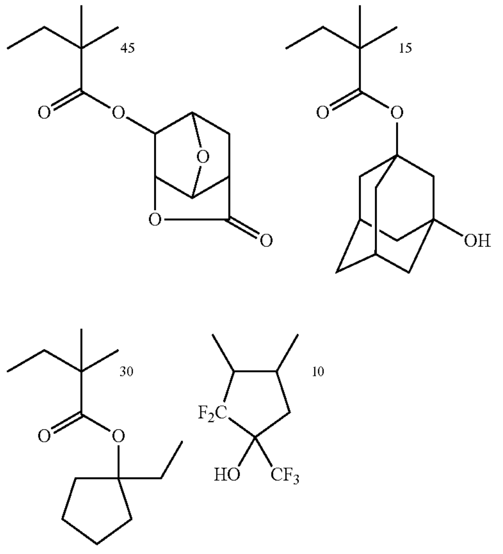
Mw = 10100
Mx/Mn = 1.54
Resin 13
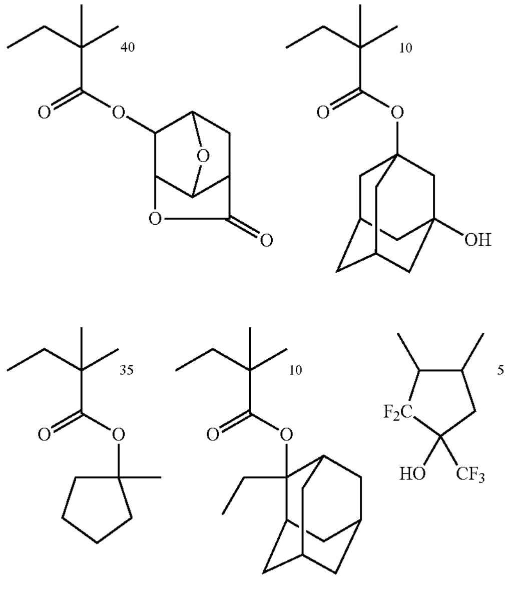
Mw = 7500
Mx/Mn = 1.52
Resin 14
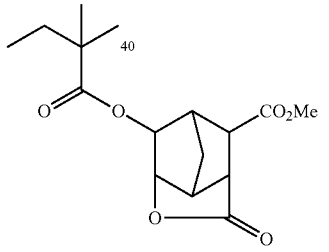

-continued
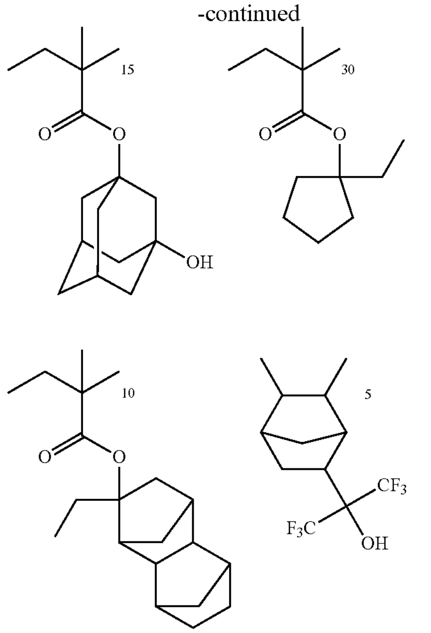
Mw = 7800
Mw/Mn = 1.53
Resin 15
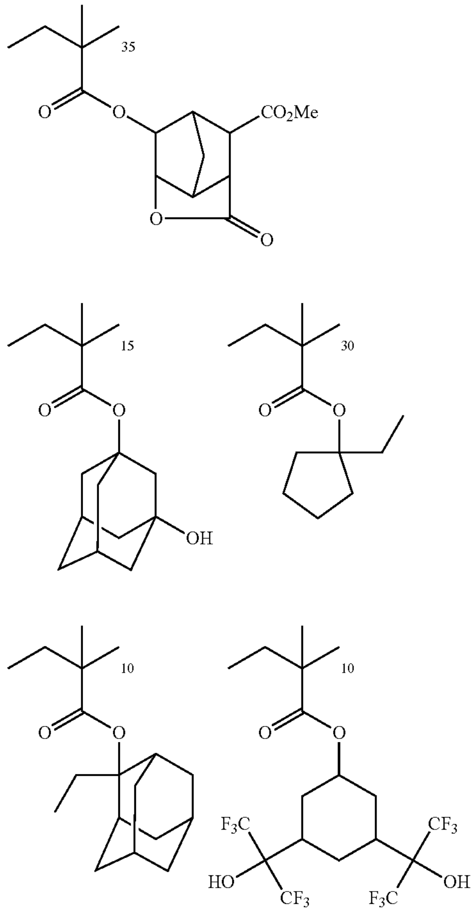
Mw = 9300
Mw/Mn = 1.53
[Compound (PA)]
PA-a
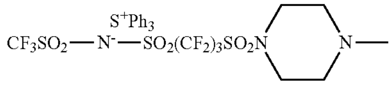
PA-b
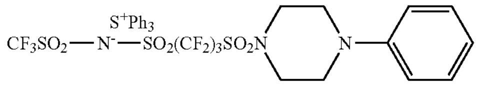
PA-c
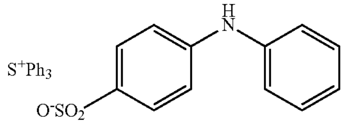
PA-d
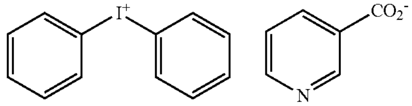
PA-e
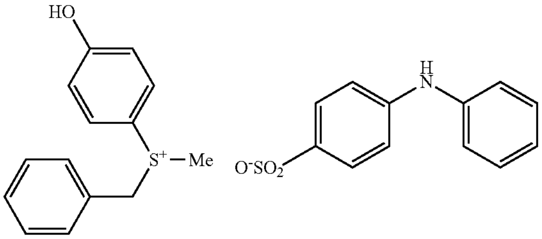
PA-f
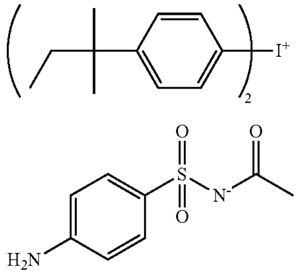
PA-g
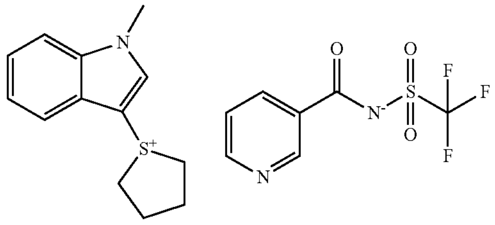
PA-h
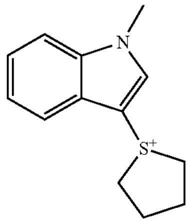

-continued
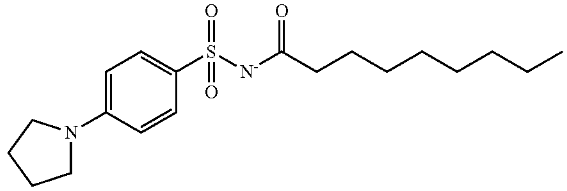
PA-i
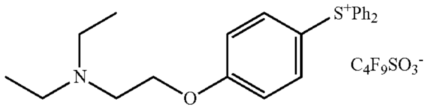
PA-j
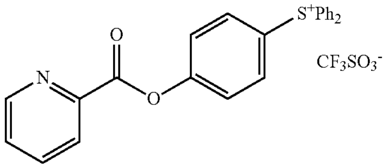
PA-k
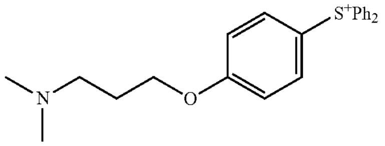
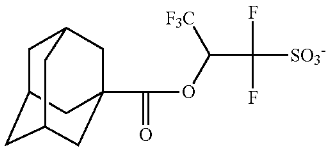
PA-m
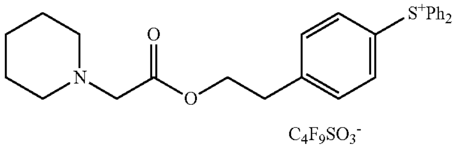
PA-n
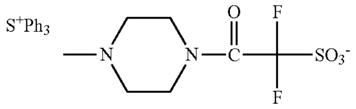
PA-o
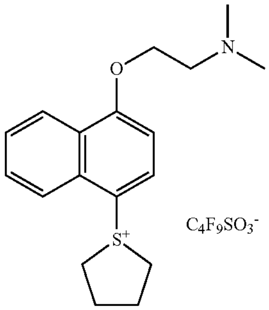
[Photoacid Generator]
PAG-1: triphenylsulfonium nonafluorobutanesulfonate
PAG-2:
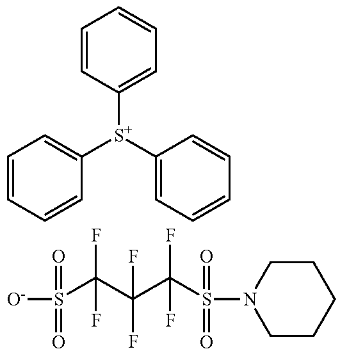
PAG-3:
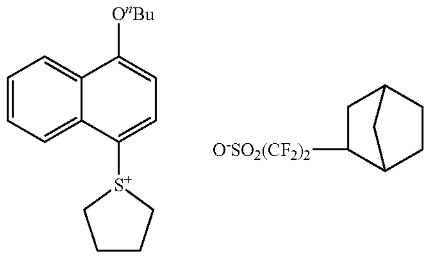
PAG-4:
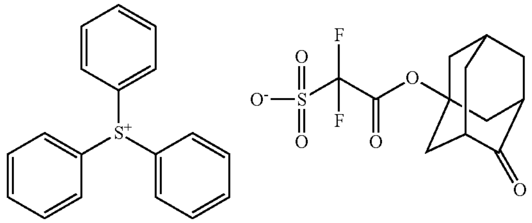
PAG-5:
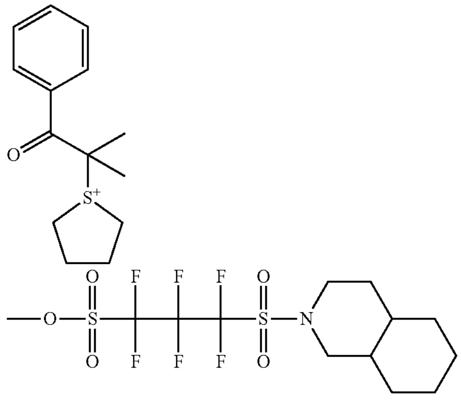
PAG-6:
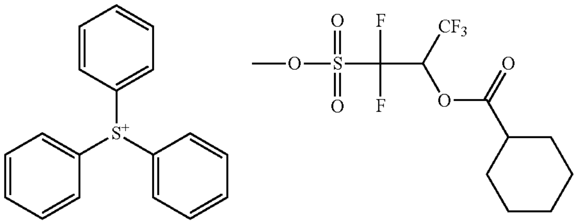

[Basic Compound]

DIA: 2,6-diisopropylaniline,

PEA: N-phenyldiethanolamine,

TMEA: tris(methoxyethoxyethyl)amine,

APCA: 4-hydroxy-1-tert-butoxycarbonylpiperidine,

DBA: N,N-dibutylaniline, and

PBI: phenylbenzoimidazole.

[Surfactant]

W-1: Megafac F176 (produced by Dainippon Ink & Chemicals, Inc.) (fluorinated),

W-2: Megafac R08 (produced by Dainippon Ink & Chemicals, Inc.) (fluorinated and siliconized), W-3: Troy Sol S-366 (produced by Troy Chemical Co., Ltd.), W-4: PF656 (produced by OMNOVA SOLUTIONS, INC., fluorinated), and W-5: PF6320 (produced by OMNOVA SOLUTIONS, INC., fluorinated).

[Solvent]

A1: propylene glycol monomethyl ether acetate,

A2: cyclohexanone,

A3: γ-butyrolactone,

B1: propylene glycol monomethyl ether, and

B2: ethyl lactate.

(Exposure Condition 1: Examples 44 to 46: ArF Dry Exposure)

An organic antireflection film ARC29A (produced by Nissan Chemical Industries, Ltd.) was applied onto a silicon wafer and baked at 205° C. for 60 seconds, thereby forming a 78 nm-thick antireflection film. Each of the prepared positive resist compositions was applied thereonto and baked at 110° C. for 60 seconds, thereby forming a 120 nm-thick resist film. The resultant wafer was exposed through a 6% half-tone mask of 75 nm line width 1:1 line and space pattern by means of an ArF excimer laser scanner (manufactured by ASML, PAS5500/1100, NA0.75). Thereafter, the exposed wafer was baked at 90° C. for 60 seconds, developed with an aqueous solution of tetramethylammonium hydroxide (2.38 mass %) for 30 seconds, rinsed with pure water and spin dried, thereby obtaining a resist pattern.

(Exposure Condition 2: Examples 1 to 16, 18 to 20, 22 to 43 and 47 to 52, and Comparative Examples 1 to 3: ArF Liquid Immersion Exposure)

An organic antireflection film ARC29SR (produced by Nissan Chemical Industries, Ltd.) was applied onto a silicon wafer and baked at 205° C. for 60 seconds, thereby forming a 95 nm-thick antireflection film. Each of the above prepared positive resist compositions was applied thereonto and baked at 85° C. for 60 seconds, thereby forming a 100 nm-thick resist film. The resultant wafer was exposed through a 6% half-tone mask of 48 nm line width 1:1 line and space pattern by means of an ArF excimer laser liquid immersion scanner (manufactured by ASML, XT-1700i, NA1.20, $\sigma_0/\sigma_1$=0.94/0.74). Ultrapure water was used as the immersion liquid. Thereafter, the exposed wafer was baked at 90° C. for 60 seconds, developed with an aqueous solution of tetramethylammonium hydroxide (2.38 mass %) for 30 seconds, rinsed with pure water and spin dried, thereby obtaining a resist pattern.

(Exposure Condition 3: Examples 17 and 21: ArF Liquid Immersion Exposure)

A resist pattern was formed in the same manner as under the above exposure condition 2 except that after the formation of the 100 nm-thick resist film but before the exposure, a top coat composition prepared using a hydrophobic resin indicated in Table 3 was applied onto the resist film and baked at 115° C. for 60 seconds, thereby forming a 0.05 μm-thick top coat film. As the solvent of the top coat composition, use was made of 4-methyl-2-pentanol (MIBC). The concentration of the top coat composition was 2.4 mass %.

[LWR]

When the exposure condition 1 was employed, the line width of a 75 nm 1/1 (line and space) pattern was measured at 50 points, and the 3σ value of the measurements was computed as LWR.

When the exposure condition 2 or 3 was employed, the line width of a 48 nm 1/1 (line and space) pattern was measured at 50 points, and the 3σ value of the measurements was computed as LWR.

[Defocus Latitude (DOF Evaluation)]

The optimum exposure amount and optimum depth of focus were respectively defined as the exposure amount and depth of focus that reproduced the 75 nm line and space mask pattern under the exposure condition 1 and the 48 nm line and space mask pattern under the exposure condition 2 or 3. The focal depth range that allowed the line width of the above line width ±10% (namely, 75 nm±10% under the exposure condition 1, and 48 nm±10% under the exposure condition 2 or 3) when the depth of focus was varied (defocused) while maintaining the exposure amount at the optimum exposure amount was observed. The larger the value of the focal depth range, the greater the defocus latitude and the more preferable.

[Evaluation of Pattern Collapse]

The optimum exposure amount was defined as the exposure amount that reproduced the 75 nm line and space mask pattern under the exposure condition 1 and the 48 nm line and space mask pattern under the exposure condition 2 or 3. The applied exposure amount was increased from the optimum exposure amount to thereby cause the line width of thus formed line pattern to be finer. The critical pattern collapse was defined as the limit minimum line width allowing pattern resolution without any collapse. The smaller the value of the limit minimum line width, the finer the pattern resolved without any collapse, that is, the more effective the suppression of pattern collapse and the higher the resolving power.

The obtained evaluation results are given in Table 3 below. With respect to each of the individual components of the table, the ratio indicated when multiple types are used is a mass ratio.

In Table 3, when the resist composition contained a hydrophobic resin, "added" is noted as the type of usage of the hydrophobic resin. In contrast, when the resist composition did not contain any hydrophobic resin and when after the formation of a film, a top coat protective film containing a hydrophobic resin was formed on an upper layer of the film, "TC" is noted as the type of usage of the hydrophobic resin.

TABLE 3

| Ex. | Resin (10 g) | Compound (PA) (g) | Acid generator (g) | Basic Compound (0.4 g) | Hydrophobic Resin Added (35 mg) or TC | Surfactant (g) | Solvent | LWR (nm) | DOF (μm) | Pattern collapse (nm) |
|---|---|---|---|---|---|---|---|---|---|---|
| 1 | 1 | PA-a (0.3) | PAG-1 (2.2) | APCA | HR-24 Added | W-4(0.01) | S1 = 100 | 4.5 | 0.09 | 29.3 |
| 2 | 2 | PA-a (0.3) | PAG-1 (2.2) | DBA | HR-47 Added | W-2(0.02) | S1/S4/S6 = 80/5/15 | 4.0 | 0.13 | 25.6 |
| 3 | 3 | PA-a (0.3) | PAG-1 (2.2) | PBI | HR-47 Added | W-1(0.01) | S1/S6 = 95/5 | 3.9 | 0.1 | 27.4 |
| 4 | 4 | PA-a (0.3) | PAG-1 (2.2) | DIA | HR-69 Added | W-4(0.01) | S1/S3 = 90/10 | 3.7 | 0.11 | 26.7 |
| 5 | 5 | PA-a (0.3) | PAG-1 (2.2) | APCA | HR-26 Added | W-4(0.01) | S1/S5 = 80/20 | 3.5 | 0.15 | 24.5 |
| 6 | 6 | PA-a (0.3) | PAG-1 (2.2) | DBA | HR-74 Added | W-4(0.01) | S1/S4/S6 = 80/5/15 | 3.3 | 0.16 | 22.4 |
| 7 | 7 | PA-a (0.3) | PAG-1 (2.2) | PEA | HR-69 Added | W-3(0.03) | S1 = 100 | 4.0 | 0.13 | 25.2 |
| 8 | 8 | PA-a (0.3) | PAG-1 (2.2) | TEA | HR-53 Added | W-3(0.02) | S1 = 100 | 3.2 | 0.18 | 20.1 |
| 9 | 9 | PA-a (0.3) | PAG-1 (2.2) | DBA | HR-47 Added | W-1(0.01) | S1/S5 = 60/40 | 4.6 | 0.09 | 29.8 |
| 10 | 10 | PA-a (0.3) | PAG-1 (2.2) | TEA | HR-53 Added | W-3(0.02) | S1 = 100 | 4.7 | 0.08 | 30.2 |
| 11 | 4 | PA-b (0.4) | PAG-1 (2.0) | APCA | HR-53 Added | — | S1/S3 = 90/10 | 3.8 | 0.11 | 27.7 |
| 12 | 4 | PA-c (0.4) | PAG-1 (2.1) | APCA | HR-47 Added | W-4(0.01) | S1 = 100 | 4.1 | 0.10 | 29.0 |
| 13 | 4 | PA-d (0.4) | PAG-1 (2.2) | APCA | HR-47 Added | W-4(0.01) | S1 = 100 | 4.6 | 0.09 | 30.3 |
| 14 | 4 | PA-e (0.4) | PAG-1 (2.2) | APCA | HR-47 Added | W-4(0.01) | S1/S5 = 60/40 | 4.2 | 0.10 | 29.3 |
| 15 | 4 | PA-f (0.4) | PAG-1 (2.0) | TPSA | HR-47 Added | W-4(0.01) | S1 = 100 | 4.3 | 0.10 | 29.6 |
| 16 | 4 | PA-g (0.4) | PAG-1 (1.9) | DBA/PEA (0.2 g/0.2 g) | HR-47 Added | W-4(0.01) | S1 = 100 | 4.0 | 0.11 | 28.5 |
| 17 | 4 | PA-h (0.4) | PAG-1 (2.2) | APCA | HR-49 TC | W-4(0.01) | S1/S3 = 90/10 | 3.9 | 0.11 | 28.2 |
| 18 | 4 | PA-I (0.4) | PAG-1 (1.8) | PBI | HR-69 Added | W-4(0.01) | S1 = 100 | 4.4 | 0.10 | 29.9 |
| 19 | 4 | PA-j (0.4) | PAG-1 (2.2) | TMEA | HR-53 Added | W-4(0.01) | S1/S3 = 90/10 | 4.5 | 0.09 | 30.0 |
| 20 | 8 | PA-b (0.35) | PAG-1 (2.0) | APCA | HR-47 Added | W-4(0.01) | S1/S5 = 60/40 | 4.1 | 0.13 | 25.5 |
| 21 | 8 | PA-c (0.4) | PAG-1 (1.5) | PEA | HR-49 TC | W-3(0.02) | S1/S3 = 90/10 | 4.4 | 0.13 | 26.4 |
| 22 | 8 | PA-d (0.25) | PAG-1 (2.0) | APCA | HR-47 Added | W-3(0.01) | S1/S3 = 90/10 | 4.9 | 0.11 | 28.4 |
| 23 | 8 | PA-e (0.2) | PAG-1 (2.2) | APCA | HR-47 Added | W-4(0.01) | S1/S2/S3 = 85/5/10 | 4.5 | 0.12 | 26.9 |
| 24 | 8 | PA-f (0.22) | PAG-1 (2.2) | DBA/APCA (0.2 g/0.2 g) | HR-47 Added | W-5(0.01) | S1 = 100 | 4.6 | 0.12 | 27.3 |
| 25 | 8 | PA-g (0.18) | PAG-1 (2.2) | PEA | HR-47 Added | — | S1 = 100 | 4.3 | 0.13 | 26.2 |
| 26 | 8 | PA-h (0.3) | PAG-1 (2.3) | TEA | HR-53 Added | W-4(0.01) | S1/S3 = 90/10 | 4.2 | 0.13 | 25.8 |
| 27 | 8 | PA-I (0.25) | PAG-1 (2.2) | TMEA | HR-26 Added | W-2(0.02) | S1/S2/S3 = 85/5/10 | 4.7 | 0.12 | 27.7 |
| 28 | 8 | PA-j (0.22) | PAG-1 (2.2) | PEA | HR-26 Added | W-4(0.01) | S1/S3 = 90/10 | 4.8 | 0.12 | 27.9 |
| 29 | 4 | PA-i (0.3) | PAG-2 (2.2) | APCA | HR-26 Added | W-3(0.01) | S1/S6 = 80/20 | 4.3 | 0.10 | 28.9 |
| 30 | 4 | PA-i (0.3) | PAG-3 (2.0) | DBA | HR-69 Added | W-2(0.02) | S1 = 100 | 4.2 | 0.09 | 27.7 |
| 31 | 4 | PA-i (0.3) | PAG-4 (2.2) | PBI | HR-53 Added | W-1(0.005) | S1/S3 = 90/10 | 4.3 | 0.10 | 28.8 |
| 32 | 4 | PA-i (0.3) | PAG-5 (1.9) | DIA | HR-26 Added | W-1(0.005) | S1 = 100 | 4.1 | 0.09 | 26.5 |
| 33 | 4 | PA-i (0.3) | PAG-6 (2.2) | APCA | HR-47 Added | — | S1 = 100 | 4.3 | 0.10 | 28.7 |
| 34 | 7 | PA-i (0.3) | PAG-2 (2.2) | PEA | HR-69 Added | W-1(0.005) | S1 = 100 | 4.6 | 0.10 | 29.8 |
| 35 | 7 | PA-i (0.3) | PAG-3 (2.0) | APCA | HR-26 Added | W-1(0.005) | S1 = 100 | 4.5 | 0.09 | 28.6 |
| 36 | 7 | PA-i (0.3) | PAG-4 (2.2) | PBI | HR-74 Added | — | S1/S5 = 60/40 | 4.6 | 0.10 | 29.6 |
| 37 | 7 | PA-i (0.3) | PAG-5 (1.5) | TMEA | HR-26 Added | — | S1/S5 = 60/40 | 4.4 | 0.09 | 27.4 |

TABLE 3-continued

| Ex. | Resin (10 g) | Compound (PA) (g) | Acid generator (g) | Basic Compound (0.4 g) | Hydrophobic Resin Added (35 mg) or TC | Surfactant (g) | Solvent | LWR (nm) | DOF (μm) | Pattern collapse (nm) |
|---|---|---|---|---|---|---|---|---|---|---|
| 38 | 7 | PA-i (0.3) | PAG-6 (2.2) | PEA | HR-69 Added | W-4(0.01) | S1 = 100 | 4.6 | 0.10 | 29.6 |
| 39 | 8 | PA-i (0.22) | PAG-2 (2.2) | APCA | HR-26 Added | W-4(0.01) | S1 = 100 | 4.5 | 0.12 | 26.7 |
| 40 | 8 | PA-i (0.22) | PAG-3 (1.6) | PBI | HR-24 Added | W-4(0.01) | S1/S5 = 60/40 | 4.4 | 0.11 | 25.4 |
| 41 | 8 | PA-i (0.22) | PAG-4 (2.2) | TMEA | HR-69 Added | W-4(0.01) | S1 = 100 | 4.5 | 0.12 | 26.8 |
| 42 | 8 | PA-i (0.22) | PAG-5 (2.3) | PEA | HR-24 Added | W-3(0.01) | S1 = 100 | 4.3 | 0.10 | 24.9 |
| 43 | 8 | PA-i (0.22) | PAG-6 (2.2) | APCA | HR-74 Added | W-2(0.02) | S1/S5 = 60/40 | 4.5 | 0.12 | 26.5 |
| 44 | 1 | PA-a (0.4) | PAG-1 (2.2) | TMEA | — | W-4(0.01) | S1 = 100 | 5.5 | 0.09 | 39.2 |
| 45 | 2 | PA-a (0.4) | PAG-1 (2.2) | PEA | — | W-3(0.01) | S1 = 100 | 5.1 | 0.12 | 35.3 |
| 46 | 3 | PA-a (0.38) | PAG-1 (22) | APCA | — | W-2(0.02) | S1/S5 = 60/40 | 4.3 | 0.12 | 37.3 |
| 47 | 1/2 (5 g/5 g) | PA-a (0.4) | PAG-1 (22) | TMEA | HR-26 Added | W-4(0.01) | S1 = 100 | 5.6 | 0.09 | 28.2 |
| 48 | 2 | PA-a (0.38) | PAG-1/ PAG-2 (1.1/1.1) | PEA | HR-69 Added | W-3(0.01) | S1 = 100 | 5.1 | 0.12 | 24.3 |
| 49 | 3 | PA-a (0.33) | PAG-1/ PAG-6 (0.5/1.7) | APCA | HR-74 Added | W-2(0.02) | S1/S5 = 60/40 | 4.2 | 0.12 | 25.3 |
| 50 | 4/8 (2 g/8 g) | PA-a (0.4) | PAG-1 (2.2) | TMEA | HR-26 Added | W-4(0.01) | S1 = 100 | 3.3 | 0.16 | 22.2 |
| 51 | 1 | PA-a/PA-i (0.2/0.1) | PAG-1 (2.2) | APCA | HR-24 Added | W-4(0.01) | S1 = 100 | 4.3 | 0.10 | 28.7 |
| 52 | 8 | PA-a/PA-i (0.2/0.1) | PAG-1 (2.2) | APCA | HR-24 Added | W-4(0.01) | S1 = 100 | 3.4 | 0.15 | 24.3 |
| Comp. Ex. 1 | 8 | — | PAG-1 (2.2) | APCA | HR-47 Added | W-4(0.01) | S1/S5 = 60/40 | 6.6 | 0.02 | 35.1 |
| Comp. Ex. 2 | 11 | PA-a (0.25) | PAG-1 (2.2) | APCA | HR-47 Added | W-4(0.01) | S1 = 100 | 6.0 | 0.02 | 40.2 |
| Comp. Ex. 3 | 11 | — | PAG-1 (2.2) | APCA | HR-47 Added | W-4(0.01) | S1/S5 = 60/40 | 7.2 | 0.01 | 45.2 |
| 53 | 12 | PA-a (0.3) | PAG-1 (2.2) | TMEA | HR-26 Added | W-1(0.01) | S1/S5 = 60/40 | 4.6 | 0.09 | 29.5 |
| 54 | 13 | PA-a (0.3) | PAG-1 (2.2) | TEA | HR-48 Added | W-3(0.02) | S1 = 100 | 4.7 | 0.09 | 30 |
| 55 | 14 | PA-a (0.3) | PAG-1 (2.2) | TMEA | HR-53 Added | W-1(0.01) | S1/S5 = 60/40 | 4.7 | 0.09 | 29.7 |
| 56 | 15 | PA-a (0.3) | PAG-1 (2.2) | PBI | HR-47 Added | W-1(0.01) | S1/S2/S3 = 85/5/10 | 4.0 | 0.11 | 27.2 |
| 57 | 3 | PA-a (0.32) | PAG-6 (2.5) | TMEA | HR-26 Added | W-1(0.01) | S1 = 100 | 3.2 | 0.17 | 19.8 |
| 58 | 3 | PA-c (0.25) | PAG-1 (2.1) | DIA | HR-24 Added | W-4(0.01) | S1/S2/S3 = 85/5/10 | 4.3 | 0.13 | 26.1 |
| 59 | 3 | PA-k (0.31) | PAG-6 (1.5) | DBA | HR-24 Added | W-4(0.01) | S1 = 100 | 4.8 | 0.11 | 27.5 |
| 60 | 3 | PA-m (0.23) | PAG-2 (2.0) | TMEA | HR-26 Added | W-1(0.01) | S1/S5 = 60/40 | 4.7 | 0.11 | 27.4 |
| 61 | 3 | PA-n (0.20) | PAG-4 (2.2) | DIA | HR-74 Added | W-3(0.01) | S1 = 100 | 3.3 | 0.17 | 20.7 |
| 62 | 15 | PA-a (0.31) | PAG-1 (2.0) | TMEA | HR-26 Added | — | S1 = 100 | 3.2 | 0.18 | 19.8 |
| 63 | 15 | PA-i (0.31) | PAG-1 (2.0) | TMEA | HR-26 Added | — | S1/S2/S3 = 85/5/10 | 4.6 | 0.12 | 27.9 |
| 64 | 15 | PA-k (0.30) | PAG-6 (1.8) | DBA | HR-24 Added | W-3(0.01) | S1/S5 = 60/40 | 4.7 | 0.11 | 27.4 |
| 65 | 15 | PA-o (0.27) | PAG-3 (2.3) | TMEA | HR-26 Added | — | S1/S3 = 90/10 | 4.6 | 0.12 | 27.1 |

It is apparent from Table 3 that the patterns formed from the compositions of the present invention excel in the LWR, DOF and pattern collapse performance, and that thus the compositions of the present invention can be appropriately used in at least a dry exposure process and an ArF liquid immersion exposure process.

What is claimed is:

1. An actinic-ray- or radiation-sensitive resin composition comprising:

(A) a resin containing a repeating unit with any of partial structures of general formula (I) below, the resin being configured to increase its rate of dissolution in an alkali developer when acted on by an acid;

(B) a compound (PA) containing a functional group with proton acceptor properties and being configured to decompose when exposed to actinic rays or radiation to thereby produce a compound exhibiting lower or no proton acceptor properties or a compound exhibiting acid properties instead of the proton acceptor properties; and (C) a compound being configured to generate an acid when exposed to actinic rays or radiation;

wherein the resin is contained in an amount of 50 mass % or more based on total solids of the composition, (I)

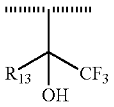

in which $R_{13}$ represents a hydrogen atom, an alkyl group or a cycloalkyl group; and wherein the composition further comprises a hydrophobic resin.

2. The composition according to claim 1, wherein the repeating unit is represented by at least one selected from the group consisting of general formulae (I-1) to (I-3) below, (I-1)

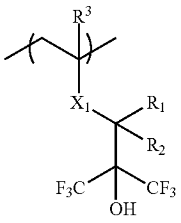

(I-2)

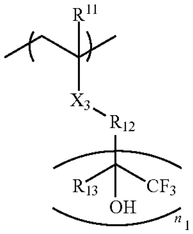

-continued (I-3)

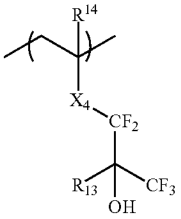

in which each of $R^3$, $R^{11}$ and $R^{14}$ independently represents a hydrogen atom, an alkyl group or a halogen atom;

each of $X_1$, $X_3$ and $X_4$ independently represents any one of —C(═O)—, —C(═O)—O—, —C(═O)—O—$R_6$—, —O—, —C(═O)—$R_6$—C(═O)— and —C(═O)—O—$R_6$—C(═O)—O—, in which $R_6$ represents an alkylene group or a cycloalkylene group;

$R_1$ represents a hydrogen atom, an alkyl group, a cycloalkyl group or a halogen atom, and $R_2$ represents a hydrogen atom, an alkyl group or a cycloalkyl group, provided that $R_1$ and $R_2$ may be bonded to each other to thereby form a ring;

$R_{12}$ represents a cycloalkylene group or a cycloalkanetriyl group, and $R_{13}$ represents a hydrogen atom, an alkyl group or a cycloalkyl group, provided that in general formula (I-2), $R_{12}$ and $R_{13}$ may be bonded to each other to thereby form a ring; and $n_1$ is 1 or 2.

3. The composition according to claim 2, wherein the repeating unit is represented by the general formula (I-1) or (I-3).

4. The composition according to claim 2, wherein the repeating unit is represented by the general formula (I-2) in which $n_1$ is 2.

5. The composition according to claim 1, wherein the compound produced by the decomposition of the compound (PA) upon exposure to actinic rays or radiation is represented by general formula (PA-1) below:

$$Q\text{-}A\text{-}(X)_n\text{—}B\text{—}R \quad \text{(PA-1)}$$

in which

Q represents —$SO_3H$, —$CO_2H$ or —$W_1NHW_2R_f$, in which $R_f$ represents an alkyl group, a cycloalkyl group or an aryl group, and each of $W_1$ and $W_2$ independently represents —$SO_2$— or —CO—;

A represents a single bond or a bivalent connecting group;

X represents —$SO_2$— or —CO—;

n is 0 or 1;

B represents a single bond, an oxygen atom or —$N(R_x)R_y$—, in which $R_x$ represents a hydrogen atom or a monovalent organic group, and $R_y$ represents a single bond or a bivalent organic group, provided that $R_x$ may be bonded to $R_y$ to thereby form a ring or may be bonded to R to thereby form a ring; and R represents a monovalent organic group containing the functional group with proton acceptor properties.

6. The composition according to claim 5, wherein Q represents —$SO_3H$ or —$CO_2H$.

7. The composition according to claim 1, wherein the compound (PA) is represented by general formula (7) below, $$(R)_m—A^+—(R_N)_n \quad X^- \qquad (7)$$

in which

A represents a sulfur atom or an iodine atom;

m is 1 or 2 and n is 1 or 2, provided that m+n=3 when A is a sulfur atom and that m+n=2 when A is an iodine atom;

R represents an aryl group;

$R_N$ represents an aryl group substituted with the functional group with proton acceptor properties; and $X^-$ represents a counter anion.

8. The composition according to claim 1, wherein the resin further contains any of repeating units of general formula (II-1) below:

(II-1)

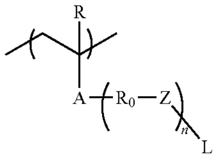

in which

R represents a hydrogen atom, an alkyl group or a halogen atom;

A represents —COO— or —CONH—;

$R_0$, when n≧2 each independently, represents an alkylene group, a cycloalkylene group or a combination thereof;

Z, when n≧2 each independently, represents an ether bond, an ester bond, an amido bond, a urethane bond or a urea bond;

L represents a substituent with a lactone structure; and n is an integer of 1 to 5.

9. The composition according to claim 1, the hydrophobic resin comprising at least one of a fluorine atom and a silicone atom.

10. The composition according to claim 1, the hydrophobic resin comprising at least one group selected from among the following groups (x), (y) and (z):

(x) an alkali-soluble group;

(y) a group that is decomposed by the action of an alkali developer, resulting in an increase of solubility in the alkali developer; and (z) a group that is decomposed by the action of an acid.

11. The composition according to claim 1, wherein a content of the hydrophobic resin in the composition based on the total solids thereof is in the range of 0.01 to 20 mass %.

12. A resist film formed from the composition according to claim 1.

13. A method of forming a pattern, comprising:

forming the composition according to claim 1 into a film, exposing the film, and developing the exposed film.

14. The method according to claim 13, wherein the exposure is performed through an immersion liquid.

15. An actinic-ray- or radiation-sensitive resin composition comprising:

(A) a resin containing a repeating unit with any of partial structures of general formula (I) below, the resin being configured to increase its rate of dissolution in an alkali developer when acted on by an acid;

(B) a compound (PA) containing a functional group with proton acceptor properties and being configured to decompose when exposed to actinic rays or radiation to thereby produce a compound exhibiting lower or no proton acceptor properties or a compound exhibiting acid properties instead of the proton acceptor properties; and (C) a compound being configured to generate an acid when exposed to actinic rays or radiation;

wherein the resin is contained in an amount of 50 mass % or more based on total solids of the composition, (I)

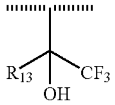

in which $R_{13}$ represents a hydrogen atom, an alkyl group or a cycloalkyl group and wherein the acid generator (C) is limited to a compound represented by general formula (ZI) or (ZII)

$$R_{201}—S^+(R_{202})—R_{203} \quad Z^- \qquad (ZI)$$

$$R_{204}—I^+—R_{205} \quad Z^- \qquad (ZII)$$

wherein in general formula (ZI), each of $R_{201}$, $R_{202}$ and $R_{203}$ independently represents an organic group, and $Z^-$ represents an sulfonate anion configured to generate the acid represented by general formula (I) below:

wherein in general formula (ZII), each of $R_{204}$ and $R_{205}$ independently represents an aryl group, an alkyl group or a cycloalkyl group, and $Z^-$ represents an sulfonate anion configured to generate the acid represented by general formula (I) below:

$$HO_3S—(C(Xf)(Xf))_x—(C(R^1)(R^2))_y—(L)_z—A \qquad (I)$$

wherein in general formula (I), each of Xfs independently represents a fluorine atom or an alkyl group having at least one hydrogen atom thereof substituted with one or more fluorine atoms, each of $R^1$ and $R^2$ represents a hydrogen atom, L, when z≧2 each independently, represents a bivalent connecting group, A represents an organic group with a cyclic structure, x is 1 or 2, y is an integer of 0 to 10, and z is an integer of 0 to 10.

16. The composition according to claim 15, wherein the compound produced by the decomposition of the compound (PA) upon exposure to actinic rays or radiation is represented by general formula (PA-1) below:

$$Q\text{-}A\text{-}(X)_n\text{—}B\text{—}R \quad \text{(PA-1)}$$

in which

Q represents —$SO_3H$, —$CO_2H$ or —$W_1NHW_2R_f$, in which $R_f$ represents an alkyl group, a cycloalkyl group or an aryl group, and each of $W_1$ and $W_2$ independently represents —$SO_2$—or —CO—;

A represents a single bond or a bivalent connecting group;

X represents —$SO_2$— or —CO—;

n is 0 or 1;

B represents a single bond, an oxygen atom or —$N(R_x)R_y$—, in which $R_x$ represents a hydrogen atom or a monovalent organic group, and $R_y$ represents a single bond or a bivalent organic group, provided that $R_x$ may be bonded to $R_y$ to thereby form a ring or may be bonded to R to thereby form a ring; and R represents a monovalent organic group containing the functional group with proton acceptor properties.

17. The composition according to claim 16, wherein Q represents —$SO_3H$ or —$CO_2H$.

18. The composition according to claim 15, wherein the compound (PA) is represented by general formula (7) below, $$\underset{(R)_m\text{—}A^+\text{—}(R_N)_n}{X^-} \quad (7)$$

in which

A represents a sulfur atom or an iodine atom;

m is 1 or 2 and n is 1 or 2, provided that m+n=3 when A is a sulfur atom and that m+n=2 when A is an iodine atom;

R represents an aryl group;

$R_N$ represents an aryl group substituted with the functional group with proton acceptor properties; and $X^-$ represents a counter anion.

19. An actinic-ray- or radiation-sensitive resin composition comprising:

(A) a resin containing a repeating unit with any of partial structures of general formula (I) below, the resin being configured to increase its rate of dissolution in an alkali developer when acted on by an acid;

(B) a compound (PA) containing a functional group with proton acceptor properties and being configured to decompose when exposed to actinic rays or radiation to thereby produce a compound exhibiting lower or no proton acceptor properties or a compound exhibiting acid properties instead of the proton acceptor properties; and (C) a compound being configured to generate an acid when exposed to actinic rays or radiation;

wherein the resin is contained in an amount of 50 mass % or more based on total solids of the composition, (I)

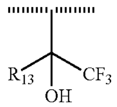

in which $R_{13}$ represents a hydrogen atom, an alkyl group or a cycloalkyl group, and wherein the resin (A) further contains at least two kinds of repeating unit represented by general formula (1) below:

(1)

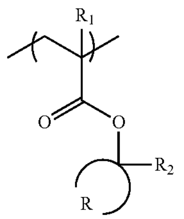

wherein in general formula (I), $R_1$ represents a hydrogen atom, a methyl group or any of the groups of the formula —$CH_2$—$R_9$, in which $R_9$ represents a monovalent organic group, $R_2$ represents an alkyl group or a cycloalkyl group and R represents an atomic group required for forming an alicyclic structure in cooperation with a carbon atom.

20. The composition according to claim 19, wherein the compound produced by the decomposition of the compound (PA) upon exposure to actinic rays or radiation is represented by general formula (PA-1) below:

$$Q\text{-}A\text{-}(X)_n\text{—}B\text{—}R \quad \text{(PA-1)}$$

in which

Q represents —$SO_3H$, —$CO_2H$ or —$W_1NHW_2R_f$, in which $R_f$ represents an alkyl group, a cycloalkyl group or an aryl group, and each of $W_1$ and $W_2$ independently represents —$SO_2$— or —CO—;

A represents a single bond or a bivalent connecting group;

X represents —$SO_2$—or —CO—;

n is 0 or 1;

B represents a single bond, an oxygen atom or —$N(R_x)R_y$—, in which $R_x$ represents a hydrogen atom or a monovalent organic group, and $R_y$ represents a single bond or a bivalent organic group, provided that $R_x$ may be bonded to $R_y$ to thereby form a ring or may be bonded to R to thereby form a ring; and R represents a monovalent organic group containing the functional group with proton acceptor properties.

21. The composition according to claim 20, wherein Q represents —$SO_3H$ or —$CO_2H$.

22. The composition according to claim 19, wherein the compound (PA) is represented by general formula (7) below, $$\underset{(R)_m\text{—}A^+\text{—}(R_N)_n}{X^-} \quad (7)$$

in which

A represents a sulfur atom or an iodine atom;

m is 1 or 2 and n is 1 or 2, provided that m+n=3 when A is a sulfur atom and that m+n=2 when A is an iodine atom;

R represents an aryl group;

$R_N$ represents an aryl group substituted with the functional group with proton acceptor properties; and $X^-$ represents a counter anion.

23. The composition according to claim 19, wherein the alicyclic structure formed by R included in at least one kind of repeating unit represented by general formula (1) is an alicyclic structure of a single ring.

* * * * *